US008541837B2

(12) United States Patent
Hirler

(10) Patent No.: US 8,541,837 B2
(45) Date of Patent: Sep. 24, 2013

(54) SEMICONDUCTOR FIELD EFFECT POWER SWITCHING DEVICE

(75) Inventor: Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/461,198

(22) Filed: May 1, 2012

(65) Prior Publication Data

US 2012/0217540 A1 Aug. 30, 2012

Related U.S. Application Data

(60) Division of application No. 12/540,860, filed on Aug. 13, 2009, now Pat. No. 8,203,181, which is a continuation-in-part of application No. 12/241,925, filed on Sep. 30, 2008, now Pat. No. 8,022,474.

(51) Int. Cl.

| | |
|---|---|
| ***H01L 29/66*** | (2006.01) |
| ***H01L 29/772*** | (2006.01) |
| ***H01L 29/78*** | (2006.01) |

(52) U.S. Cl.

USPC .................. 257/331; 257/401; 257/E29.201; 257/E21.419

(58) Field of Classification Search

CPC .................................................. H01L 29/7813
USPC .................. 257/331, 401, E29.201, E29.26, 257/337, 341, E21.418, E21.419
See application file for complete search history.

(56) References Cited

U.S. PATENT DOCUMENTS

| | | | |
|---|---|---|---|
| 5,623,152 A | 4/1997 | Majumdar et al. | |
| 5,818,084 A | 10/1998 | Williams et al. | |
| 6,351,018 B1 | 2/2002 | Sapp | |
| 6,600,194 B2 * | 7/2003 | Hueting et al. | 257/331 |
| 6,987,305 B2 | 1/2006 | He et al. | |
| 8,013,391 B2 | 9/2011 | Yedinak et al. | |
| 2002/0130358 A1 | 9/2002 | Van Dalen et al. | |
| 2004/0043565 A1 | 3/2004 | Yamaguchi et al. | |

(Continued)

FOREIGN PATENT DOCUMENTS

| | | |
|---|---|---|
| DE | 10250175 | 2/2005 |
| DE | 102004029435 | 1/2006 |

(Continued)

OTHER PUBLICATIONS

D. Chen, et al., "Super Barrier Rectifier—A New Generation of Power Diode", 2007, 11 pages.

(Continued)

*Primary Examiner* — Jerome Jackson, Jr.
*Assistant Examiner* — Paul Budd
(74) *Attorney, Agent, or Firm* — Dicke, Billig & Czaja, PLLC

(57) ABSTRACT

A semiconductor device having a semiconductor body, a source metallization arranged on a first surface of the semiconductor body and a trench including a first trench portion and a second trench portion and extending from the first surface into the semiconductor body is provided. The semiconductor body further includes a pn-junction formed between a first semiconductor region and a second semiconductor region. The first trench portion includes an insulated gate electrode which is connected to the source metallization, and the second trench portion includes a conductive plug which is connected to the source metallization and to the second semiconductor region.

11 Claims, 87 Drawing Sheets

(56) References Cited

U.S. PATENT DOCUMENTS

| | | | | |
|---|---|---|---|---|
| 2006/0017056 | A1 | 1/2006 | Hirler | |
| 2006/0220140 | A1 | 10/2006 | Robb et al. | |
| 2008/0012050 | A1 | 1/2008 | Aoki et al. | |
| 2008/0073707 | A1 * | 3/2008 | Darwish | 257/330 |
| 2009/0189218 | A1 | 7/2009 | Pan | |
| 2010/0308400 | A1 | 12/2010 | Darwish et al. | |

FOREIGN PATENT DOCUMENTS

| | | |
|---|---|---|
| DE | 10214175 | 6/2006 |
| DE | 102006045126 | 4/2007 |
| WO | 0051167 | 8/2000 |

OTHER PUBLICATIONS

Q. Huang, et al., "MOS Controlled Diodes—A New Power Diode", Solid-State Electronics, vol. 38, No. 5, pp. 977-980, 1995.
Office Action mailed Oct. 3, 2011 in U.S. Appl. No. 12/540,860.
Final Office Action mailed Jan. 4, 2012 in U.S. Appl. No. 12/540,860.
Sze, Physics of Semiconductor Devices, 1981, John Wiley & Sons, second edition, pp. 366-371.
Office Action mailed Jan. 14, 2011 in U.S. Appl. No. 12/241,925.
Office Action mailed Aug. 31, 2012 in U.S. Appl. No. 13/183,872.
Notice of Allowance mailed Dec. 28, 2012 in U.S. Appl. No. 13/183,872.

* cited by examiner

100

100

100

100

100

100

100

100

100

100

100

SEMICONDUCTOR FIELD EFFECT POWER SWITCHING DEVICE

CROSS-REFERENCE TO RELATED APPLICATIONS

This Utility Patent Application is a divisional application of U.S. application Ser. No. 12/540,860, filed Aug. 13, 2009, which is a Continuation-In-Part of U.S. application Ser. No. 12/241,925, filed on Sep. 30, 2008, which both are incorporated herein by reference.

BACKGROUND

Field-effect controlled power switching devices such as a Metal Oxide Semiconductor Field Effect Transistor (MOSFET) or an Insulated Gate Bipolar Transistor (IGBT) have been used for various applications including but not limited to use as switches in power supplies and power converters. One example illustrating the use of MOSFETS in a dc to dc converter is given in FIG. 1.

The direction of current flow through the field-effect controlled devices operating as switches may be different in different operating cycles of power converters. In a "forward mode" of the field-effect controlled device, the pn-body diode at the body-drain junction of the field-effect controlled device is reversely biased and the resistance of the device can be controlled by the voltage applied to the gate electrode of the field-effect controlled device. In a "reversed mode" of the field-effect controlled device, the pn-body diode is forward biased. This results in a loss which is mainly determined by the product of current flow and voltage drop across the body diode. To minimize losses during reverse mode of the field-effect controlled device, i.e., maximize efficiency of the power supply or power converter, a shunting device, e.g., a diode, can be switched in parallel to the body diode of the field-effect-controlled switching device. Ideally, the shunting device should conduct no current when the body diode is reverse-biased and turn on at a lower voltage than the body diode when the body diode is forward-biased. To avoid unwanted inductivities and capacities associated with the required contacts and supply lines of additional devices, integrated power devices including e.g., a MOSFET and a diode have been proposed.

Commonly, mainly Schottky diodes have been used as integrated shunting devices. A Schottky diode is characterized by a low forward voltage drop of about 0.4 V at a given typical current, a low turn-on voltage of about 0.3 V, fast turn off, and nonconductance when the diode is reverse biased. For comparison, a silicon pn-diode has a forward voltage drop of about 0.9 V at given typical current and a turn-on voltage of about 0.6 V to 0.8 V. The losses during reverse biasing of a silicon MOSFET can, therefore, be reduced by connecting a Schottky-diode in parallel to the pn-body diode. However, to create a Schottky diode a metal-semiconductor barrier must be formed. In order to obtain proper electric characteristics for the Schottky diode, the metal used for the Schottky-contacts likely differs from the metal used for other structures such as Ohmic metal-semiconductor contacts. This can complicate the manufacture of the device. Further, the quality of a Schottky diode is usually affected by subsequent processes required for forming the MOSFET. In addition, Schottky diode rectifiers suffer from problems such as high leakage current and reverse power dissipation. Also, these problems usually increase with temperature and current thus causing reliability problems e.g., for power supply and power converter applications. Therefore, monolithically integrated power devices including Schottky barrier diodes can cause design problems.

For these and other reasons, there is a need for the present invention.

SUMMARY

According to an embodiment, a semiconductor device having a semiconductor body, a source metallization and a trench is provided. The semiconductor body includes a first surface, a first semiconductor region of a first conductivity type and a second semiconductor region of a second conductivity type which forms pn-junction with the second semiconductor region. The source metallization is arranged on the first surface. The trench extends from the first surface into the semiconductor body and includes, in a horizontal plane which is essentially parallel to the first surface, a first trench portion and a second trench portion. The first trench portion includes a gate electrode which is connected to the source metallization and an insulating layer which insulates the gate electrode from the second semiconductor region. The second trench portion includes a conductive plug which is connected to the source metallization and to the second semiconductor region.

According to another embodiment, a semiconductor device is provided. The semiconductor device includes a source metallization, a first field-effect structure and a second field-effect structure. The first and second field-effect structures include a source region of a first conductivity type which is connected to the source metallization and a body region of a second conductivity type which is adjacent to the source region. The first field-effect structure further includes a first gate electrode and a first insulating region which is arranged at least between the first gate electrode and the body region. A first capacitance is formed between the first gate electrode and the body region. The second field-effect structure further includes, in a first vertical cross-section, a second gate electrode which is connected to the source metallization and a second insulating region which is, in a first vertical cross-section, arranged at least between the second gate electrode and the body region. A second capacitance is formed between the second gate electrode and the body region. The capacitance per unit area of the second capacitance is larger than the capacitance per unit area of the first capacitance.

According to yet another embodiment, a method for manufacturing a semiconductor device is provided. A semiconductor body having a first surface, a first semiconductor region of a first conductivity type and a second semiconductor region of a second conductivity type is provided. The first semiconductor region and the second semiconductor region form a pn-junction. A trench is formed such that the trench extends from the first surface into the semiconductor body and includes, in a horizontal plane substantially parallel to the first surface, a first trench portion and second trench portion. A gate electrode and an insulating layer which insulates the gate electrode from the second semiconductor region in the first trench portion are formed. A conductive plug is formed in the second trench portion such that the conductive plug is connected with the second semiconductor region. And a source metallization is formed on the first surface such that the source metallization is connected to the gate electrode and the conductive plug.

Further embodiments, modifications and improvements of the semiconductor device and the method will become more apparent from the following description and the appending claims.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 21 illustrates a vertical cross-section of a semiconductor device according to an embodiment.

FIGS. 37-43 illustrate further manufacturing processes for forming a semiconductor device according to certain embodiments.

FIGS. 59-63 illustrate still a further manufacturing method for forming a semiconductor device according to certain embodiments.

FIGS. 69-73 illustrate yet a further manufacturing method for forming a semiconductor device according to certain embodiments.

FIG. 81 illustrates numerical simulations for semiconductor devices according to an embodiment.

DETAILED DESCRIPTION

Figure 1:
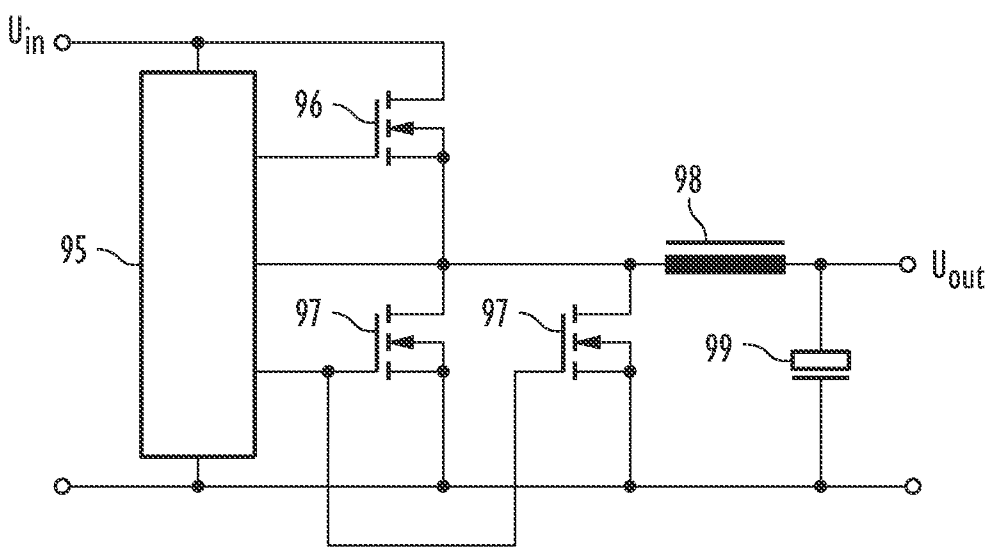
FIG. 1 illustrates a circuit diagram of a typical dc to dc converter wherein semiconductor devices according to several embodiments can be used.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "lateral" and "horizontal" as used in this specification intends to describe an orientation parallel to a first surface of a semiconductor substrate or body. This can be for instance the surface of a wafer or a die.

The term "vertical" as used in this specification intends to describe an orientation which is arranged perpendicular to the first surface of the semiconductor substrate or body.

In this specification, n-doped is referred to as first conductivity type while p-doped is referred to as second conductivity type. It goes without saying that the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "n+"-doping region has a larger doping concentration than the "n"-doping region. Indicating the relative doping concentration does not, however, mean that doping regions of the same relative doping concentration have the same absolute doping concentration unless otherwise stated. For example, two different n+ regions can have different absolute doping concentrations. The same applies, for example, to an n+ and a p+ region.

Specific embodiments described in this specification pertain to, without being limited thereto, power semiconductor devices which are controlled by field-effect and particularly to unipolar devices such as MOSFETs, bipolar devices such as IGBTs and unipolar and bipolar devices having compensation structures such as Superjunction-MOSFETs.

The term "field-effect" as used in this specification intends to describe the electric field mediated formation of an "inversion channel" and/or control of conductivity and/or shape of the inversion channel in a semiconductor region of the second conductivity type. Typically, the semiconductor region of the second conductivity type is arranged between two semiconductor regions of the first conductivity type and a unipolar current path through a channel region between the two semiconductor regions of the first conductivity type is formed and/or controlled by the electric field. The conductivity type of the channel region is typically changed to the first conductivity type, i.e., inverted, for forming the unipolar current path between the two semiconductor regions of the first conductivity type.

In the context of the present specification, the semiconductor region of the second conductivity type in which an inversion channel can be formed and/or controlled by the field effect is also referred to as body region.

In the context of the present specification, the term "field-effect structure" intends to describe a structure which is formed in a semiconductor substrate or semiconductor device and has a gate electrode which is insulated at least from the body region by a dielectric region or dielectric layer. Examples of dielectric materials for forming a dielectric region or dielectric layer between the gate electrode and the body region include, without being limited thereto, silicon oxide ($SiO_2$), silicon nitride ($Si_3N_4$), silicon oxi-nitride ($SiO_xN_y$), zirconium oxide ($ZrO_2$), tantalum oxide ($Ta_2O_5$), titanium oxide ($TiO_2$) and hafnium oxide ($HfO_2$).

Above a threshold voltage $V_{th}$ between the gate electrode and the body region, an inversion channel is formed and/or controlled due to the field-effect in a channel region of the body region adjoining the dielectric region or dielectric layer. The threshold voltage $V_{th}$ typically refers to the minimum gate voltage necessary for the onset of a unipolar current flow between the two semiconductor regions of the first conductivity type, which form the source and the drain of a transistor.

In the context of the present specification, devices such as MOS-controlled diodes (MCDs), MOSFETs, IGBTs and devices having compensation structures such as Superjunction-MOSFETs as well as integrated devices with different field-effect structures are also referred to as field-effect structures.

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e., the term MOSFET is used in the more general term meaning IGFET (insulated-gate field-effect transistor) and MISFET, respectively.

Figure 2:
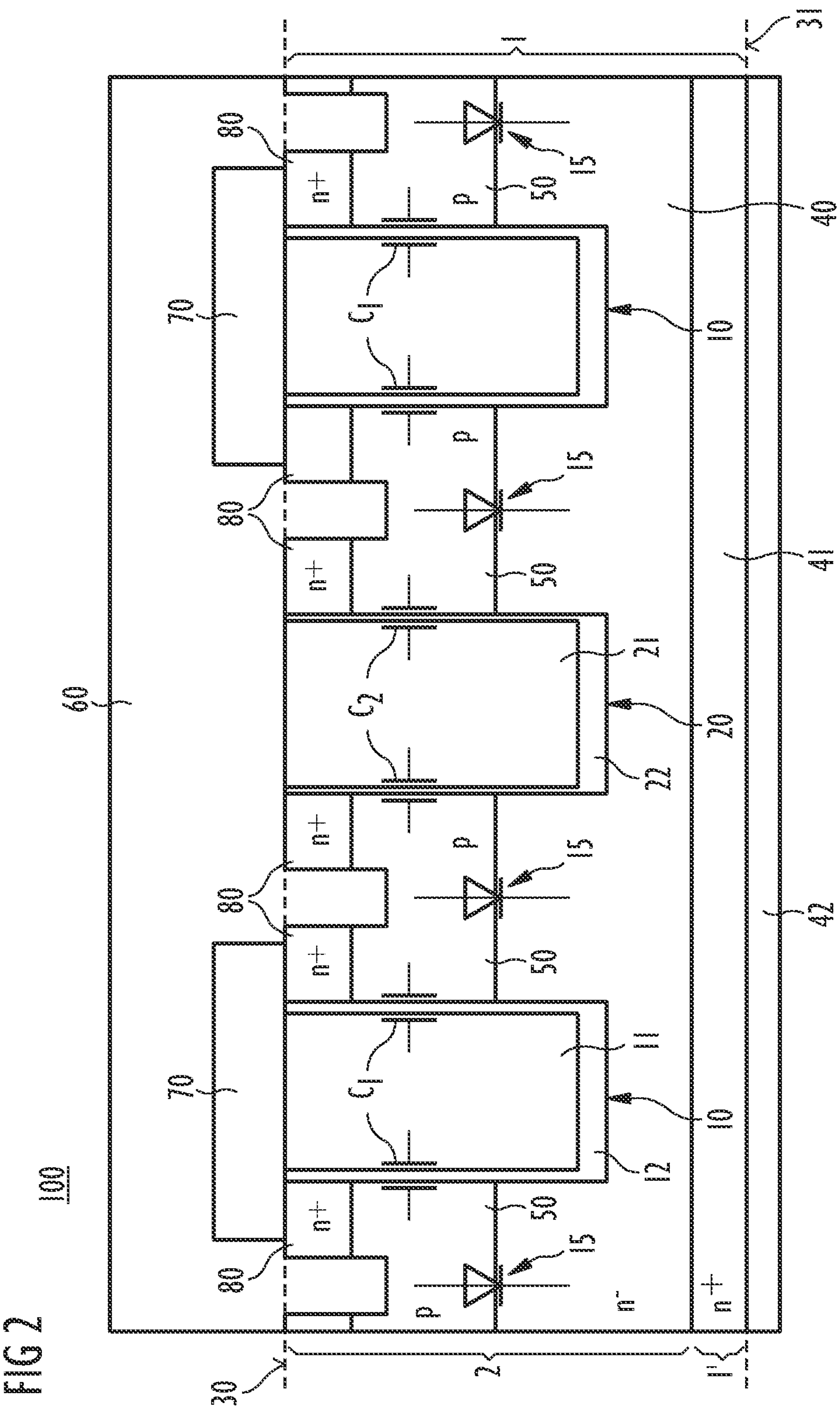
FIG. 2 illustrates a vertical cross-section of a semiconductor device according to an embodiment.

FIG. 2 illustrates an embodiment of a power semiconductor device 100 in a vertical cross-section. The semiconductor device 100 includes a semiconductor substrate 1 having a first surface 30 and a second surface 31 arranged opposite to the first surface 30. The semiconductor substrate 1 can be made of any semiconductor material suitable for manufacturing a semiconductor device. Examples of such materials include, without being limited thereto, elementary semiconductor materials such as silicon (Si), group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), indium gallium phosphide (InGaP) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon-silicon carbide (Si—SiC) and SiGe graded heterojunction semiconductor material. For power semiconductor applications currently mainly Si, SiC and Si—SiC materials are used.

The semiconductor substrate 1 can be a single bulk mono-crystalline material. It is also possible, that the semiconductor substrate 1 includes a bulk mono-crystalline material and at least one epitaxial layer formed thereon. Using epitaxial layers provides more freedom in tailoring the background doping of the material since the doping concentration can be adjusted during deposition of the epitaxial layer or layers.

Typically, the semiconductor substrate 1 is formed by providing a single bulk mono-crystalline body 1' of a first conductivity type (n-doped) on which one or more single-crystalline layers 2 are deposited epitaxially. The epitaxial layer or layers 2 accommodates or accommodate an n-doped drift region 40, a p-doped body region or body regions 50 and an n-doped source region or source regions 80. During epitaxial deposition, the desired doping concentration of the drift region 40 can be adjusted by supplying an appropriate amount of dopant. Different thereto, the body region or regions 50 and the source region or regions 80 are typically formed in the epitaxially deposited drift region 40 by implantation. It would also be possible to form the body region 50 during epitaxial deposition by appropriately providing dopants of the second conductivity type (p-doped) in the desired concentration. The source region 80 can also be formed as a substantially continuous layer by implantation or during epitaxial deposition. If desired, the manufacturing can include separate epitaxial deposition processes with different dopants of varying concentration or with the same dopant but with varying concentration to form the respective functional regions. In some embodiments, the final doping concentration of the drift region 40 can vary to include doping profiles having at least one minimum or at least one maximum or having an increasing or decreasing doping concentration from a drain region 41 to the body region 50.

In other embodiments, a substrate wafer or die having the desired background doping concentration of the drift region 40 is provided. The substrate wafer is suitably thinned and body region 50 and source region 80 are formed by implantation at the first surface 30. If desired, the substrate wafer can be further thinned at the second surface 31 and the drain region 41 is formed by implantation at the second surface 31. It would also be possible to thin the substrate wafer after implanting source and body regions 80, 50 only. By using this approach, an expensive epitaxial deposition can be avoided.

The semiconductor substrate 1 of FIG. 2 includes a common drift region 40 and a spaced apart source region 80 both of the n-conductivity type. Typically, the source region 80 is in electrical contact with a common source metallization 60, and the doping concentration of the source region 80 is higher than the doping concentration of the drift region 40 as indicated by the symbols "n+" and "n". Between the drift region 40 and the source region 80 a p-doped body region 50 is arranged and respective pn-junctions between the source region 80 and the body region 50 and between the body region 50 and the drift region 40 are formed. At least two first trenches 10 and at least a second trench 20 laterally arranged between the two first trenches 10 extend from the source region 80 through the body region 50 partially into the drift region 40. Typically, the first and second trenches 10 and 20 extend in a direction perpendicular to the illustrated cross-section. The trenches may, however, have any shape and can e.g., be formed as stripes. Typically, the trenches have, in a vertical cross-section, a width of about 0.5 μm to about 2 μm and a lateral distance of about 0.5 μm to about 2 μm. Further, the first trenches 10 extend typically deeper into the semiconductor substrate 1 than the second trenches 20.

The sidewalls and the bottom walls of the first trenches 10 and the second trench 20 illustrated in FIG. 2 are covered with a first insulating region 12 and a second insulating region 22, respectively. The insulated first and second trenches 10 and 20 are filled with a first conductive region 11 forming a first gate electrode 11 and second conductive region 21 forming a second gate electrode 21, respectively. The material of the first and second gate electrode 11 and 21 may be a metal such as Ti, W and Co or a material with metallic or near metallic properties with respect to electric conductivity such as highly doped n-type or p-type poly-Si, TiN or an electrically conductive silicide such as $WSi_2$. Due to their metallic properties each of the first and second gate electrodes 11 and 21 forms with the respective first and second insulating region 12 and 22 and the adjoining body region 50 a metal-insulator-semiconductor (MIS) structure.

In the context of the present specification, the term "gate electrode" intends to describe an electrode which is situated next to, and insulated from a body region 50, i.e., "gate electrodes" may also be those electrodes which are not at gate potential. The gate electrodes may be formed on top of the semiconductor substrate 1 or between mesa regions. In the context of the present specification, the term "mesa" or "mesa region" intends to describe the semiconductor region between two adjacent trenches extending into the semiconductor substrate in a vertical cross-section.

The second gate electrode 21 is in contact with a source metallization 60 which is also in contact with the source region 80 and the body region 50.

In the context of the present specification, the terms "in Ohmic contact", "in electric contact", "in contact" and "electrically connected" intend to describe that there is an Ohmic electric connection or Ohmic current path between two regions, portion or parts of a semiconductor devices, in particular a connection of low Ohmic resistance, even if no voltages are applied to the semiconductor device. An Ohmic electric connection is characterized by a linear and symmetric current-voltage (I-V) curve.

Due to the body diodes 15 formed by the pn-junctions between the body region 50 and the common drift region 40, the source metallization 60 and the drift region 40 are e.g., not in contact.

The first gate electrodes 11 are in contact with a gate metallization (not illustrated in FIG. 2). Further, the drift region 40 is in Ohmic contact with a common drain metallization 42 on the second surface 31 of the semiconductor device 100, wherein for better contact, a highly n-doped common drain region 41 can be arranged between the common drift region 40 and the common drain metallization 42.

In the cross-sectional view, the device 100 has separated body regions 50 and separated source regions 80. The source regions 80 adjoining a first trench 10 and a second trench 20 may also be referred to as first source regions and second source regions, respectively. However, the source regions 80 and/or the body regions 50 may also be simply connected at least in respective pairs. The electric contact between the source metallization 60 and the body region 50 may e.g., only be realized in certain portions of the semiconductor device 100. In this case the illustrated source regions 80 between two adjacent trenches are simply connected. Typically, even actually separated body regions 50 are in electric contact with each other. Further, even actually separated source regions 80 are typically in electric contact with each other too. For clarity reasons, apparently and actually separated body and source regions are labeled with the same respective reference sign.

According to a first embodiment, the capacitance per unit area C2 between the second gate electrode 21 and the body region 50, in the following also referred to as second capacitance per unit area, is larger than the capacitance per unit area C1, in the following also referred to as first capacitance per unit area, between the first gate electrode 11 and the body region 50. Typically, inversion channels can be formed along the first and second insulating region 12 and 22 in the body region 50. Due to the different capacitances per unit area between the body region 50 and the respective gate electrodes, the voltage differences between the body region 50 and the respective electrode, which is required to form the inversion channel, is typically lower for the second field-effect structure.

According to another embodiment, the permittivity of the second insulating region 22 is higher than the permittivity of the first insulating region 12 at least between the body region 50 and the respective gate electrodes 11 and 12. Thereby, the second capacitance per unit area C2 can be larger than the first capacitance per unit area C1 even at same geometry of the first and second trench 10 and 11. For example, the first insulating region 12 is made of $SiO_2$, $Si_3N_4$ or $SiO_xN_y$, whereas the second insulating region 22 is made of $HfO_2$. In another example, the first and second insulating region 12 and 22 are made of $SiO_2$ and $Si_3N_4$, respectively. The first and second insulating regions 12 and 22 may also include several layers of different materials. These layers should be chosen such that the second capacitance per unit area C2 is larger than the first capacitance per unit area C1.

According to yet another embodiment, the first gate electrode 11, the first insulating region 12, the source region 80 in contact with the source metallization 60, the body region 50 and the drift region 40 in contact with the drain metallization 42 forms a first field-effect structure, namely a MOSFET.

Figure 3:
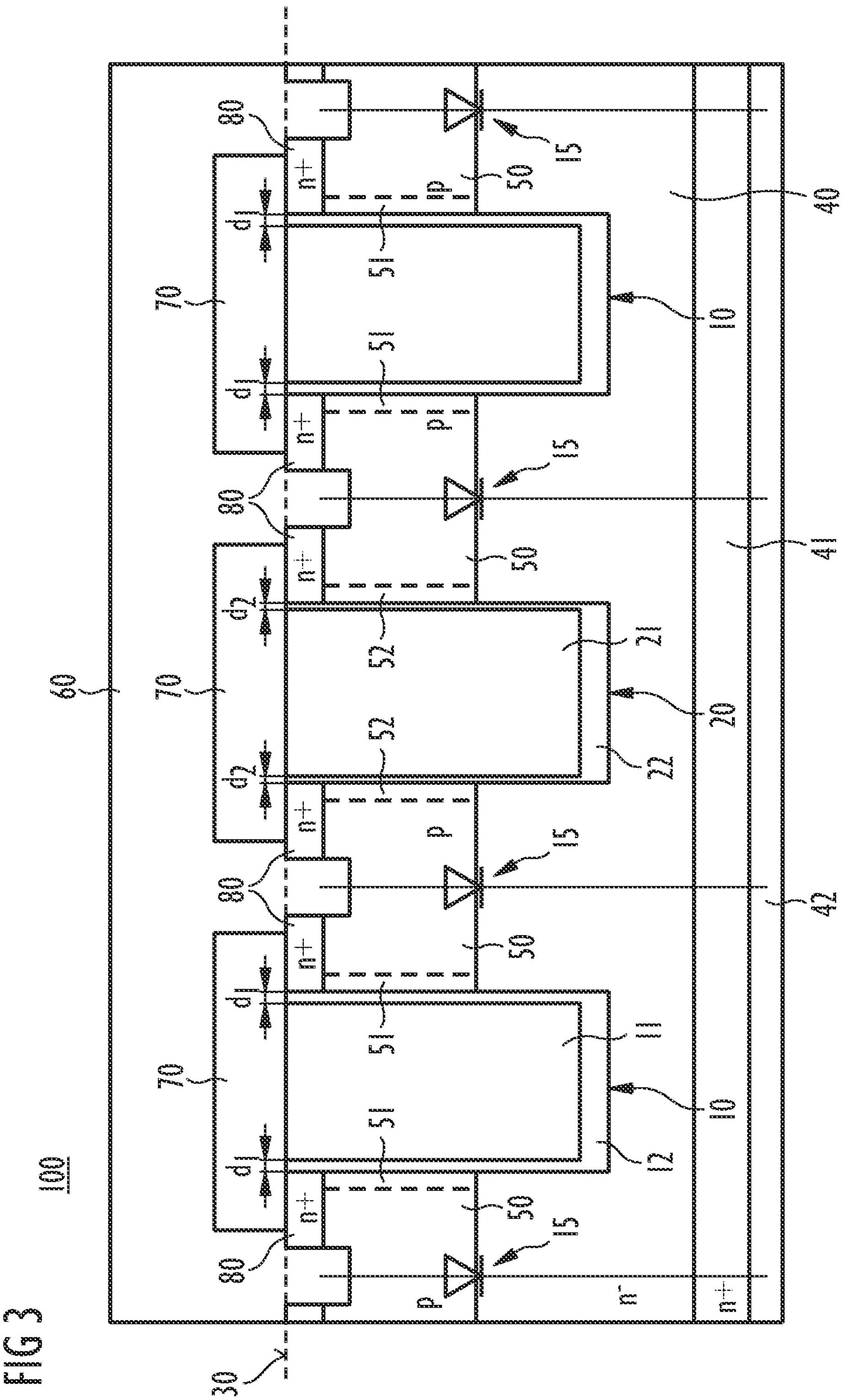
FIGS. 3 to 8 illustrate embodiments of semiconductor devices in vertical cross-sections.

If the voltage $V_{GS}$ between the gate metallization and source metallization 60 exceeds a threshold value, an n-type inversion channel 51 is formed along the first insulating region 21 in the body region 50 as indicated in FIG. 3 illustrating a similar semiconductor device 100 as FIG. 2 but in a different cross-section, in which the second gate electrode 21 is also spaced apart from the source metallization 60 by a dielectric portion 70. However, the second gate electrode 21 is in contact with the source metallization 60 in other portions of the device 100. In other words, there is at least a second cross-section through the semiconductor device 100 of FIG. 3 illustrating that the source metallization 60 is connected to the second gate electrode 21. This applies to all Figures of the present specification in which the contact between the second gate electrode 21 and the source metallization 60 is not illustrated.

According to yet another embodiment, the second gate electrode 21, which is in contact with the source region 80 and the source metallization 60, the second insulating region 22, the body region 50 and the drift region 40 in contact with the drain metallization 42 form a second field-effect structure, which is in the following referred to as MOS-gated diode (MGD). The term "MOS-gated diode" or "MGD" as used in this specification intends to describe a MOSFET structure with shorted gate electrode and source electrode, i.e., a MGD is a two terminal field-effect structure. Further, the body region 50 of the MGD is typically in contact with the source electrode 60. Typically, the MGD is connected in parallel to the body diodes 15 formed between the body region 50 and the drain region 40.

In other words, embodiments as described herein include an integrated semiconductor device which has a body diode 15 formed between a body region 50 and a common drift region 40, a first field-effect structure and a second field effect structure which is typically a MGD. The first field-effect structure and the second field effect structure are typically connected to a first common metallization and a second common metallization. Typically, the first common metallization is electrically connected to the source regions 80 of the first and second field effect structures. This metallization is therefore typically referred to as source metallization 60. The body region 50 is typically also connected to the first common metallization. The second common metallization is typically in electrical contact with the common drift region 40. The total current between the two common metallization may flow in either direction through the integrated semiconductor device.

In a "forward mode" of the semiconductor device, in which the body diode 15 is reversely biased, the first field-effect structure can control the resistance of the semiconductor device by the field-effect. Therefore, the first field-effect structure is also referred to as controllable field-effect structure. To control the resistance, an appropriate voltage difference between the first common metallization and an insulated gate electrode 11 of the first field-effect structure is applied or changed as known to those skilled in the art. Thereby, an inversion channel 51 within the body region 50 can be formed and/or modified and the current blocking body diode 15 can be bypassed. At given voltage difference between the first and second common metallization the total current flowing through the semiconductor device can by controlled in this way.

In a "reverse mode" or "backward mode" of the semiconductor device, the body diode 15 is forwardly biased. Furthermore, since the body region 50 and the source region 80 are shorted in many embodiments, a current can flow through the device in backward mode. Further, the insulated gate electrode 21 of the second field-effect structure is shorted with the source metallization 60. Thus the current cannot be controlled by applying a control voltage to the second field-effect structure. However, an inversion channel can also be formed in the reversed mode under specific conditions. Generally, the forming of an inversion channel in the channel region of a p-type body region next to an insulated gate electrode requires a positive voltage difference between the insulated gate electrode and the body region $V_{GB}>0$. Even if the body contact and the insulated gate electrode are electrically connected, a positive voltage difference can occur depending on the built-in potential between the source region 80 and the body region 50, the voltage drop due to the current flow from the source region 80 to the drain region 41, and on the work function differences between the gate material and the material of the body region 50.

Due to the resistivity of the body region 50, any current flow during reverse mode reduces the voltage along the current path in the body region 50 to values which are lower than the voltage $V_S$ applied to the source metallization 60. This typically results in a lower potential of the body region next to the insulated gate electrode. Therefore, the voltage difference $V_{GB}$ increases typically with the current and current density, respectively.

In certain embodiments the second field-effect structure (MGD) is designed such that the total current through the integrated semiconductor device in reverse mode is, above an average current flow density threshold, typically dominated by a unipolar current flowing via an inversion channel 52 along the insulating gate electrode 21. Typically, this reduces the electric losses of the integrated semiconductor device compared to the case of a total current flow across the pn-junctions of the body diode 15 during reverse mode.

Further, not the electric potential but the quasi-Fermi level of the electrons (and that of the holes) is typically equalized between the metallic gate electrode, the metallic source electrode and the metallic body contact, when the contacts are short-circuited. Therefore, a positive potential difference $V_{GB}$ between a gate electrode, in particular the second gate electrode 21, and the body region 50 can be formed even without applying an external voltage or current to the semiconductor device 100. The gate potential $V_G$ reads:

$$V_G = E_g(\text{material}_{body})/2 + \chi(\text{material}_{body}) - WF(\text{material}_{gate\ electrode})$$

with work function WF, electron affinity $\chi$ and band gap $E_G$. For a monocristalline silicon body and highly phosphorous doped polycrystalline silicon (poly-Si) electrodes, the gate potential $V_G$ typically amounts to about $$V_G = 0.56\text{ V} + 4.17\text{ V} - 4.35\text{ V} = 0.37\text{ V}.$$

In the context of the present specification, the term "work function" intends to describe the minimum energy (usually measured in electron volts) needed to remove an electron from a solid to a point outside the solid surface. This corresponds for metals to the energy needed to move an electron from the Fermi energy level, which lies within the conduction band, into vacuum. For a semiconductor material or an insulator the work function can be defined as the sum of the electron affinity $\chi$ and half of the band-gap, i.e., the minimum energy needed to move an electron from the intrinsic Fermi level into vacuum.

Gate electrode materials having a work function which is lower than the above given value of 4.35 V for highly phosphorous doped polysilicon will produce even higher positive $V_{GB}$ than 0.37 V. In some embodiments, the work functions of the first and second gate electrode 11 and 21 are different. Typically, the work function of the second gate electrode 21 is smaller than the work function of the first gate electrode 11. For example, the first gate electrode 11 is made of highly doped poly-Si, and the second gate electrode is made of TiN, TaN or Co. Typically, the electron affinity of the body region 50 is also smaller than the work function of the first gate electrode 11. For example, the first gate electrode 11 and the body region 50 are made of highly doped poly-Si and of Si, respectively.

If the voltage difference $V_{GB}$ between the insulated gate electrode and the body region is larger than a threshold voltage $V_{th}$, an inversion channel is formed along the insulated gate electrode in the body region 50.

Generally, the threshold voltage $V_{th}$ of a field-effect structure reduces with increasing gate capacitance per unit area and decreasing doping concentration of the body region 50. This applies both for a MOSFET structure during "threshold connection" in forward mode ($V_{GS}=V_{DS}>0$) and a MOSFET structure in reverse mode (or "reverse threshold connection", $V_{DG}=V_{DS}<0$) with the voltage differences $V_{GS}$, $V_{DG}$ and $V_{DS}$ between gate and source, drain and gate, and drain and source, respectively. During "reverse threshold connection" of the MOSFET, the drain is used as electron source and the source is used as electron drain. In addition to the electron transport through the inversion channel of the MOSFET, the current of the reverse bipolar transistor in the mesa and the hole current across the pn-body diode typically contribute to the total current in reverse mode. Therefore, the threshold voltage $V_{th}$ of the MGD is typically lower than the threshold voltage $V_{th}$ of the MOSFET even at same capacitance per unity area between the body region 50 and the respective gate electrode.

Further, only a weak inversion channel or weak inversion layer 52, which has a charge carrier concentration of about $10^{17}$ $cm^{-3}$ to about $10^{18}$ $cm^{-3}$, is typically formed along the second insulating region 22 in the body region 50 of the MGD.

Since the second gate electrode 21 is connected to the source metallization 60 in the FIGS. 2 and 3, the lower threshold voltage $V_{th}$ of the MGD is typically not reflected in the gate characteristic of the MOSFET with integrated MGDs. Further, the maximum rated gate voltage of the MOSFET does not result in a lower limit for the gate thickness of the MGD.

The inversion channel is typically only formed along the second insulating region 22 during reverse mode. This is because the second field-effect structure (MGD) has a higher capacitance per unit area between its gate electrode and the body region than the first field-effect structure (MOSFET).

The voltage drop across the semiconductor device 100 can, depending on the current density and the properties of the MGDs, typically be reduced from about 0.9 V of the body diode 15 to values below 0.5 V during reverse mode of the integrated MOSFET 100. Thereby, the losses are reduced in this mode. The use of MOSFETs with integrated MGD 100 in a typical converter can therefore increase the converter efficiency. This is explained in more detail with reference to FIG. 1.

FIG. 1 illustrates a circuit diagram of a typical step-down dc to dc converter, i.e., a buck converter, using MOSFETS. An input voltage $U_{in}$ is stepped down to a lower output voltage $U_{out}$. The topology of the illustrated circuitry is widely used, e.g., on computer mainbords, to convert a typical input voltage $U_{in}$ of 12 V provided by the mains adapter to the required voltages of e.g., about 1.2 V to about 3.3 V of the consumers of the mainboard such as a CPU, a GPU, a DSP, a DRAM and driver chips. The buck converter has four operating phases which are controlled by a driver IC 95. In a first phase the highside MOSFET switch 96 is switched on and the two lowside MOSFET switches 97 are switched off. This causes a linear current increase through the inductor 98 charging the capacitance 99. If the output voltage $U_{out}$ exceeds a certain threshold, the driver IC 95 switches the MOSFET 96 off which initiates the second phase. Now the load current flows in the freewheel circuit formed by the inductor 96, the capacitance 97 and the body diodes of the two MOSFETs 97. In this phase the MOSFETs 97 are in reverse mode, and the losses are mainly caused by the body diodes which are now biased in forward direction. Typically, the forward voltage drop of the body diode of a silicon MOSFET is for typical currents about 0.9 V or even larger. After a dead time the MOSFETs 97 are switched on by the driver IC 95 to reduce losses (third phase). If the output voltage falls below a limit the MOSFETs 97 are switched off again (fourth phase) prior to returning to the first phase. To minimize the losses of the buck converter, MOSFETs 100 with integrated second field effect devices having a low voltage drop if the body diode is switched in forward direction can be used. This applies also to other type of converters such as step-up converters and single ended primary inductance converters.

Except for the capacitances per unit area, the technical features can be optimized independently for the first and second field-effect structures. Examples of such features include but are not limited to the leakage current, the blocking ability, the quality of Ohmic contacts and related temperature dependencies.

Further, different threshold voltages for the MOSFETs which are higher than the threshold voltage of the second field effect structure (MGD) on a single integrated circuit may be required. This can e.g., be obtained by selectively providing channel implants for the first field effect structures forming the respective transistors. Additional channel implants, i.e., the doping of the channel region 51 to adjust the threshold voltage of the first field effect structures, may be used for those MOSFETS which have different threshold voltage requirements $V_{th}$.

Further, the concept of integrating a first field-effect structure having a first capacitance per unit area between its gate electrode and a body region and a second field-effect structure, which includes a shorted gate electrode and source electrode and has a capacitance per unit area between its gate electrode and the body region which is higher than the first capacitance per unit area, is not limited to the illustrated vertical field-effect structures with gate electrodes arranged in trenches as illustrated in FIGS. 2 and 3 (VMOSFET, UMOSFET). In further embodiments the principles disclosed herein are also used in lateral devices such as a lateral MOSFET and in planar vertical devices, i.e., devices with non-buried gate electrode, such as a DMOSFET.

In other words, the semiconductor device 100 includes a source metallization 60 in contact with a source region 80 of a first conductivity type, a drain region 41 of the first conductivity type and a body region 50 of a second conductivity type. The body region 50 respectively adjoins the source region 80 and the drift region 40. The semiconductor device 100 further includes a first field-effect structure with a first gate electrode 11 and a first capacitance per unit area C1 between the first gate electrode 11 and the body region 50, and a second field-effect structure with a second gate electrode 21 and a second capacitance per unit area C2 between the second gate electrode 21 and the body region 50 which is larger than the first capacitance per unit area C1.

According to certain embodiments, the semiconductor device is a power-semiconductor device which includes a plurality of monolithically integrated first and second field-effect structures. In other embodiments, the semiconductor device 100 includes only one first and/or one second field-effect structure.

Referring again to FIG. 3 still a further embodiment will be explained. Accordingly, the thickness $d_2$ of the second insulating region 22 between the second gate electrode 21 and the body region 50, in the following also referred to as second thickness, is smaller than the thickness $d_1$ of the first insulating region 12 between the first gate electrode 11 and the body region 50. In the following the thickness $d_1$ is also referred to as first thickness. Thereby, the second capacitance per unit area C2 can be larger than the first capacitance per unit area C1 even if the same electrically insulating material is used for forming the first and second insulating region 12 and 22.

For example, for a silicon oxide as gate insulating material, the first thickness d1 is typically in a range between about 10 nm and about 100 nm.

The second thickness $d_2$ can be significantly smaller, e.g., by a factor of two or more than a typical thickness of a silicon oxide layer as gate insulator of about 40 nm to 60 nm in standard power MOSFETs. In certain embodiments, the second thickness $d_2$ is smaller than about 8 nm. The second thickness $d_2$ may be smaller than 6 nm or 4 nm and may even be smaller than 1 nm.

Typically, the second thickness d2 is smaller than the maximum thickness of the second insulating region 22 between the second gate electrode 21 and the common drift region 40. Further, the first thickness d1 is typically smaller than the maximum thickness of the first insulating region 22 between the first gate electrode 11 and the common drift region 40.

Figure 4:
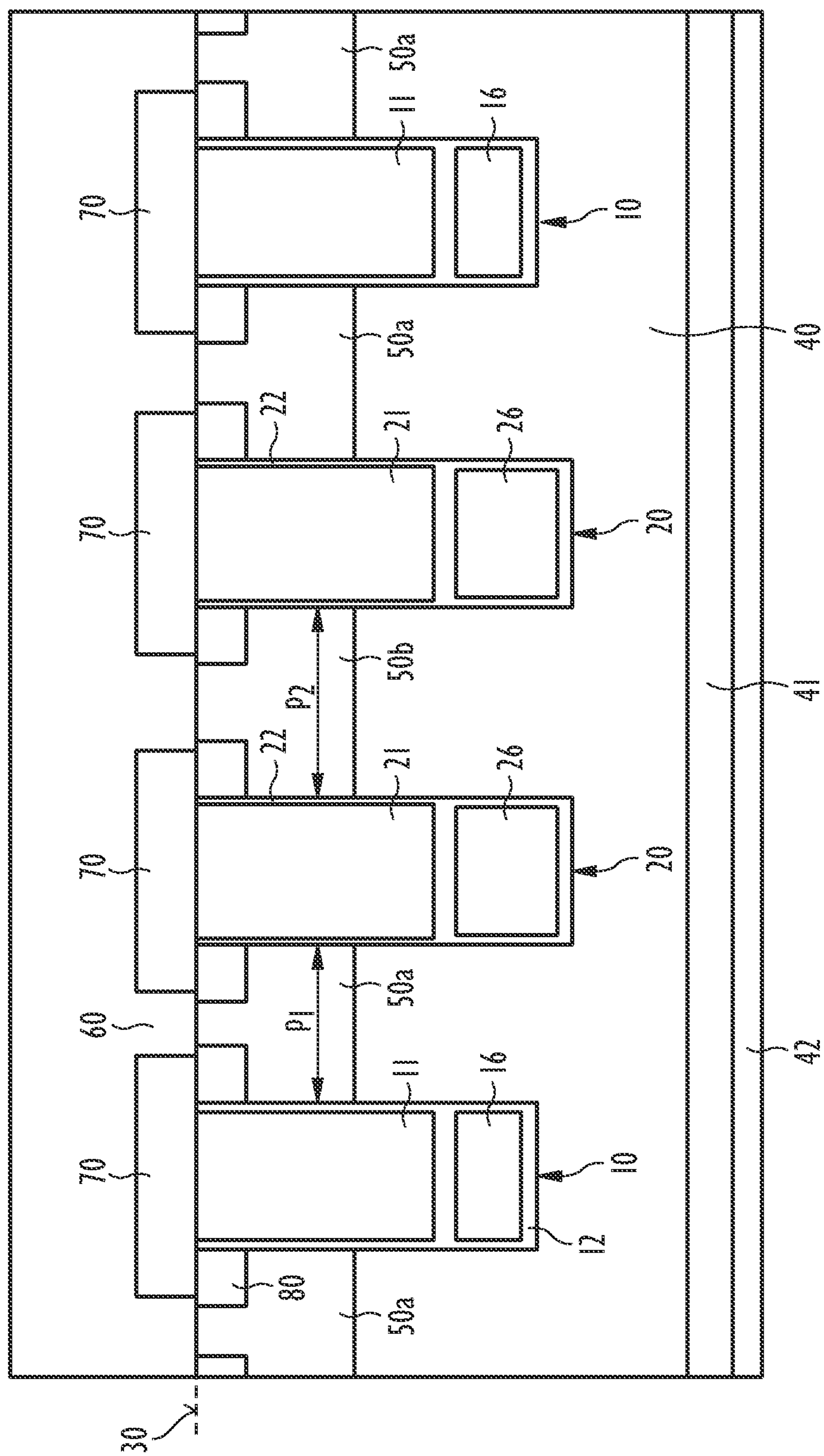

FIG. 4 illustrates a vertical cross-section of a semiconductor device 100 according to further embodiments. The illustrated semiconductor device 100 differs from the one illustrated in FIG. 3 in that it includes two second trenches 20 next to each other. Further, in each of the first and second trenches 10 and 20 field plates 16 and 26 were formed below the respective gate electrodes 11 and 21. The two second trenches 20 are spaced to respective neighboring first trenches 10 by a mesa region of a first lateral distance $p_1$. In addition, the two second trenches 20 are spaced apart by a mesa region of a second lateral distance $p_2$. In certain embodiments, the first lateral distance $p_1$ is larger than the second lateral distance $p_2$ and/or the second field plates 26 extends vertically deeper into the common drift region 40 than the first field plates 16. Since the second gate electrodes 21 and the first and second field plates 16 and 26 are on source potential, the drift region 40 in the mesa between the two second trenches 20 is screened against high electric field strength in forward mode. Consequently, the second field effect structure, i.e., the integrated MGD, is typically better protected against Avalanche breakdown than the first field effect structure.

Due to the arrangement of the first and second trenches 10 and 20, there are four first body sub-regions 50*a* which adjoin the first insulating region 12 and one second body sub-region 50*b* which does not adjoin the first insulating region 12 but adjoins the second insulating regions 22 of the neighboring second trenches 20. In some embodiments the second body sub-region 50*b* has lower doping concentration than the first body sub-regions 50*a*. This will typically further reduce the threshold voltage $V_{th}$ for forming the inversion channel of the second field effect structure and hence the voltage drop during reverse mode.

Figure 5:
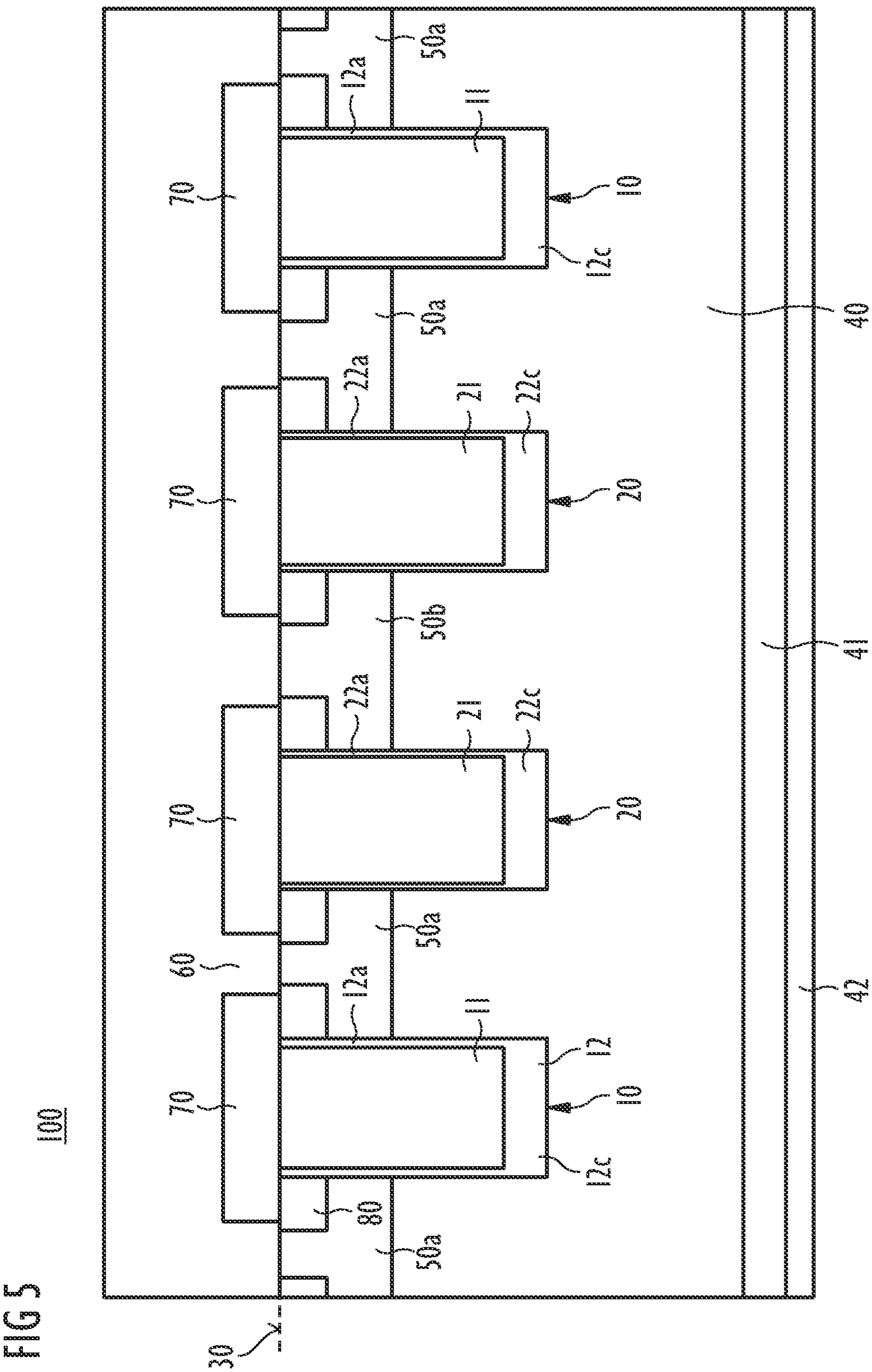

The semiconductor device 100 illustrated in FIG. 5 differs from the one illustrated in FIG. 3 in the geometry of the insulating regions 12 and 22 in a lower portion of the first and second trenches 10 and 20, respectively. Typically, both insulating regions include two respective insulating portions, a first and a second insulating portion 12*a* and 22*a* between the body region 50*a* or 50*b* and the respective gate electrode 11 and 22 and first and second insulating bottom portion 12*c* and 22*c* filling at least the space between the bottom of the trenches 10 and 20 and the respective gate electrodes 11 and 21. In some embodiments, the lateral and/or vertical thickness of the insulating bottom portions 12*c* and 22*c* below the respective gate electrodes exceeds the respective thickness of the insulating portions 12*a* and 22*a* in a vertical cross-section. Thereby, the field strength in the bottom portions 12*c* and 22*c* can be reduced. Typically, the lateral and/or vertical thickness of the first and second insulating bottom portions 12*c* and 22*c* is in a range of about 50 nm to about 300 nm.

With respect to FIG. 6 further embodiments will be explained. The semiconductor device 100 illustrated in a vertical cross-section includes an n-type source region 80 in contact with a common source metallization 60. The source region 80 adjoins a p-type body region 50 which adjoins a common n-type drift region 40. Between the body region 50 and the drift region 40 a body diode (not illustrated) is formed. Within the drift region 40 a third semiconductor region 25 or third conductive region 25 of the p-type is typically buried. Typically the doping concentration of the third conductive region 25 is higher than the doping concentration of the body region 50. Further, the third conductive region 25 and the body region 50 are spaced apart from each other. Due to the formed pn-junction between the third conductive region 25 and the drift region 40, a space charge region or layer is typically formed next to the pn-junction. A second trench 20 extends from the source region 80 through the body region 50 and at least partially into the drift region 40. The second trench 20 adjoins the third conductive region 25 and includes an insulating layer 22 and a conductive plug 21, which forms an Ohmic connection between the source metallization 60 and the third conductive region 25. The insulating layer 22 is only arranged on the side walls of the second trench 20 and insulates the conductive plug 21 from the body region 50 and the source region 50. The body region 50 may be connected to the source metallization 60.

In some embodiments as described herein, the conductive plug 21, the insulating layer 22 and the body region 50 form a second field effect structure which is typically a MGD having a second capacitance per unit area C2 between the conductive plug 21 forming a second gate electrode 21 and the body region 50.

In certain embodiments, the semiconductor device 100 further includes at least one first trench 10 which extends from the source region 80 through the body region 50 partially into the drift region 40. In FIG. 6 two first trenches 10 are exemplarily illustrated. The side walls and the bottom walls of the first trenches 10 are covered with a first insulating layer 12. The insulated first trenches 10 are filled with first conductive regions forming first gate electrodes 11.

In some embodiments as described herein, the second and first trenches can also be described as a trench and a further trench, respectively. In this case, the second field-effect structure and the first field-effect structure form a field-effect structure and a further field-effect structure, respectively.

Typically the capacitance C1 per unit area between the first gate electrode 11 and the body region 50 is lower than the second capacitance per unit area C2. This can again be achieved by choosing an appropriate effective thickness and/or permittivity of the first insulating region 12 and the insulating layer 22. In addition to the common source metallization 60, the semiconductor device 100 typically includes a common drain metallization 42 and a common gate metallization (not illustrated) in electrical contact with the first gate electrodes 11 so that the device 100 can be operated as a three-terminal MOSFET. As the MOSFET 100 includes a MGD which is connected in parallel to the body diode, the integrated MOSFET 100 has typically a lower voltage drop during reverse mode compared to standard MOSFETs. This favors the use of the integrated MOSFET 100 as a low-side MOSFET 97 in a converter as illustrated in FIG. 1.

In some embodiments, the first trench 10 further includes in the lower portion a conductive field plate 16 in contact with the source metallization 60 to allow a higher doping concentration and/or thinner drift region 40 while keeping the breakdown voltage substantially constant. The field plates 16 and the third conductive region 25 screen the body region 50 during forward mode. Further, the third conductive region 25 can carry an Avalanche current. Therefore, the body region 50 may also be floating.

Figure 6:
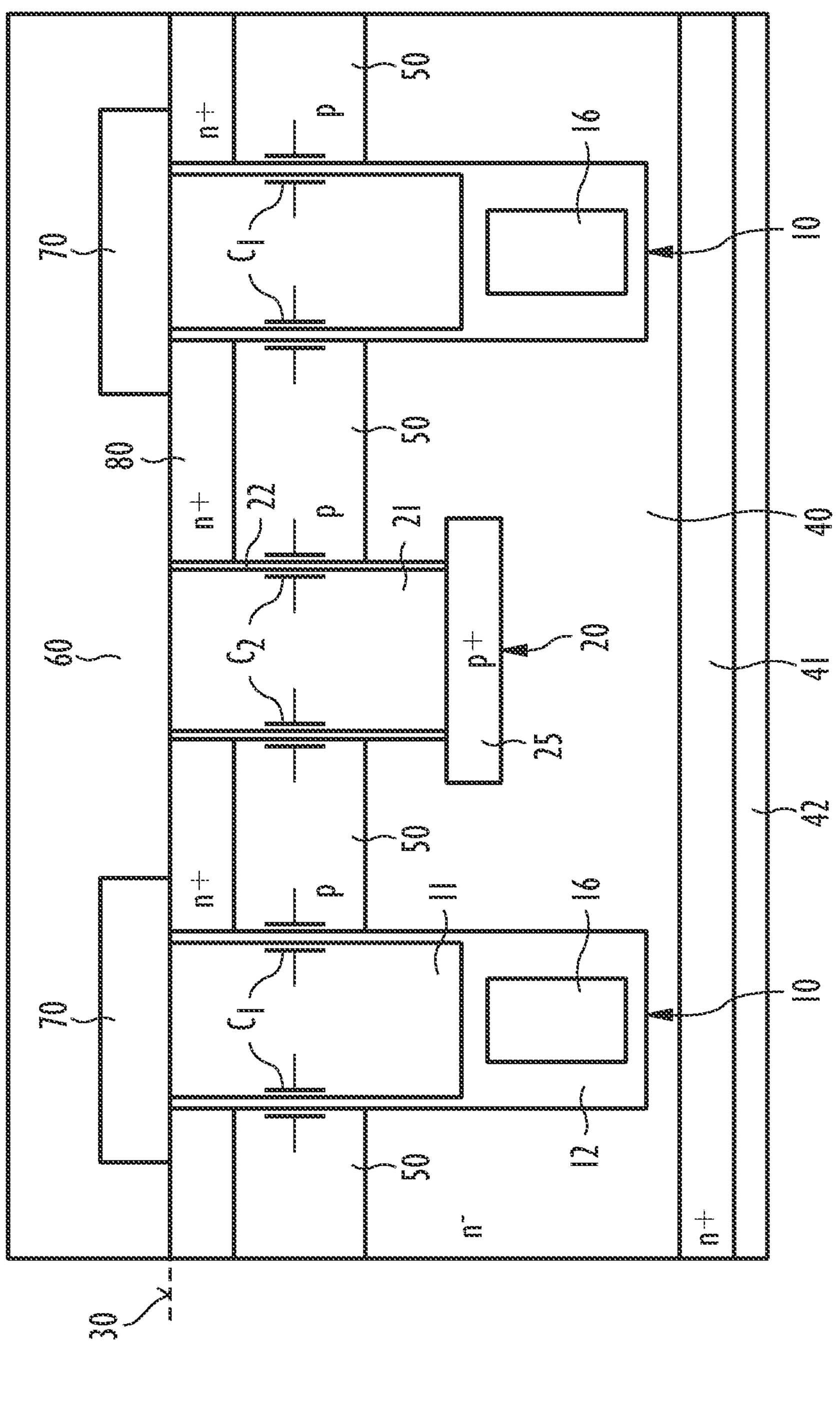
Figure 7:
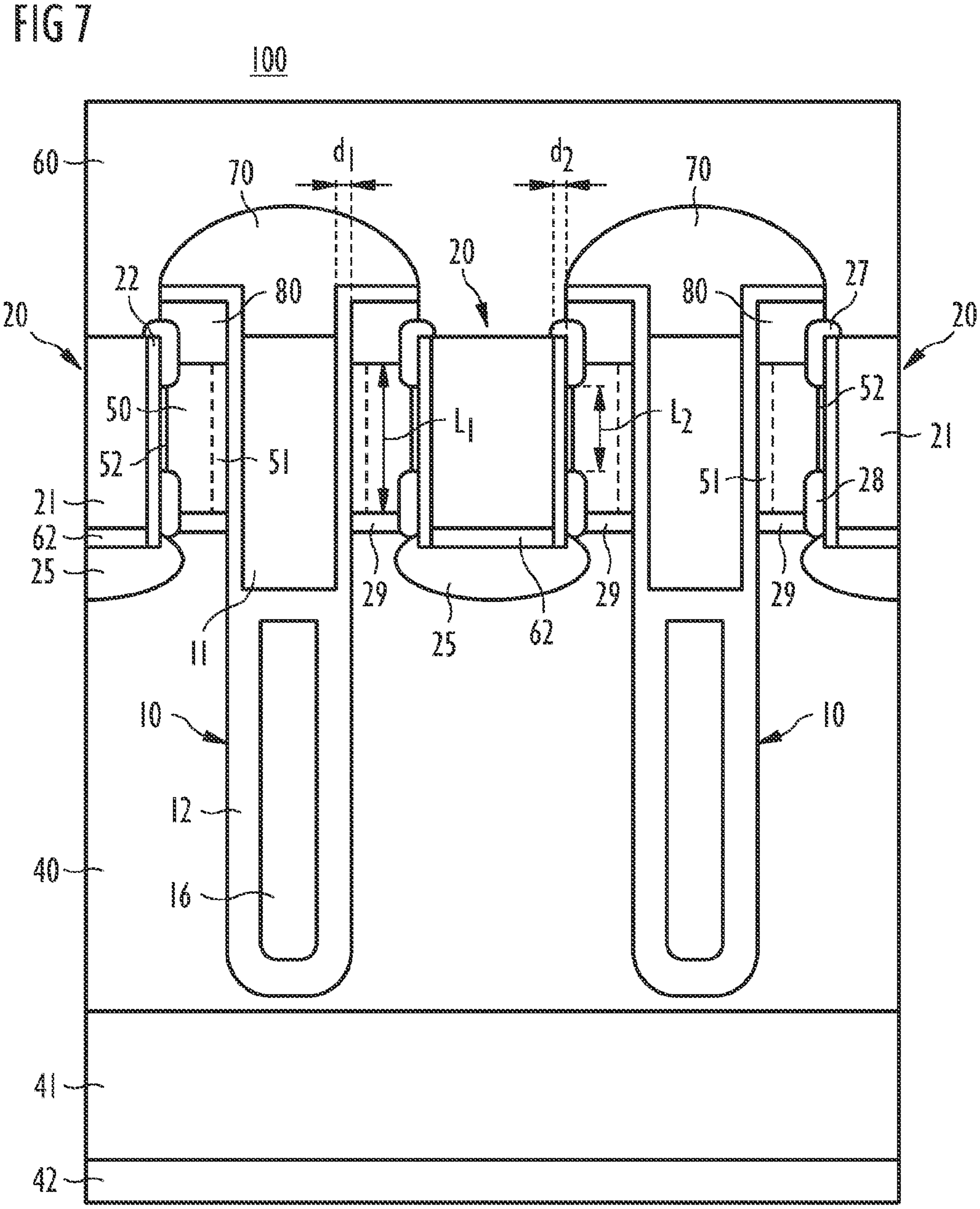

FIG. 7 illustrates, in a vertical cross-section, a similar MOSFET with integrated MGDs 100 as illustrated in FIG. 6. In addition, the first and second inversion channels 51 and 52 are illustrated, which can be formed in the body region 50 by the field-effect such that they extend from the source region 80 to the drift region 40. For clarity reasons not all inversion channels of the semiconductor device 100 are labeled with the respective reference signs. In certain embodiments, the doping concentration of the channel regions 52 is lower than the doping concentration of the remaining part of the body region 50 to further reduce the threshold voltage of the second inversion channels 52. Due to the formed inversion channels 52 of the MGD during reverse mode, the amount of stored minority carriers (reverse recovery charge) is typically also reduced compared to standard MOSFETs. A reduction of the stored charge generally results in a reduction of the current peak during commutation. Thus, the switching behaviour of the MOSFET with integrated MGDs 100 can be improved compared to standard MOSFETs. Accordingly, the MOSFET with integrated MGDs 100 can also be used as low-side switch with improved switching behaviour in a converter circuit arrangement.

Further, first doped regions 27, second doped regions 28 and third doped regions 29 are illustrated in the cross-section of FIG. 7. The first doped regions 27 adjoin the source metallization 60, the source region 80, the body region 50 and the insulating layer or second insulating region 12. The second doped regions 28 adjoin the third conductive region 62, the body region 50, the common drift region 40, the insulating layer 12 and a respective third doped region 29. The third doped regions 29 are arranged between the body region 50 and the drift region 40 on both sides of each conductive plug 21. In certain embodiments, each of the first, second and third doped regions 27, 28 and 29 are regions of the first conductivity type, i.e., n-doped regions, having a doping concentration which is typically higher than the doping concentration of the drift region 40. Thereby, the length $L_2$ of the second inversion channel 52, which can be formed in the body region 50 along the second insulating region 22, can be tailored independently from the length $L_1$ of the first inversion channel 51, which can be formed in the body region 50 along the insulating layer 12. According to another embodiment, the length $L_2$ is smaller than the length $L_1$. Thereby, the electric resistance of the second inversion channel 52 can be further reduced. This results in even lower losses of the MOSFET with integrated MGDs 100 during reverse mode as desirable for many applications e.g., as lowside MOSFET 97 in the converter of FIG. 1.

In certain embodiments, a conductive contact layer 62 is arranged between the conductive plug 21 and the third conductive region 25 to improve the electric contact and to reduce the resistance between the source metallization 60 and the third conductive region 25. Typically, the contact layer 62 has a metallic or near metallic conductivity. For example, the contact layer 62 can be made of a metal, a silicide or Ti/TiN for improving the contact between a poly-Si plug 21 and a p-type third conductive region 25 made of silicon.

Figure 8:
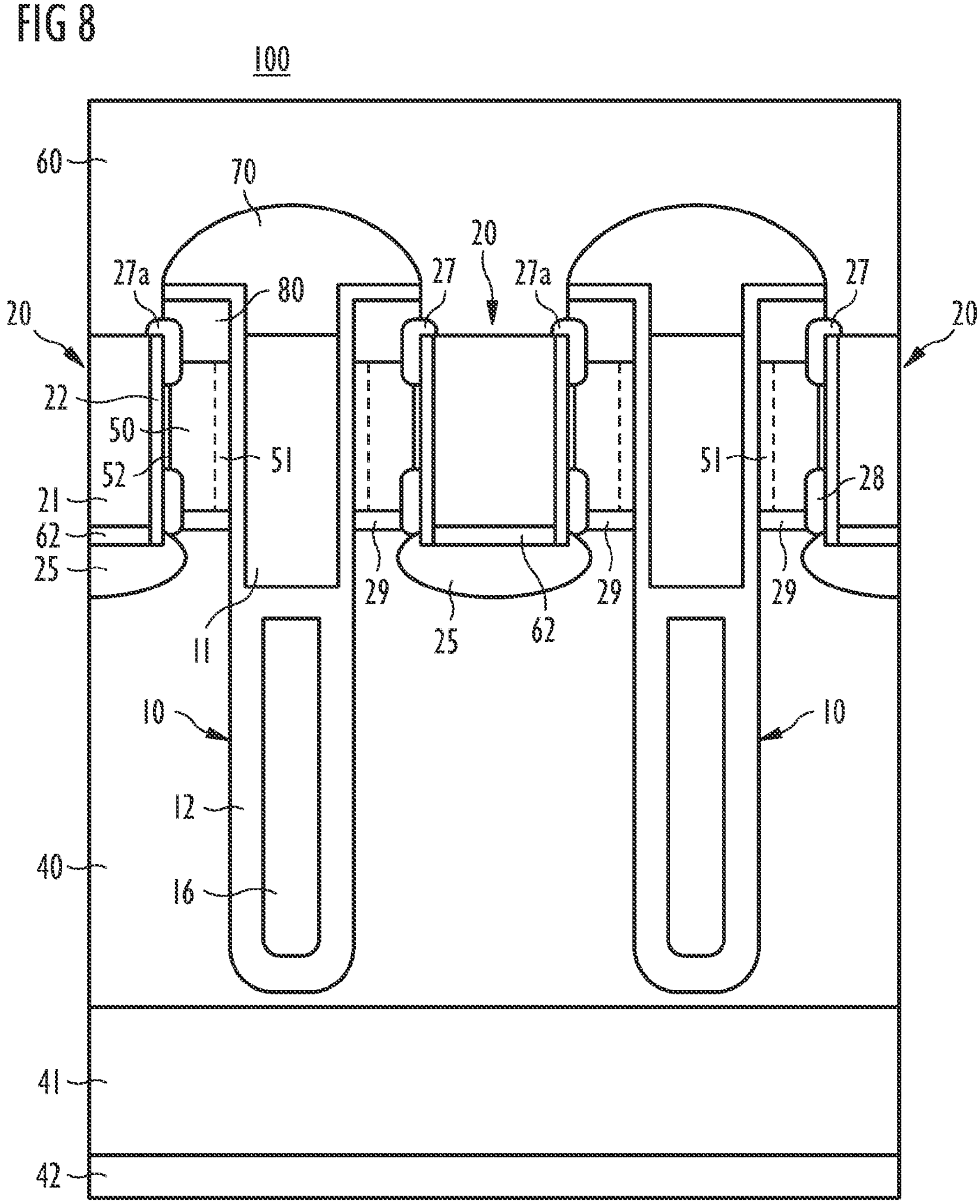

In another embodiment, some of the first doped regions 27*a* are of the p-type as illustrated in FIG. 8, which also illustrates a cross-section through a MOSFET with integrated MGDs 100. If the device 100 is not designed to have floating body regions 50, the p-type first doped regions 27*a* can be used for electrically connecting the body region 50 and the source metallization 60. The cross-section of FIG. 8 may also correspond to a further cross-section of the MOSFET with integrated MGDs 100 of FIG. 7. In other words, the shortening of the vertical extension of the second inversion channel and the electrical connecting of the body region 50 may be done in different portions of the semiconductor device 100.

Figure 9:
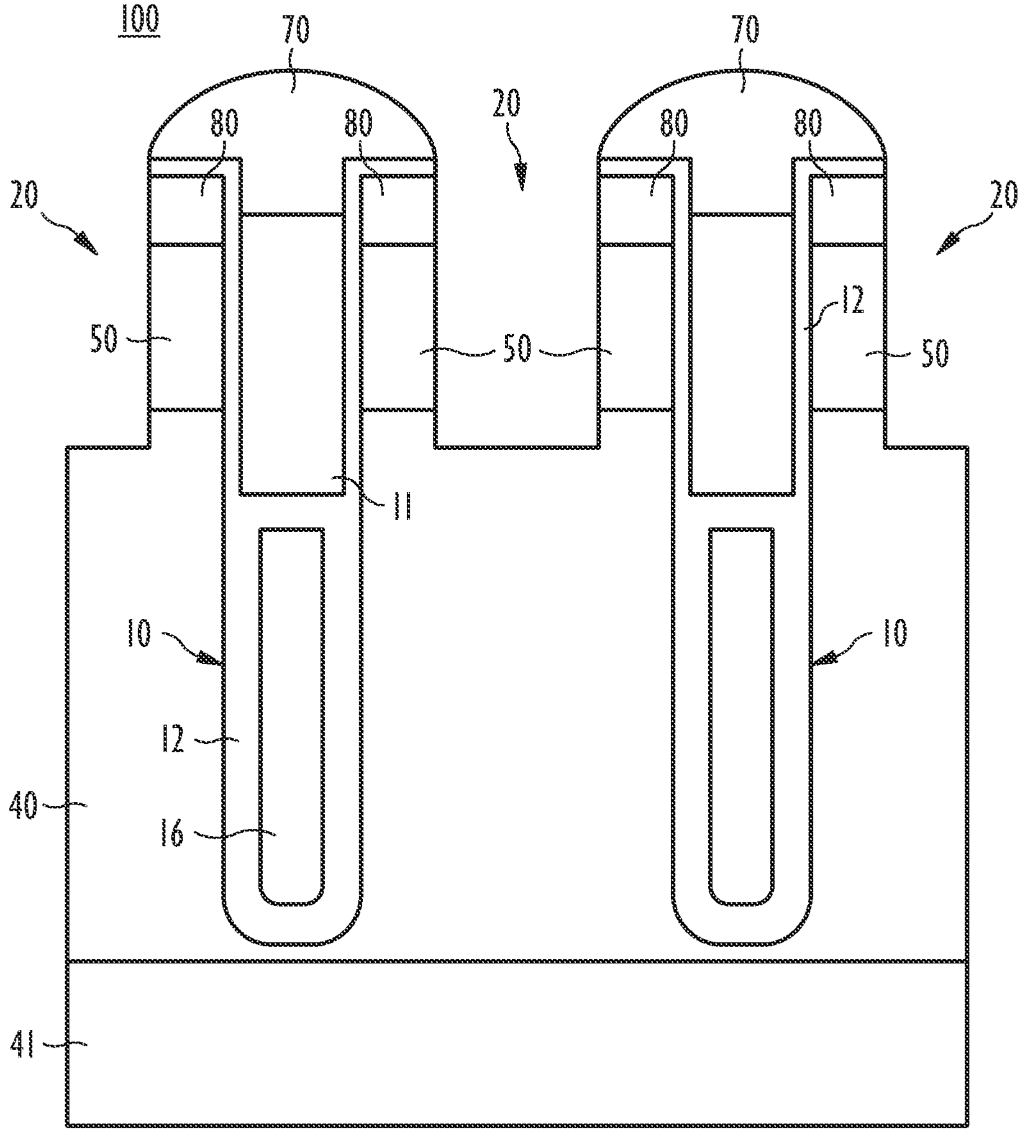
FIGS. 9-13 illustrate manufacturing processes according to certain embodiments.

With respect to the FIGS. 9-13 an embodiment of a method for manufacturing a MOSFET with integrated MGDs 100 is explained. FIG. 9 illustrates a vertical cross-section of the semiconductor device 100 after providing a semiconductor substrate which includes an n-type common drain region 41 and an n-type common drift region 40 and after further processes including forming first and second trenches 10 and 20, forming p-type body regions 50 and n-type source regions 80 and forming dielectric portions 70. In each of the first trenches 10 a field plate 16, a gate electrode 11 and an insulating region 12 were formed. Further, the second trenches 20 were etched through the source region 80 and the body region 50 partially into the common drift region 40. All these processes were performed using standard processes for forming vertical trench MOSFETS known to those skilled in the art.

Figure 10:
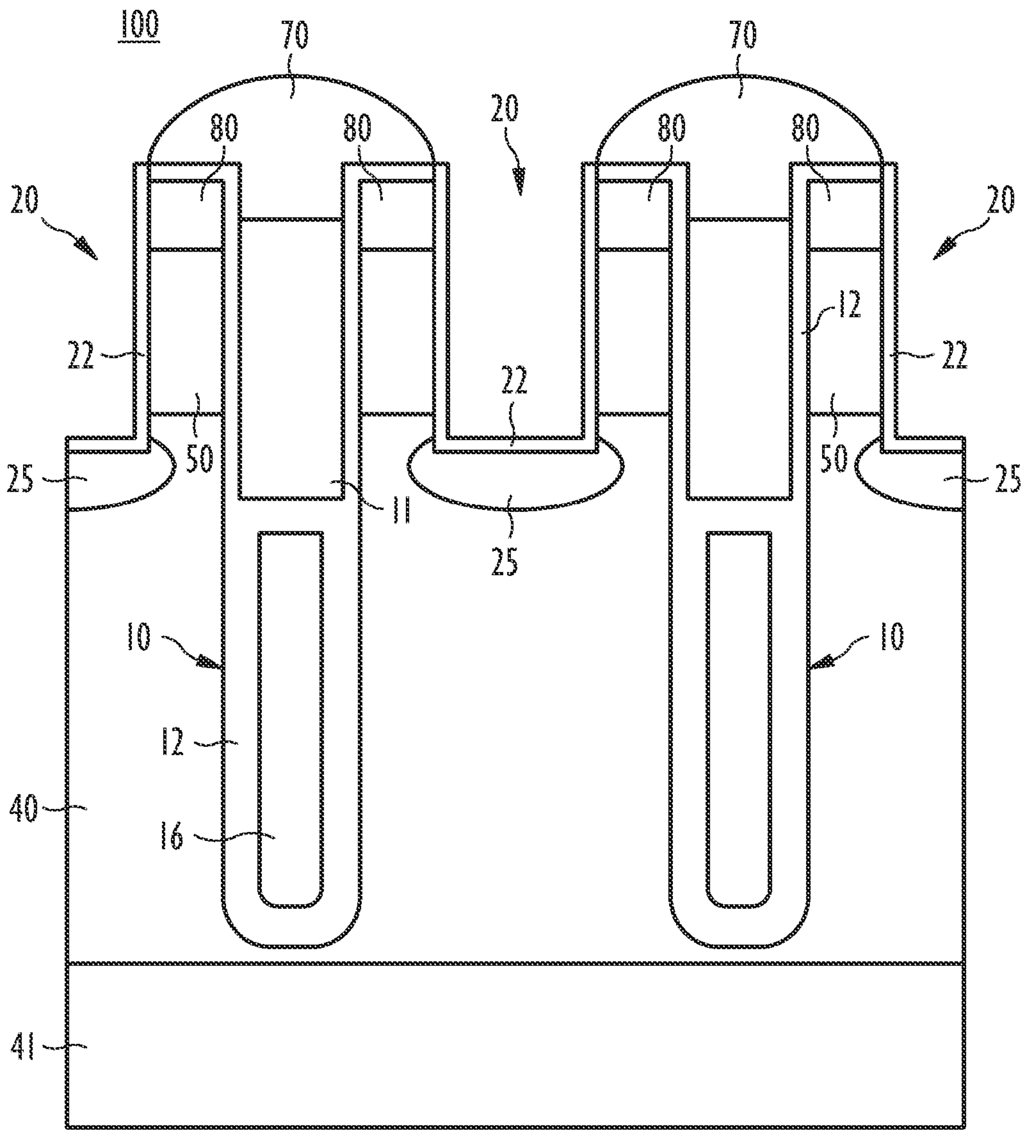

Subsequently, an insulating layer 22 is arranged on the side walls and the bottom walls of the second trenches 20. This can be done by a thermal oxidation of the semiconductor substrate and/or by deposition of an insulating material. In some embodiments the thickness of the insulating layer 22 between the mesa and the recess of the second trenches 20 is smaller than the thickness of the first insulating region 12 between the body regions 50 and the first gate electrode 11. In certain embodiments the permittivity of the insulating layer 22 is higher than the permittivity of the first insulating region 12. FIG. 10 illustrates the semiconductor device 100 after a subsequent ion implantation process for forming p-type third conductive regions 25 in the drift region 40. The third conductive regions 25 adjoin the insulating layer 22 on the bottom of the second trench 20.

Figure 11:
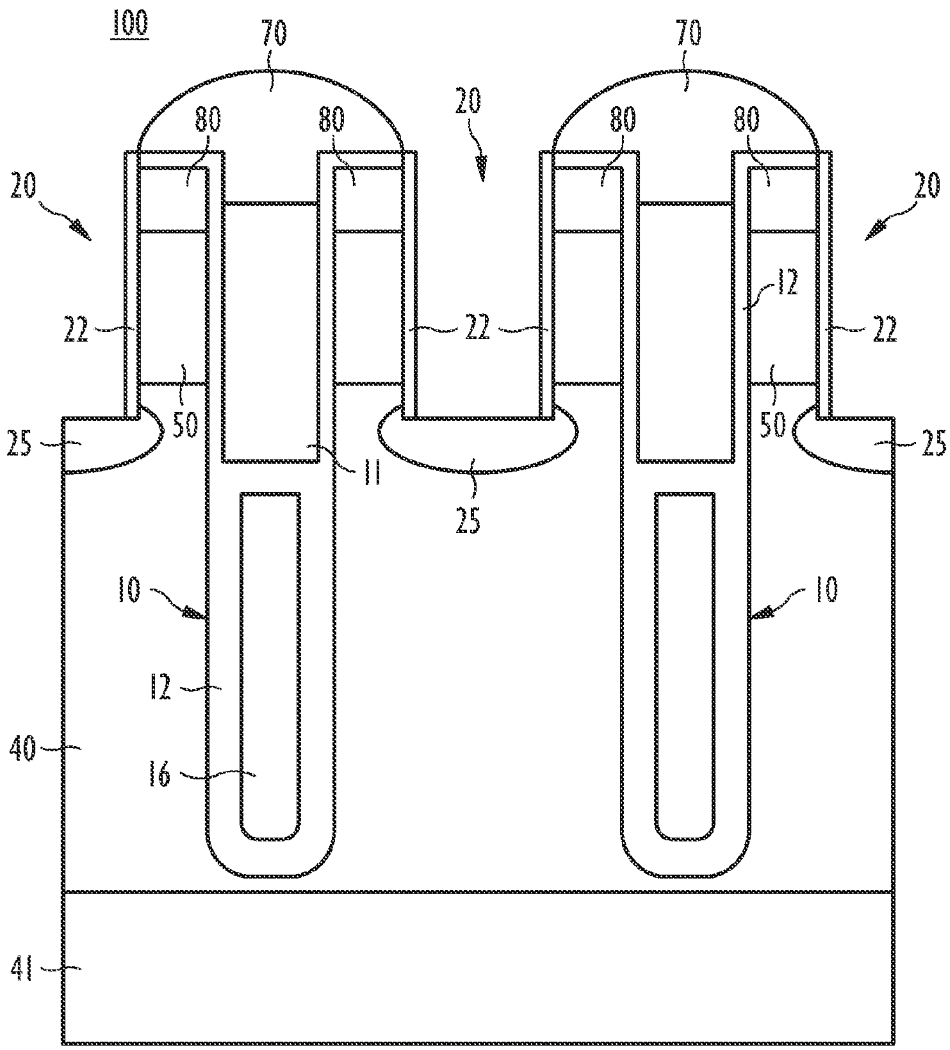

Thereafter, an anisotropic etching process is carried out to remove the insulating layer 22 on the bottom of the second trenches 20 as illustrated in FIG. 11.

Figure 12:
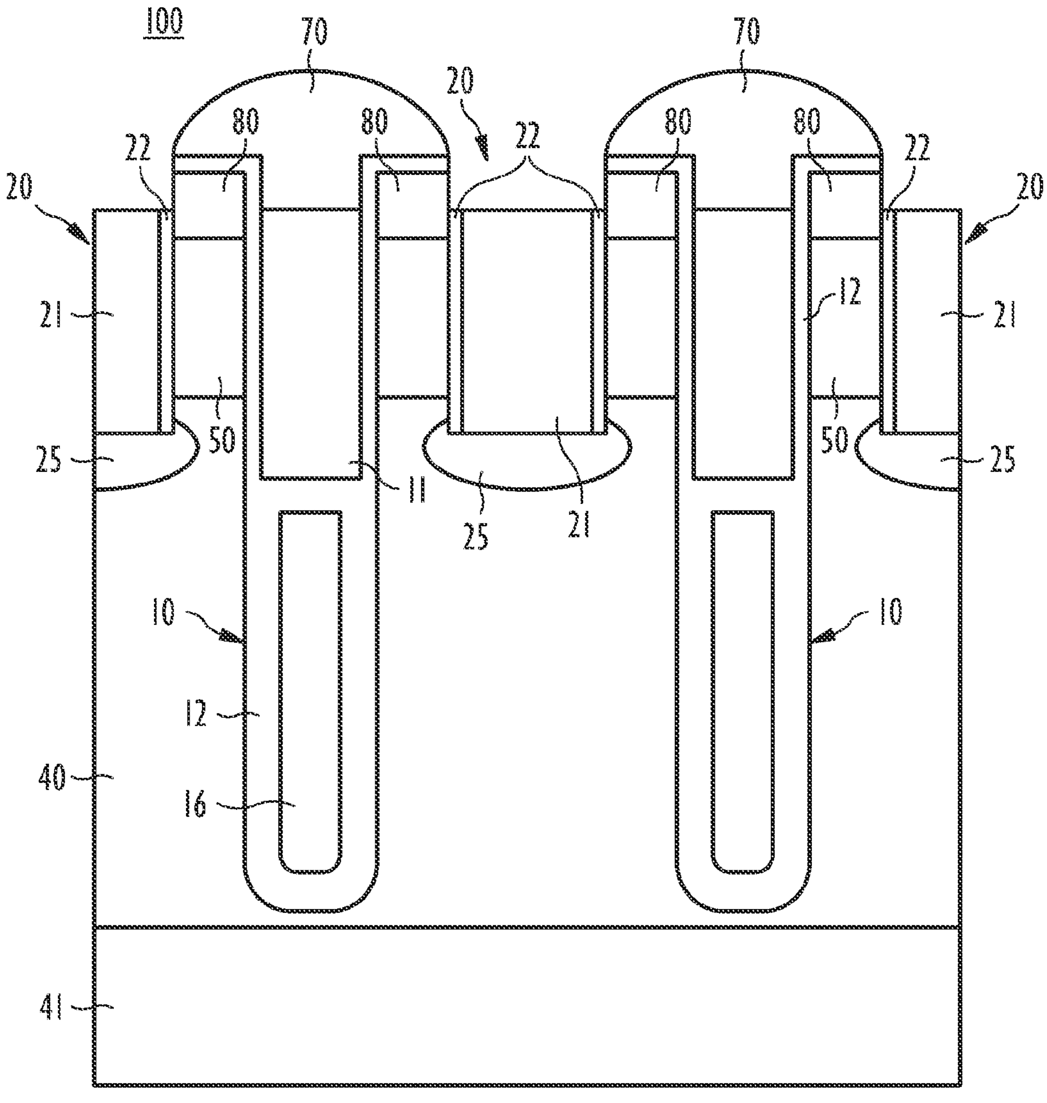

Subsequently, a conductive material such as highly doped poly-Si is deposited in the second trench 20 for forming a conductive plug 21. The dielectric layer 22 and the conductive plug are etched back in an upper portion of the second trenches 20 to expose the source regions 80. This results in a structure as illustrated in FIG. 12.

Alternatively, the third conductive regions 25 can be formed after etching the insulating layer 22 on the bottom of the second trench 20 and filling the second trench 20 with poly-Si, e.g., by diffusion of boron out of the deposited poly-Si.

Figure 13:
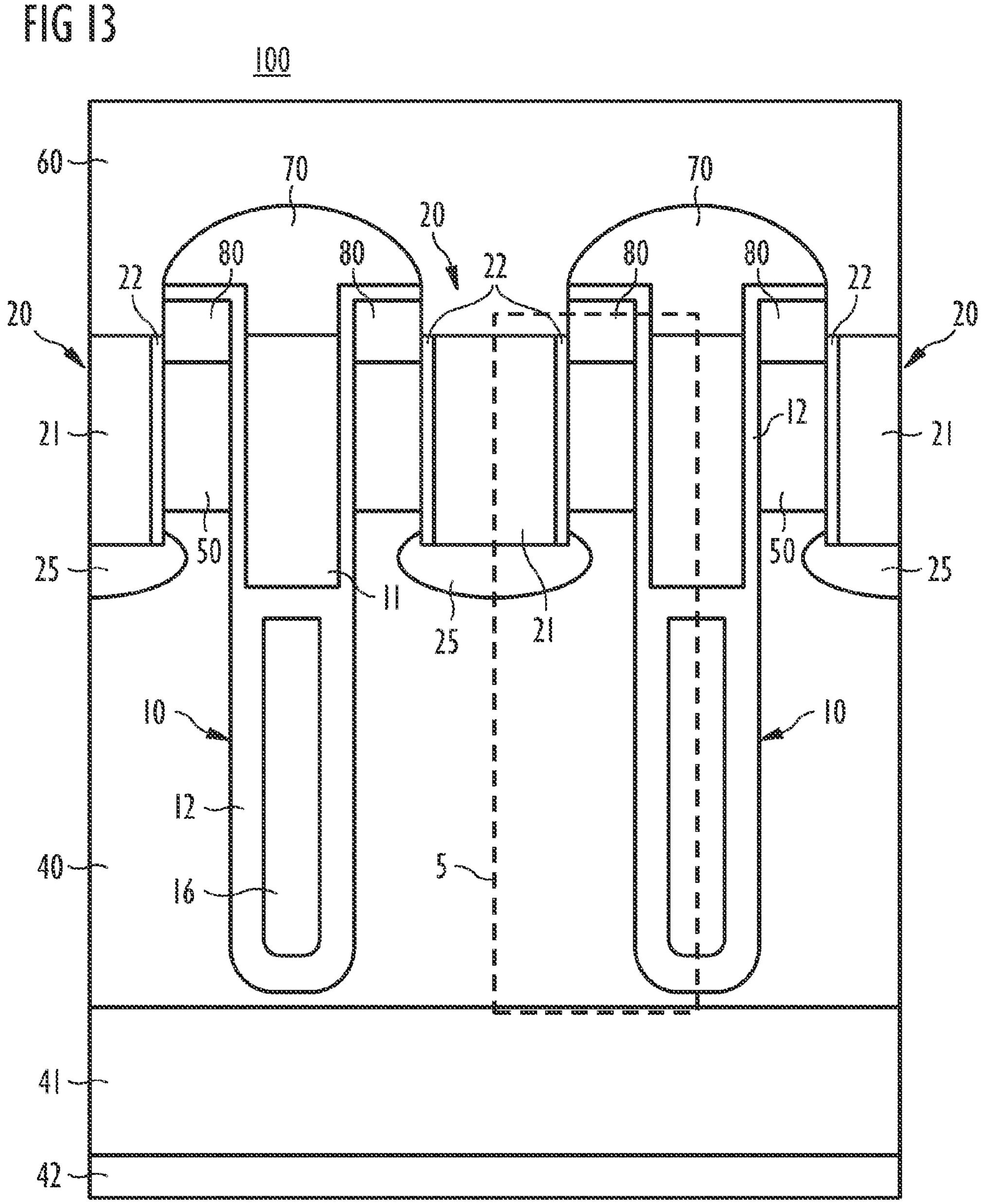

Finally, a common source metallization 60 and a common gate metallization (not illustrated) are formed on the top side and a common drain metallization 42 is formed on the bottom side of the semiconductor device 100 as illustrated in FIG. 13.

Figure 14C:
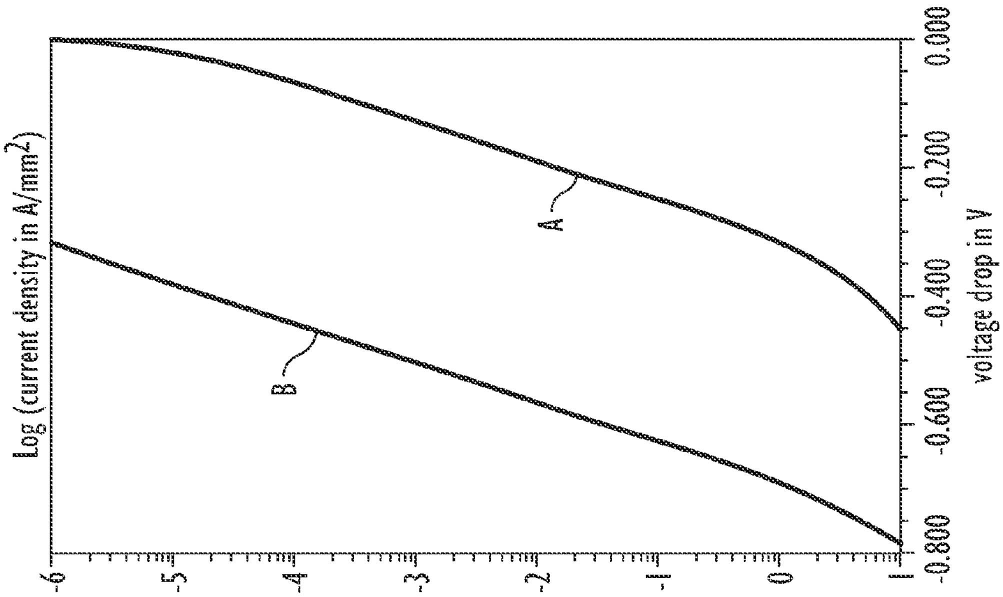
FIGS. 14A-14C illustrate numerical simulations for a semiconductor device according to a disclosed embodiment in comparison with a standard MOSFET.

Since standard processes are used prior to etching the second trenches 20 the pitch and/or the lateral distance between two first trenches 10 next to each other has typically not to be increased compared to standard MOSFETS without integrated MGDs. Still the voltage drop during reverse mode (reversed current flow) can be significantly reduced as will be explained with respect to FIG. 14.

Figure 14B:
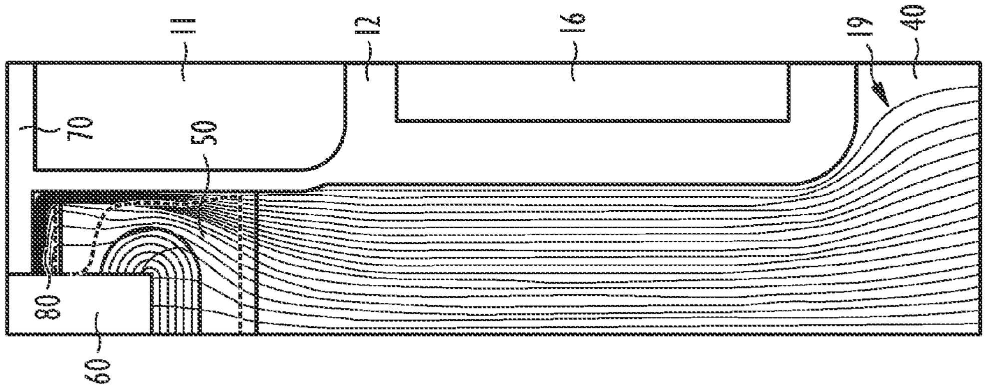
Figure 14A:
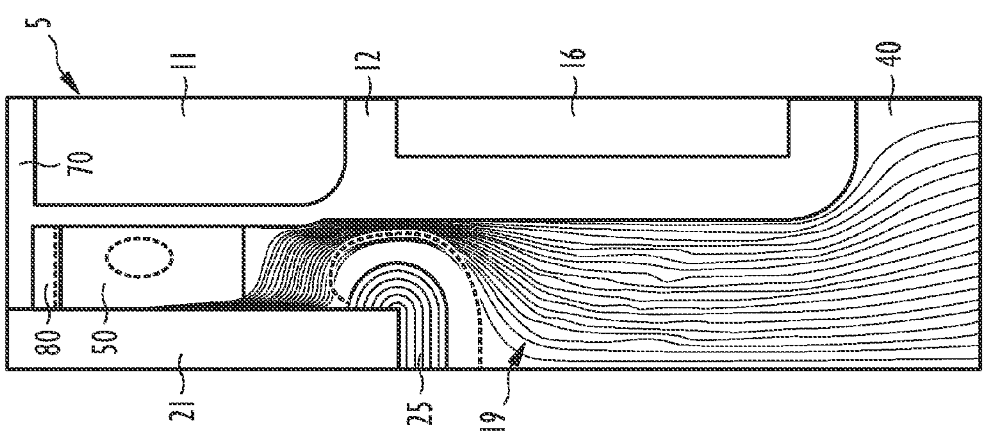

FIG. 14A illustrates, within the rectangular section 5, the current lines 19 of an integrated MOSFET as illustrated in FIG. 13 with integrated MGDs according to a numerical simulation. The insulating layer 22 is too thin (5 nm) to be clearly visible. For comparison the current lines 19 during reversed mode of the standard MOSFET with the same pitch is given in FIG. 14B. As can be seen the current in FIG. 14A is dominated by an electron current flowing from the source region 80 through the inversion channel 52 (not labelled) in the body region 50 to and through the drift region 40. In contrast thereto, the current in the standard MOSFET is bipolar under the same condition due the current flow across the body diode. As a result of the additionally formed inversion channel 52, the voltage drop across the MOSFET with integrated MGDs is only half as large as for the standard MOSFET in a wide current range in reverse mode. The corresponding current density-voltage-characteristics of FIGS. 14A and 14B are plotted in FIG. 14C as curves A and B, respectively.

Figure 15:
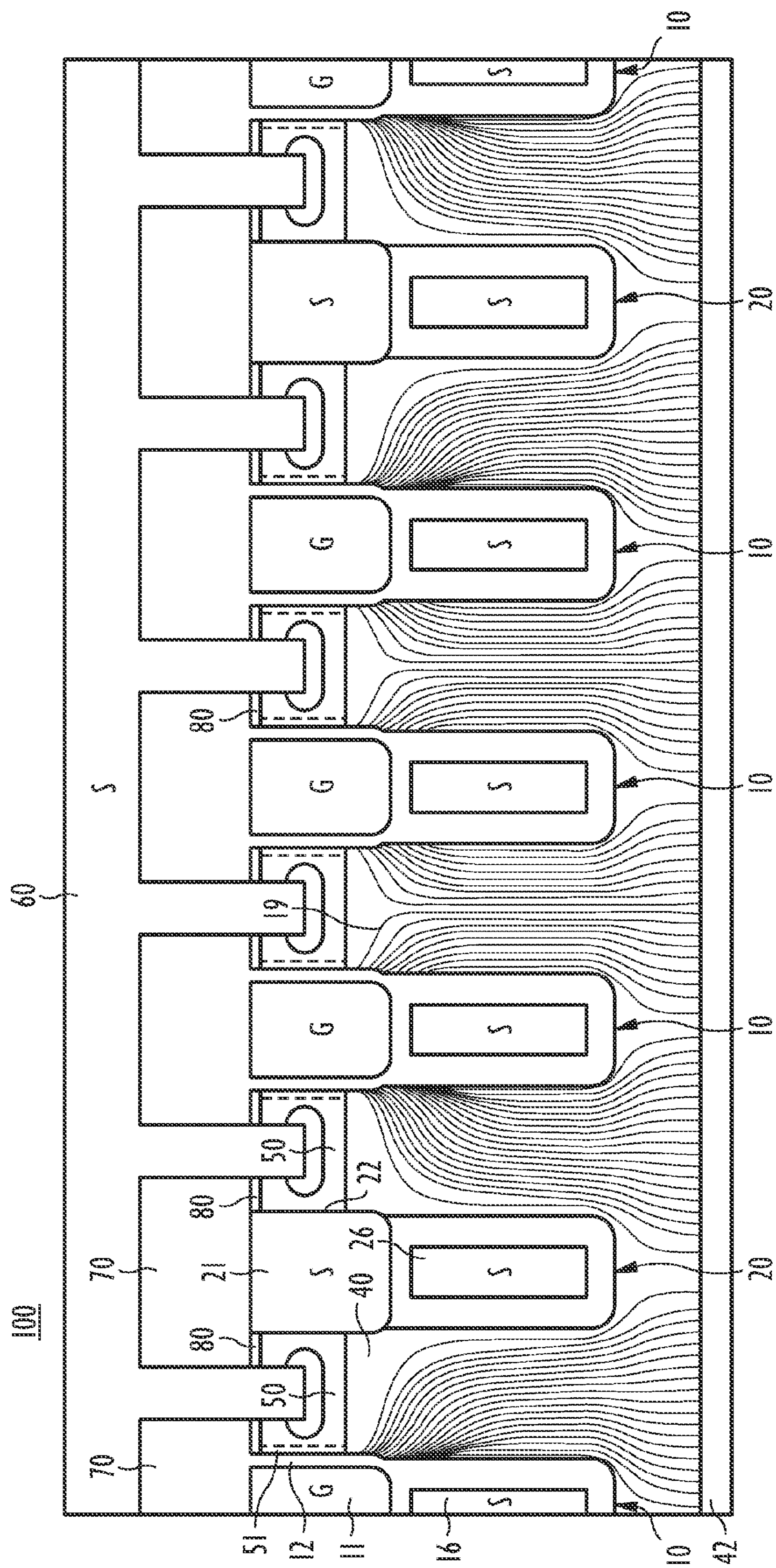
FIG. 15 illustrates a vertical cross-section of a power MOSFET according to an embodiment including numerically obtained current lines for normal MOSFET operation.

Field plates may also additionally be incorporated in semiconductor devices as illustrated in FIG. 4. This is further illustrated in FIG. 15 illustrating in a vertical cross-section a section of a power-MOSFET 100 with a plurality of integrated MOSFETS and MGDs. Each of the illustrated first and second trenches 10 and 20 includes in its lower portion a field plate 16 and 26, respectively. The field plates 16 and 26 are connected to the source metallization as indicated by the reference sign "S". The first gate electrodes 11 are connected to a not illustrated gate metallization as indicated by the reference sign "G". For sake of clarity, only the first two trenches from the left of FIG. 15 are fully designated with reference signs. A more detailed section of the structure is given below in FIG. 17.

According to a further embodiment, the plurality of first field-effect structures (MOSFETS) and second field-effect structures (MGDs) are arranged in a regular pattern. Typically, this regular pattern at least extends over the major portion of the semiconductor device 100. The border area of the device may, however, deviate from the pattern e.g., to compensate boundary effects. In FIG. 15 every fourth field-effect structure is a MGD. As can be seen from the additionally plotted electron current lines 19 during normal MOSFET operation of the MOSFET 100, i.e., during forward mode in which the electrons flow from source metallization 60 through the source region 80, the inversion channels 51 in the body region 50 and the drift region 40 to the drain metallization 42, every mesa contributes to the total current flow. A closer inspection of the current lines 19 reveals that the integration of MGDs increases the resistance in forward mode $R_{on}$ only by 22% which is lower than the expected increase of 33%.

Figure 16:
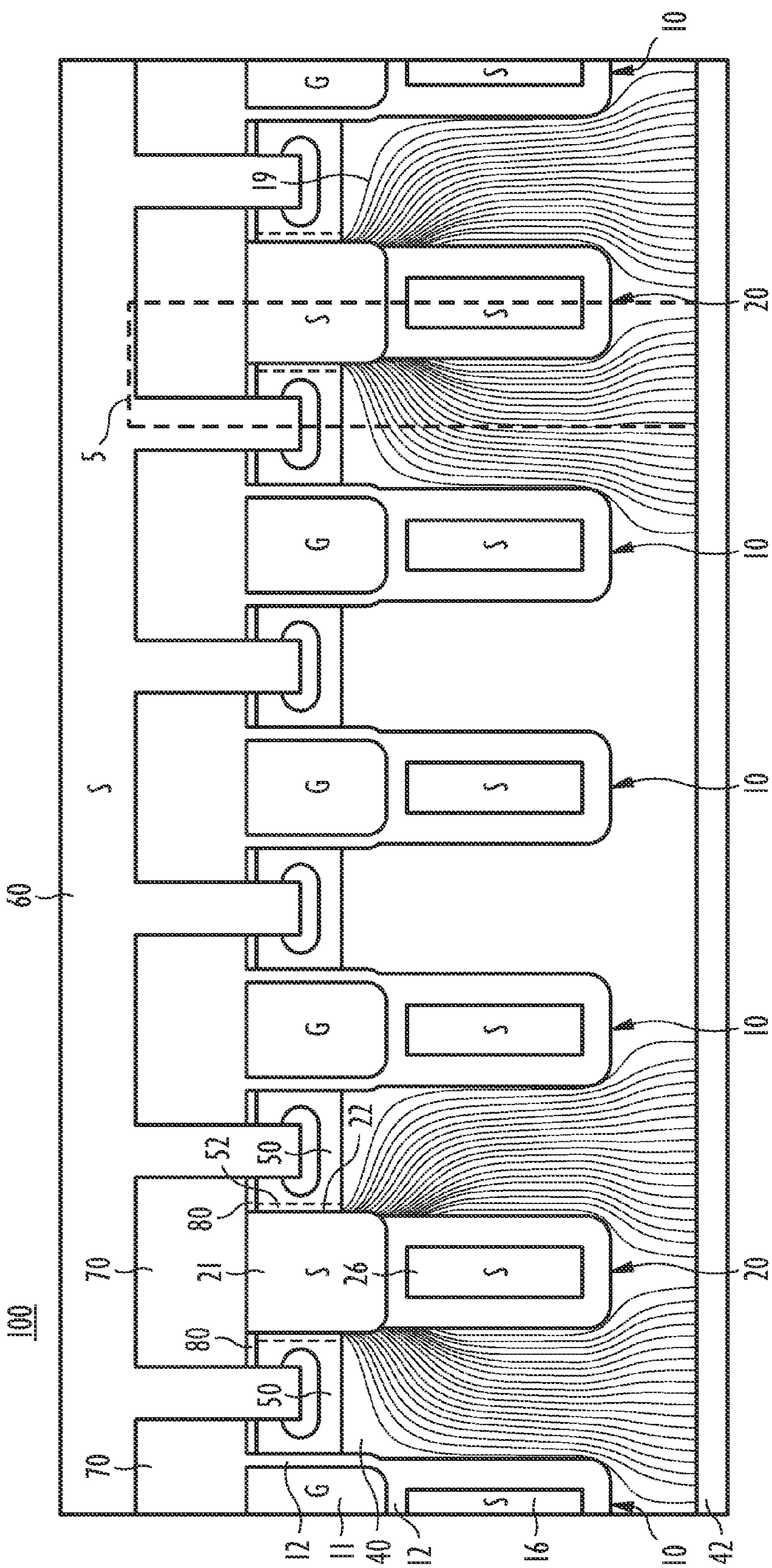
FIG. 16 illustrates the same vertical cross-section of the power MOSFET of FIG. 15 including numerically obtained current lines during diode forward operation.

On the other hand, during reversed current (reverse mode) the electron current flows from the drain metallization 42 through the drift region 40, the inversion channel 52 in the body region 50 next to the only 5 nm thick gate insulation 22 and the source region 80 to the source metallization 60. This is illustrated in FIG. 16 illustrating the same MOSFET as in FIG. 15 but during reverse mode. Due to the lower voltage drop across the inversion channel 52 compared to the body diode of the MOSFET, the losses during reverse mode can be reduced significantly. This depends both on the arrangement of the MGDs within the MOSFET 100 and their characteristics. Typically, the losses during reverse mode decrease with increasing fraction of MGDs and are lower for a regular pattern arrangement of MGDs and MOSFETs compared to a clustered arrangement, i.e., an arrangement of MGDs and MOSFETs in different parts of the semiconductor device 100. A clustered arrangement of MOSFETS and MGDs may e.g., be used if the MOSFETS and MGDs have to be optimized differently.

Further, $R_{on}$ will typically increase with increasing fraction of MGDs. The ratio between the MOSFETS and MGDs is typically chosen to be in a range between about 1:1 to 100:1 in regular pattern and clustered arrangements of MGDs and MOSFETS. Thereby, the trade-off between $R_{on}$ and electric losses in reversed mode can be balanced in accordance with the MOSFET specifications for an application or circuitry.

Figure 17B:
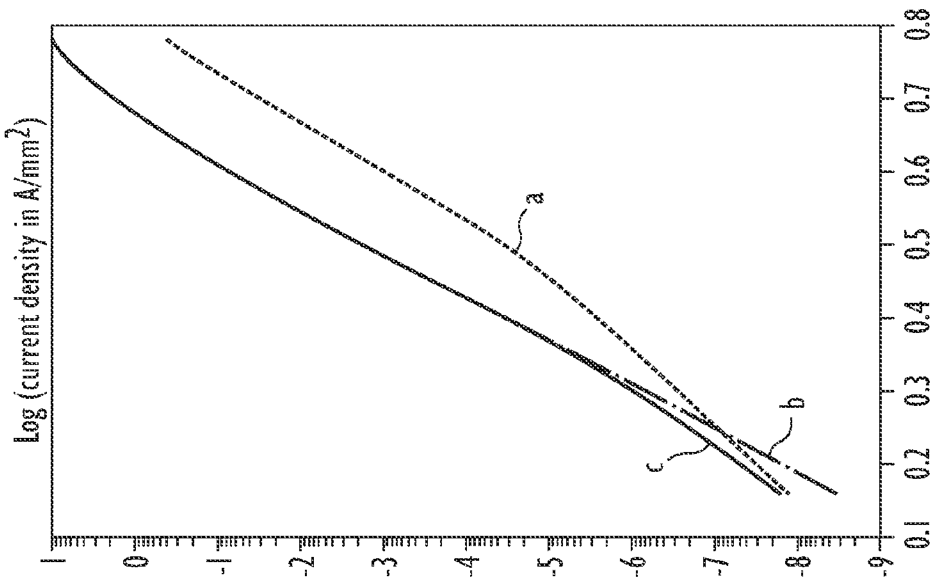
FIGS. 17A and 17B illustrate an inset of FIG. 16 and related current-voltage characteristics, respectively.
Figure 17A:
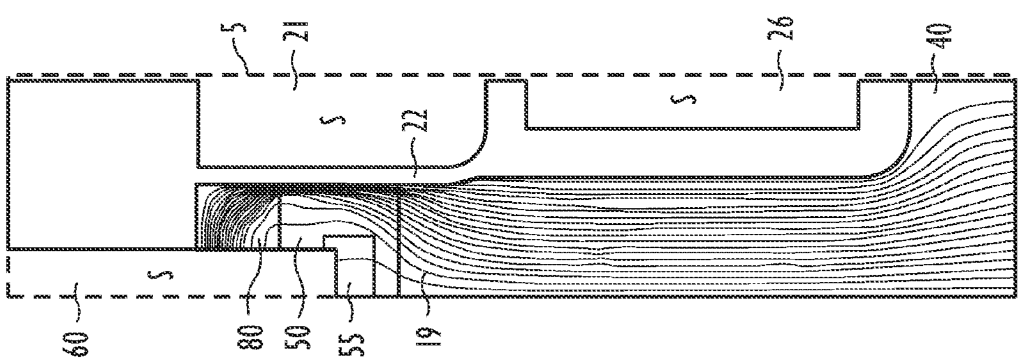

In FIG. 17A the geometry and the current flow during reverse mode of a MGD is illustrated in more detail in the section 5 of FIG. 16. Typically, the p-type body region 50 includes a higher doped p-type contact portion 55. The thickness $d_2$ of the second insulating region 22 between the second gate electrode 21 at source potential and the body region 50, which is also connected to source, is for illustrative purposes higher than in FIGS. 14 and 15 and amounts to 35 nm. In FIG. 17B the hole current density (curve a), the electron current density (curve b) and the total current density (curve c) for the MGD of FIG. 17A are plotted as function of the voltage drop across the MGD. Due to the formed inversion channel within the body region 50, the total current is dominated by a unipolar electron current, i.e., the electron current contributes to more than 90% to the total current, above an average current flow density of about 10 μA/$mm^2$ in the common drift region 40. This depends on the thickness and/or the permitivitty of the second insulating region 22 between the second gate electrode 21 and the body region 50. In certain embodiments the current through the semiconductor device in reverse mode (forward bias of the body diode 15) is dominated by a unipolar current above an average current flow density in the drift region 40 of about 1 mA/$mm^2$.

Figure 18:
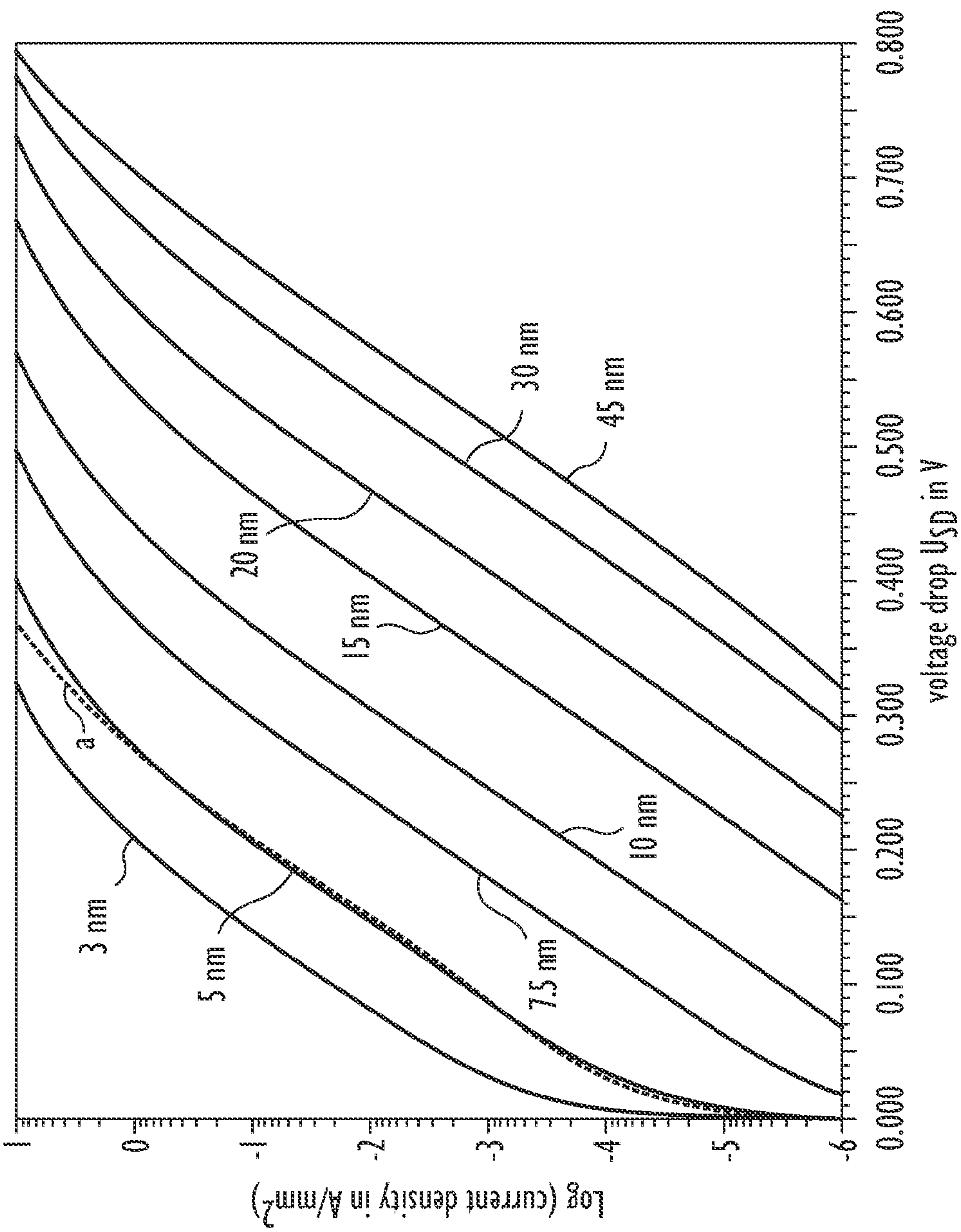
FIGS. 18, 19 and 20A and 20B illustrate current voltage characteristics for a semiconductor device according to certain embodiments.

FIG. 18 illustrates the current density-voltage characteristics of a silicon MGD as in FIG. 17A with poly-Si as material of the second gate electrode 21 and $SiO_2$ as material of the second insulating region 22 in dependence of the second thickness $d_2$. At given current density the voltage drop decreases with decreasing second thickness $d_2$. At a thickness $d_2$ of 5 nm, the current density-voltage characteristics of the MGD are, in a wide current density range, almost identical to a Trench-MOS-Barrier-Schottky-diode (TMBS-diode) with a work function of 4.75 eV. For a 3 nm thick gate oxide the losses are even lower. Thus an integrated MGD can replace an integrated Schottky-diode. Thereby, the aforementioned disadvantages of an integrated Schottky-diode can be avoided. Further, the losses in reverse mode can even further be reduced.

Figure 19:
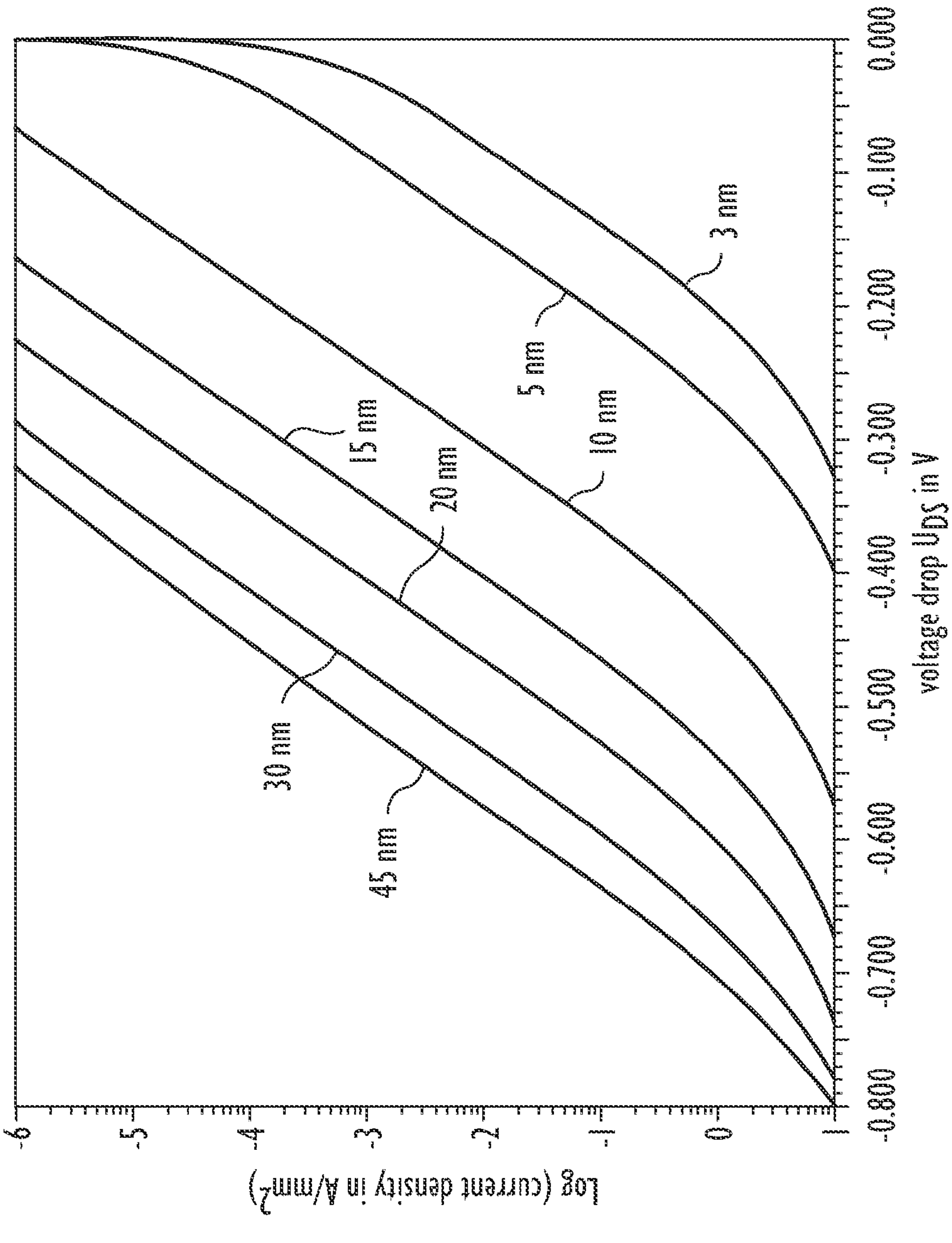

FIG. 19 illustrates the current density-voltage characteristics during reverse mode of an integrated power semiconductor device having a ratio between MOSFETS and MGDs of 9:1 in dependency of the second thickness $d_2$. The MOSFETS have a first thickness $d_1$ of 45 nm. Up to a current density of about 10 A/$mm^2$ the losses can be reduced significantly by the MGDs having a lower second thickness $d_2$.

Figure 20B:
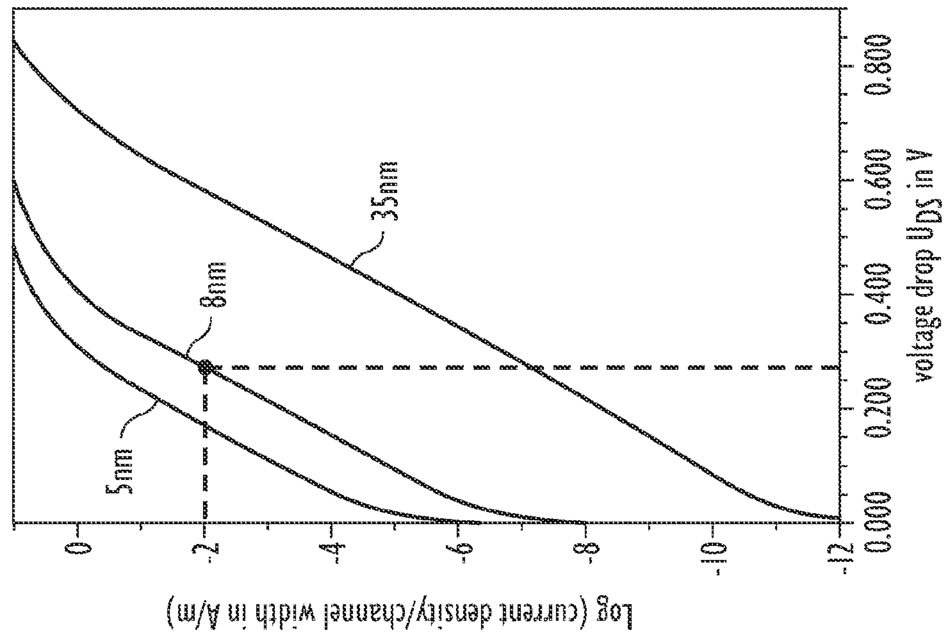
Figure 20A:
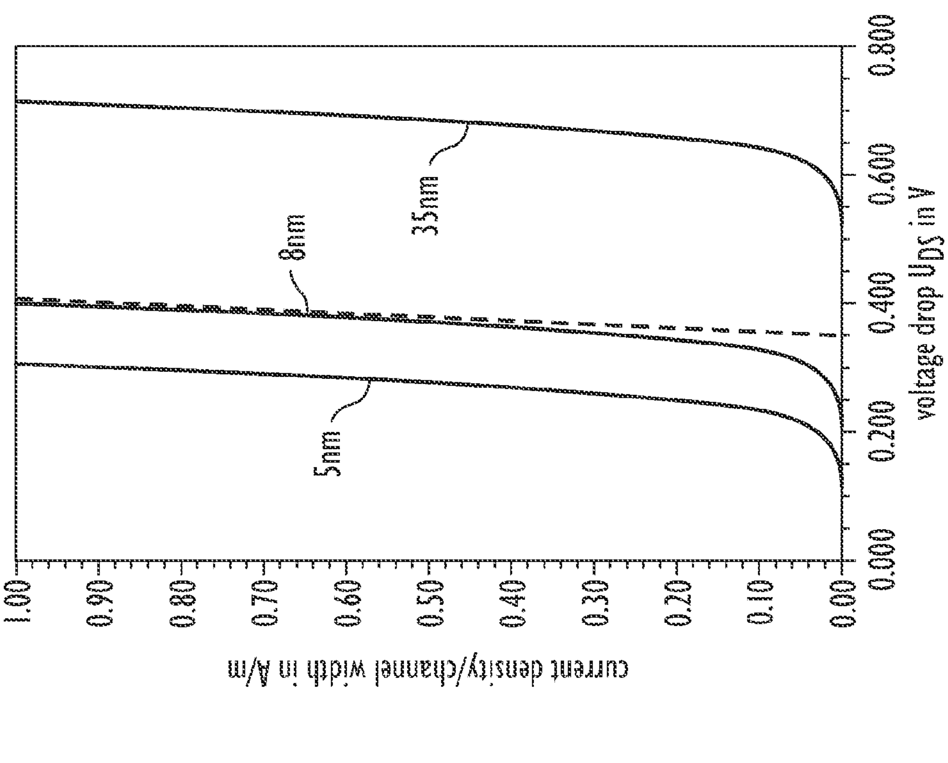
Figure 2I:
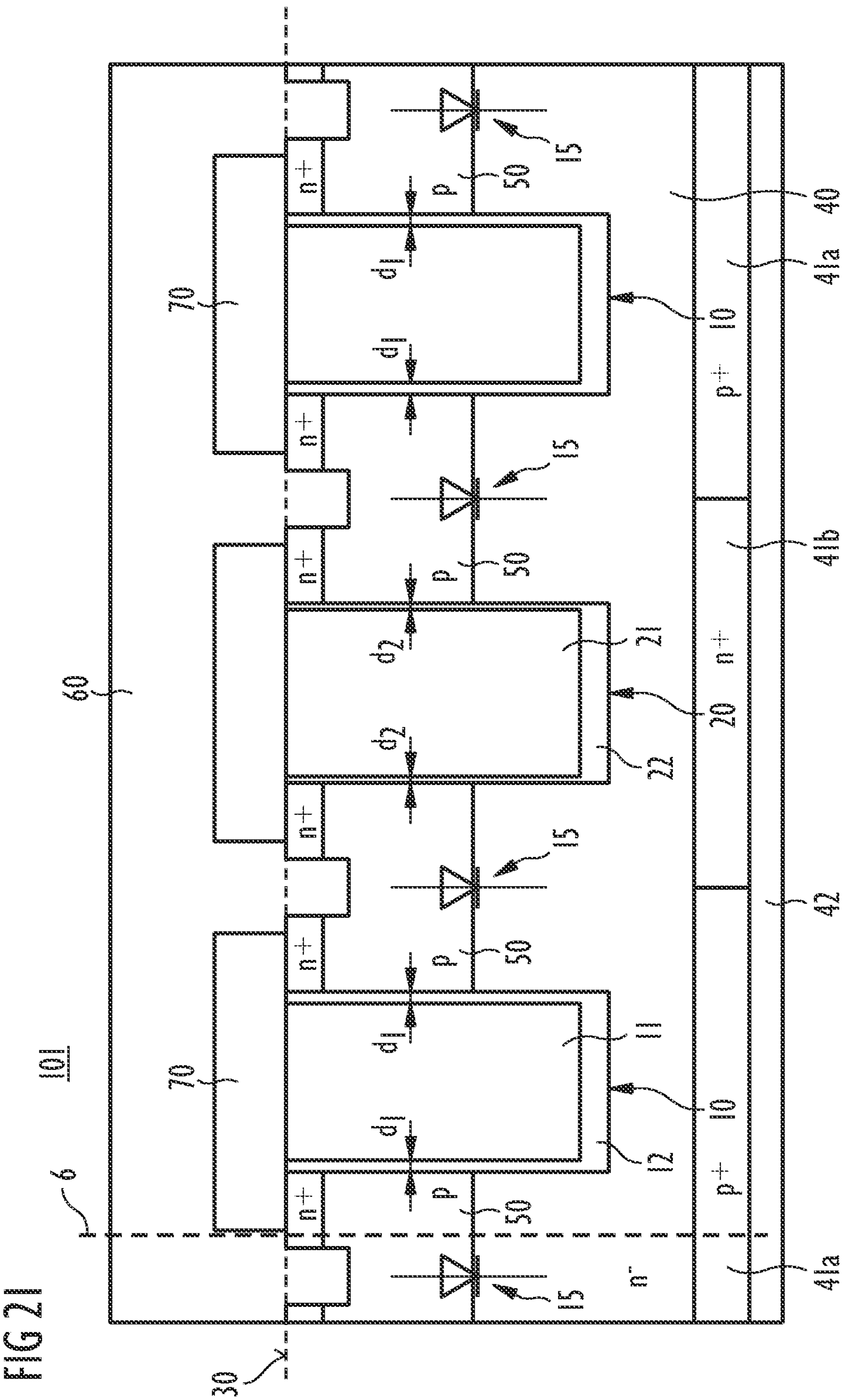

In FIG. 20 the current per channel width-voltage characteristics of a typical silicon MGD as illustrated in FIG. 17A are plotted for second thicknesses $d_2$ of 5 nm, 8 nm and 35 nm. FIGS. 20A and 20B illustrate a linear plot and a linear-log plot, respectively. The threshold voltage $V_{th}$ of a semiconductor device can be defined as the intersection of a suitable tangent with the abscissa in the linear plot as illustrated for the 8-nm-curve in FIG. 20A. This results in a threshold voltage $V_{th}$ for the MGD having a second thickness d2 of 8 nm of about 0.35 V. Another possibility of defining the threshold voltage $V_{th}$ bases on a required current per channel width, which definition is used in this specification. For a current per channel width of 10 mA/m a threshold voltage $V_{th}$ of about 0.26 V is obtained from FIG. 20B for the MGD with a second thickness $d_2$ of 8 nm. Accordingly, threshold voltages of MGDs can be achieved which are well below the values that can be obtained by using increasing the body effect for thicker gate oxides. In certain embodiments, the threshold voltage $V_{th}$ of the MOS-gated diode, defined by a current per channel width of 10 mA/m, is positive but lower than or equal to about 0.26 V.

The threshold voltage $V_{th}$ in FIG. 20 was obtained for $SiO_2$ having a relative dielectric constant of 3.9 as gate oxide, i.e., as material of the second insulating region 22. Hafnium oxide $HfO_2$ has e.g., a relative dielectric constant of about 12. Thus the curves illustrated in FIG. 20 also correspond to a MGD with $HfO_2$ as gate oxide but with an increased second thickness $d_2$ by a factor of about 3.1, which corresponds to the ratio between the relative dielectric constant of $HfO_2$ and 3.9. For example, the curves for the 8 nm thick $SiO_2$ gate oxide correspond also to the curves of a MGD which has a second gate electrode 21 insulated with an about 25.3 nm thick $HfO_2$ layer.

According to another embodiment, a semiconductor device includes a common source metallization, at least a first field-effect structure and at least a second field-effect structure. The first and second field-effect structure include a source region of a first conductivity type which is connected to the common source metallization and a body region of a second conductivity type which is adjacent to the source region. The first field-effect structure further includes a first gate electrode and a first insulating region of a first equivalent oxide thickness which is arranged at least between the first gate electrode and the body region. The second field-effect structure further includes a second gate electrode which is connected to the common source metallization and a second insulating region of a second equivalent oxide thickness which is arranged at least between the second gate electrode and the body region. The second equivalent oxide thickness is lower than the first equivalent oxide thickness.

In the context of the present specification, the term "equivalent oxide thickness" intends to describe the average thickness of the insulating region between a gate electrode and the body region multiplied with the ratio between the relative dielectric constant of the material of the insulating region and the relative dielectric constant of $SiO_2$ which is usually 3.9.

In certain embodiments the second equivalent oxide thickness is smaller than about 8 nm. In other words, the second gate capacitance per unit area C2 is larger than about 4.3 $nF/mm^2$ in certain embodiments. The second equivalent oxide thickness may also be smaller than 6 nm or 4 nm and may even be smaller than 1 nm. Likewise, the second gate capacitance per unit area C2 may be larger than about 5.7 $nF/mm^2$ or about 8.6 $nF/mm^2$ and may even be larger than about 34.4 $nF/mm^2$.

Integrated MGDs can also be used in reverse conducting IGBTs. FIG. 21 illustrates a similar semiconductor device as FIG. 3. However, instead of the common drain region 41 between the drift region 40 and the drain metallization 42 in FIG. 3 a highly doped p-type region 41 a is arranged between the drift region 40 and the drain metallization 42 below the first trench 10. Thus four alternating layers (N-P-N-P along the dashed line 6) of an n-channel IGBT are formed. The additional PN junction blocks reverse current flow. This means that IGBTs cannot conduct in reverse mode, unlike a MOSFET. In bridge circuits, where a reverse current flow is needed, an additional diode (called a freewheeling diode) has to be connected antiparallel to the IGBT, i.e., in parallel to the body diode of the IGBT, to conduct a current in the opposite direction. Note that the source metallization 60 and the drain metallization 42 are also referred to as emitter metallization 60 and collector metallization 42 in case of an IGBT. Likewise, a highly doped n-type region 41*b* is arranged between the drift region 40 and the collector metallization 42 below the second trench 20. The second gate electrode 21, in contact with the emitter region 80 and the emitter metallization 60, the second insulating region 22, the body region 50 and the drift region 40, in contact with the collector metallization 42, form a MOS-gated diode. Typically, the MGD is connected in parallel to the body diodes 15 and can operate as an integrated freewheeling diode in reverse mode. Again, the capacitance per unit area between the second gate electrode 21 and the body region 50 is larger than the capacitance per unit area between the first gate electrode 21 and the body region 50. This can again be achieved by choosing the thickness $d_2$ to be smaller than the first thickness $d_1$ and/or by choosing a material with higher dielectric constant for the second insulating region 22 compared to the dielectric constant of the material of the first insulating region 12.

With reference to FIGS. 22-29, manufacturing processes according to several embodiments will be explained.

Figure 22:
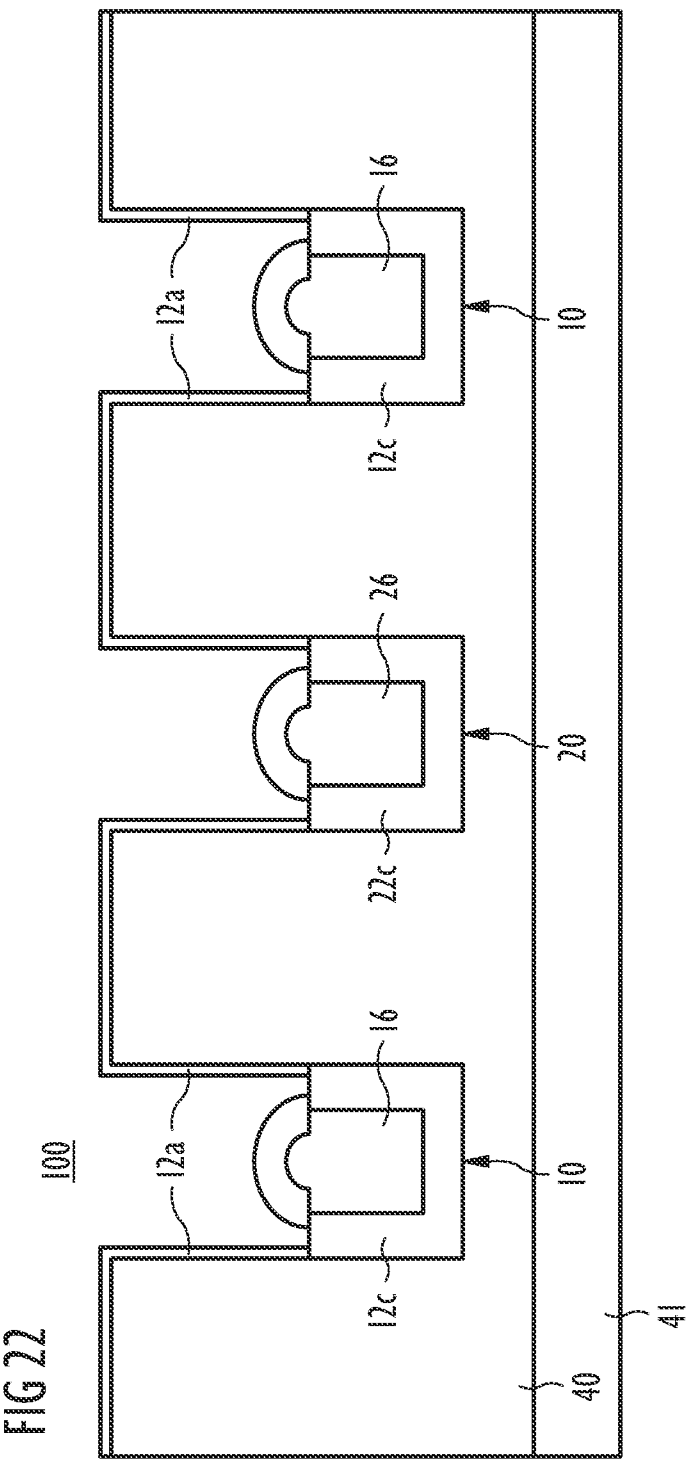
FIGS. 22-29 illustrate manufacturing processes for forming a semiconductor device according to certain embodiments.
Figure 23:
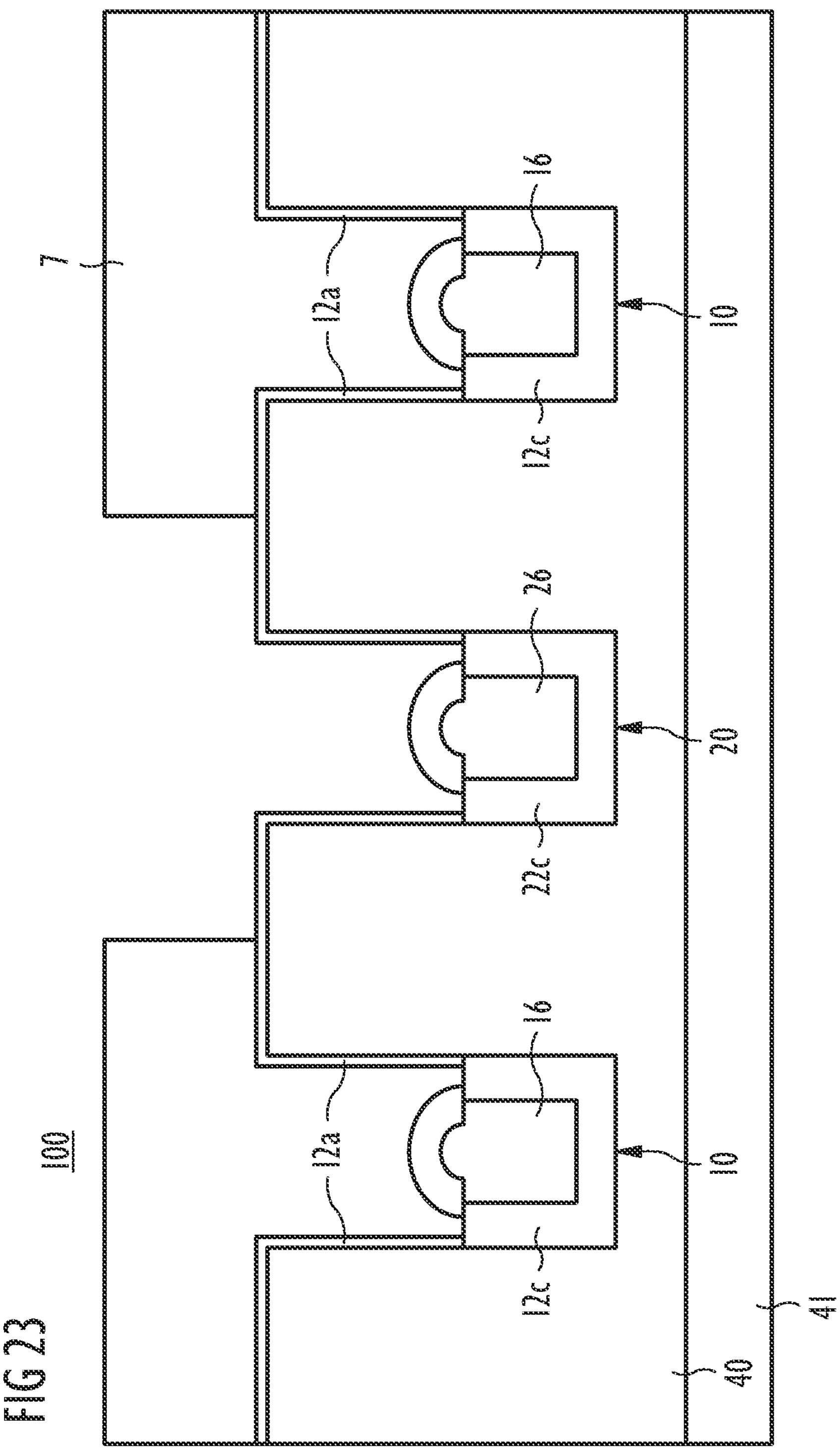

FIG. 22 illustrates a section of a silicon-semiconductor device 100 in a vertical cross-section after forming an n-type drain region 41 and after further processes including forming an n-type drift region 40, forming first and second trenches 10 and 20, forming insulating bottom portions 12*c* and 22*c* in the lower portions of the first and second trenches 10 and 20, respectively, forming respective field plates 16 and 26 and performing a thermal oxidation process to form a first dielectric $SiO_2$ region or layer 12*a* on the side walls in an upper portion of the first trenches 10. Typically, the dielectric layer 12*a* has a thickness of about 30 nm to about 60 nm and also covers the sidewalls of the second trenches 20. Thereafter, the first trenches 10 are covered with a photolithographically structured mask 7 to protect the first trenches 10. The resulting semiconductor structure is illustrated in FIG. 23.

Figure 24:
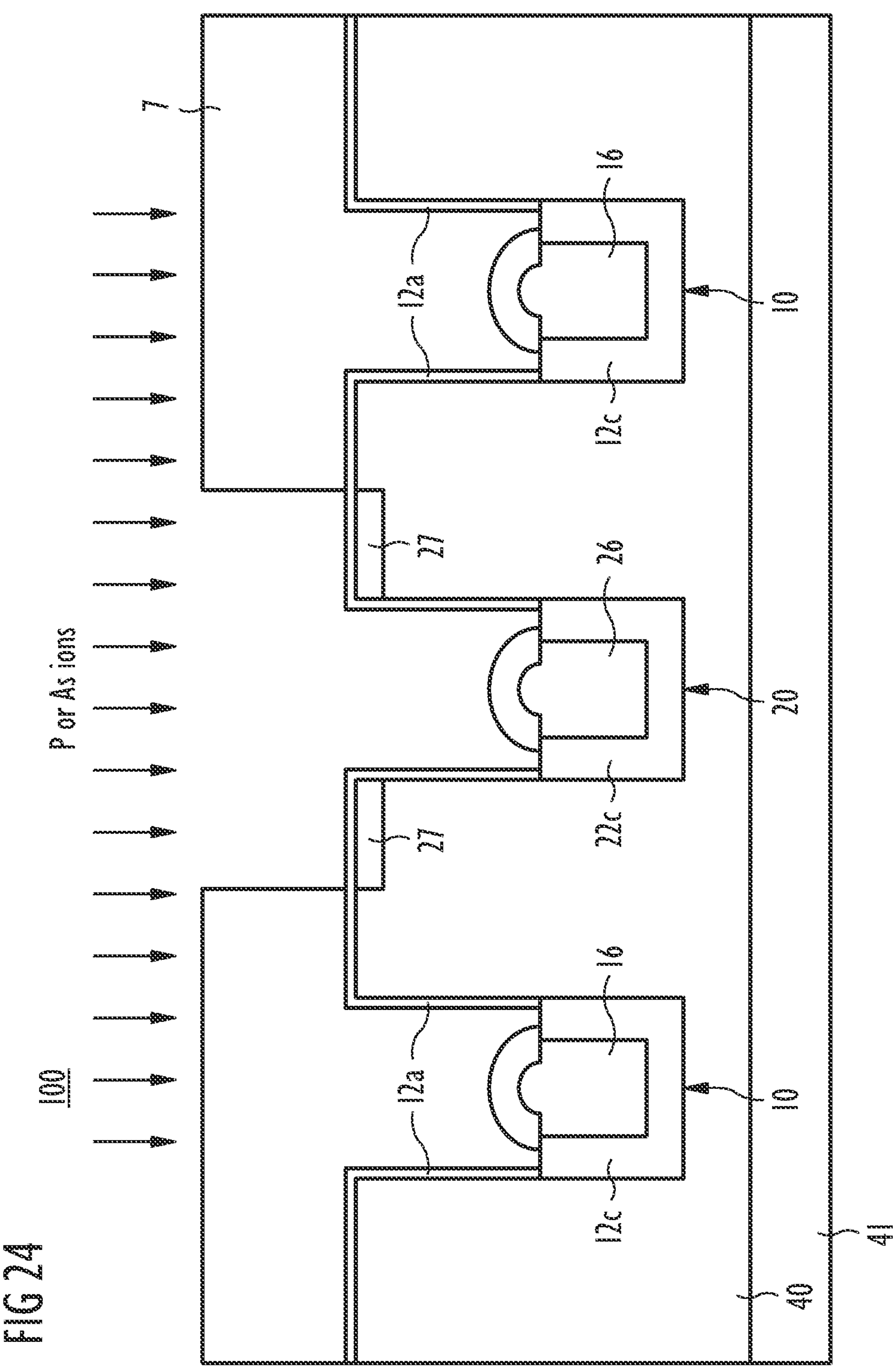
Figure 25:
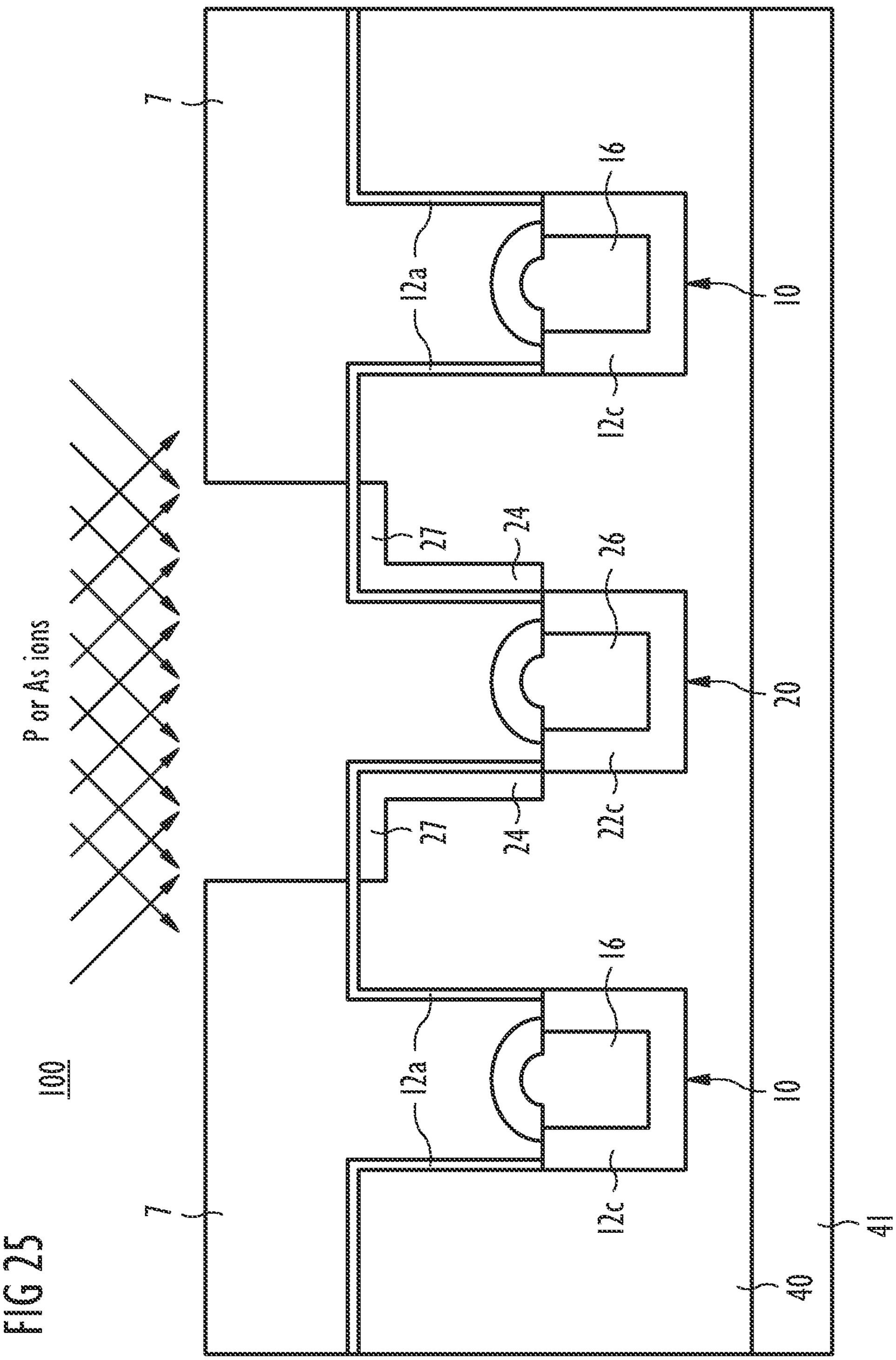

According to FIG. 24, an optional ion implantation process, e.g., with P or As, can be carried out. Thereby, higher doped n-type doped regions 27 for reducing the channel length of the later formed second field-effect structure can be formed (see also FIG. 7). As illustrated in FIG. 25, a second optional ion implantation process, e.g., with P or As, can be carried out to form temporarily higher doped n-type regions 24. After a later ion implantation, e.g., with boron, and subsequent drive-in for forming the p-type body region, the higher doped n-type regions 24 are transformed into portions of the body region which have a lower effective p-type doping concentration than the other portions of the body region. Thereby the threshold voltage $V_{th}$ of the later formed second field-effect structure can be reduced further.

Figure 26:
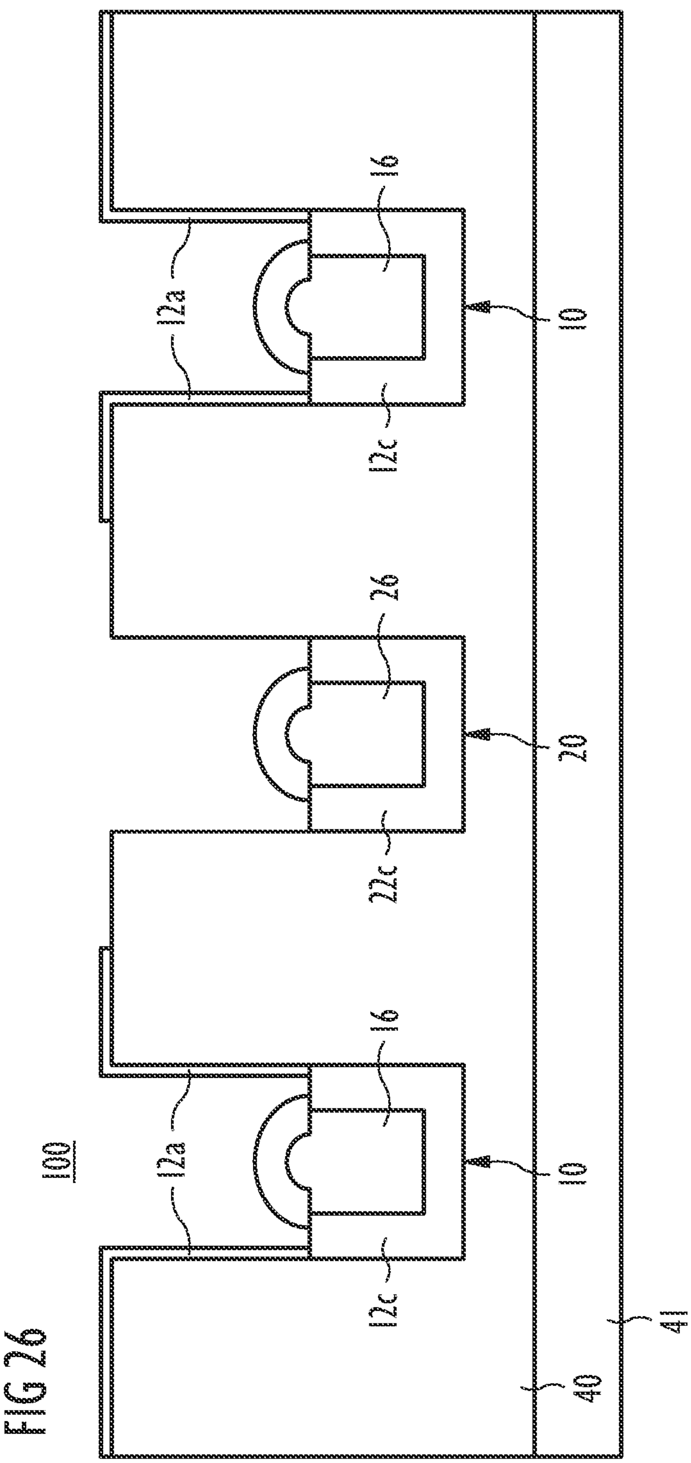
Figure 27:
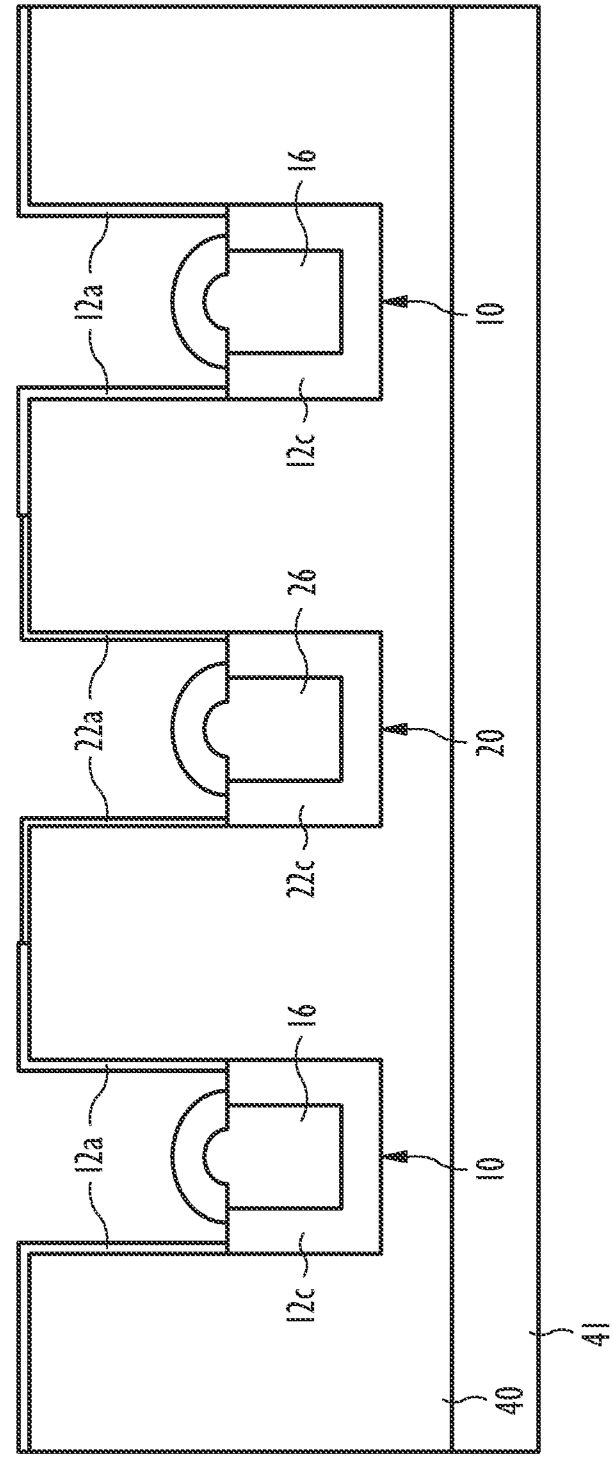
Figure 28:
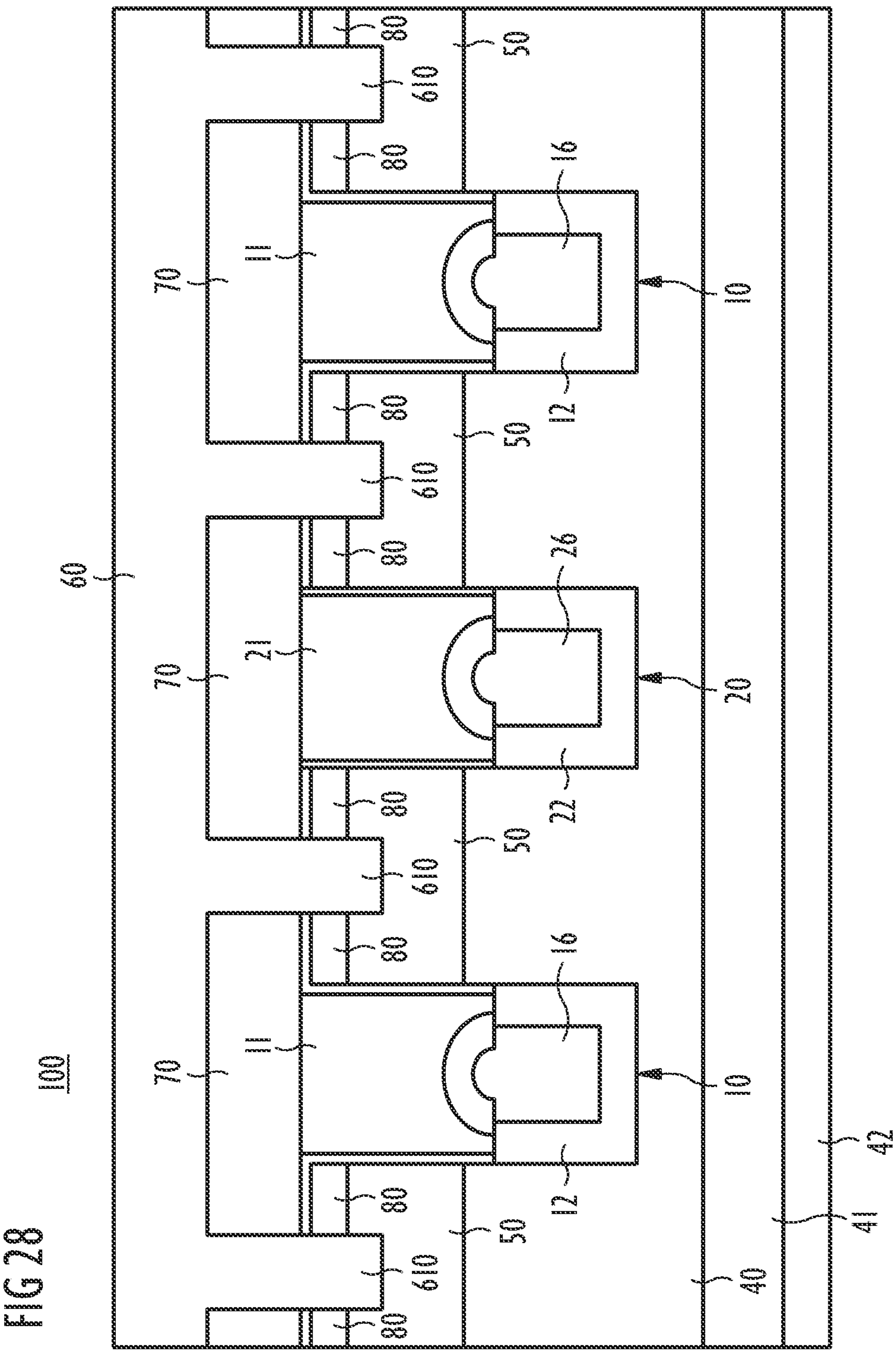
Figure 29:
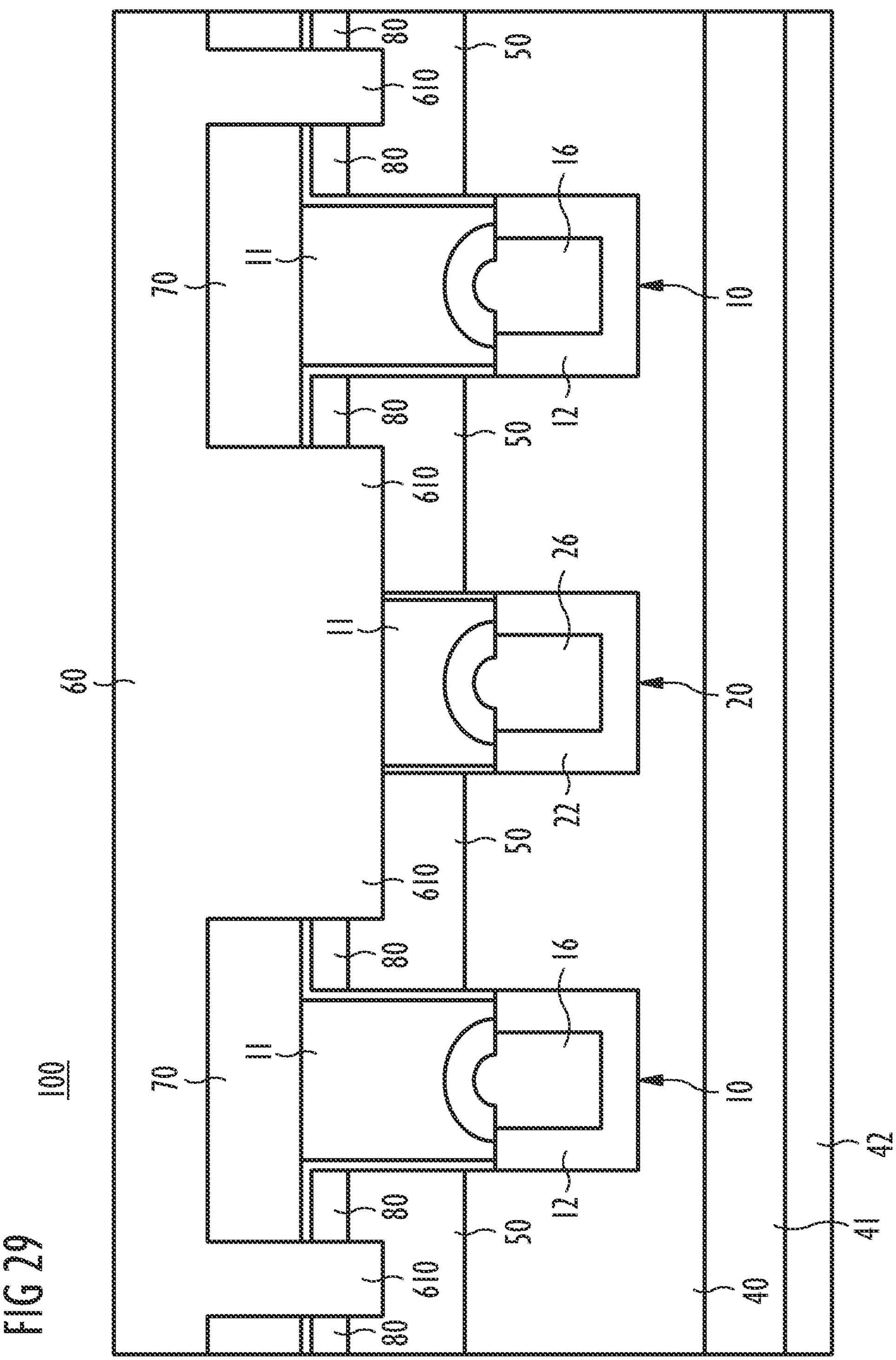

Subsequently, the oxide on the side walls in the upper portion of the second trench is removed, e.g., by wet-chemical etching. Afterwards the mask 7 is removed. The resulting semiconductor structure is illustrated in FIG. 26. Thereafter, a second thermal oxidation process is used to form a second insulating portion or dielectric layer 22*a* on the side walls in an upper portion of the second trench 20 as illustrated in FIG. 27. In the illustrated cross-section, the lateral thickness of the second dielectric layer 22*a* on the side walls in the upper portion of the second trench 20 ranges typically from about 1 nm to about 8 nm, but may be even smaller than 1 nm. Due to the different lateral thicknesses of the dielectric layers 12*a* and 22*a* on the side walls in the upper portions of the respective trenches, the later formed second field effect structure has a higher capacitance per unit area between its gate electrode and the body region 50 than the later formed first field-effect structure.

Thereafter, first and second gate electrodes 11 and 21 are formed, e.g., by a chemical vapor deposition (CVD) and back-etching of highly doped poly-Si. Further, a body region

Figure 30:
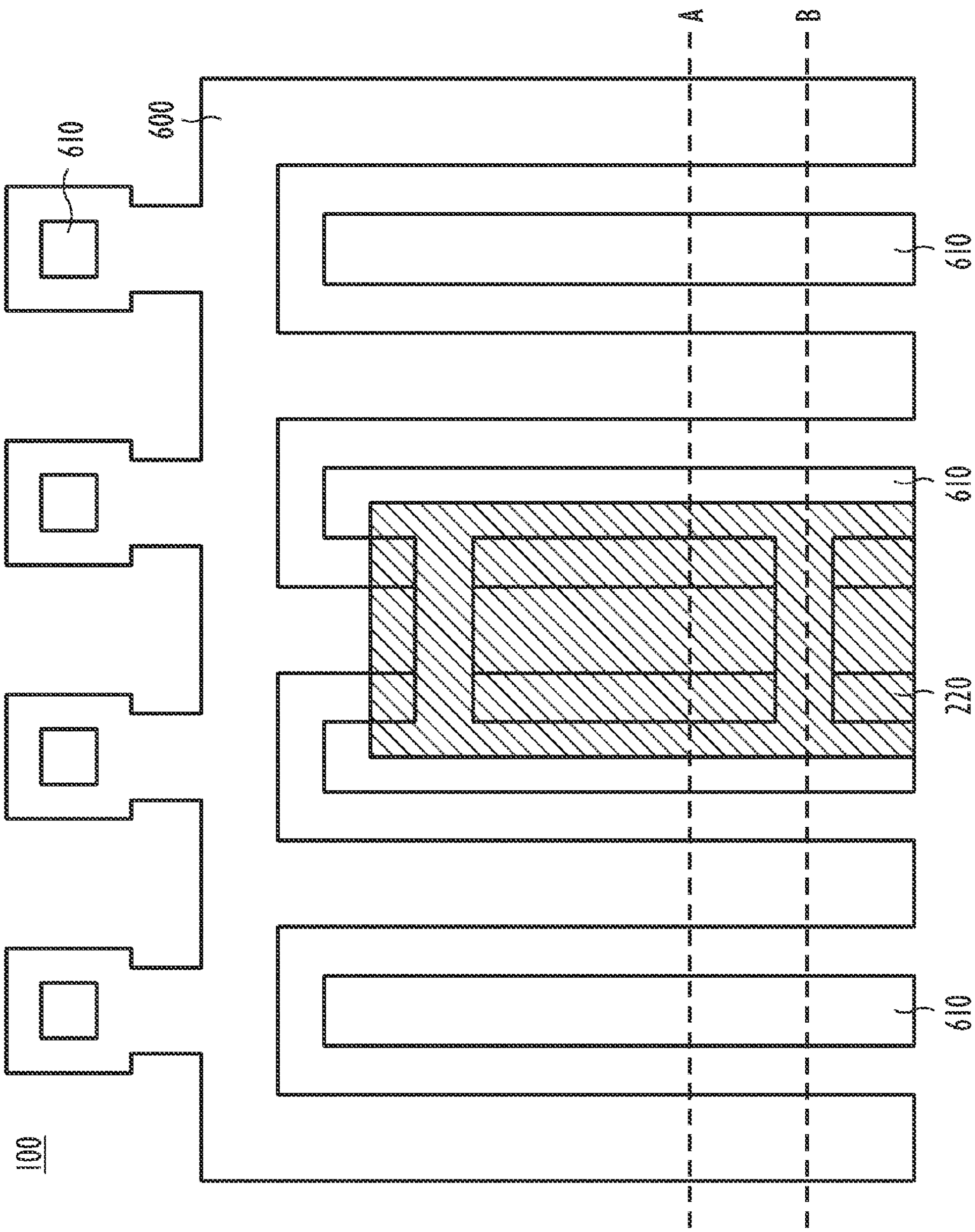
FIGS. 30 and 31 illustrate plan views of the semiconductor device illustrated in FIGS. 28 and 29, respectively.
Figure 31:
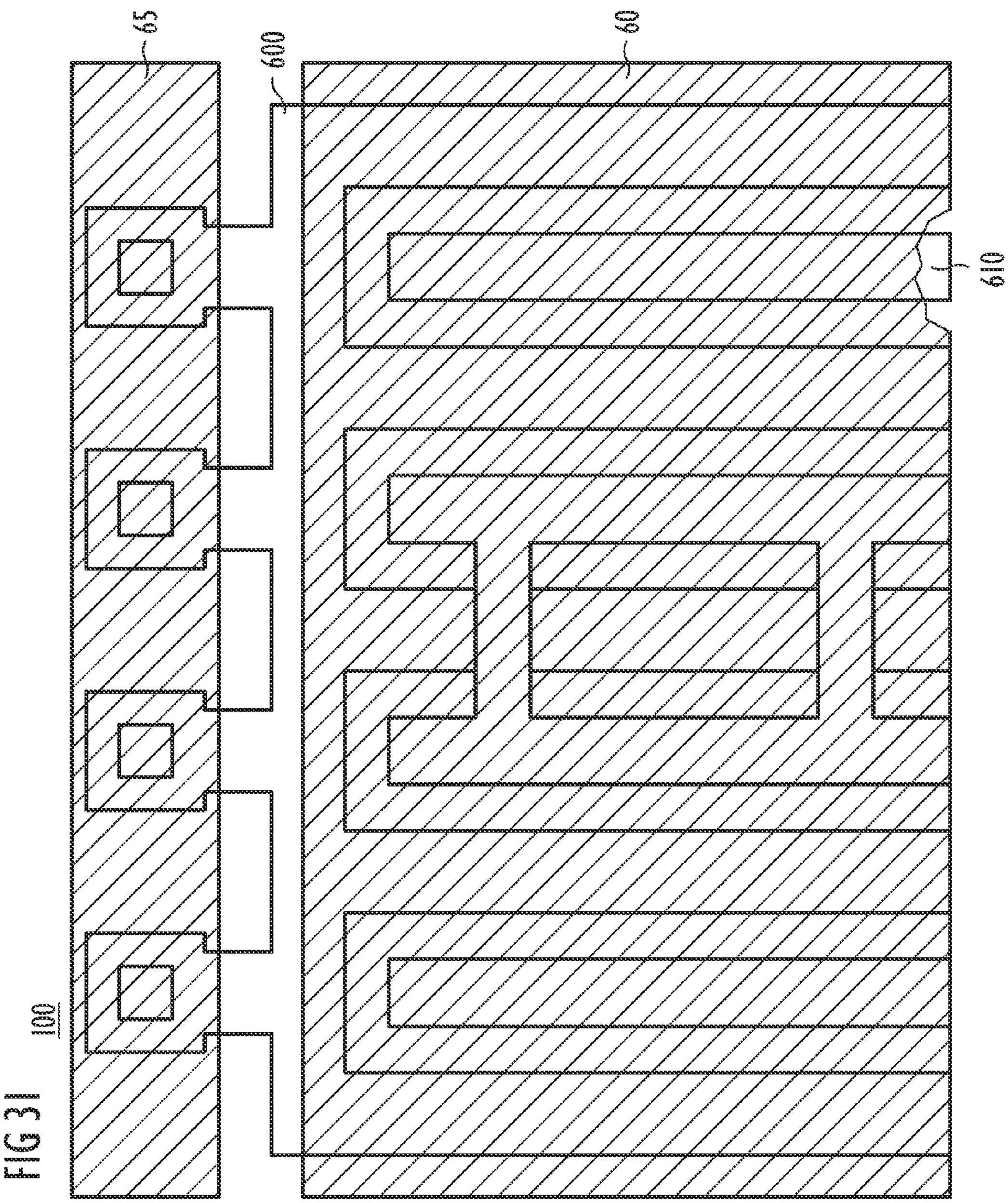

50 and a source region 80 are formed, e.g., by appropriate ion implantation and subsequent drive-in. In addition, dielectric portions 70 are formed by deposition. Finally, a common gate metallization 65 in electrical contact with the first gate electrodes 11, a common drain metallization 42 in electrical contact with the drain region 41, and a common source metallization 60 in electrical contact with the body region 50, the source region 80, the second gate electrode 21 and the field plates 16 and 26 are formed. The resulting MOSFET with integrated MGDs 100 is illustrated in two different vertical cross-section in FIGS. 28 and 29, which correspond to the lines A and B of FIG. 30 respectively. The contact between the second gate electrodes 21 and the source metallization 60 is only illustrated in FIG. 29. FIGS. 30 and 31 illustrate plan views of the MOSFET 100 without and with the source metallization 60 and the gate metallization 65. The reference sign 220 denotes the portion of the semiconductor device 100 in which the second insulating portion or dielectric layer 22*a* was formed. In other words, the portion 220 of the semiconductor device 100 represents the portion in which the MGDs were formed. The reference signs 600 and 610 refer to the poly-Si filling, which forms the first and second gate electrodes 11 and 21, and to the groove contacts for connecting the body regions 50, the source regions 80 and the second gate electrode 21 with the source metallization 60, respectively.

In other words, the method described with reference to FIGS. 22-29 includes a process of providing a semiconductor body of a first conductivity type, e.g., of n-type. The semiconductor body typically includes a drift region 40 of the first conductivity type and first and second trenches 10 and 20. The first and second trenches 10 and 20 may already include suitably formed and insulated field plates 16 and 26, respectively. Further, the method includes forming a source region 80 of the first conductivity type and an adjoining body region 50 of a second, i.e., opposite, conductivity type. A first field-effect structure, which includes a first gate electrode 11 and a first insulating region 12*a* arranged at least between the first gate electrode 11 and the body region 50, and a second field-effect structure, which includes a second gate electrode 21 and a second insulating region 22*a* arranged at least between the second gate electrode 11 and the body region 50, are formed such that the capacitance per unit area between the second gate electrode 21 and the body region 50 is larger than the capacitance per unit area between the first gate electrode 11 and the body region 50. Further, a common source metallization 60 at least in contact to the source region 80 and the second gate electrode 21 is formed.

Typically, the formed second field-effect structure is a MGD connected in parallel to the body diode 15 of the first field-effect structure.

Examples for the first field-effect structure include but are not limited to a MOSFET and a reverse conducting IGBT. For forming an IGBT, the provided semiconductor body may already include highly doped region 41*a* of the second conductivity type and highly doped region 41*b* of the first conductivity type adjoining each other and arranged below the drift region 40.

In further embodiments, the provided semiconductor body already includes compensation structures as used in Superjunction-MOSFETs.

Figure 32:
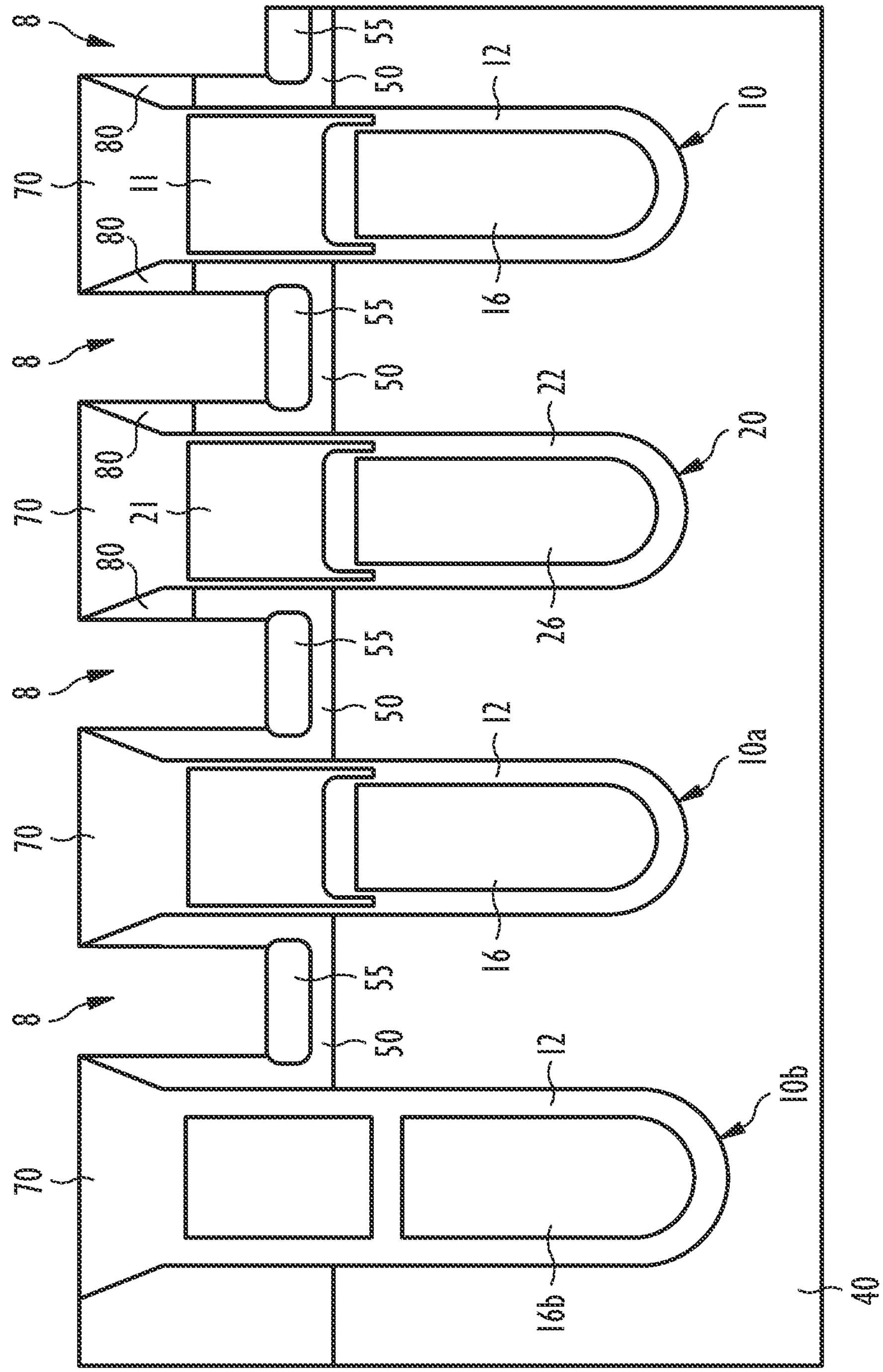
FIGS. 32-35 illustrate further manufacturing processes for forming a semiconductor device according to certain embodiments.

With reference to FIGS. 32-36, manufacturing processes according to certain embodiments will be explained. The FIGS. 32-35 illustrate vertical cross-sections through a semiconductor device 100 along the line B of FIG. 36. FIG. 32 illustrates the semiconductor device 100 after forming an n-type drift region 40 and after further processes including forming a p-type body region 50, forming an n-type source region 80, forming first and second trenches 10 and 20, forming insulating portions 70, forming shallow grooves 8 and forming higher doped p-type contact portions 55. The first and second trenches 10 and 20 include respective field plates 16 and 26, respective first and second gate electrodes 11 and 21 and respective first and second insulating regions 12 and 22. The higher doped contact portions 55 are arranged in the body region 50 below the adjoining grooves 8, and improve the later formed contact between the body region 50 and the source metallization 60. The trenches 10*a* and 10*b* are similar to the illustrated first trench 10. However, they are closest to a first lateral boundary of the semiconductor device 100 and have no adjoining source region 80 to compensate boundary effects. For the same reason, the trench 10*b* next to the first lateral boundary of the semiconductor device 100 and its field plate 16*b* extend vertically deeper into the drift region 40.

Figure 33:
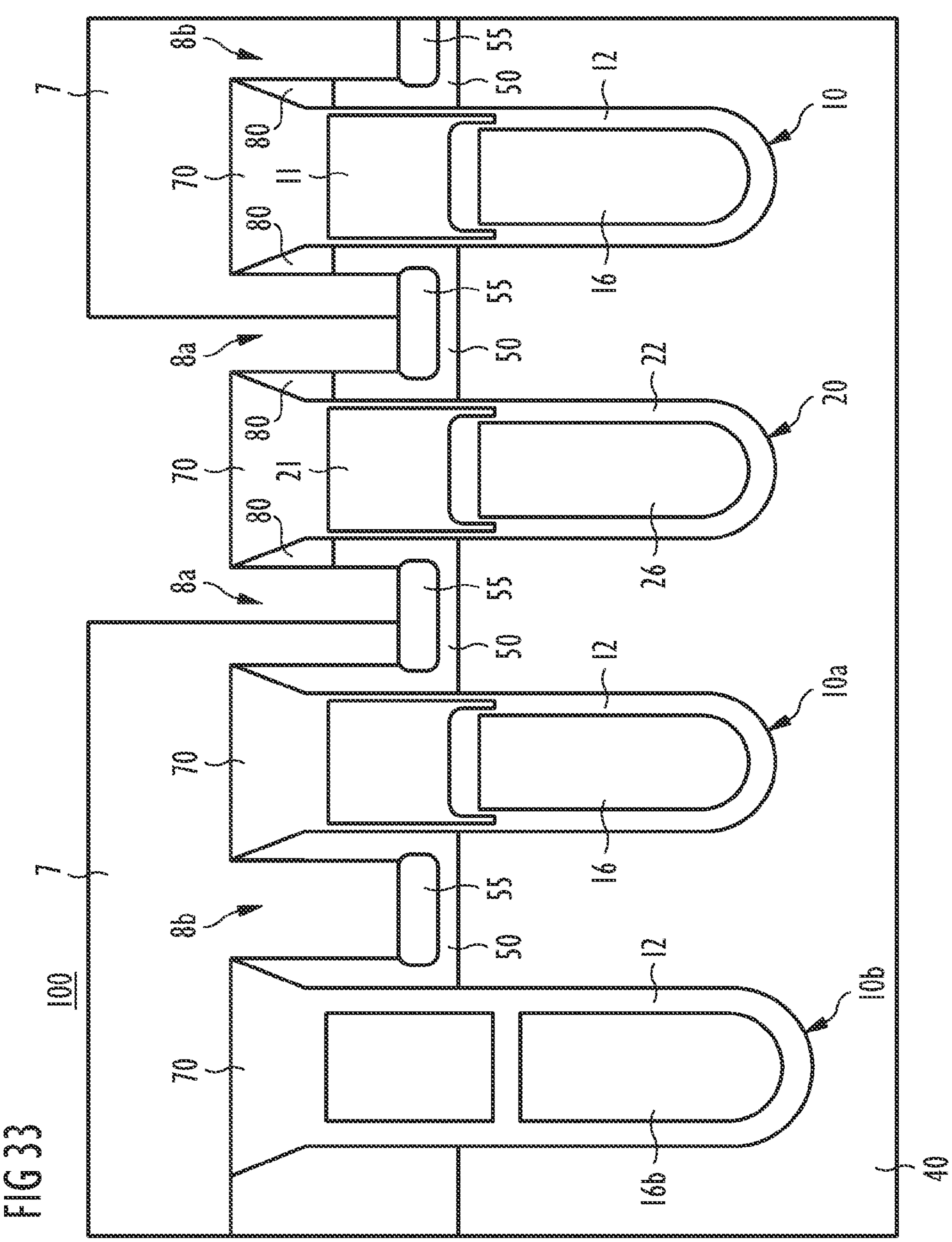
Figure 34:
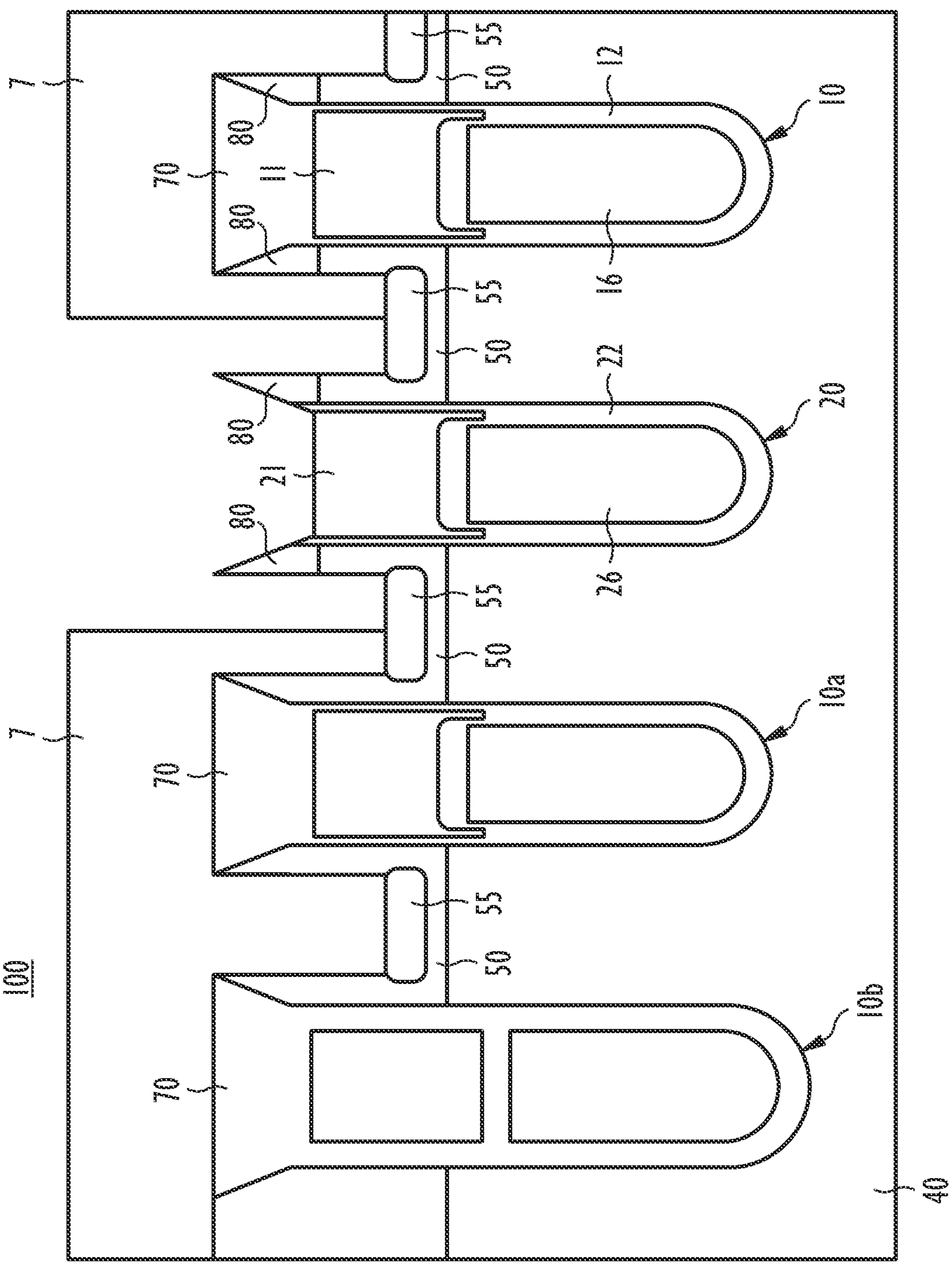
Figure 35:
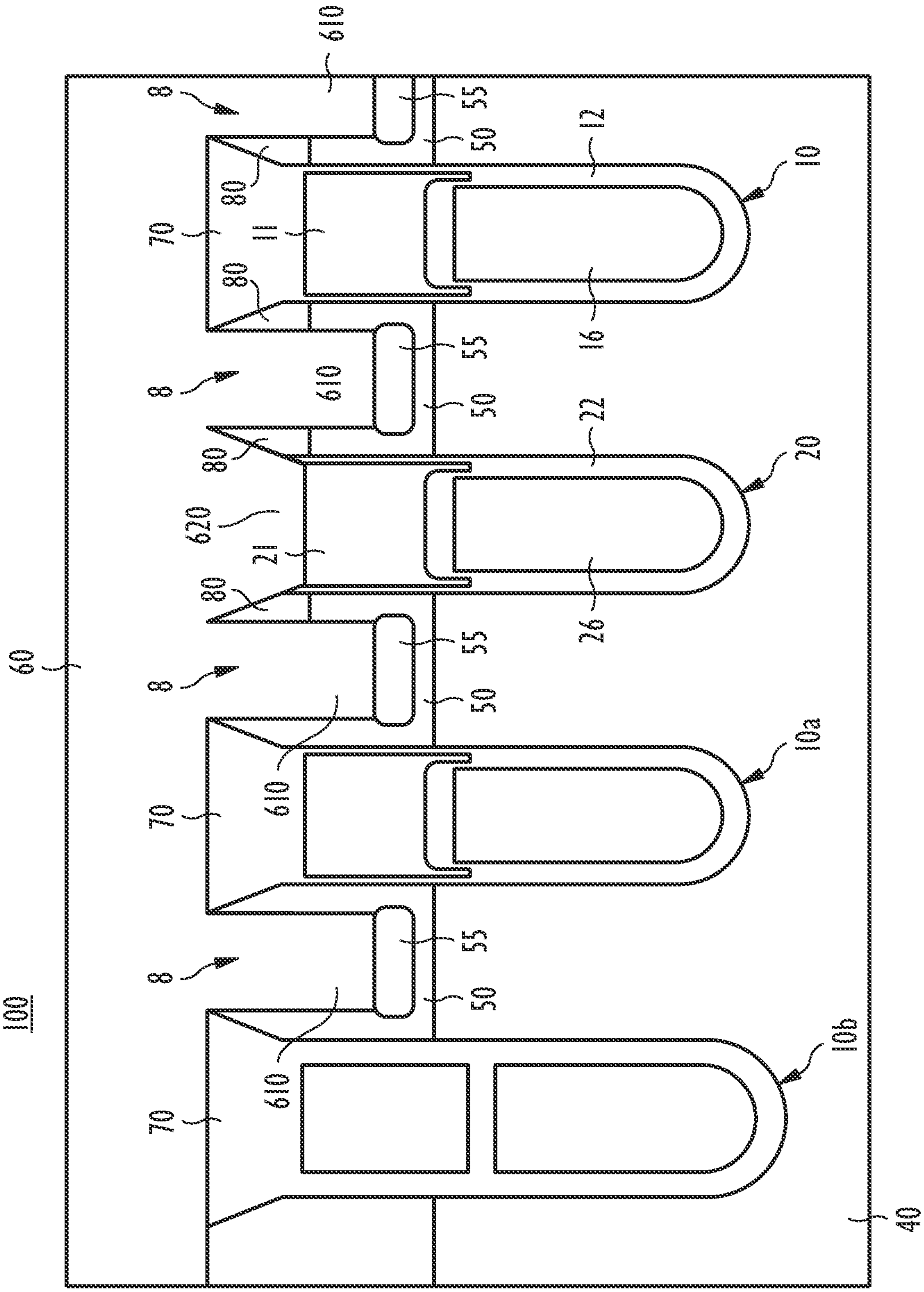

A photoresist 7 is deposited and structured such that only the grooves 8*a* next to the second trench 20 are exposed partially in a portion adjoining the second trench 20 and the contact portions 55 as illustrated in FIG. 33. The other grooves 8*b* remain completely filled with the photoresist 7. Subsequently, the insulating portion 70 which cover the second gate electrode 21 is removed by etching. This results in a structure 100 as illustrated in FIG. 34. Thereafter, the photoresist 7 is removed, and the source metallization 60 is deposited to electrically connect the source region 80, the body region 50 and the second gate electrode 21 as illustrated in FIG. 35. According to the performed manufacturing processes, the electrical connection between the source metallization 60 and the second gate electrode 21 is formed as a self-adjusted contact in a shallow trench 620. The shallow trench 620 extends vertically not as deep into the semiconductor device 100 as the grooves 8, which are also filled with the source metallization 60 to form a groove contact 610 to the body region 50, the source region 80 and the contact portion 55.

Figure 36:
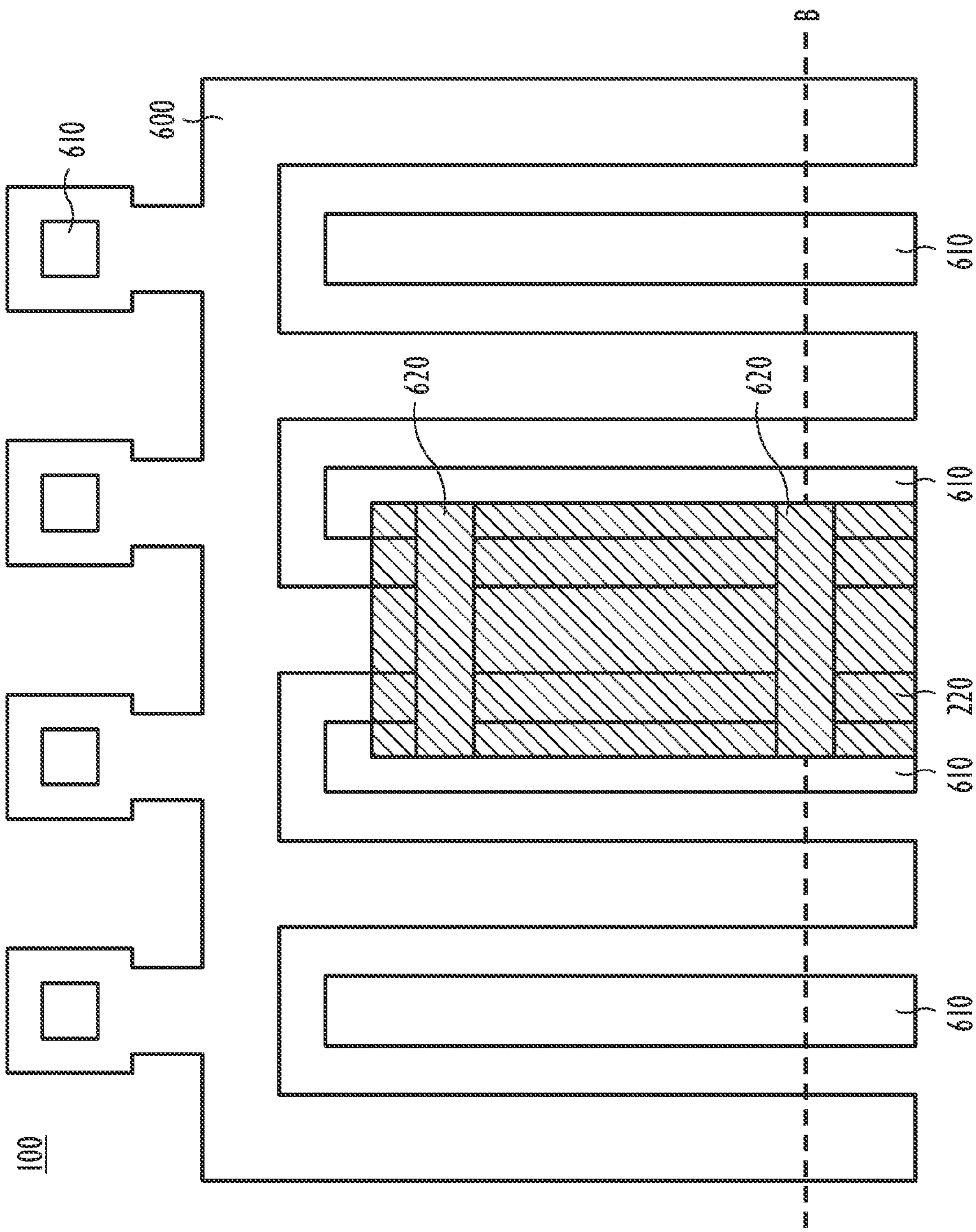
FIG. 36 illustrates a plan view of the semiconductor device illustrated in FIG. 35.

FIG. 36 illustrates a plan view of the MOSFET 100 including the region 220 in which the integrated MGD was formed. The reference sign 600 again refers to the poly-Si filling of the first and second trenches 10, 10*a*, 10*b* and 20. FIG. 36 further illustrates the shallow groove contacts 620 between the source metallization 60 and the second gate electrode 21. In addition, the groove contacts 610 between the source metallization 60 and the body region 50, the source region 80 and the contact portions 55 are illustrated.

FIGS. 37-73 illustrate vertical cross-sections through a semiconductor device 100 after several manufacturing processes for forming the semiconductor device 100.

Figure 37:
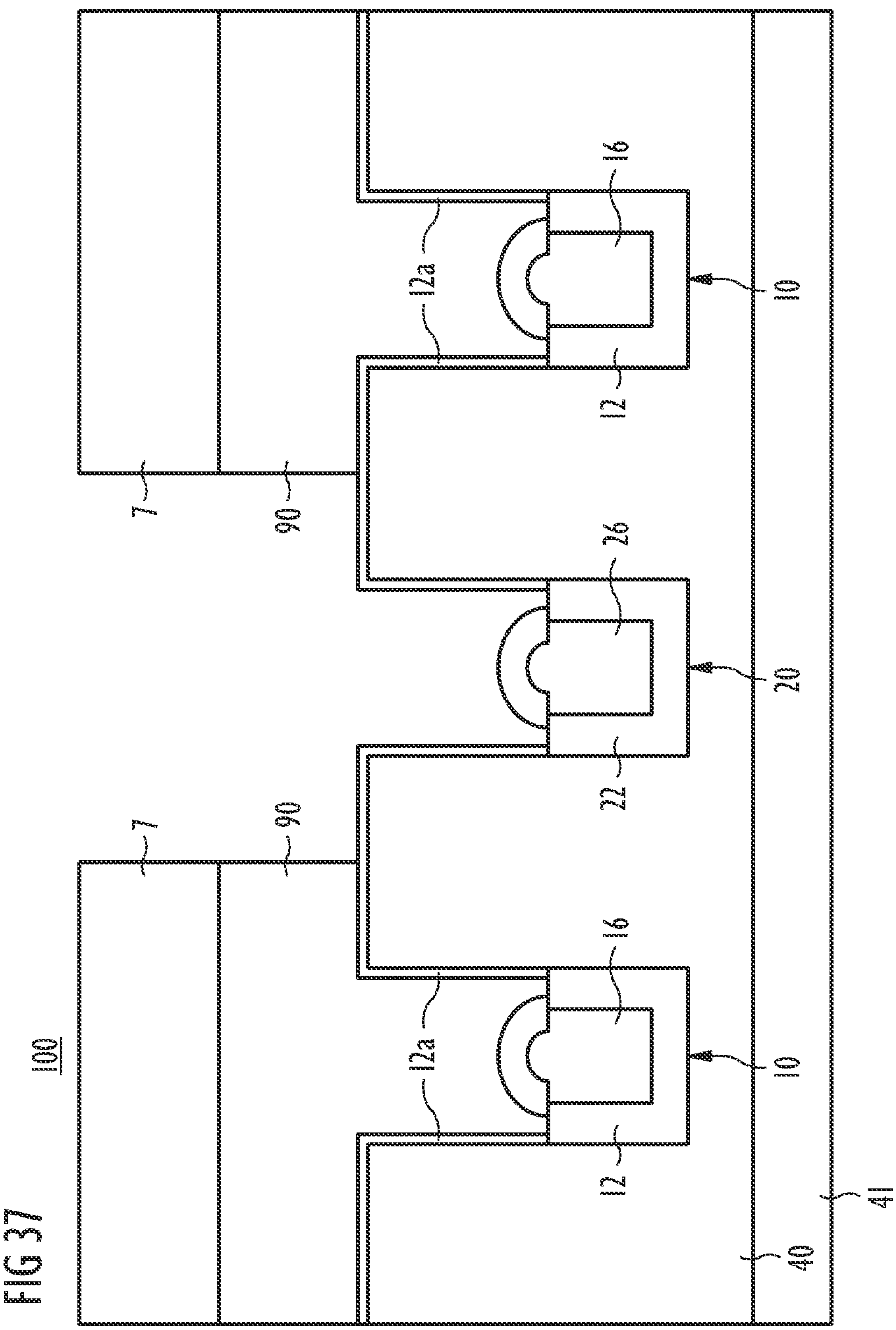
Figure 38:
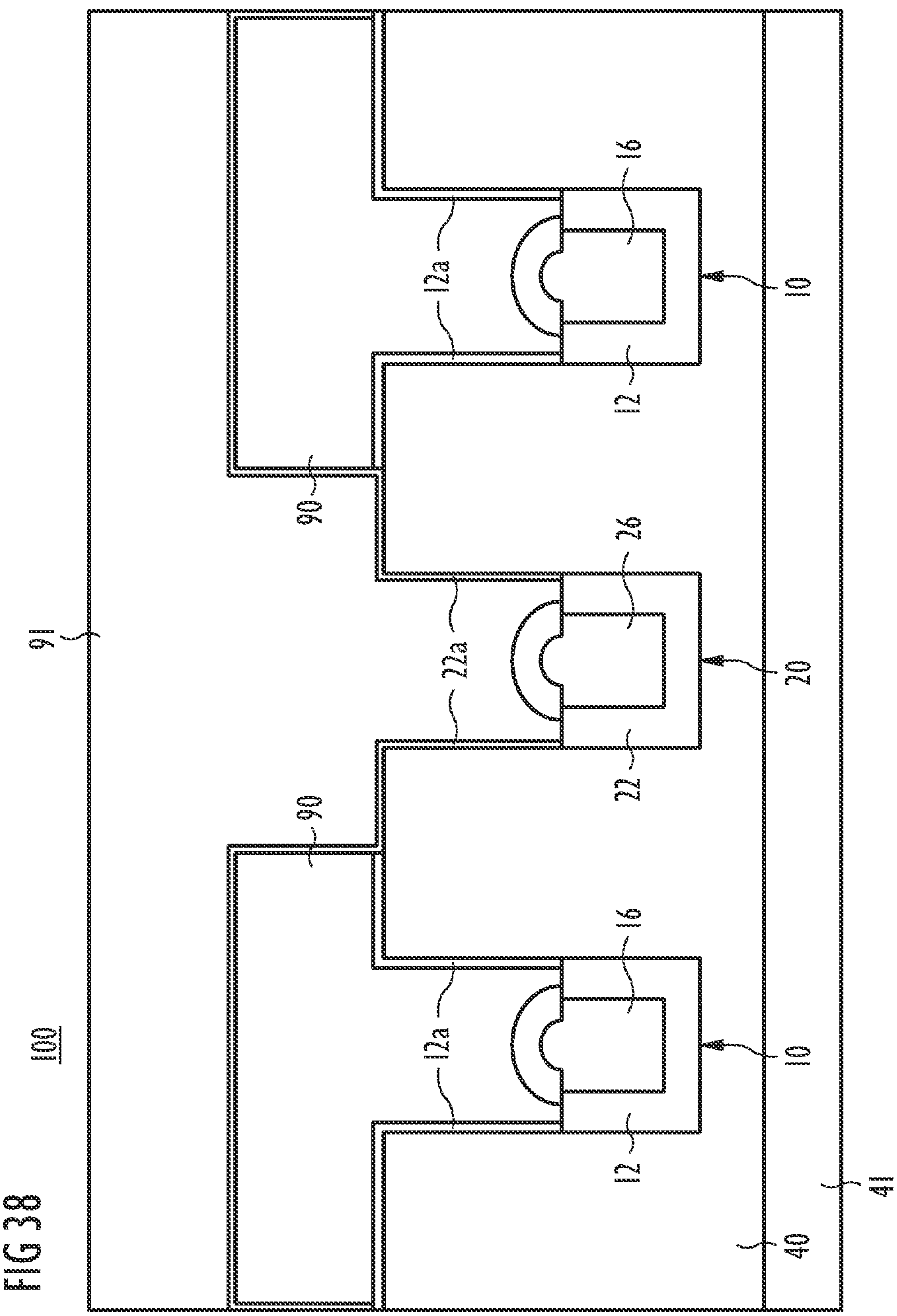

The manufacturing processes illustrated with respect to FIGS. 37-48 avoid any lithographical processes on the gate oxide and allows the use of different materials, e.g., materials with different work functions, for the first and second gate electrodes 11 and 21. Starting point for the following process processes is the structure 100 of FIG. 22. Onto this structure a poly-Si layer 90 and a photoresist are deposited. Thereafter, the photoresist is structured for forming an etching mask 7. In the subsequent wet-chemical or dry poly-Si etching process the second trench 20 is exposed in an upper portion. The resulting semiconductor structure is illustrated in FIG. 37. Thereafter, the etching mask 7 is removed, the Silicon oxide is etched off the side walls of the second trench 20, and a thermal oxidation process is carried out to form the second insulating portions 22*a*. Afterwards, a second overlaying poly-Si layer 91 is deposited as illustrated in FIG. 38. Subsequently, a chemical-mechanical polishing (CMP) process is carried out to remove the poly-Si above the first and second trenches 10 and 20 and to form a flat surface.

Figure 39:
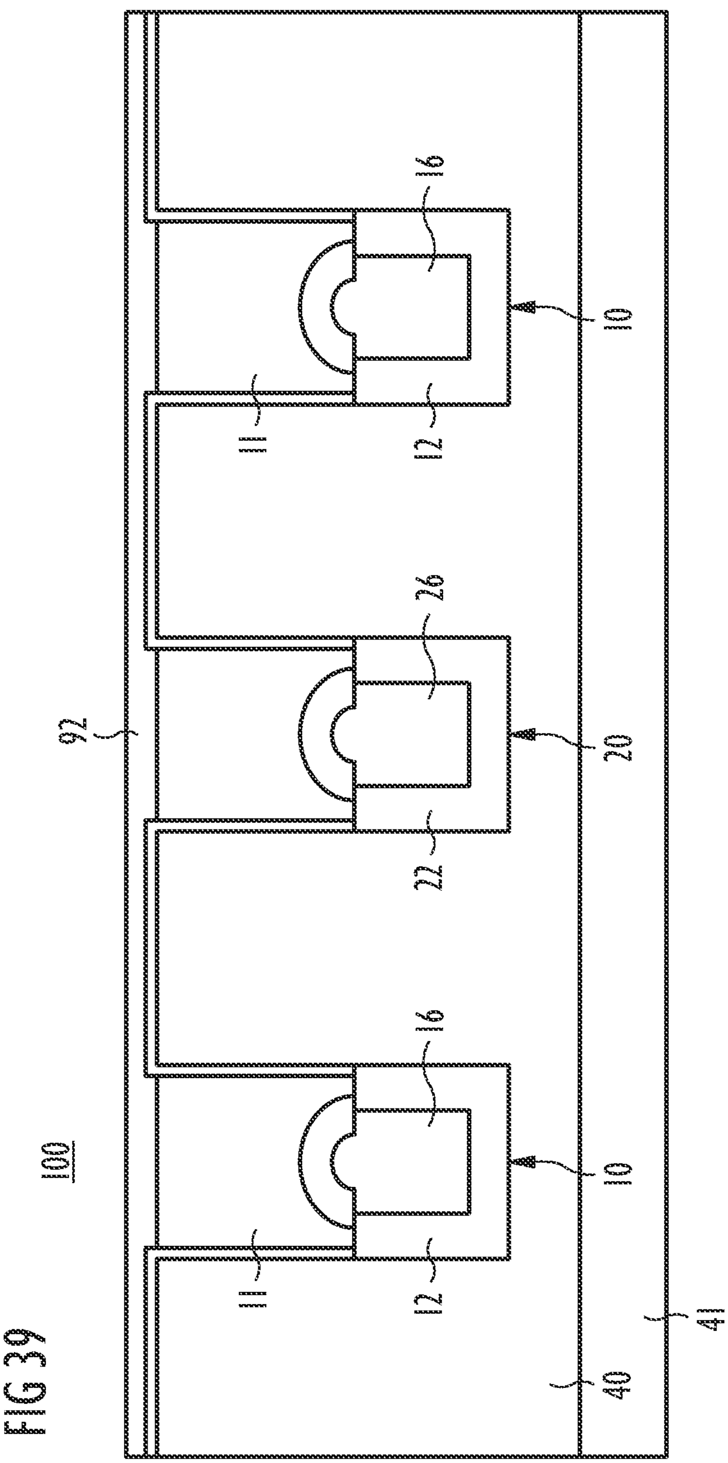
Figure 40:
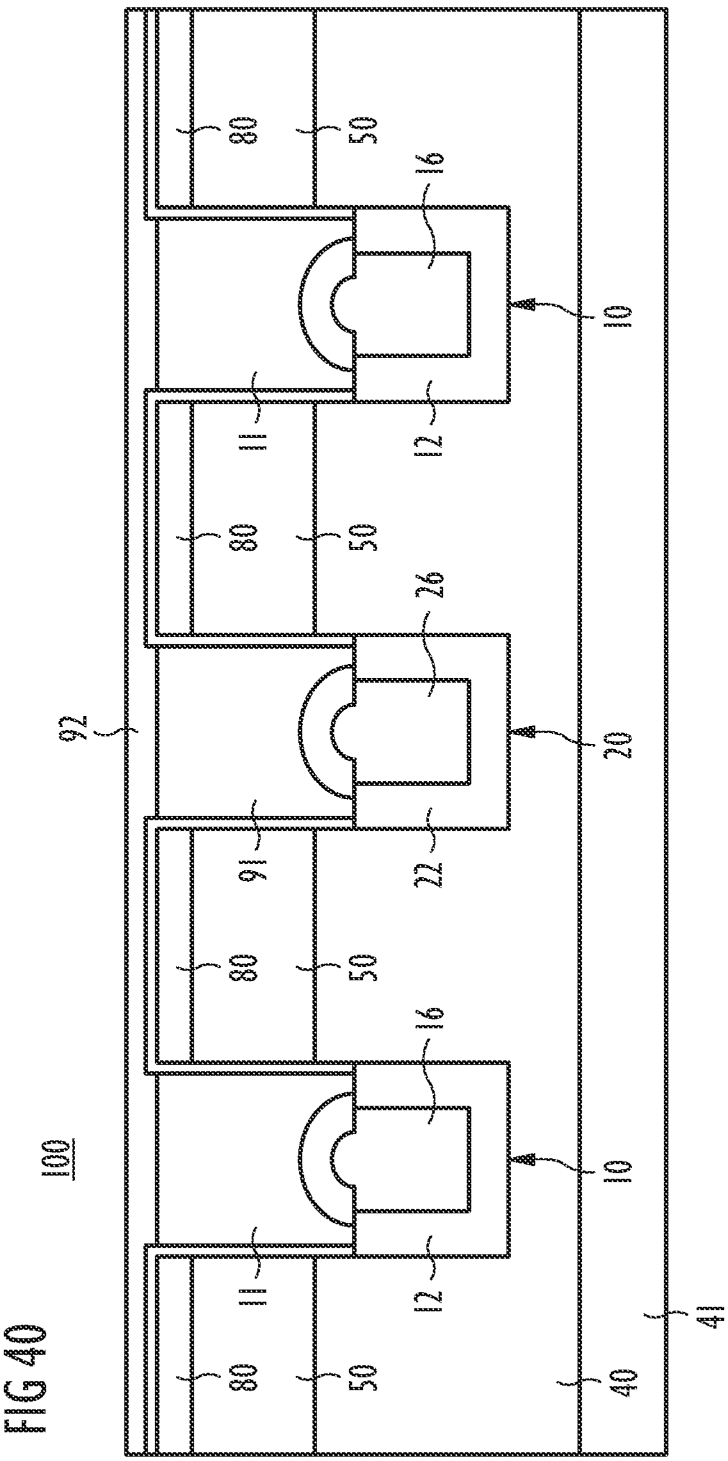
Figure 4I:
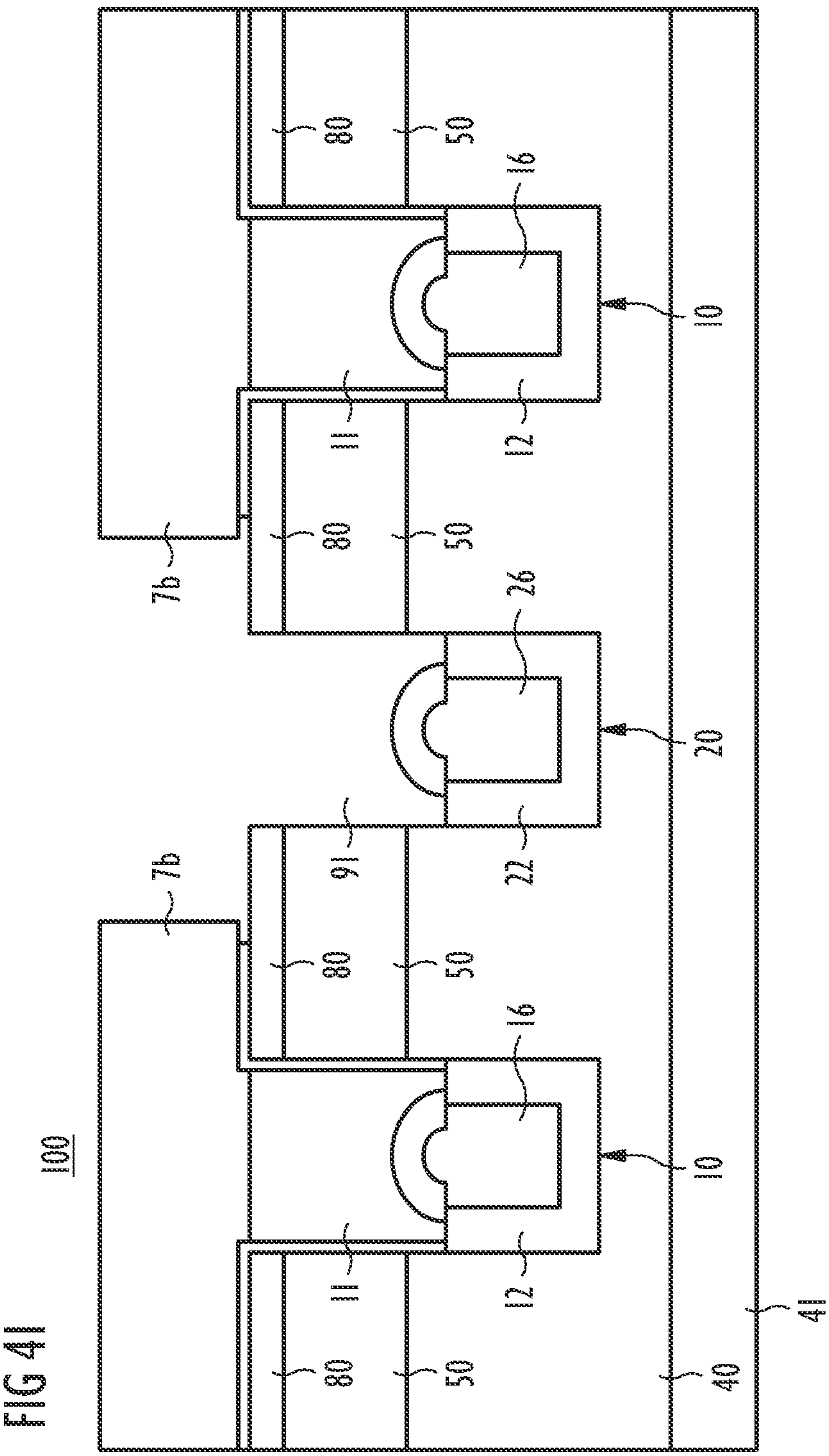
Figure 42:
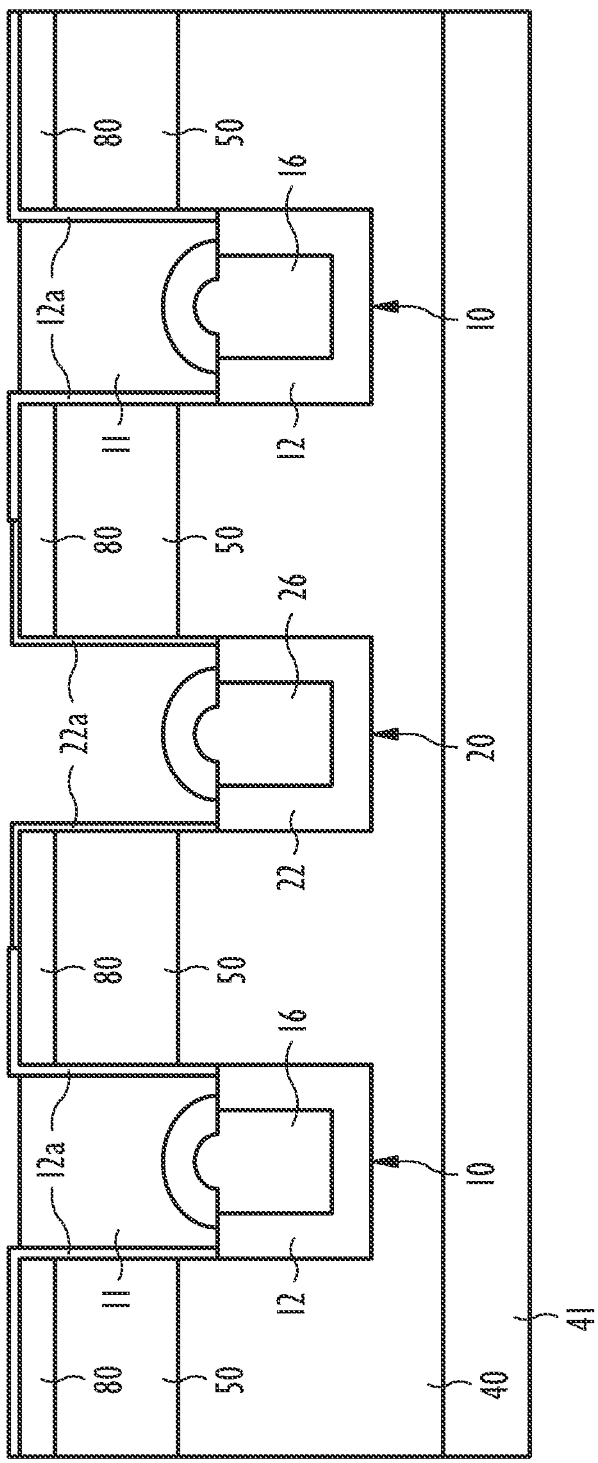
Figure 43:
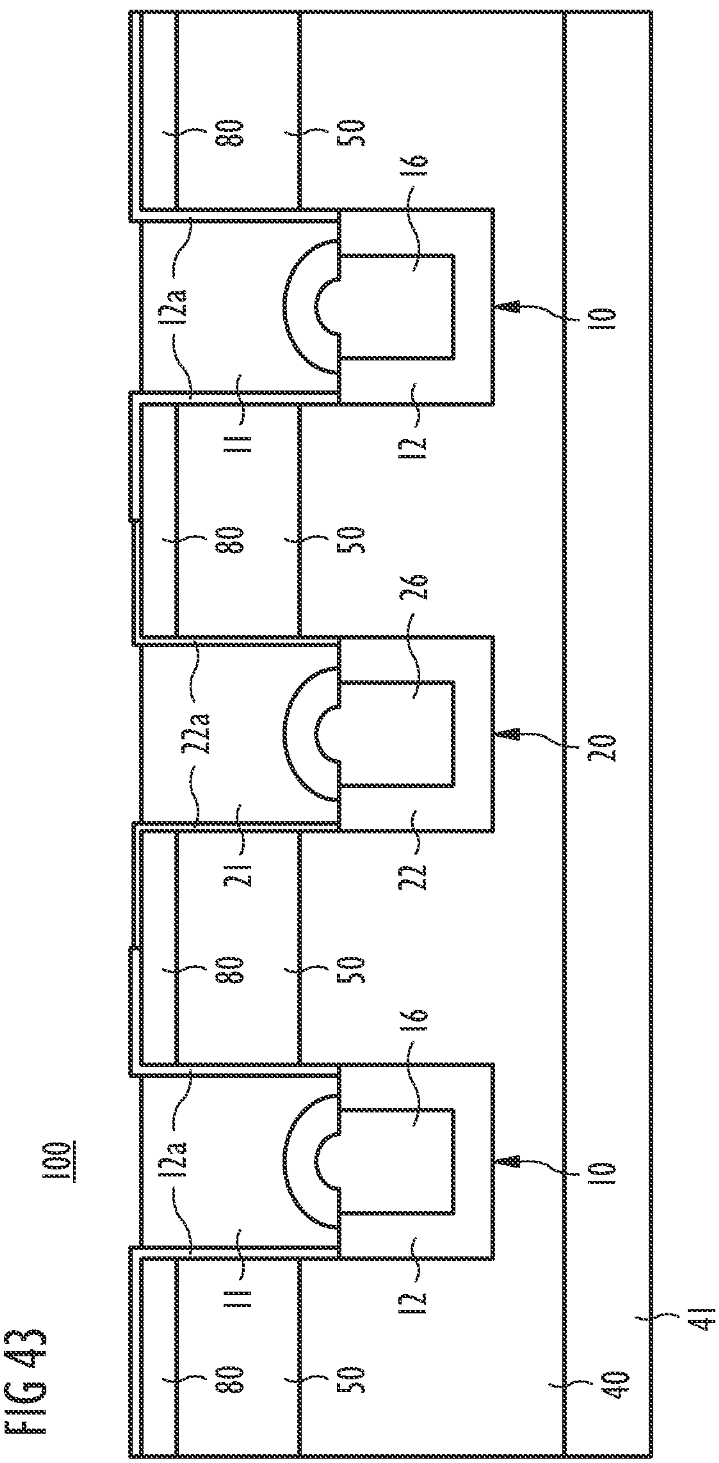

In an alternative process, a poly-Si layer 90 is deposited onto the structure illustrated in FIG. 22 and subsequently etched back. On top of the surface of the resulting structure a $Si_3N_4$ layer 92 is deposited, e.g., by a CVD process. This results in a structure as illustrated in FIG. 39. In the next two processes the body region 50 and source region 80 are formed by appropriate ion implantation and drive-in. This results in a structure as illustrated in FIG. 40. Thereafter, the following processes are subsequently performed. The $Si_3N_4$ layer 92 is removed by a wet-chemical etching. The first trenches 10 are masked by a further photolithographically structured mask 7*b*. The poly-Si 91 is removed from the second trench 20 by etching. Further, the insulating oxide layer on the sidewalls of the second trench 20 and on the source region 80 adjoining the second trench 20 are removed using an isotropic etching process. The resulting structure is illustrated in FIG. 41. After removing the mask 7*b*, a thermal oxidation is carried out to form second insulating portion 22*a* on the side walls in the upper portion of the second trench 20. Typically, the second insulating portions 22*a* are, in the lateral direction of the vertical cross-section illustrated in FIG. 42, thinner than the first insulating portions 12*a*. Subsequently, the second gate electrode 21 is formed by CVD and back-etching of highly doped poly-Si or a material with a lower work function than highly doped poly-Si such as TiN. This results in the structure illustrated in FIG. 43.

Finally, dielectric portions 70, a gate metallization 65 in contact with the first gate electrodes 11, a drain metallization 42 in contact with the drain region 41, and a source metallization 60 in contact with the second gate electrode 21, the body region 50 and the source region 80 are formed.

Figure 44:
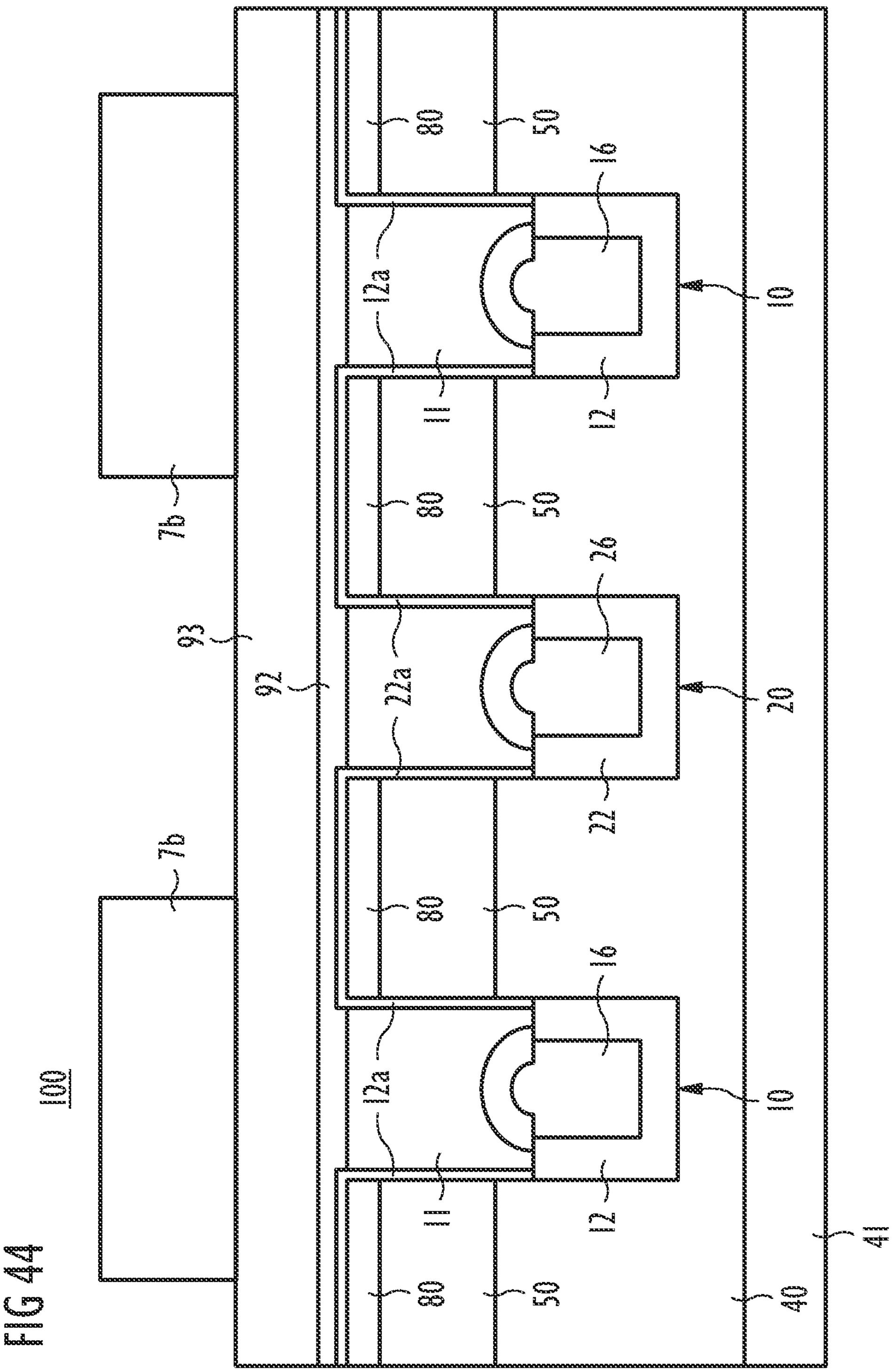
FIGS. 44-48 illustrate alternative manufacturing processes for forming a semiconductor device according to certain embodiments.
Figure 45:
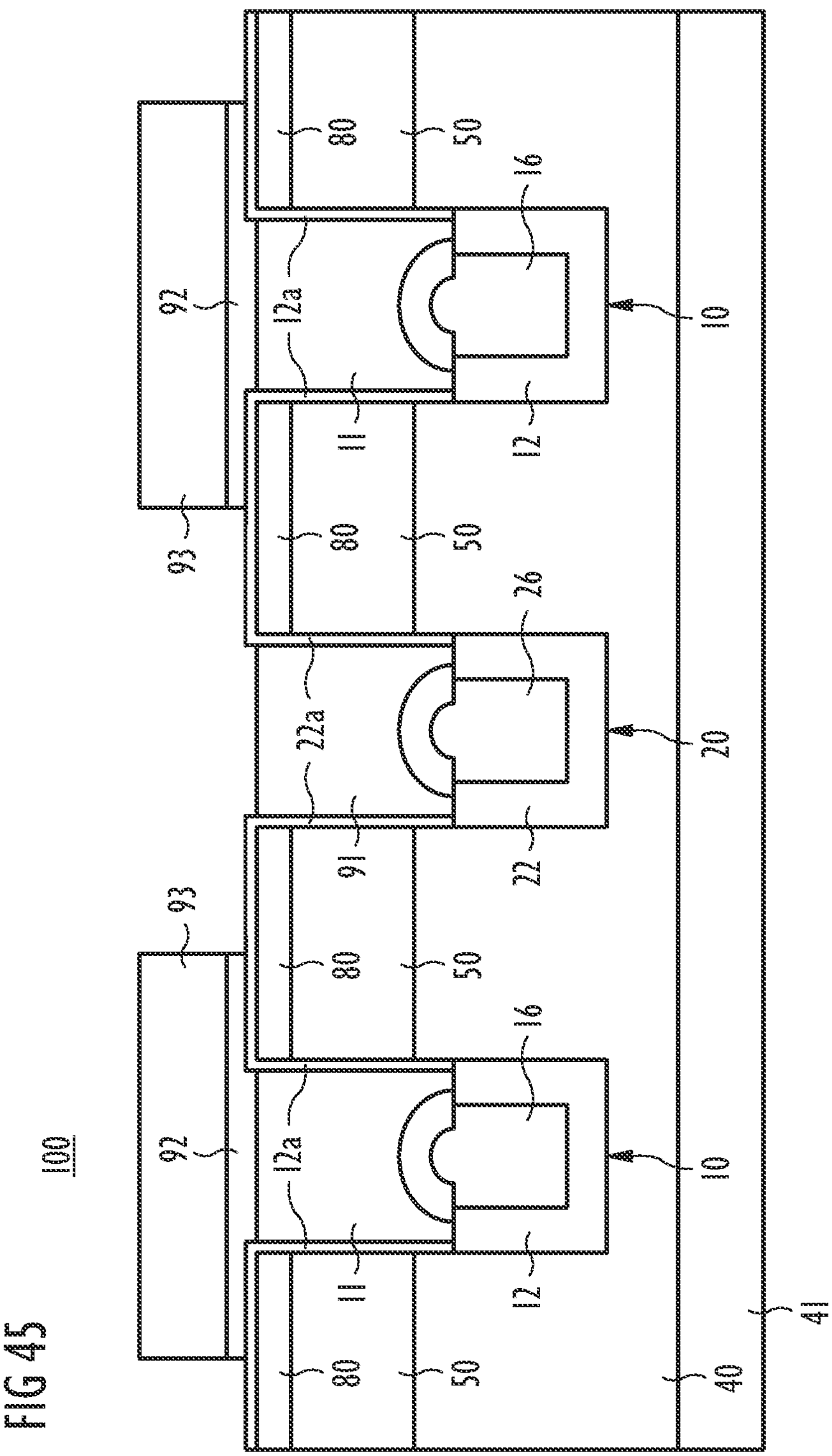
Figure 46:
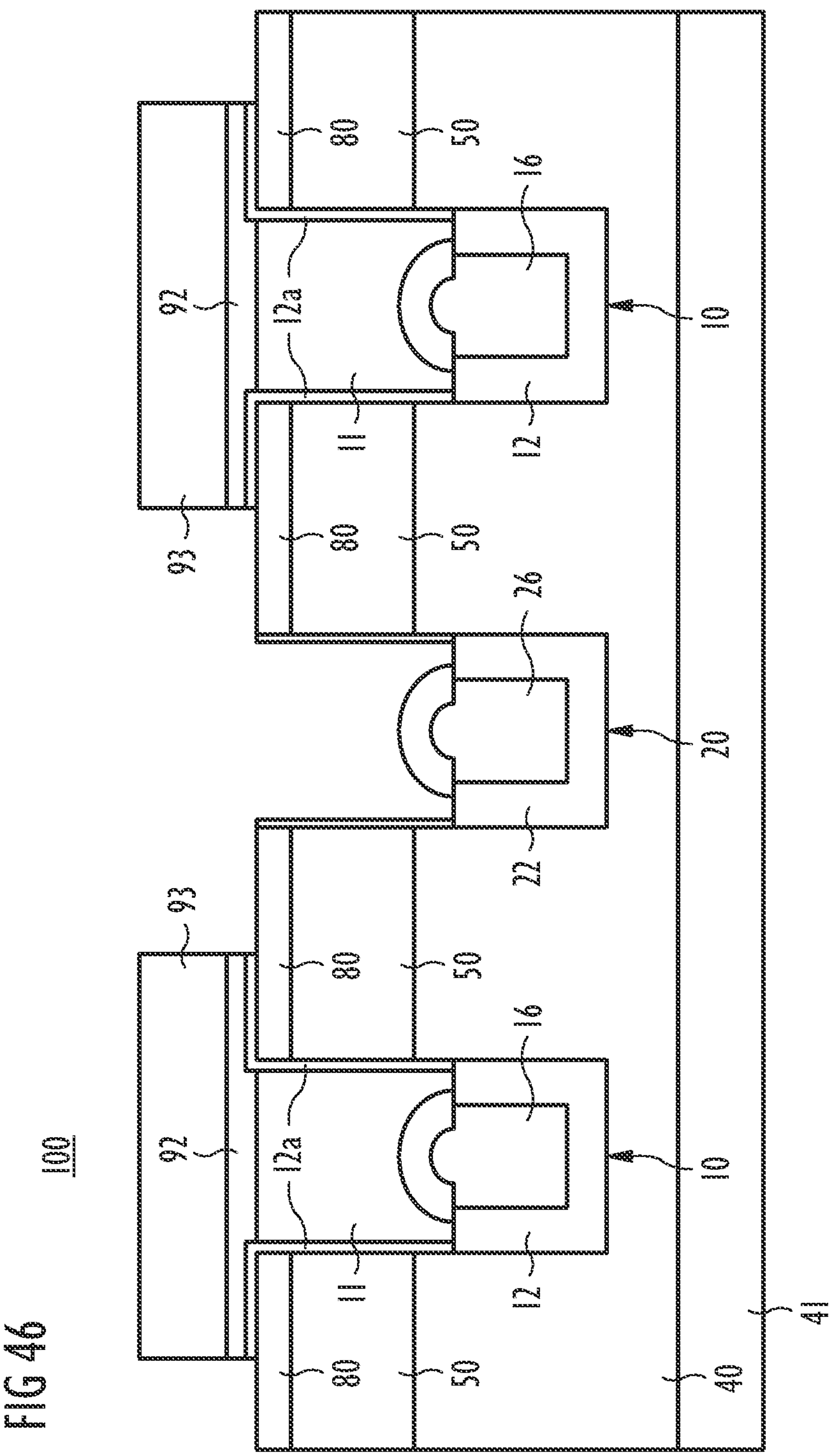
Figure 47:
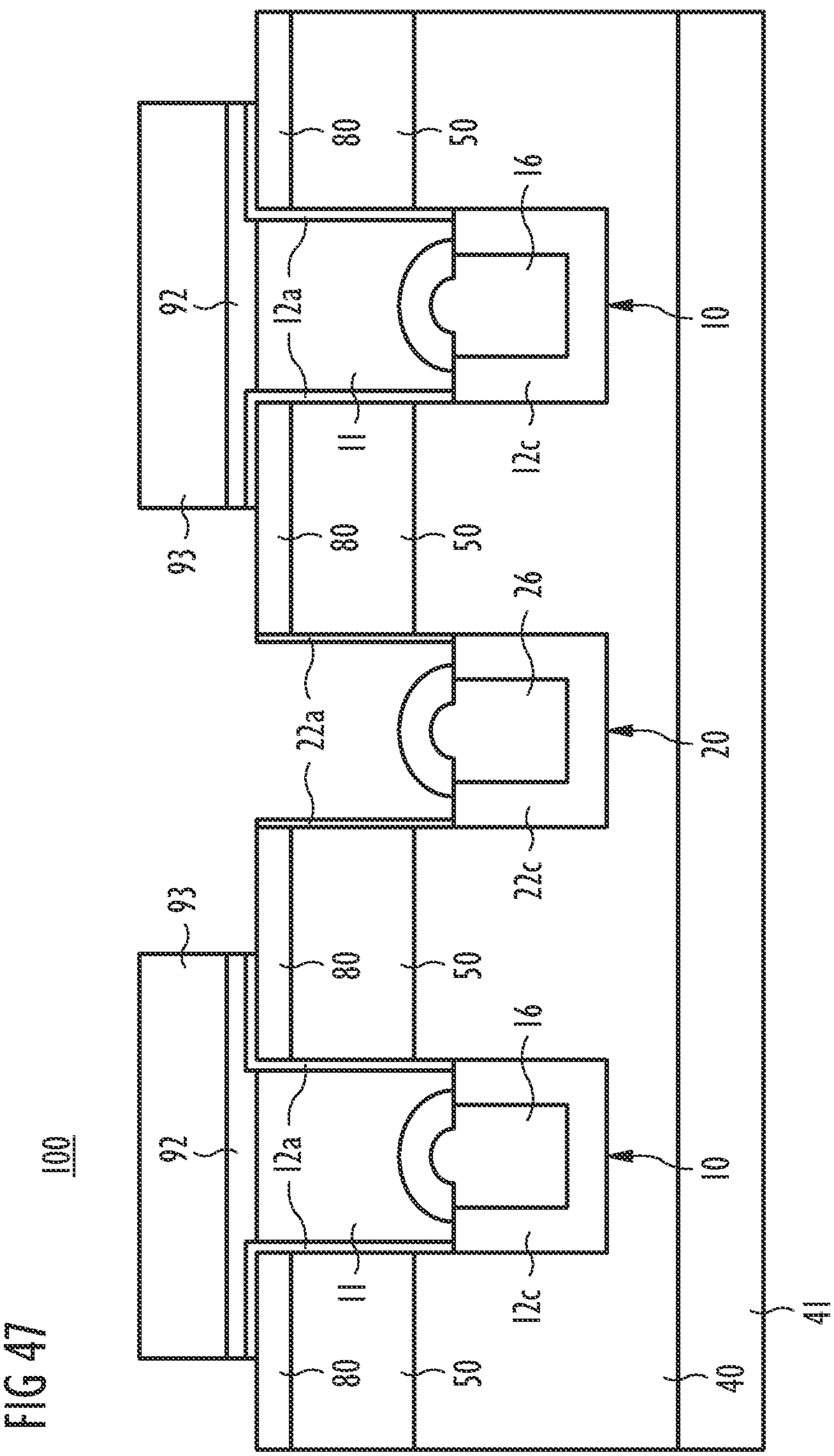

Alternatively, the following processes can be carried out after the processes resulting in the structure illustrated in FIG. 40. On top of the $Si_3N_4$ layer 92 an intermediate oxide layer 93 is deposited and a photolithographically structured mask 7*b* is formed thereon for masking the first trench 10 as illustrated in FIG. 44. Subsequent etching of the intermediate oxide layer 93, removing of the mask 7*b* and wet chemical etching of the $Si_3N_4$ layer 92 selective to $SiO_2$ result in a structure 100 as illustrated in FIG. 45. Thereafter, the poly-Si 91 is removed in the upper portion of the second trench 20 using isotropic etching. Further, the insulating silicon oxide layer on the sidewalls of the second trench 20 and on the source region 80 adjoining the second trench 20 is removed by isotropic etching. The resulting structure is illustrated in FIG. 46. Subsequently, a thermal oxidation is carried out to form second insulating portions 22*a* on the side walls in the upper portion of the second trench 20. The second insulating portions 22*a* are, in the lateral direction of the vertical cross-section illustrated in FIG. 47, typically thinner than the first insulating portion 12*a*.

Subsequently, the $SiO_2$ layer formed during the thermal oxidation on the source region 80 is anisotropically etched back to expose the upper surface of the source region 80 for later contacting to the source metallization 60. Alternatively, an isotropic etching in combination with a protecting plug can be used.

Figure 48:
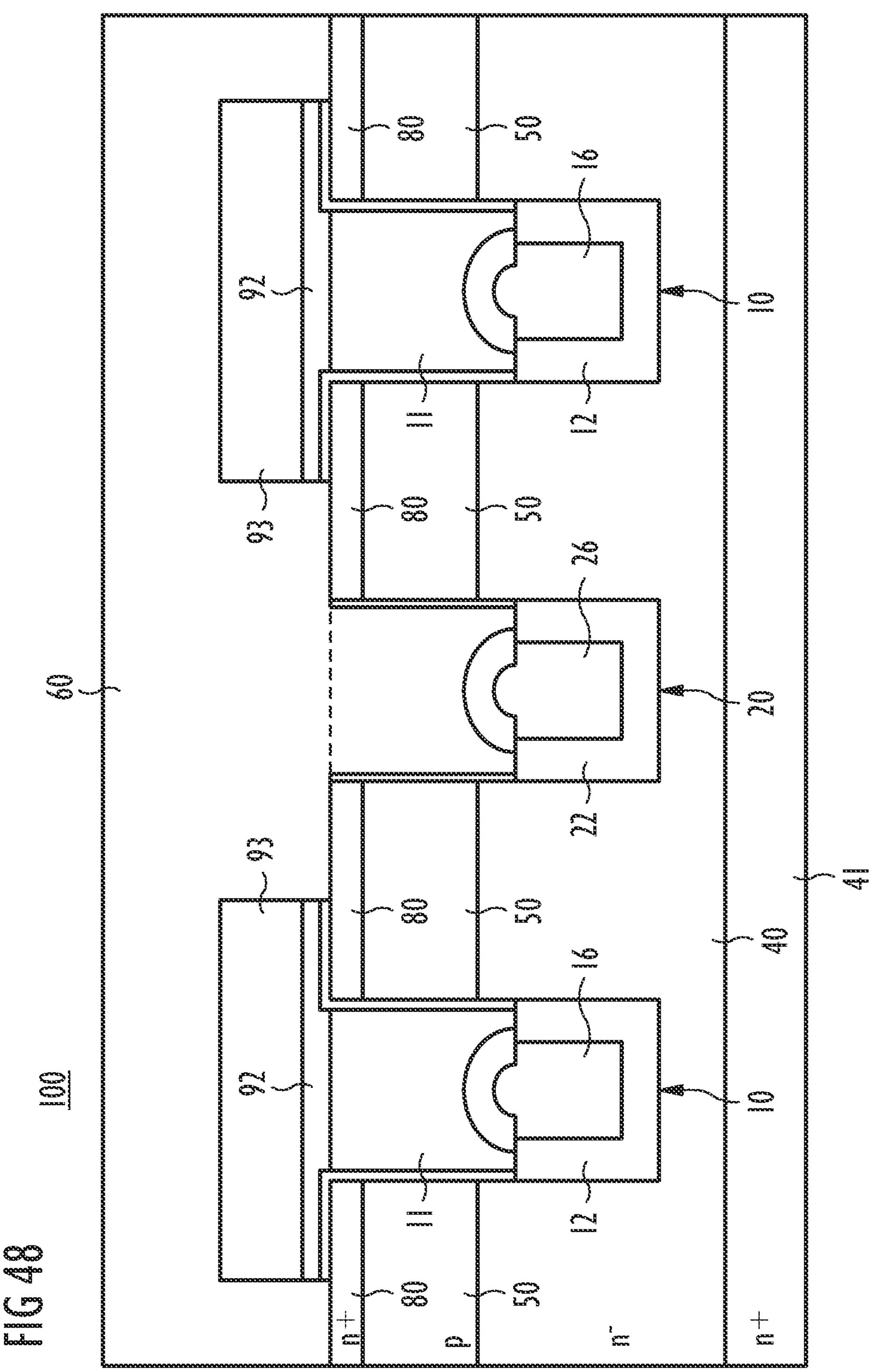

Finally, the connected second gate electrode 21 and source metallization 60 are formed by depositing of highly doped poly-Si or a material with a lower work function than highly doped poly-Si such as TiN. The resulting MOSFET with integrated MGDs is illustrated in FIG. 48. The illustrated dashed line indicates that the second gate electrode 21 and the gate metallization 60 can be made of the same material or different materials.

With respect to FIGS. 49-73 five embodiments of manufacturing methods for forming a field plate trench semiconductor device 100 will be explained. They all have in common that at least the sidewalls of the second trenches 20 are protected by a protecting region against oxidation during the thermal oxidation for forming the first insulating regions 12*a* in an upper portion of the first trenches 10. Otherwise, the thermal oxidation for forming the first insulating regions 12*a* will also cause oxidation of the silicon in the boundary region to the second trench 20. Typically, this causes a formation of processes in the mesa next to already formed field plates. Depending on the size and the position of the formed mesa processes, high field strength may occur in particular during reversed bias. Therefore, a material of low oxygen permeability under thermal oxidation conditions is typically deposited at least on the side walls in an upper portion of the second trench 20. Thereby, the formation of a process in the drift region 40 next to a transition region between the second insulating portion 22*a* and the thicker insulating bottom portion 22*c* of the second insulating region 22 can be avoided or at least reduced to a size which is smaller than about the half of the thickness $d_2$ of the second insulating portion 22*a* between the second gate electrode 21 and the body region 50. For example, the size of the process in the mesa may be only 4 nm or 2 nm or even smaller. Thus the size of the process in the mesa is significantly reduced compared to standard processing of MOSFETS which results in mesa processes of about 20 nm. Thereby, the electric field magnitude during reverse bias can be reduced in the drift region 40 close to the transition region. This will be explained with respect to FIGS. 74A-F.

In short, the embodiments include providing a semiconductor substrate of a first conductivity type. At least a first trench 10 and at least a second trench 20 are etched into the semiconductor substrate. A first oxide layer which covers at least a lower portion of the walls of the first trench 10 and a lower portion of the walls of the second trench 20 is formed. Subsequently, a first conductive region 16 at least in the lower portion of the first trench 10 and at least a second conductive region 26 in the lower portion of the second trench 20 are formed. This is typically done by CVD and back-etching of highly conductive poly-Si. A thermal oxidation process is performed to form a first insulating region 12*a* on the side walls in an upper portion of the first trench 10. During this thermal oxidation process the second trench 20 is protected such that the semiconductor substrate forming the walls of the second trench 20 is not or almost not oxidized. Thereafter, a second insulating region 22*a* is formed on the side walls in an upper portion of the second trench 20. Subsequently, a first gate electrode 11 in the upper portion of the first trench 10 and a second gate electrode 21 in the upper portion of the second trench 20 are formed. Further, a source region 80 of the first conductivity type and a body region 50 of a second conductivity type are formed such that they are adjoining Typically, the drift region 40 adjoining the body region 50 is thereby finally formed such that the first and second trenches 10 and 20 extend in a vertical direction below the pn-junction between the body region 50 and the drift region 40. Thereafter, a source metallization 60, which is at least in contact to the source region 80 and the second gate electrode 21, is formed. Typically, the body region 50 is also electrically connected to the source metallization 60. Further, the first and second conductive region 16 and 26 are typically also electrically connected to the source metallization 60 and operate as field plates 16 and 26.

According to an embodiment the first insulating region 12*a* and second insulating region 22*a* are formed such, that the capacitance per unit area between the second gate electrode 21 and the body region 50 is higher than the capacitance per unit area between the first gate electrode 11 and the body region 50.

According to a further embodiment, the second gate electrode 21 extends less deep into the drift region 40 than the first gate electrode 11. This further reduces the electric field magnitude during reverse mode in the drift region 40 next to the transition region of the second insulating region 22. Typically, this is also achieved by the five methods for forming a field plate trench semiconductor device explained in the following.

Figure 49:
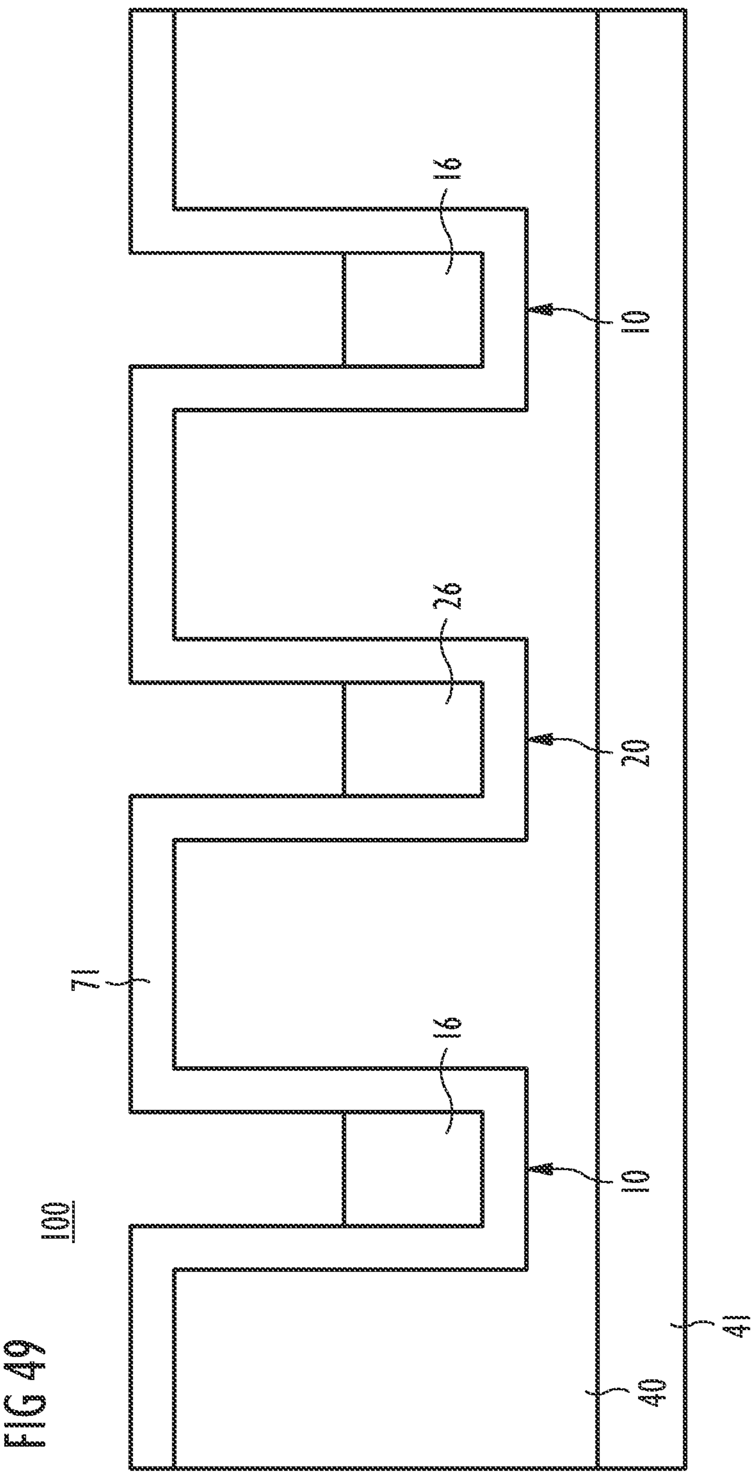
FIGS. 49-56 illustrate a manufacturing method for forming a semiconductor device according to certain embodiments.
Figure 50:
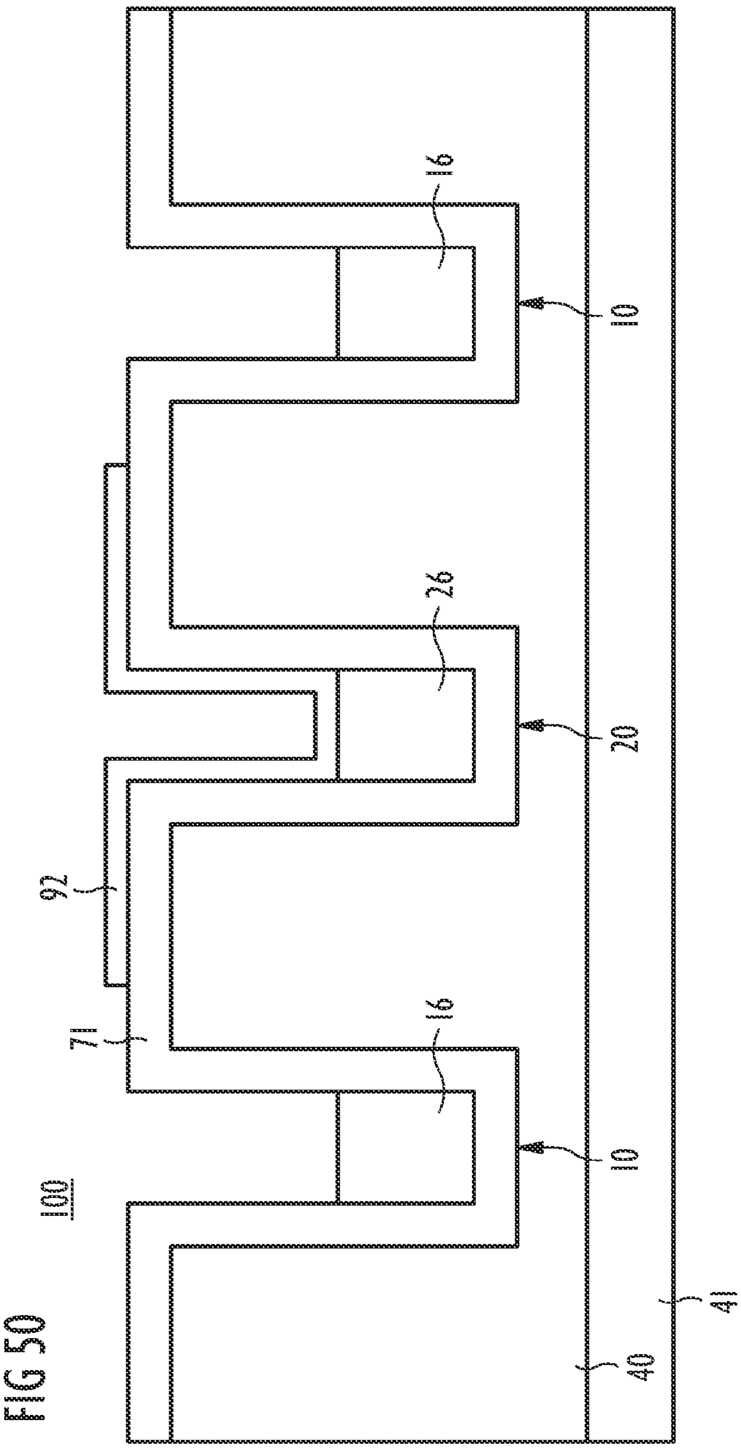
Figure 51:
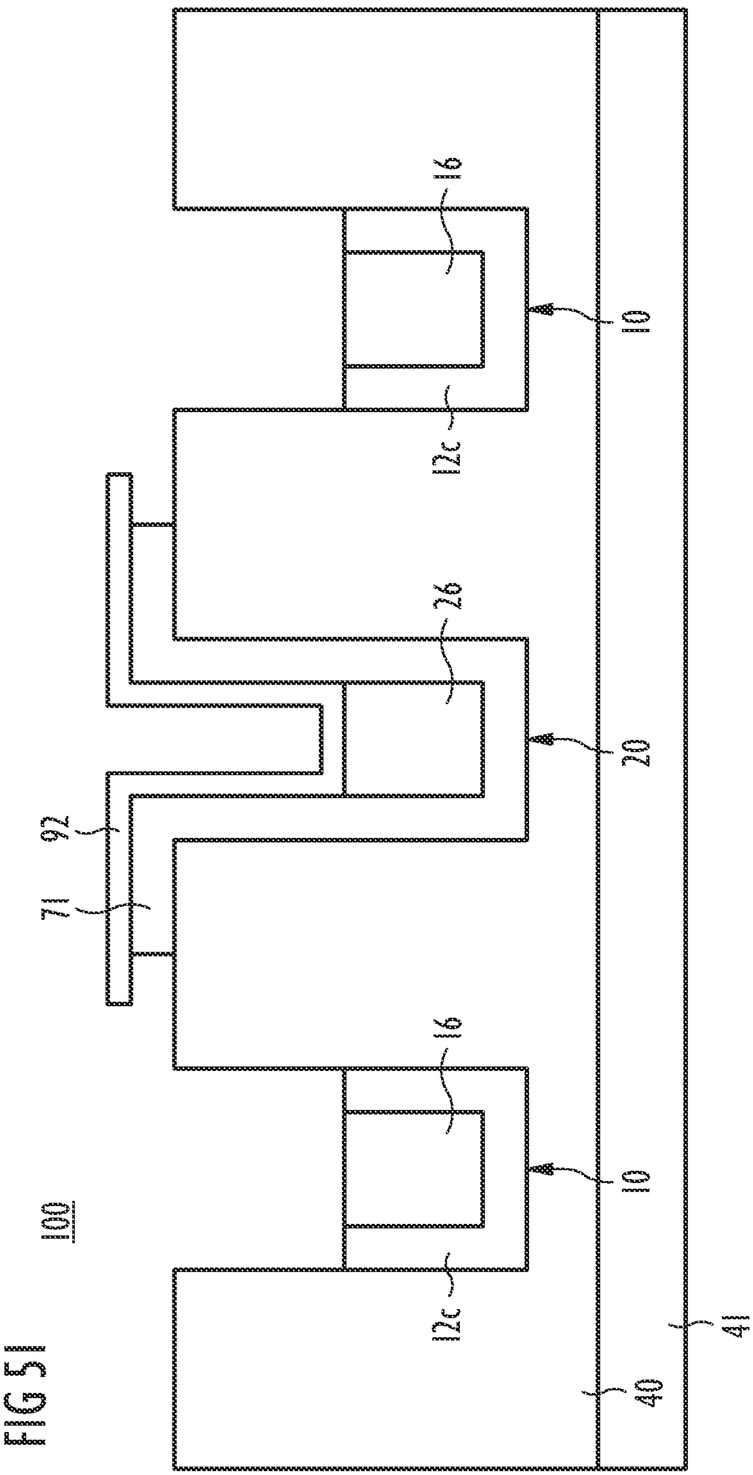
Figure 52:
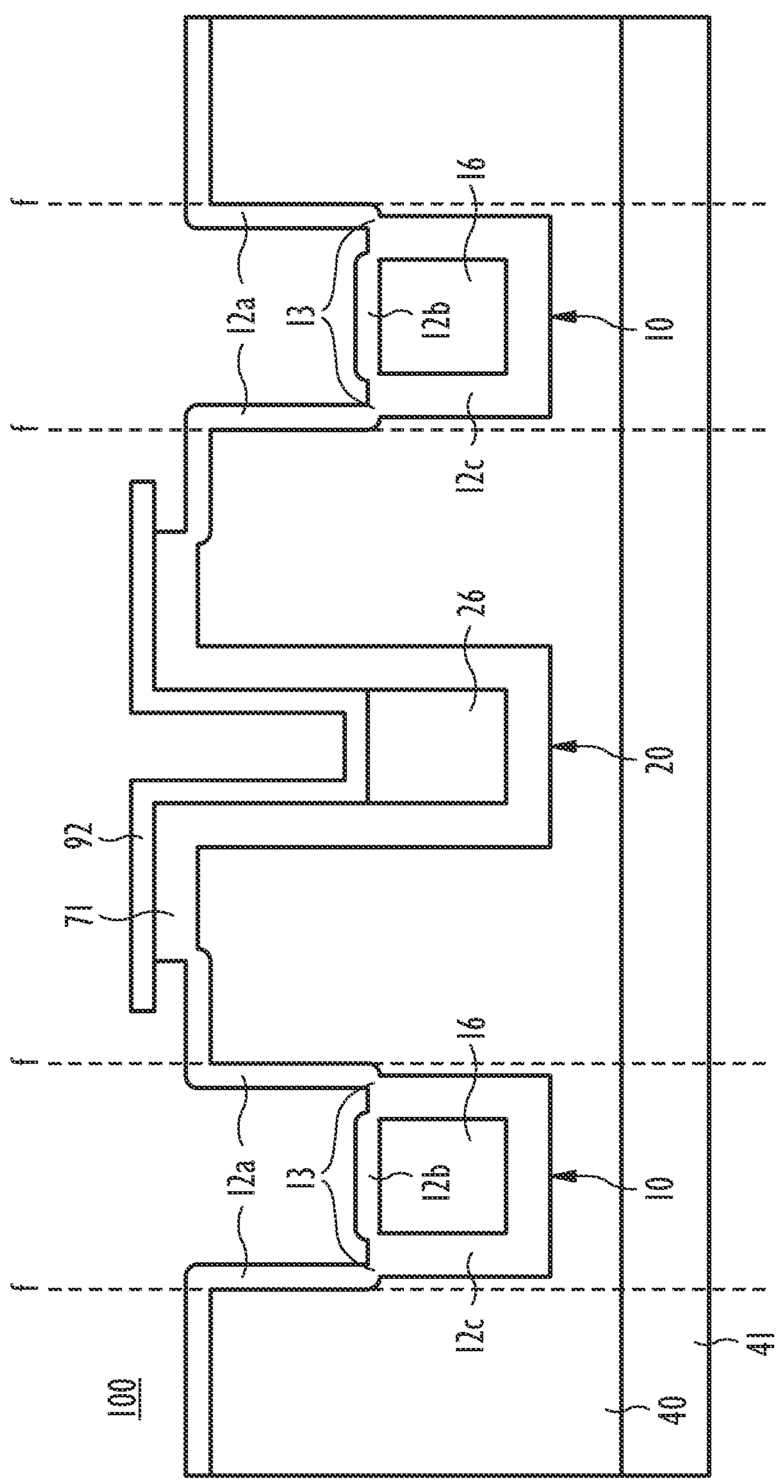

Referring now to FIGS. 49-56 the first of the five embodiments for forming a field plate trench semiconductor device 100 will be explained in detail. FIG. 49 illustrates the structure 100 after providing an n-type Si-substrate which includes a drift region 40 and a higher doped drain region 41 and after further processes including etching of two first trenches 10 and a second trench 20 into the semiconductor substrate, forming a first oxide layer 71 on the semiconductor substrate such that the side walls and the bottom wall of the first and second trench 10 and 20 are also covered and forming first conductive regions 16 in a lower portion of the first trench 10 and a second conductive region 26 in a lower portion of the second trench 20. Typically, first and second insulating bottom portion 12*c* and 22*c* are later at least partially formed from the lower portions of the first oxide layer 71 next to the first and second conductive regions 16 and 26, respectively. Further, the first and second conductive region 16 and 26 are typically formed by CVD and back-etching of highly doped poly-Si. Thereafter, a $Si_3N_4$ mask 92 is formed by providing a nitride layer overlying the first oxide layer 71, using e.g., CVD and subsequent structuring of the nitride layer. The resulting structure 100 is illustrated in FIG. 50. The $Si_3N_4$ mask 92 is used to protect the second trench 20 against the subsequent etching of the first oxide layer 71. This etching process results in exposing the upper surface of the first conductive regions 16 and the side walls of the first trenches 10 in an upper portion as illustrated in FIG. 51. This also leads to the formation of first insulating bottom portion 12*c* in the lower portion of the first trenches 10. Now a first insulating portion 12*a* can be formed by thermal oxidation on the side walls in the upper portion of the first trench 10. As can be seen in FIG. 52 the thermal oxidation process results in the formation of processes in the drift region 40 next to the transition regions 13 between the first insulating bottom portion 12*c* and the first insulating portion 12*a* of the first insulating region. In other words, the vertical boundaries between the mesa and the first insulating region 12, which is formed by the insulating bottom portion 12*c* and the first insulating portion 12*a*, deviates from the illustrated straight lines f. In the illustrated cross-section, the lateral process of the mesa next to the transition regions 13 is typically about the half of the lateral thickness of the first insulating portion 12*a*. The sidewalls of the second trench 20 are, however, completely protected by the remaining portions of the first oxide layer 71 and the mask 92 against thermal oxidation. Thus, during the process of performing the thermal oxidation for forming the first insulating portion 12*a* on the side walls in the upper portion of the first trench 10, the Si-substrate forming the side walls of the second trench 20 is practically not oxidized. Thereby, the formation of a process in the mesa close to second trench 20 can be avoided.

During thermal oxidation, third insulating portions 12*b* are typically also formed on the first conductive regions 16. Typically, the third insulating portions 12*b* are thicker than the first insulating portions 12*a* in the direction of the oxide growth. This is because the growth rate of the thermal oxide is higher for highly doped poly-Si used as material of the conductive regions 16 compared to the weaker doped silicon of the drift region 40.

Figure 53:
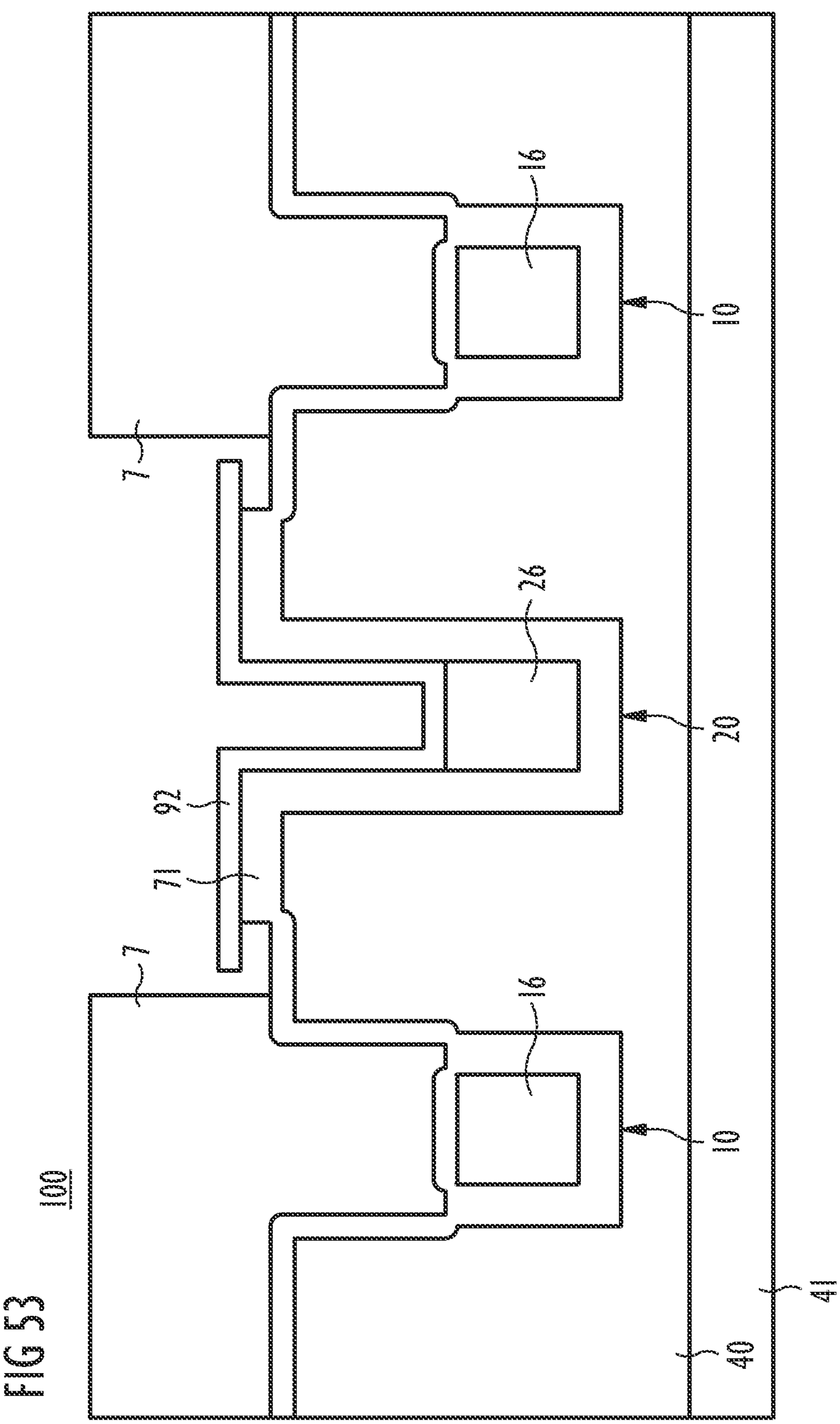
Figure 54:
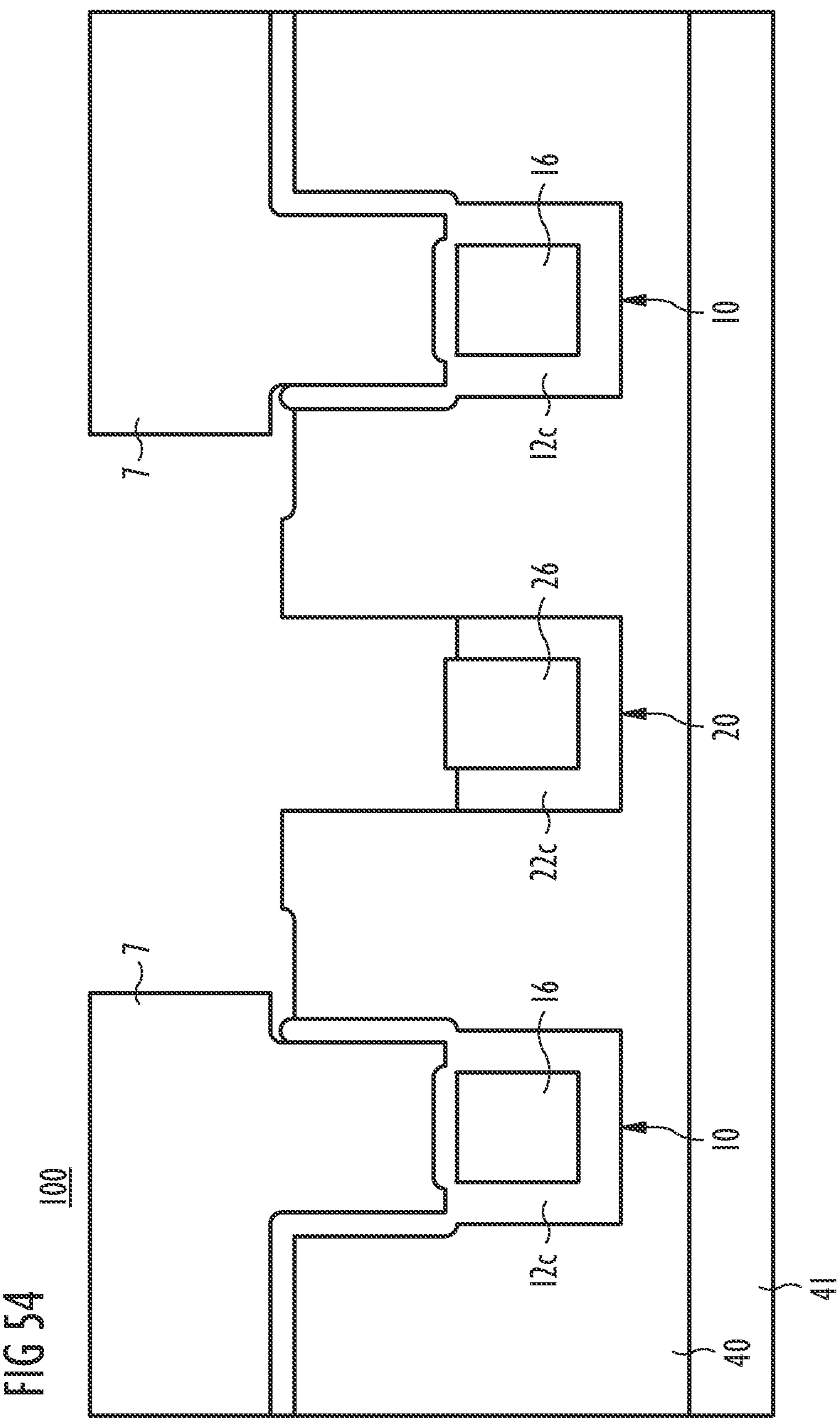
Figure 55:
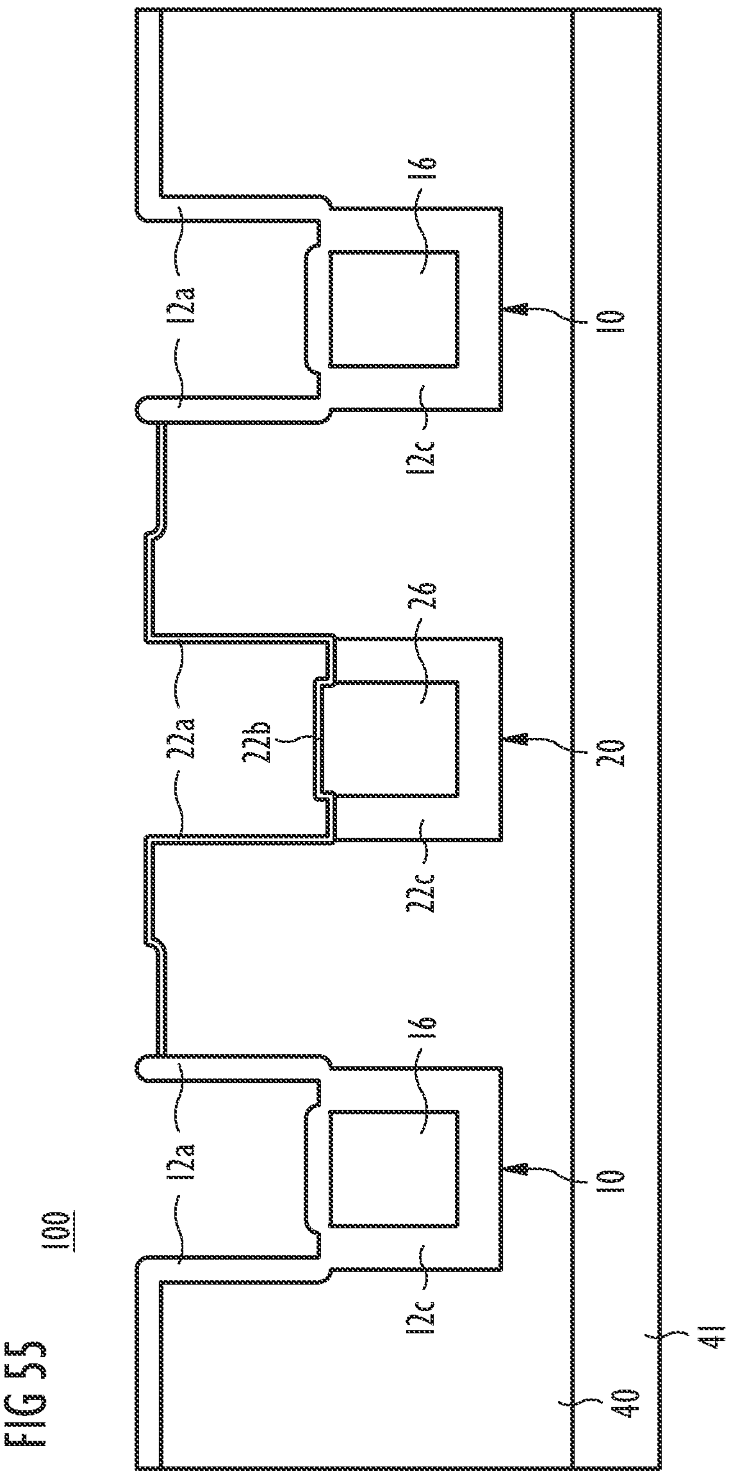

Thereafter, the first trenches 10 are masked and subsequently an etching process is performed to expose the upper portion of the second trench 20. FIG. 53 illustrates in addition to FIG. 52 a photolithographically structured mask 7, which protects the first trenches 10. FIG. 54 illustrates the structure 100 after a HF-dipping and an isotropic plasma etching to remove the $Si_3N_4$ mask 92 and the exposed oxide. Thereby, the upper surface of the second conductive regions 26 and the side walls of the second trenches 20 are exposed in the upper portions the second trenches 20. Thereafter, the mask 7 is removed and a second insulating region 22*a* is formed on the side walls in the upper portion of the second trench 20 by thermal oxidation as illustrated in FIG. 55. Alternatively and/or in addition, a dielectric material such as $Si_3N_4$, $SiO_xN_y$ or $HfO_2$ may be deposited on the side walls in the upper portion of the second trench 20 to form the insulating portion 22*a*.

Typically, the second insulating portion 22*a* is formed such, that it has a higher dielectric constant and/or lower thickness in the lateral direction of the cross-section illustrated in FIG. 55 than the first insulating portions 12*a*.

In addition, a fourth insulating portion 22*b* is typically formed during formation the second insulating portions 22*a*. The thickness of the fourth insulating portions 22*b* in the vertical direction may be adjusted e.g., by deposition of further dielectric material such that a later formed second gate electrodes 21 extends e.g., 50 nm or 100 nm less deep into the drift region 40 than a later formed first gate electrode 11.

Typically, the upper surface of the mesas adjoining the second trench 20 is also covered with a dielectric layer which was also formed during the process of forming the insulating portions 22*a*.

Figure 56:
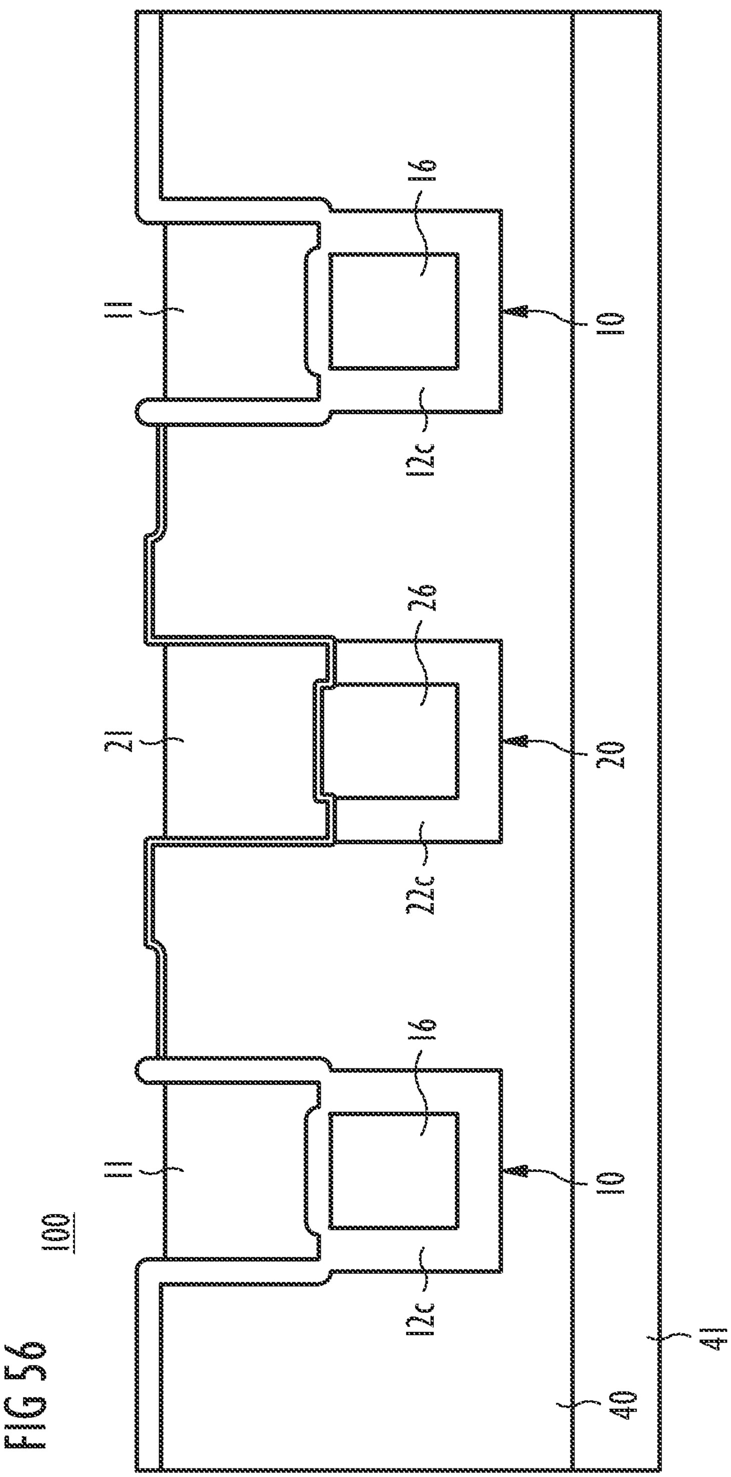

Subsequently, highly doped poly-Si is deposited and etched back to fill the first and second trenches 10 and 20 at least partially. Thereby, first and second gate electrodes 11 and 21 are formed in the upper part of the first trench 10 and second trench 20, respectively. The resulting semiconductor device structure 100 is illustrated in FIG. 56.

Typically, the minimum distance between the first field plate 16 and the first gate electrode 11 is larger than the minimum distance between the second field plate 26 and the second gate electrode 21.

Thereafter, a source region 80 and an adjoining body region 50 are formed by ion implanting. A source metallization 60 at least in contact to the source region 80 and the second gate electrode 21 is formed using standard techniques. At least a part of the typically formed dielectric layer on top of the mesas adjoining the second trench 20 is typically removed, e.g., by etching, prior to depositing the source metallization 60.

Figure 57:
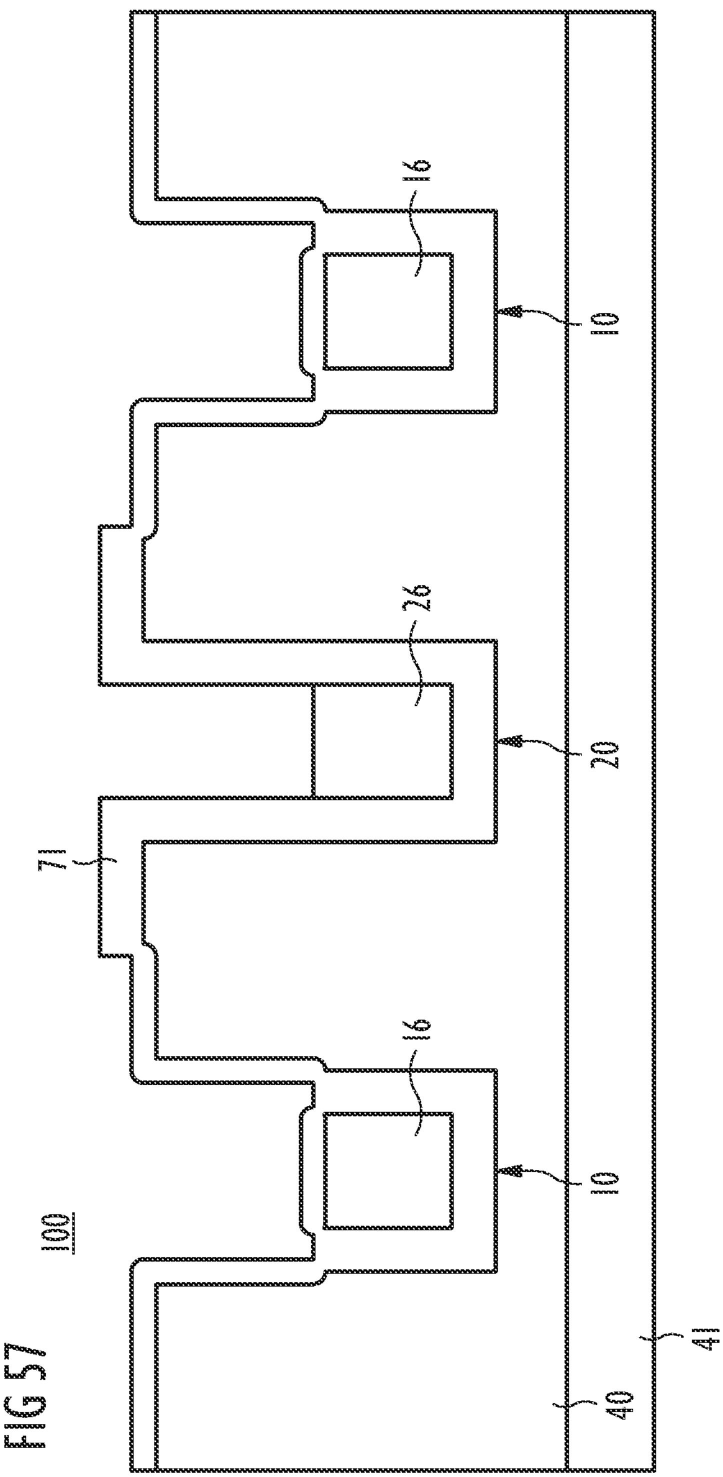
FIGS. 57-58 illustrate a further manufacturing method for forming a semiconductor device according to certain embodiments.
Figure 58:
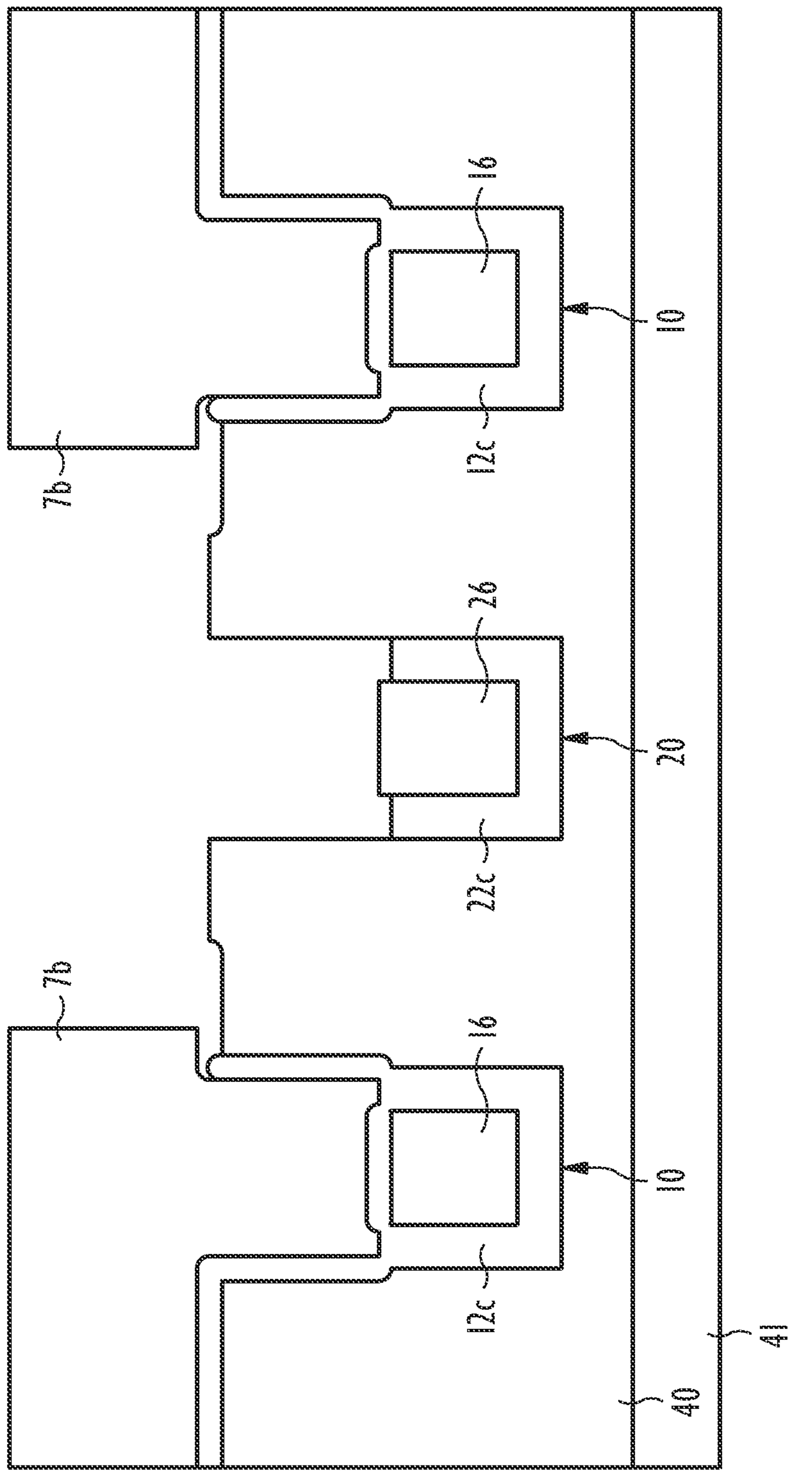

The second embodiment for forming a field plate trench semiconductor device 100 includes the same initial process processes which result in the semiconductor structure illustrated in FIG. 52. Thereafter, a HF-dipping and an isotropic nitride etching e.g., with hot phosphoric acid are performed to remove the $Si_3N_4$ mask 92 as illustrated in FIG. 57. A photolithographically structured mask 7*b* which protects the first trenches 10 is formed on the semiconductor structure 100. Subsequently, the oxide layer is etched back to expose an upper portion of the second trench 20. The resulting structure 100 is illustrated in FIG. 58. Thereafter, the mask 7*b* is removed and a typically thin second insulating region 22*a* is formed on the side walls in the upper portion of the second trench 20 by a thermal oxidation process or by a CVD process. Thus a similar semiconductor structure as already illustrated in FIG. 55 is obtained. Again, the second insulating region 22*a* may have a higher effective permittivity than the first insulating region 12*a*.

The subsequent manufacturing processes for forming a field plate trench semiconductor device are in accordance with the manufacturing processes which have been explained above with respect to FIG. 56.

Figure 59:
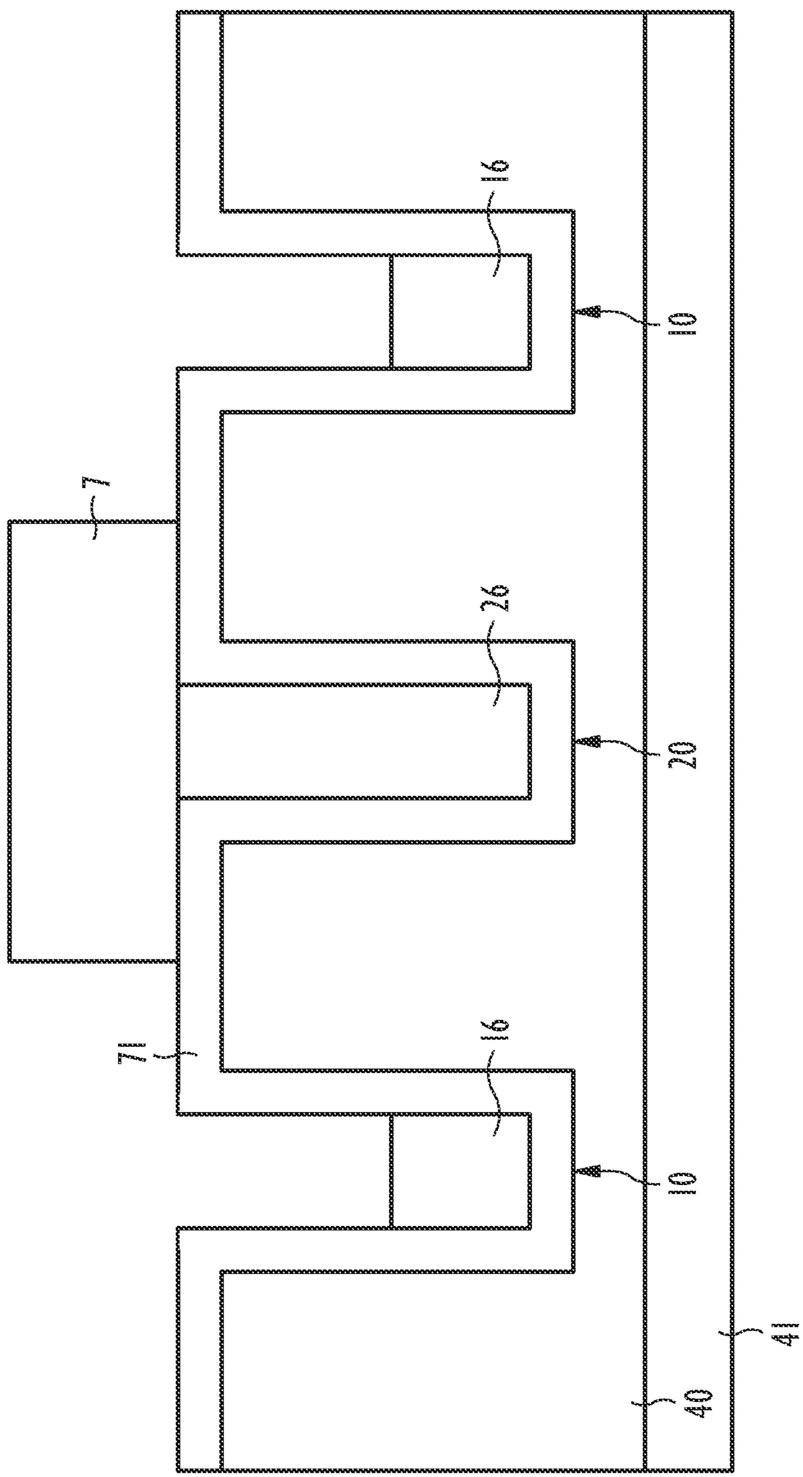
Figure 60:
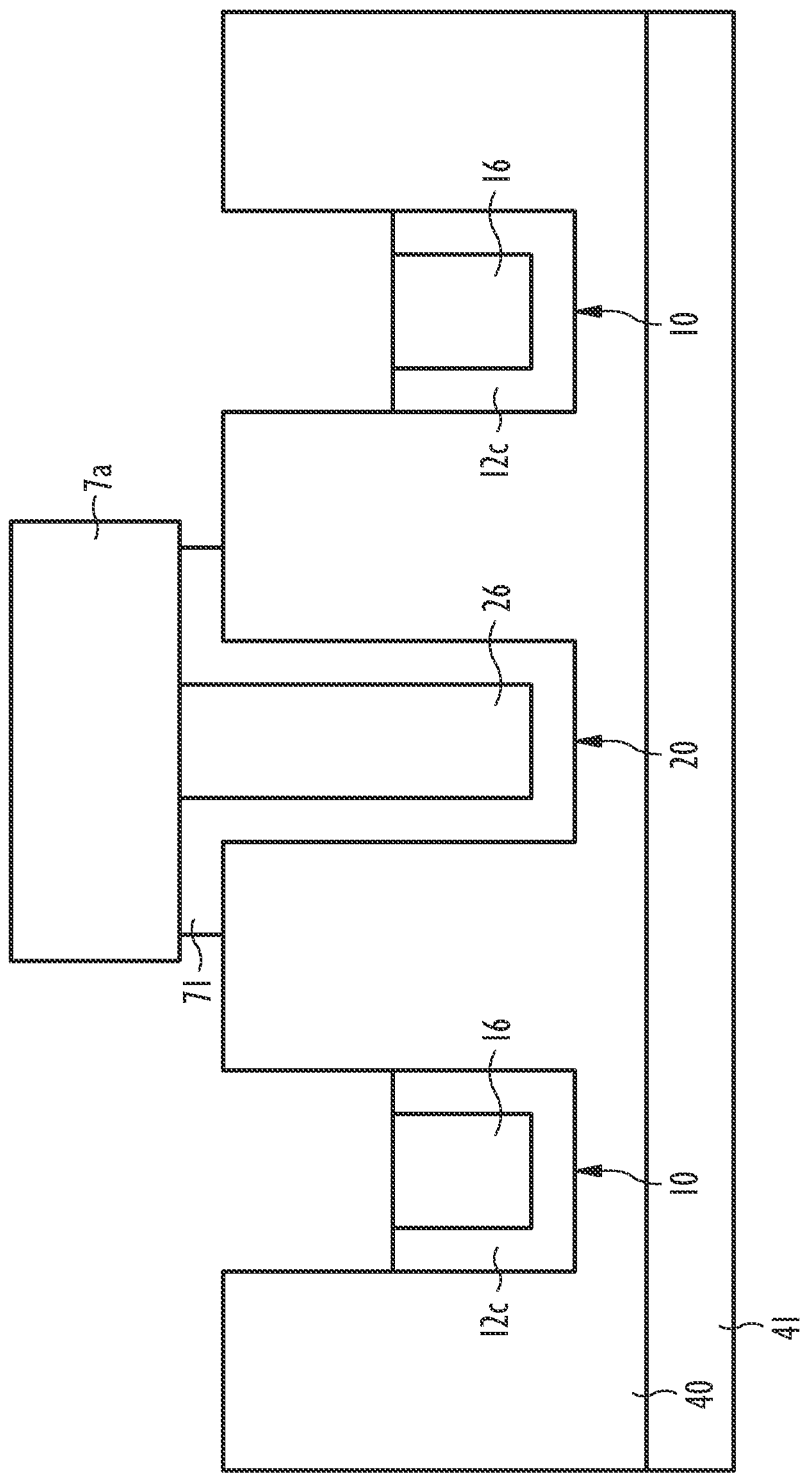
Figure 6I:
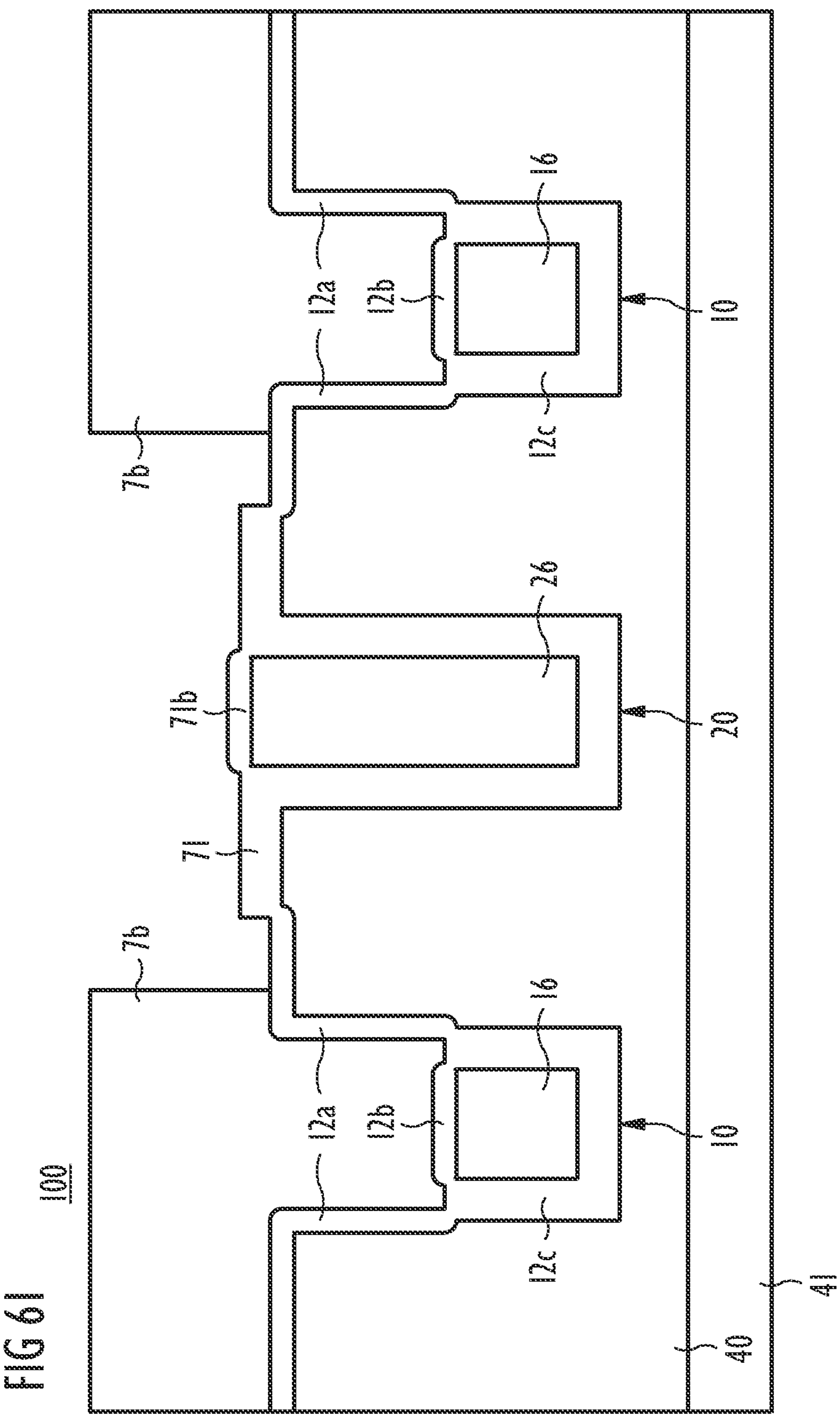

With respect to FIGS. 59 to 63 a further embodiment for forming a field plate trench semiconductor device will be explained. FIG. 59 illustrates the structure 100 after providing an n-type Si-substrate with a drift region 40 and a higher doped drain region 41 and after further processes including etching of at least a first trenches 10 and at least a second trench 20 into the semiconductor substrate, forming a first oxide layer 71 on the semiconductor substrate such that the walls of the first and second trench 10 and 20 are also covered and forming first conductive region 16 in a lower portion of the first trench 10 and a second conductive region 26 in a lower portion of the second trench 20. Typically, first and second conductive regions 16 and 26 are formed by the following subsequent processes: CVD of highly doped poly-Si, masking the second trench 20 with a first photolithographically structured mask 7, and back-etching of highly doped poly-Si. Thereafter, the first photolithographically structured mask 7 used for protecting the second trench 20 during the back etching of the poly-Si is removed. A second photolithographically structured mask 7*a* is formed to protect the second trench 20 during the subsequent etching of the first oxide layer 71. The resulting structure 100 is illustrated in FIG. 60. The second photolithographically structured mask 7*a* is removed and a thermal oxidation process is performed to form insulating portions 12*a* on the side walls of the upper part of the first trenches 10. During thermal oxidation process the sidewalls of the second trench 20 are completely protected against thermal oxidation by the remaining portions of the first oxide layer 71 and the highly doped poly-Si in the second trench 20. In parallel, third insulating portions 12*b* on the upper surface of the first conductive regions 16 are formed and the first insulating region 71 is closed by a formed insulating portion 71*b* on the second conductive region 26 as indicated in FIG. 61. In other words, the second trench 20 is completely filled with the first oxide layer 71 and the second conductive region 26 during the thermal oxidation process for forming the first and third insulating portions 12*a* and 12*b* of the first insulating region 12.

Figure 62:
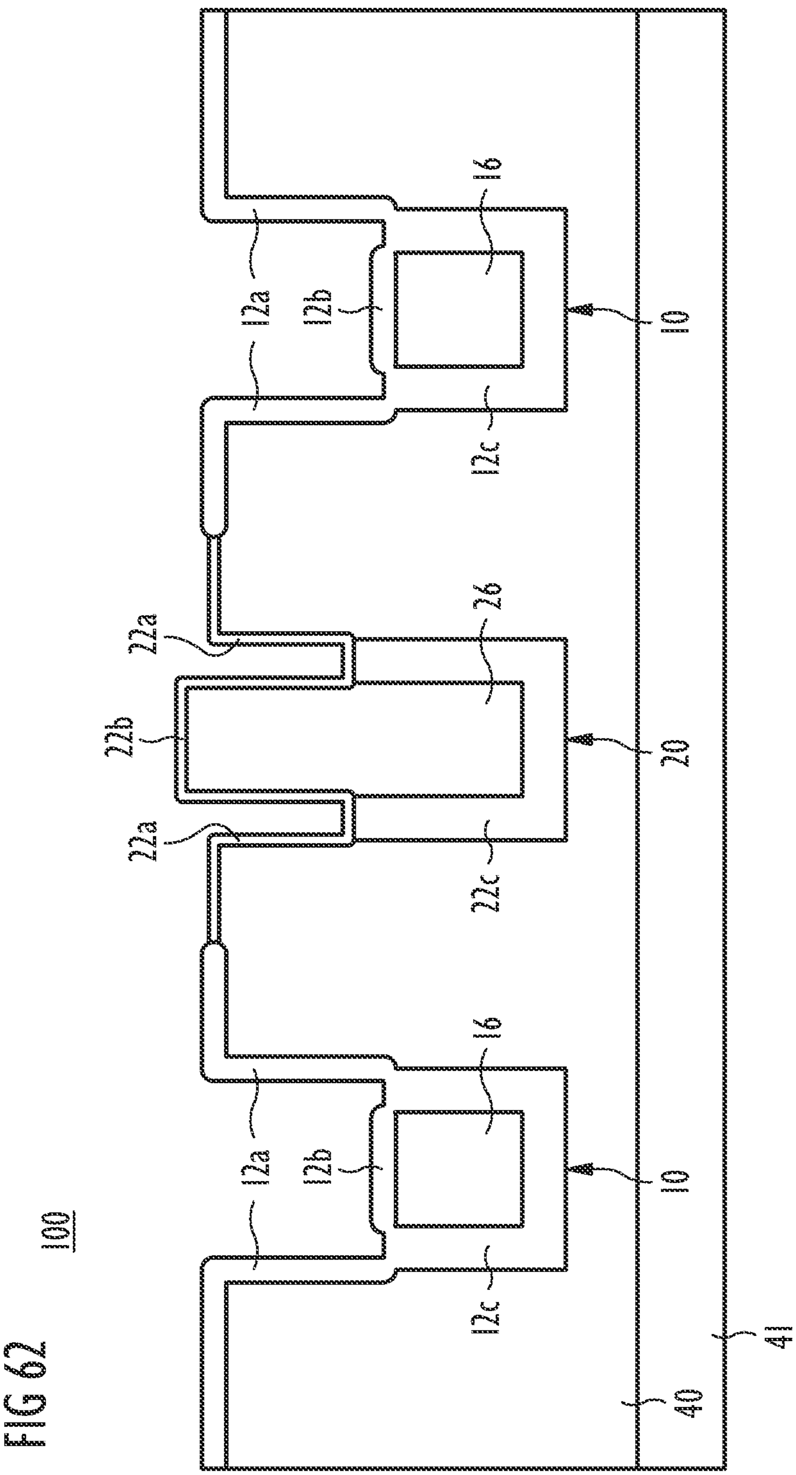
Figure 63:
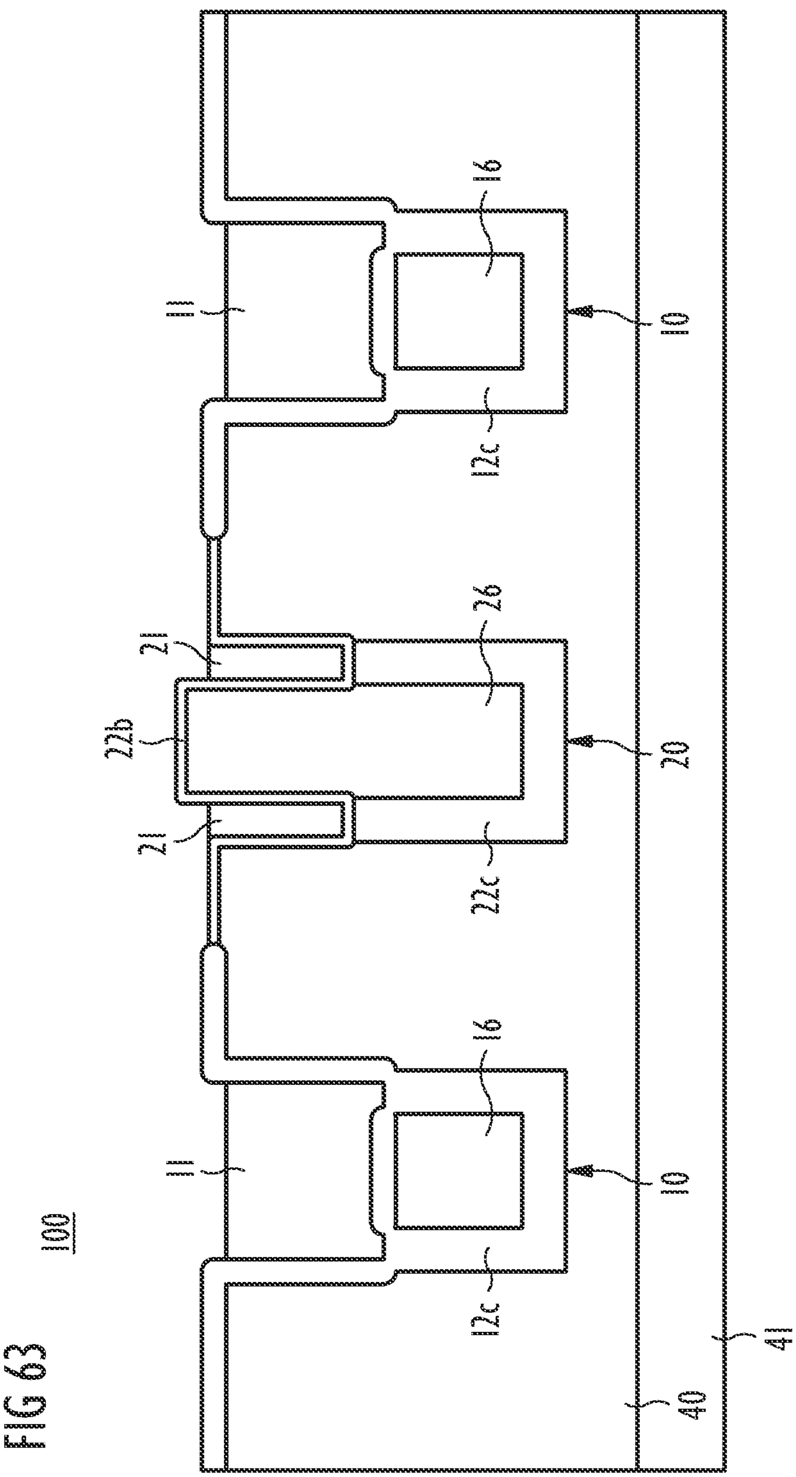

FIG. 61 further illustrates a photolithographically structured mask 7*b* which protects the first trenches 10 during the subsequent process of disposing an upper portion of the second trench 20 by etching the oxide layer. Thereafter, the mask 7*b* is removed, and second insulating portions 22*a* on the side walls of the upper portion of the second trench 20 are formed by a further thermal oxidation process and/or by CVD. In parallel, fourth insulating portions 22*b* are typically formed on the exposed surfaces of the second conductive regions 26 as indicated in FIG. 62. Further, the fourth insulating portions 22*b* may also be formed on the second insulating bottom portion 22*c*, e.g., by CVD. Thereafter, first and second gate electrodes 11 and 21 are formed by deposition of e.g., highly doped poly-Si and subsequent back etching of the deposited poly-Si. In the cross-section of the structure 100 illustrated in FIG. 63, the second gate electrode is not simply connected. Further, the first gate electrodes 11 extends deeper into the drift region 40 than the second gate electrodes 21. Typically, the first gate electrodes 11 extend more than 50 μm, e.g., 100 μm, deeper into the drift region 40 than the second gate electrodes 21. The subsequent manufacturing processes for forming a field plate trench semiconductor device are again similar to those explained with respect to FIG. 56.

Figure 64:
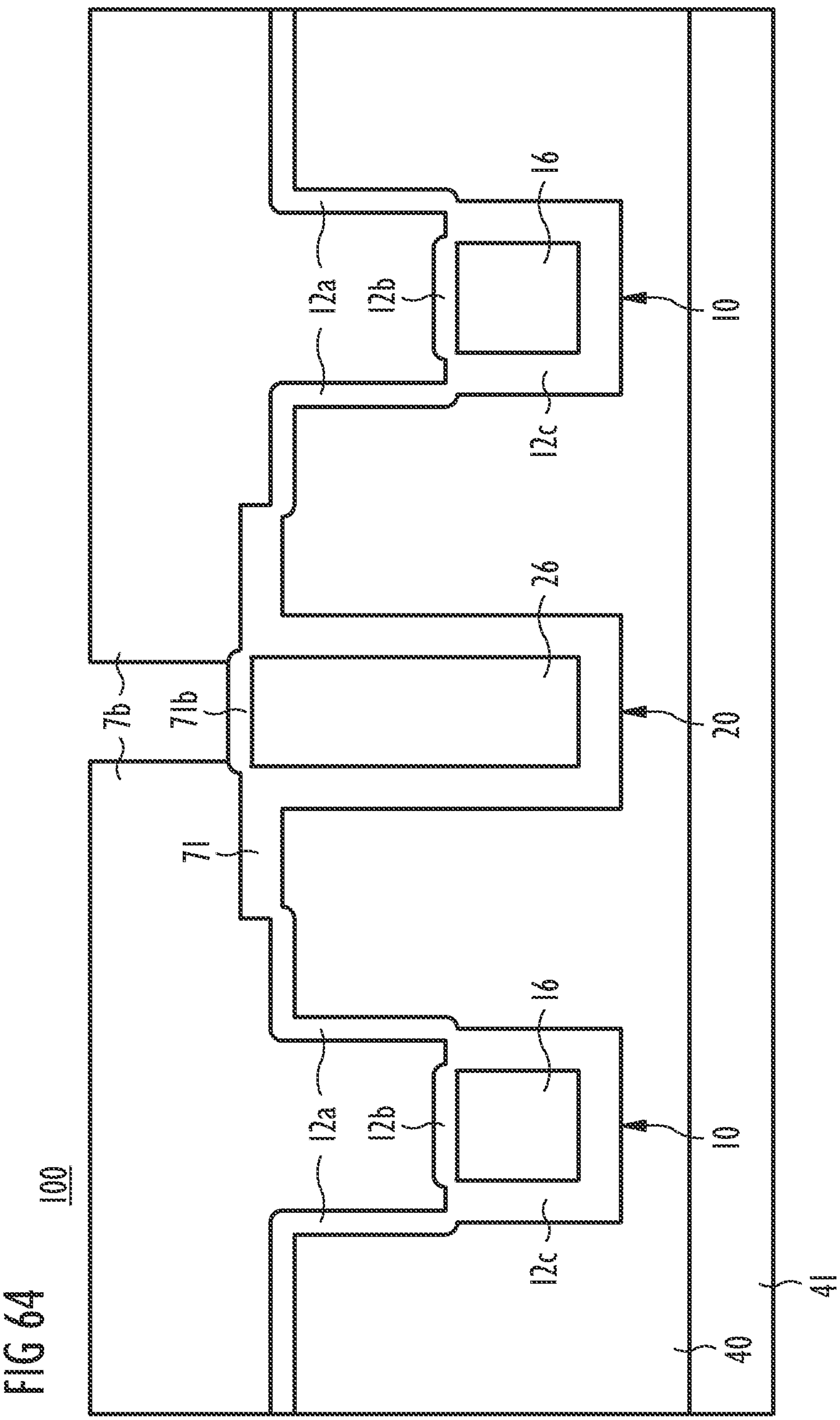
FIGS. 64-68 illustrate a further manufacturing method for forming a semiconductor device according to certain embodiments.
Figure 65:
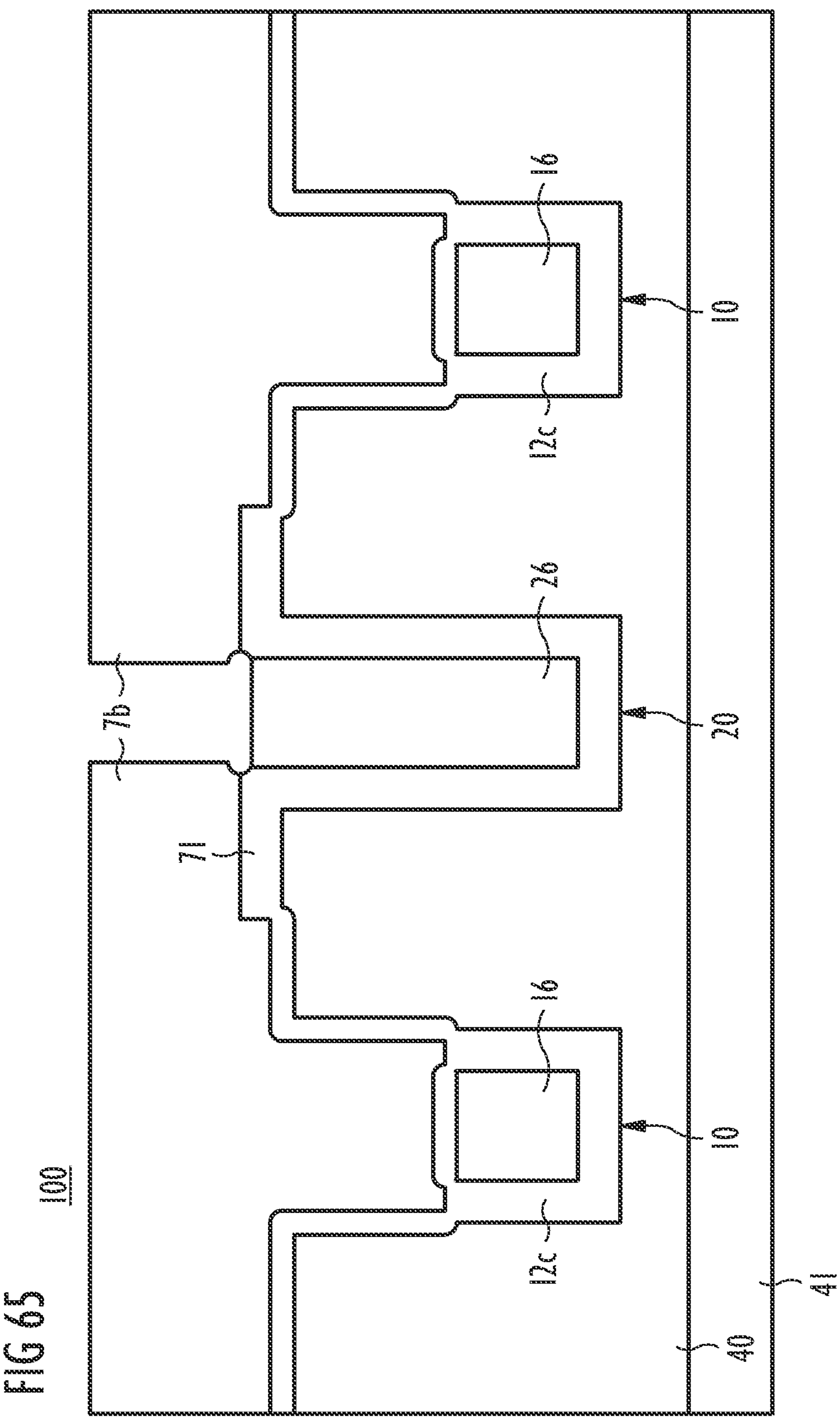
Figure 66:
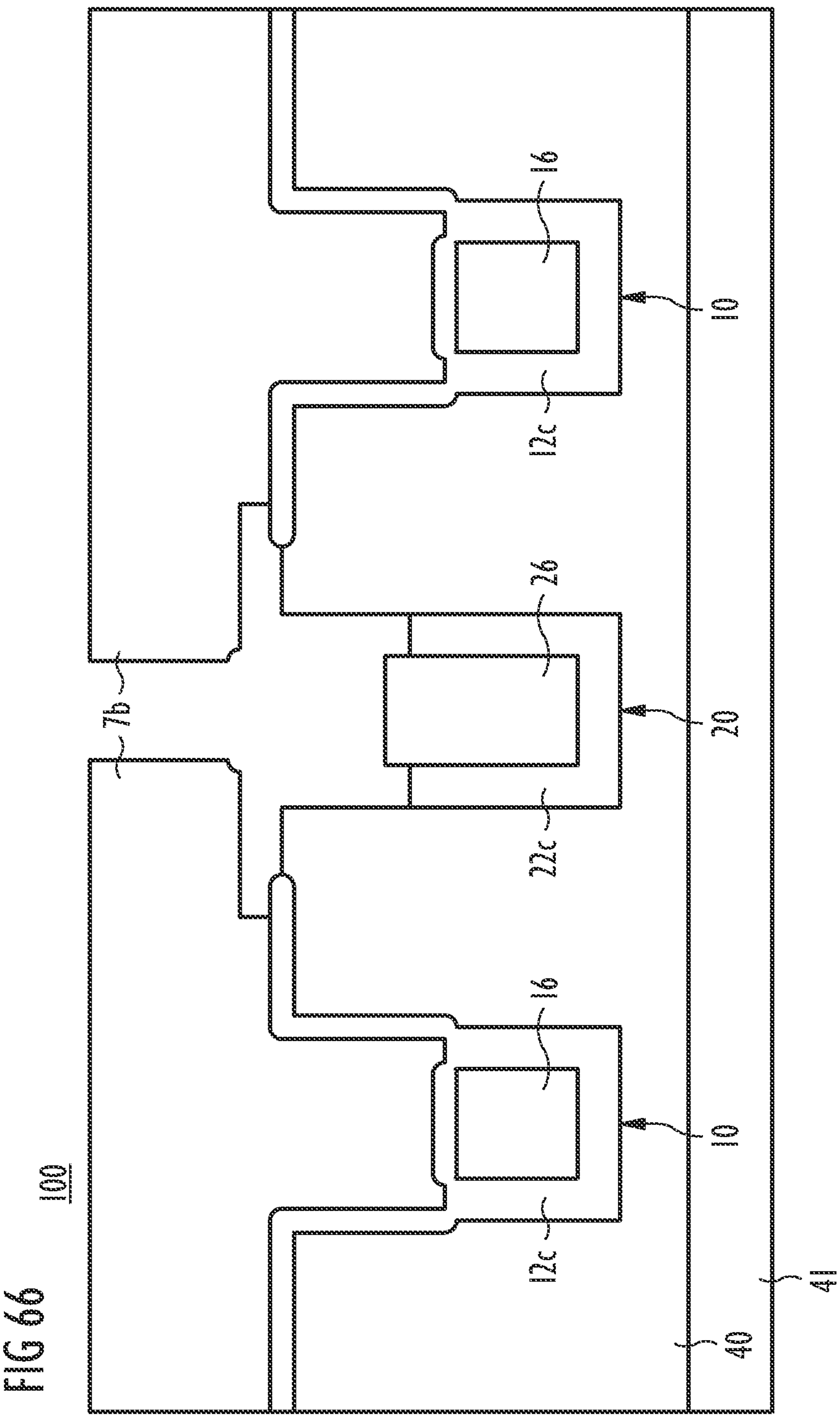
Figure 67:
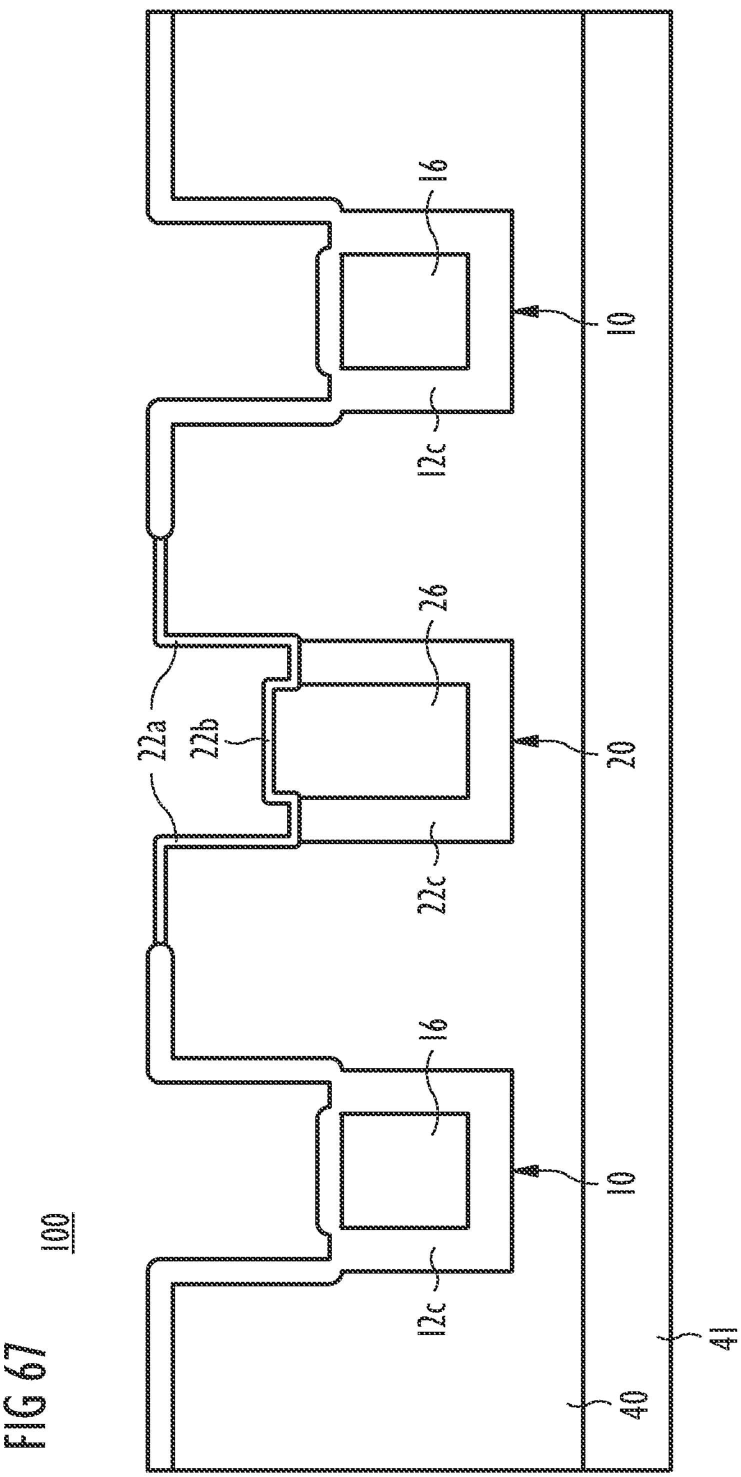
Figure 68:
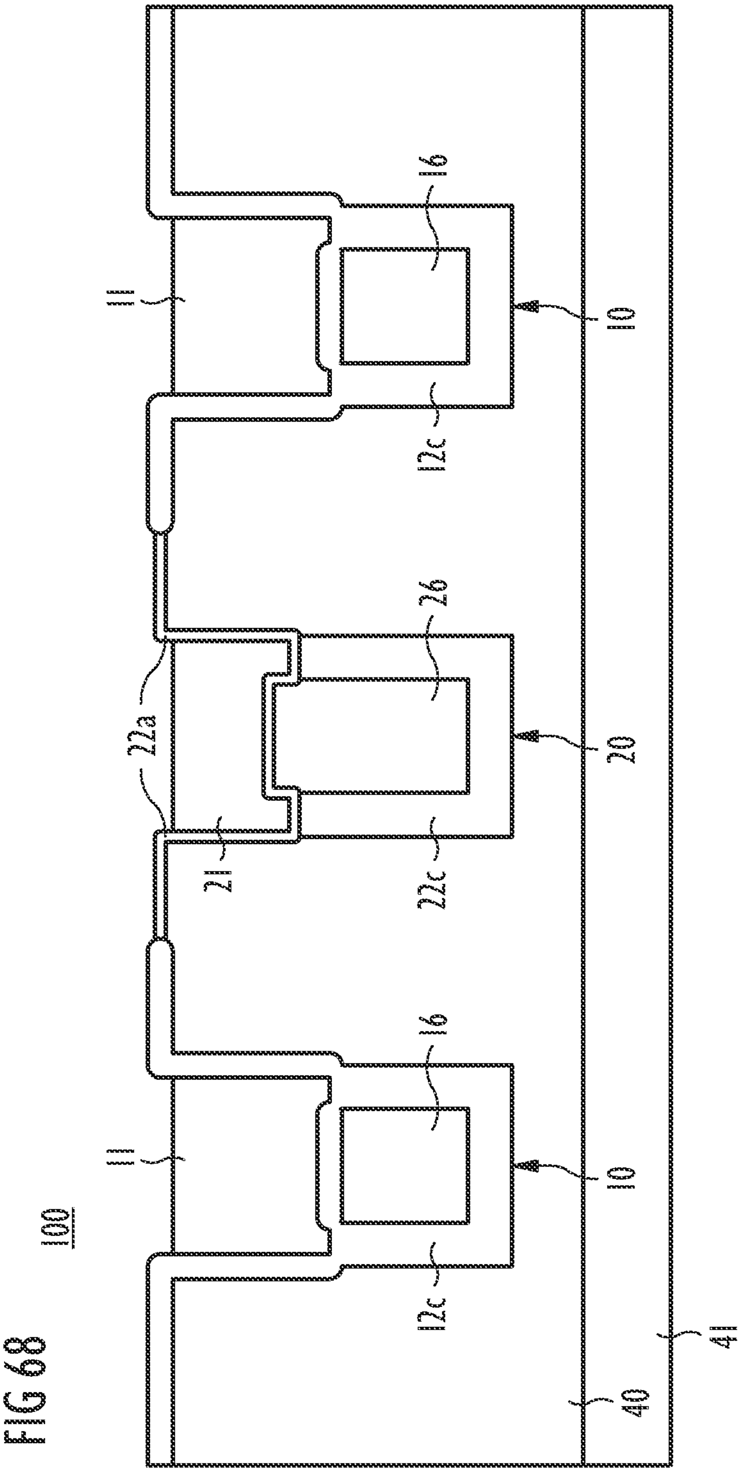
Figure 69:
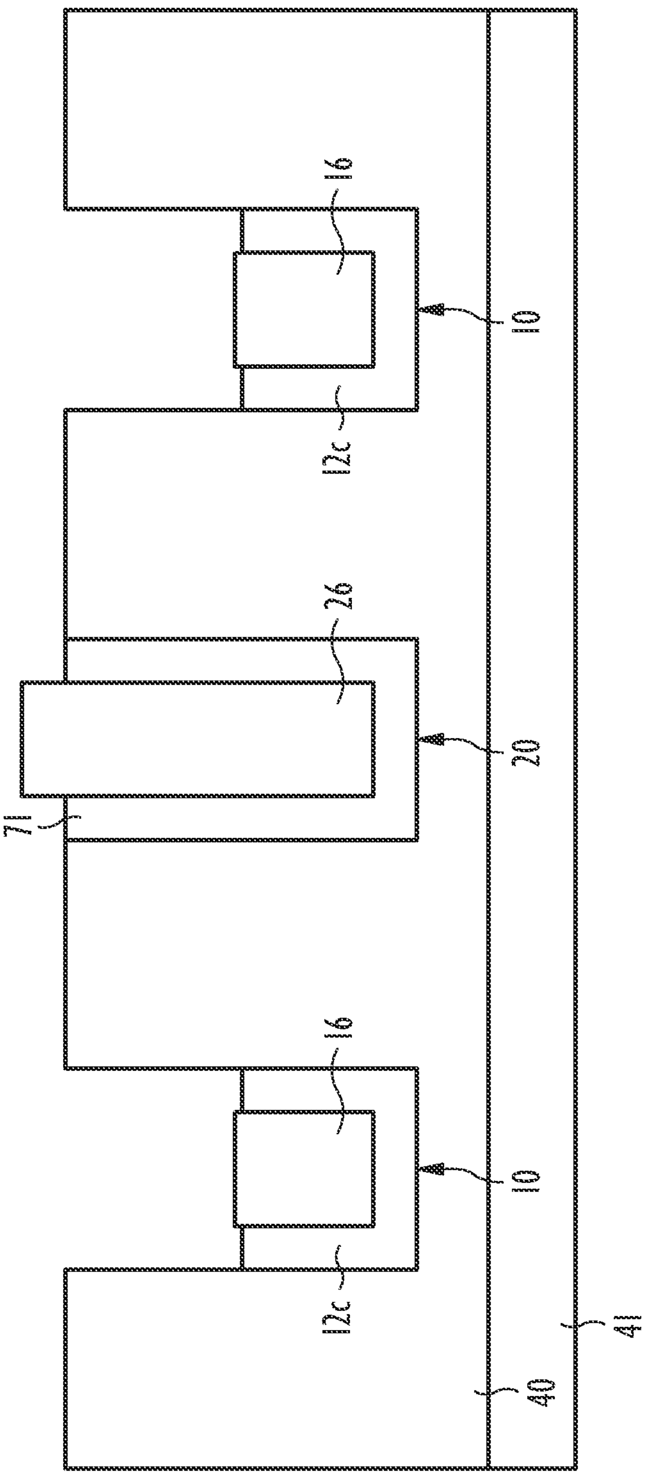

The fourth embodiment for forming a field plate trench semiconductor device is similar to the previous method up to the processes resulting in the structure 100 of FIG. 61. However, the mask 7*b*, which protects the first trenches 10, has, in the illustrated cross-section of FIG. 64, a smaller opening above the second trench 20. In FIG. 64 the opening only exposes the insulating portion 71*b* of the first oxide layer 71 above the second conductive region 26. Subsequently, an oxide etching process is performed to remove the insulating portion 71*b* as illustrated in FIG. 65. Thereafter, the poly-Si in the second trench 20 is etched back followed by a further oxide etching process to expose an upper part of the second trench 20. This is illustrated in FIG. 66. Subsequently, the photolithographically structured mask 7*b* is removed. A further thermal oxidation process and/or a further CVD process is performed to form second insulating portions 22*a* on the side walls of the upper part of the second trench 20 and fourth insulating portions 22*b* on an upper surface of the second conductive regions 26. This results in a semiconductor structure as illustrated in FIG. 67. Thereafter, first and second gate electrodes 11 and 21 are formed by deposition of e.g., highly doped poly-Si and subsequent back etching of the deposited highly doped poly-Si. This is illustrated in FIG. 68. The subsequent manufacturing processes for forming a field plate trench semiconductor device have already explained with respect to FIG. 56.

Figure 70:
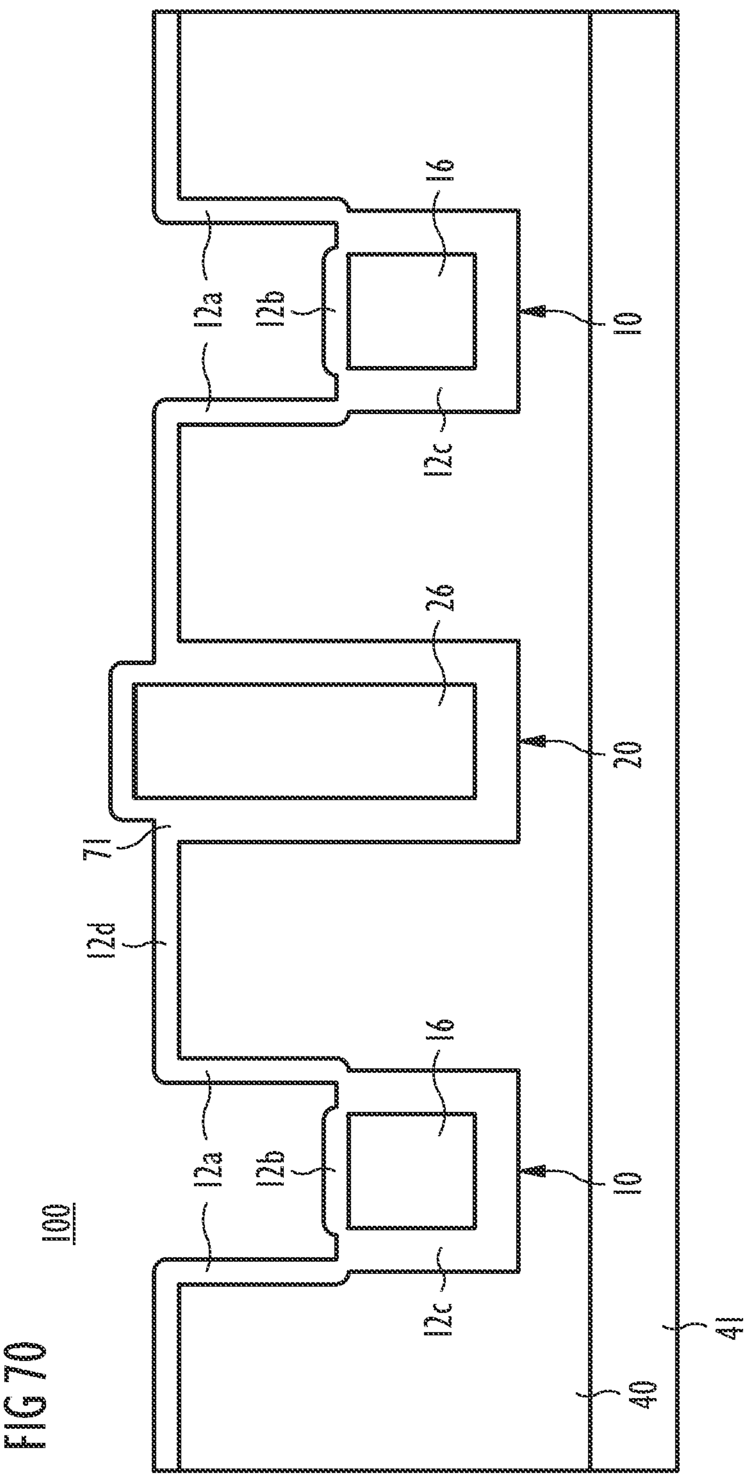
Figure 7I:
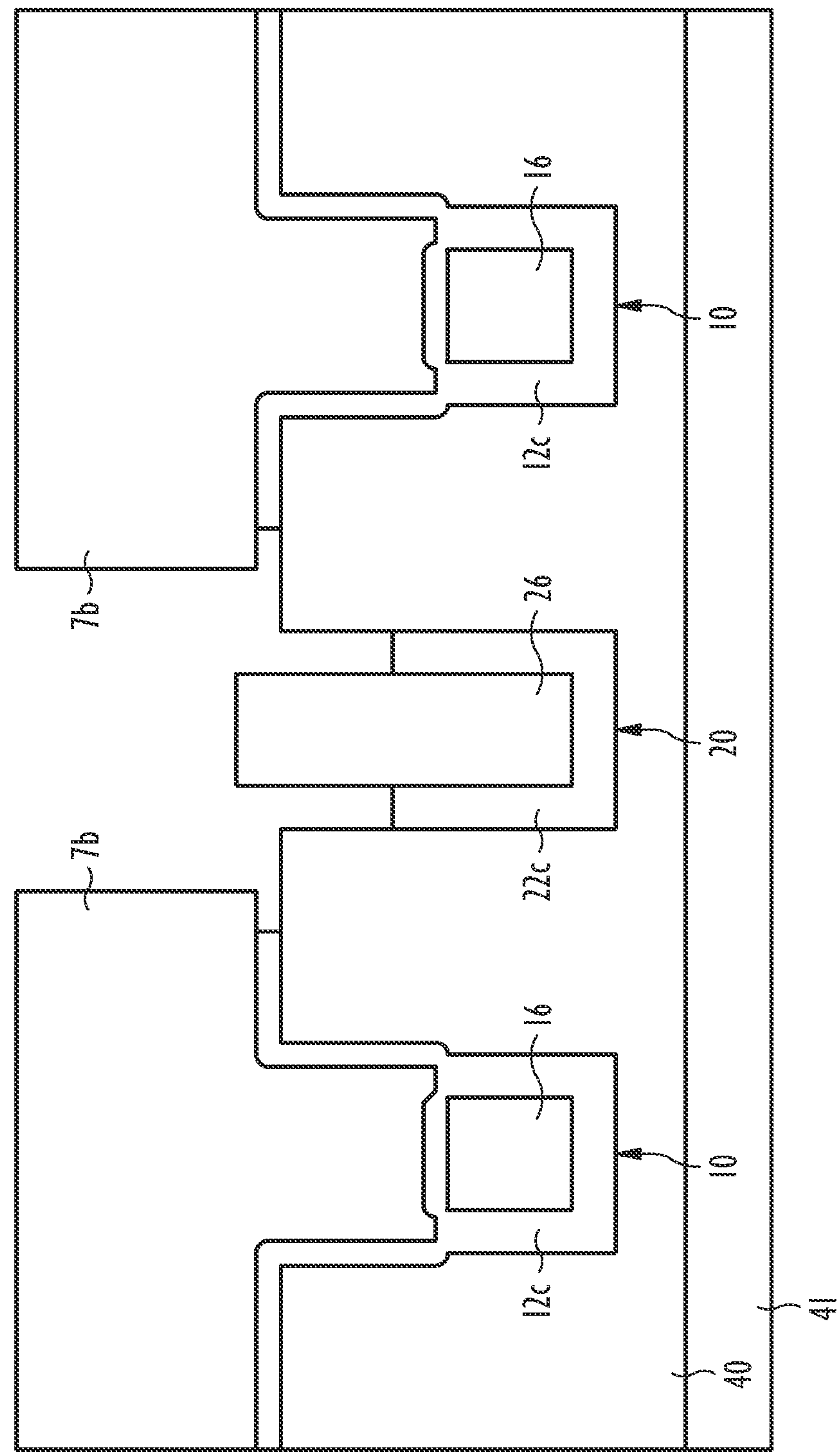
Figure 72:
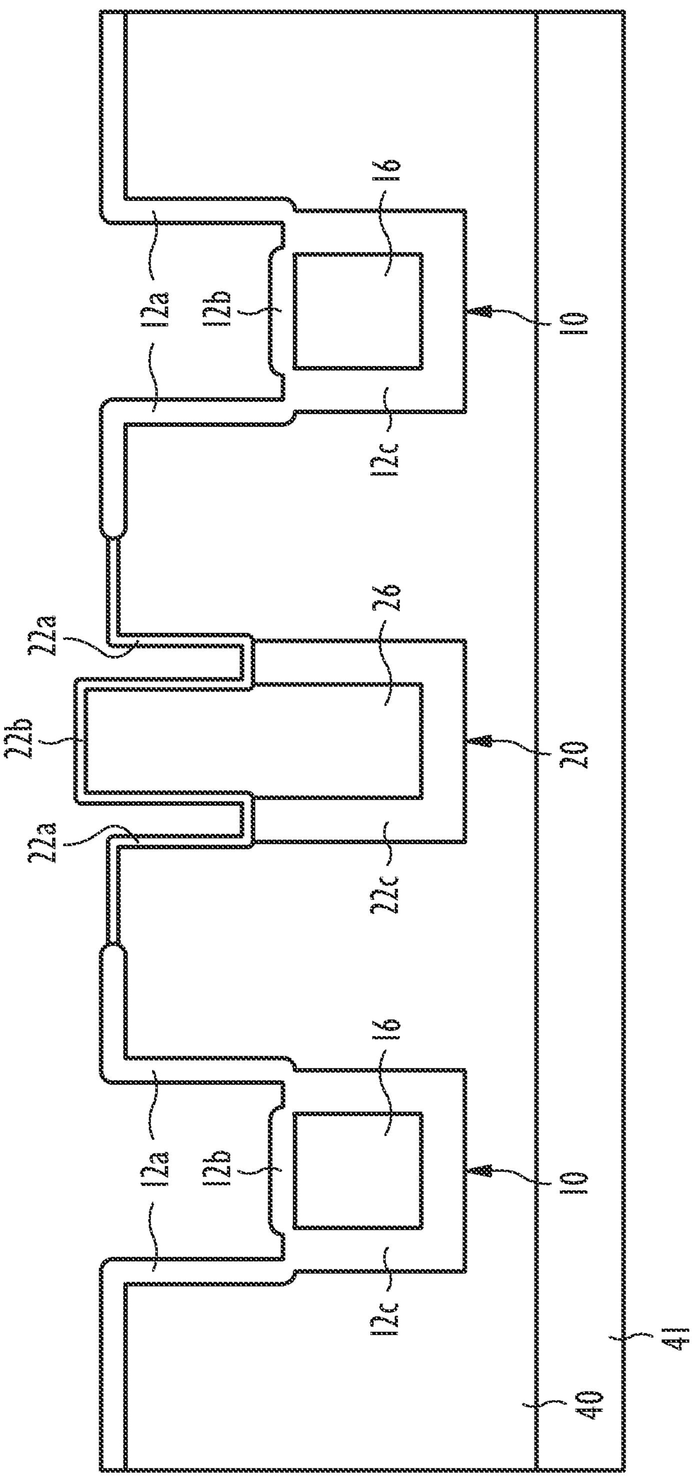
Figure 73:
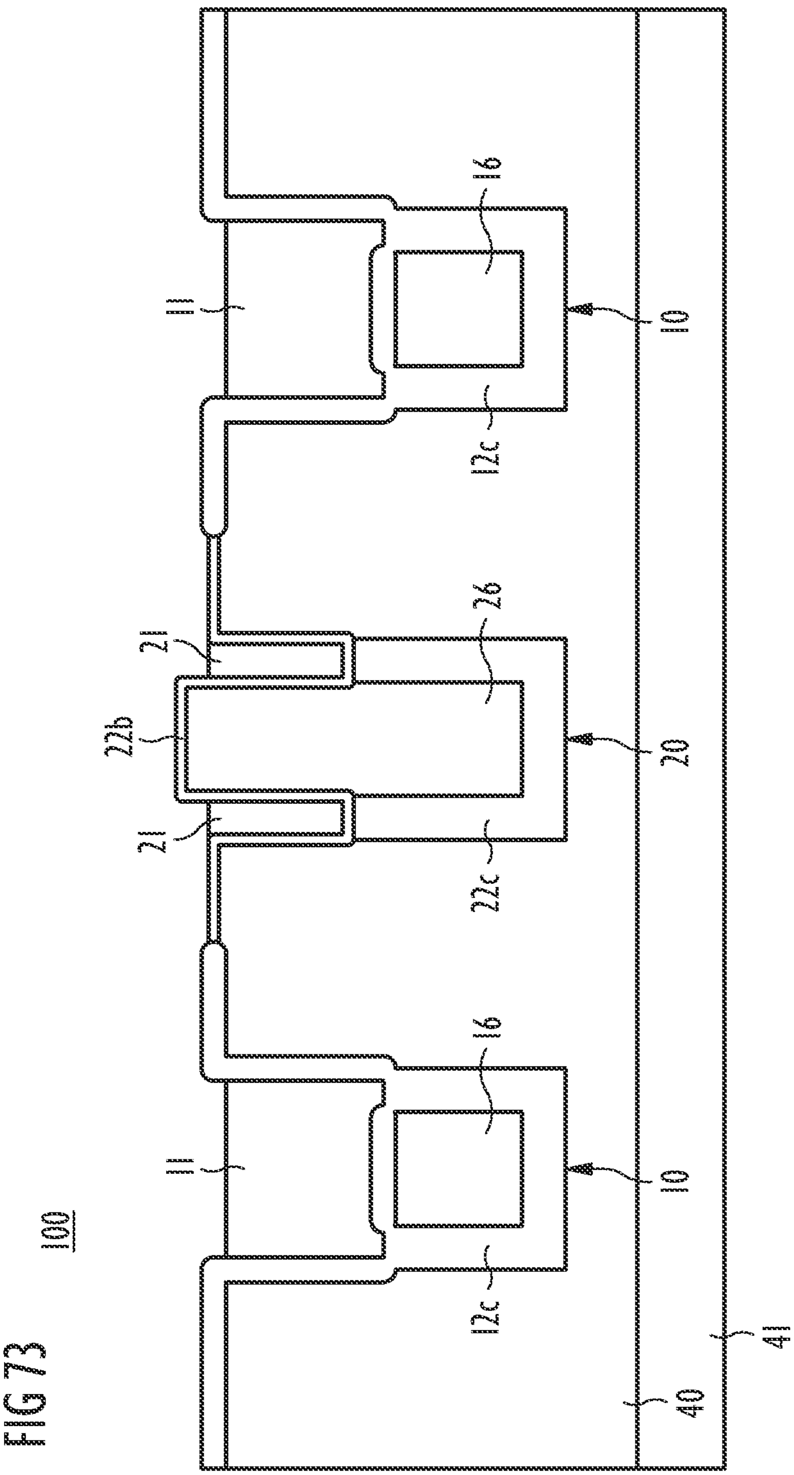

The fifth embodiment for forming a field plate trench semiconductor device 100 include the same initial process processes resulting in the semiconductor structure 100 illustrated in FIG. 59. Thereafter, the first mask 7 is removed and the first oxide layer 71 is etched back. This results in the semiconductor structure 100 of FIG. 69. A thermal oxidation is carried out for forming first insulating portions 12*a* on the side walls in the upper portion of the first trenches 10 as illustrated in FIG. 70. During the thermal oxidation process the sidewalls of the second trench 20 are completely protected against thermal oxidation by the remaining portions of the first oxide layer 71 and the highly doped poly-Si in the second trench 20. In parallel, an oxide layer 12*d* is formed on an upper surface of the mesas and the second conductive region 26. A photolithographically structured mask 7*b* is formed, which protects the first trenches 10 during the subsequent process of disposing an upper portion of the second trench 20 by etching the oxide layer 12*d* and back-etching of the first oxide layer 71. After subsequent removing of mask 7*b*, second insulating portions 22*a* are formed by a further thermal oxidation process and/or by CVD on the side walls of the upper portion of the second trench 20. In parallel, fourth insulating portions 22*b* are typically formed on the upper surface of the second conductive regions 26 and on the second insulating bottom portion 22*c* as indicated in FIG. 72. Thereafter, first and second gate electrodes 11 and 21 are formed by deposition of e.g., highly doped poly-Si and subsequent back-etching of the deposited highly doped poly-Si as illustrated in FIG. 73. The subsequent manufacturing processes for forming a field plate trench semiconductor device are similar to those explained with respect to FIG. 56.

Figure 74:
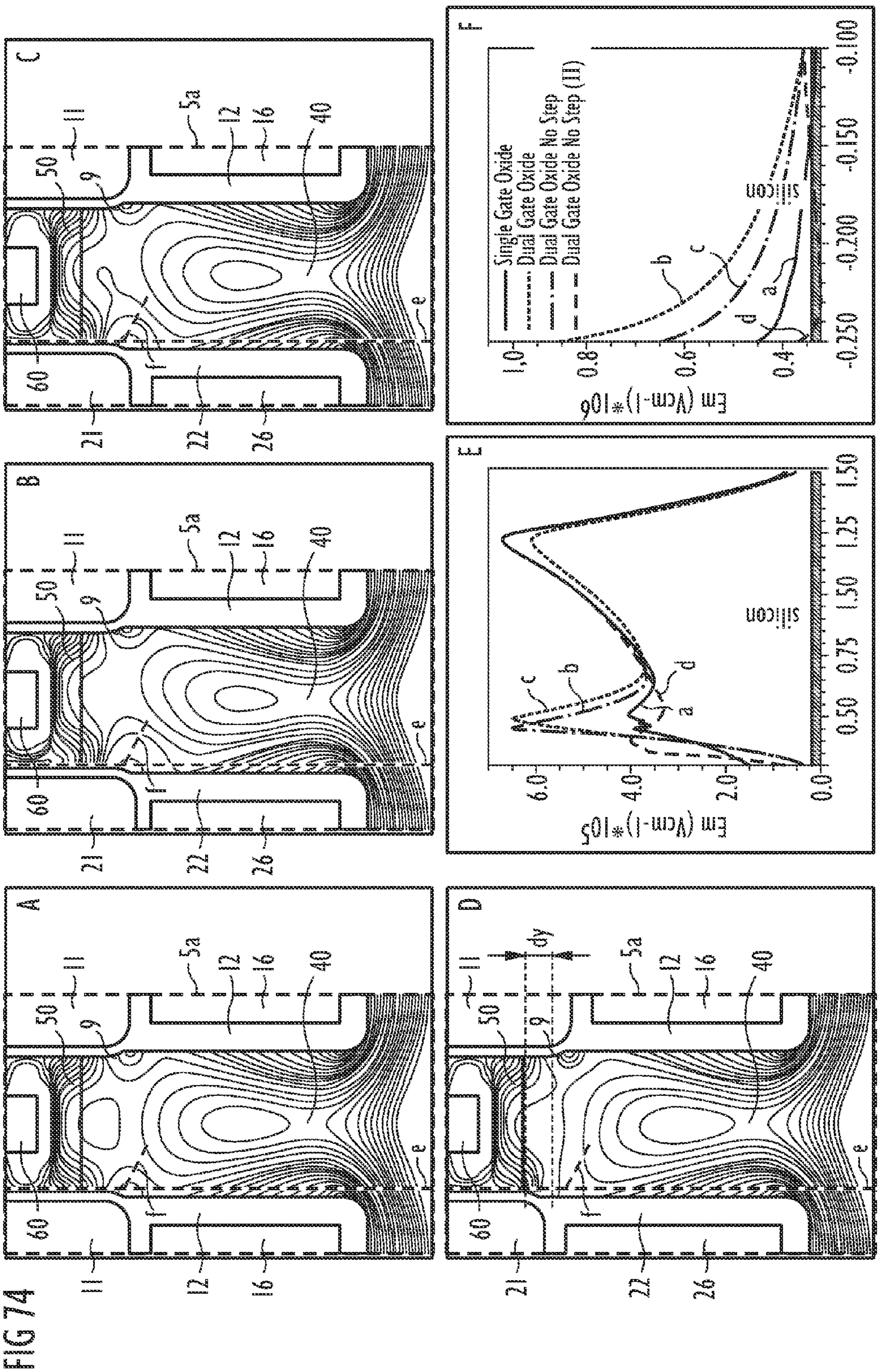
FIGS. 74A-F illustrate numerical simulations for semiconductor devices according to certain embodiments.

Referring now to FIG. 74, the improved performance of the semiconductor devices 100, which are produced in accordance with the above described embodiments for forming a field plate trench semiconductor device, will be explained. During reverse mode and higher load, the semiconductor devices 100 may be driven into an Avalanche mode. An Avalanche process during reverse mode may result in entrapment of charges in the gate oxide or gate insulation. This is likely to change the characteristics such as forward voltage drop of the semiconductor device in forward mode. Therefore, it is desirable to avoid high field strength close to a thin gate oxide. FIGS. 74A-D illustrate the magnitude of the electric field as an overlay of a contour plot and a density plot (darker regions correspond to higher electric field magnitudes) with linear scaling in reverse mode. Vertical cross-sections through four different devices are compared. Each of the sections 5*a* includes a mesa and the half of the respective adjoining trenches. For the simulation, a vanishing current was assumed at the illustrated lateral boundaries. At the lower and the upper vertical boundary the electric potential is fixed to drain potential and source potential, respectively. The voltage difference between drain and source was $V_{DS}$=30V. Further, the upper boundary of the sections 5*a* goes through the interface between the body region 50 and the source region 80. FIG. 74A illustrates the electric field magnitude between two equal MOSFET field-effect structures having a 35 nm thick $SiO_2$ gate oxide between the body region 50 and the respective gate electrode 11. This structure is also referred to as single gate oxide structure. Further, two lines e and f are drawn. They cross close to the left process of the mesa adjoining the transition region of the first insulating region 12 from a first insulating portion between the gate electrode 11 and the body region 50 to a first insulating bottom portion between a first field plate 16 and the drift region 40. The first insulating bottom portion has a larger lateral extension than the first insulating portion. In other words, the transition region of the first insulating region 12 is the region next to the first gate electrode 11, in which the lateral extension, in the illustrated cross-section, of the first insulating region 12 changes. The transition regions are typically close to the transition between an essentially vertical boundary between the gate electrode 11 and the gate oxide 12 and an essentially horizontal or lateral lower boundary between the gate electrode 11 and the gate oxide 12. For clarity reasons, only one of the two processes in FIG. 74A is designated with the reference sign 9. In FIG. 74B the electric field magnitude is plotted for the mesa between a MGD on the left and a MOSFET on the right. The MGD has a 5 nm thick gate oxide between the body region 50 and the second gate electrode 21 and the MOSFET has a 35 nm thick gate oxide between the body region 50 and the first gate electrode 11. The two lines e and f cross close to the left process of the mesa adjoining the illustrated right transition region of the second insulating region 22 from the 5 nm thick portion between the gate electrode 12 and the body region 50 to a lower thicker portion. This structure is denoted in FIG. 74 as dual gate oxide structure. The structure illustrated in FIG. 74C is similar to the one illustrated in FIG. 74B, but the left process of the mesa adjoining the right transition region was avoided during manufacturing as has been explained above. Therefore, this structure is denoted in FIG. 74 as dual gate oxide no process structure. In other word, the mesa is, in the illustrated cross-section, practically straight down to a vertical depth into which the field plates 16 and 26 extend to. The structure illustrated in FIG. 74D is similar to the one illustrated in FIG. 74C, i.e., the left process of the mesa adjoining the right transition region was avoided during manufacturing. Further, the second gate electrode 21 extends not as deep into the drift region 40 as the first gate electrode 11. The first gate electrode 11 extends about 100 μm deeper into the drift region 40 compared to the second gate electrode 21. Consequently, the right transition region of the second insulating region 22 is also arranged higher by a vertical distance dy of about 100 μm. This structure is denoted in FIG. 74 as dual gate oxide no process II structure. FIG. 74E illustrates the field magnitude along the lines e from top to bottom of the lines e in the mesa. FIG. 74F illustrates the field magnitude along lines f from top left to right bottom of the lines e in the mesa. In both FIGS. 74E and 74F the curves a, b, c and d correspond to the FIGS. 74A, 74B, 74C and 74D, respectively. As can be appreciated from the heights of the first peaks of the curves illustrated in FIG. 74E and the curves in FIG. 74F the electric field magnitude in the transition region close to the thin gate oxide of the MGD can be reduced by avoiding a process in the mesa and/or by extending the first gate electrode 11 deeper into the drift region 40 than the second gate electrode 21. Thereby, the charge generation, the risk of charge entrapment in the gate oxide and the risk of latch-up of the MGD during reversed current flow and Avalanche conditions can be reduced.

With respect to FIG. 75 further embodiments will be explained. The semiconductor device 100 is illustrated in two different vertical cross-sections 110 and 120 and includes an n-type source region 80 in contact with a common source metallization 60. The cross-sections 110 and 120 may e.g. correspond to parallel sections or parts thereof through the semiconductor device 100. In this event, the cross-sections 110 and 120 correspond to two parts 110 and 120, respectively, of the semiconductor device 100 which are located behind one another in normal direction of the two cross-sections 110 and 120. The source region 80 extends to a first surface 30 and adjoins a p-type body region 50 which adjoins a common n-type drift region 40 in both cross-sections 110 and 120. The body region 50 is typically spaced apart from the first surface 30 by the source region 80. Between the body region 50 and the drift region 40 a body diode (not illustrated) is formed. Respective pn-junctions are formed between the source region 80 and the body region 50, and between the body region 50 and the drift region 40.

In certain embodiments, the semiconductor device 100 further includes, in both shown cross-sections 110 and 120, at least one first trench 10 which extends from the source region 80 through the body region 50 and partially into the drift region 40. Accordingly, the semiconductor device 100 has separated body regions 50 and separated source regions 80 in the cross-sectional views of FIG. 75. However, the source regions 80 are typically electrically connected to each other via the common source metallization 60 and may also be simply connected at least in respective pairs. This applies also for the body regions 50. For example, the source regions 80 and the body regions 50 may both be shaped as rings or double-rings between vertical trenches as will be explained with reference to FIGS. 80A and 80B. In these cases, a vertical cross-section typically shows two separate portions for each source region 80 and each body region 50. For clarity reasons, separated body regions 50 and separated source regions 80 are, therefore, also referred to as body region 50 and source region 80, respectively. In FIG. 75 two first trenches 10 are exemplarily illustrated. The side walls and the bottom walls of the first trenches 10 are covered with a first insulating layer 12. The insulated first trenches 10 are filled with first conductive regions forming respective first gate electrodes 11. The first gate electrodes 11 are in contact with a gate metallization (not illustrated in FIG. 75) and insulated and spaced apart from the source metallization 60 by a dielectric portion 70. Further, the drift region 40 typically forms a common drift region 40 and is in Ohmic contact with a common drain metallization 42 on a second surface 31 of the semiconductor device 100, wherein for better contact, a highly n-doped common drain region 41 may be arranged between the common drift region 40 and the common drain metallization 42. Depending on the voltage of the first gate electrodes 11 relative to the body region 50 and the capacitance per unit area C1 between the first gate electrodes 11 and the body region 50, inversion channels can typically be formed along the first insulating regions 12 in the body region 50. In other words, the semiconductor device 100 of FIG. 75 includes first field effect structures and may be operated as a MOSFET.

In further embodiments, the semiconductor device 100 includes, instead of or in addition to the shown vertical MOSFET-structures, lateral MOSFET-structures, UMOSFET-structures, DMOSFET-structures, Superjunction-MOSFET-structures and/or reverse conducting IGBT-structures.

According to an embodiment, the semiconductor device 100 further includes second trenches 20 which extend from the first surface 30, through the source region 80 and at least partially into the body region 50. Each second trench 20 includes a gate electrode or electrode structure 211 and a second insulating region 22 which is, in a first vertical cross-section 110, arranged at least between the electrode structure 211 and the body region 50 for forming a MGD (MOS-gated diode).

In other words, the semiconductor device 100 includes a source metallization 60, a first field-effect structure such as a MOSFET and a second field-effect structure which is typically an MGD. The first field-effect structure includes an n-type source region 80 which is electrically connected to the source metallization 60, a p-type body region 50 which is adjacent to the source region, a first gate electrode 11 and a first insulating region 12 which is arranged at least between the first gate electrode 11 and the body region 50. The second field-effect structure includes a n-type source region 80, a p-type body region 50 which is adjacent to the source region 80, an gate electrode or electrode structure 211 and a second insulating region 22 which is, in a first vertical cross-section 110, arranged at least between the electrode structure 211 and the body region 50. The source region 50 and the electrode structure 211 are electrically connected to the source metallization 60. The second insulating region 22 and the body region 50 form a second capacitance which has a second capacitance per unit area which is higher than the first capacitance per unit area of a first capacitance formed between the first gate electrode 11 and the body region 50. It goes without saying that the doping types of the semiconductor regions may also be reversed.

Figure 75:
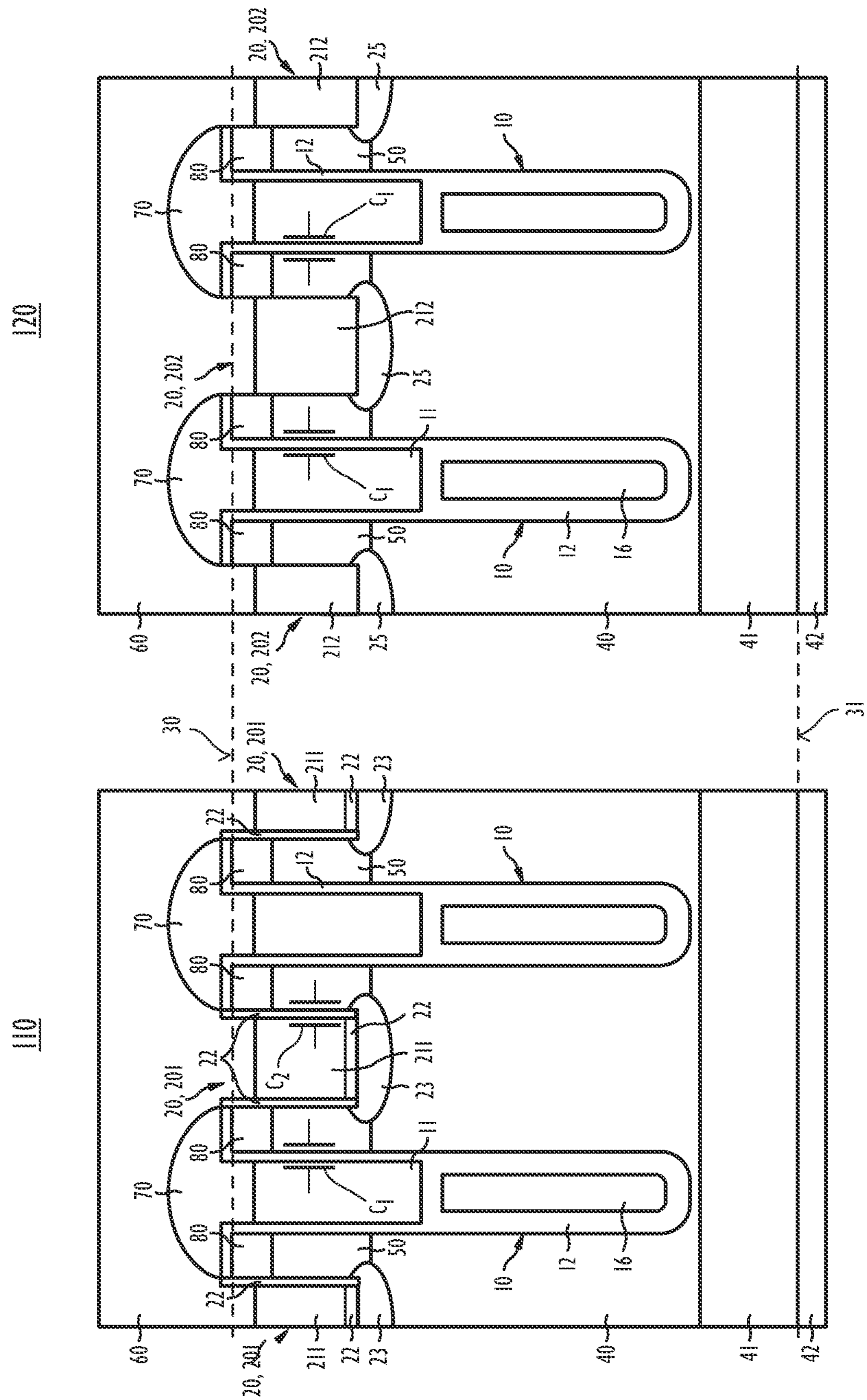
FIG. 75 illustrates two vertical cross-sections of a semiconductor device according to certain embodiments.

Typically, the semiconductor device 100 of FIG. 75 is a power semiconductor device which includes a plurality of first field effect structures. Further, each of the first trenches 10 may additionally include a field plate 16 below the respective gate electrodes 11 of the shown vertical MOSFET-structures. Further, the lateral thickness of the first insulating layer 12 between the body region 50 and the gate electrode 11 is typically smaller than between the drift region 40 and the respective field plate 16.

The plurality of first field-effect structures and MGD-structures are typically arranged in a regular pattern to ensure a uniform current distribution in forward and backward mode.

According to an embodiment, the second trenches 20 include respective first portions 201 in the first part 110 of the semiconductor device 100 and second portions 202 in the second part 110 of the semiconductor device 100 as illustrated in the cross-sections 110 and 120, respectively. Typically, the first trenches 10 extend vertically deeper into the semiconductor substrate than the first portions 201 and/or the second portions 202.

Typically, each second trench 20 is simply connected and includes a pattern of first trench portions 201 and the second trench portions 202. For example, each second trench 20 may be shaped as a bar which extends in a horizontal direction along the first surface 30, i.e. is perpendicular to the shown cross-sections 110 and 120, and may be formed by an alternating arrangement of first and second trench portions 201 and 202 in this direction.

According to an embodiment, each of the second trench portions 202 includes a conductive plug 212 which contacts an adjoining body region 50 with the common source metallization 60. In other words, the electric contact between the source metallization 60 and the body region 50 is only realized in certain regions or parts 120 of the semiconductor device 100 which are, therefore, in the following also referred to as contact regions 120 of the semiconductor device 100. The first trench portions 201 include a gate electrode 211 which is also connected to the source metallization 60 and insulated from the body region 50 by an insulating layer 22. Typically, the gate electrode 211, the insulating layer 22 and the body region 50 form a MOS-gated diode (MGD) in the regions 110 which are, therefore, in the following also referred to as MGD regions 120 of the semiconductor device 100.

In other words, the semiconductor device 100 is typically an integrated semiconductor device 100 having a field effect structure or a first field effect structure such as a MOSFET and a second field effect structure, i.e. an MGD. Typically, the semiconductor device 100 is a power semiconductor device having a plurality of first and second field effect structures. The second field-effect structures are formed in one embodiment in a trench which also includes body contact regions. This trench can therefore include a plurality of MGD regions 110 and body contact regions 120.

In some embodiments as described herein, the second and first trenches 20, 10 can also be described as a trench 20 and a further trench 10, respectively. In this case, the second field-effect structure and the first field-effect structure form a field-effect structure and a further field-effect structure, respectively.

The first field-effect structure has a source region 80 of a first conductivity type which is connected to the source metallization 60, body region 50 of a second conductivity type adjacent to the source region 80, a drift region 40 of the first conductivity type adjacent to the body region 50 and a first insulated gate electrode 11. The semiconductor device 100 further includes a trench 20 which has a first trench portion 110 and a second trench portion 120. The first trench portion 110 includes a second insulated gate electrode 211 which is insulated from the body region 50 by a dielectric layer 22 and connected to the source metallization 60. Typically, the dielectric layer 22 insulates the second insulated gate electrode 211 completely against the semiconductor body 50, i.e. the insulating layer 22 is arranged on the side walls and the bottom wall of the first trench portion 110. The second trench portion 120 includes a conductive plug 212 which electrically connects the source metallization 60 with the body region 50.

The conductive plug 212 and the second gate electrode 211 are typically simply connected, i.e. formed by a common conductive structure which is arranged in a simply connected trench 20 which typically has a plurality of first and second trench portions 201 and 202.

According to one embodiment, the semiconductor device 100 further includes a third conductive region 25 or body contact region 25 of the second conductivity type (p-type in FIG. 75) which adjoins the body region 50 and the conductive plug 212 in a lower part of the second trench portion 120. The doping concentration of the body contact region 25 is typically higher than the doping concentration of the body region 50 for forming a low Ohmic electrical contact between the body region 50 and the source metallization 60 via the conductive plug 212. In this case, an insulating layer 22 may also be arranged on the vertical walls of the second trench portions 202, i.e. between the conductive plug 212 and the body region 50.

In certain embodiments, a fourth semiconductor region 23 adjoins the insulating layer 22 in a lower portion of the first trench portion 201, the drift region 40, and the body region 50. Typically, the fourth semiconductor regions 23 are of the second conductivity type, i.e. n-type in FIG. 75. The doping concentration of the fourth semiconductor region 23 is typically higher than the doping concentration of the drift region 40 and the body region 50 in order to compensate the doping of the body region 50. In doing so, an essentially unipolar current path between the common drain metallization 42 and the source metallization 60 can be realized at a voltage which is lower than the forward voltage of a typical body diode during reverse bias of the body diode and/or the first field effect structure due to forming an inversion channel in the body region from the fourth conductive region 23 to the source region 80 and along the insulating layer 22.

Typically, the total current through the semiconductor device 100 in forward biasing of the body diode 15 is dominated by a unipolar current above an average current flow density in the drift region of about 1 $mA/mm^2$ as has been explained with reference to FIG. 17B.

In some embodiments as described herein, the second gate electrode 211, the insulating layer 22 and the body region 50 form a MGD with a capacitance per unit area C2 formed between the second gate electrode 211 and the body region 50 which is higher than the gate capacitance per unit area C1 of the first field effect structure. This can again be achieved by choosing an appropriate effective thickness and/or permittivity of the first insulating region 12 and the second insulating layer 22. During reverse bias of the body diode, the fourth semiconductor region 23 typically forms the source region of the MGD. As the semiconductor device 100, i.e. the MOSFET 100 includes a MGD which is connected in parallel to the body diode, the integrated MOSFET 100 has typically a lower voltage drop during reverse mode compared to standard MOSFETs. This favors the use of the integrated MOSFET 100 as a low-side MOSFET 97 in a converter as illustrated in FIG. 1.

Compared to the improved MOSFETs 100 described with reference to FIGS. 6-8, contacting the body region 50 of the MOSFET 100 in FIG. 75 is technically easier and typically does not reduce the depth of the body region 50 significantly. Further, the fourth semiconductor region 23 shortens the body region 50 only in a small portion close to the bottom of the first trench portion 201. Thus, the punch-through stability of the MOSFET 100 having a MGD of FIG. 75 is typically improved and the drain induced barrier lowering (DIBL) is typically less pronounced at given pitch distance between neighboring field effect structures to realize a certain resistance in forward mode $R_{on}$ of e.g. a power semiconductor device. Furthermore, the fraction of the series resistances of the MGD's which is due to the JFET-effect of the adjacent body region 50 is typically also reduced. Numerical simulations of the MOSFET 100 of FIG. 75 reveal that the fourth semiconductor region 23 may even slightly p-doped which typically further reduces the drain induced barrier lowering. Still an inversion channel can be formed along the along the insulating layer 22 during reverse bias of the body diode of the MOSFET. In order to allow forming of a space charge region below the fourth semiconductor region 23 during reversed bias, the doping concentration of an n-type fourth semiconductor region 23 should typically be chosen such that the vertically integrated doping concentration is lower than about $5*10^{12}$ $cm^{-2}$. In case of a p-type fourth semiconductor region 23, the doping concentration of the fourth semiconductor region 23 should be low enough such that the fourth semiconductor region 23 is depletable or completely depletable and that electrons can flow through the fourth semiconductor region 23 during reversed bias. Typically, doping concentration of a p-type fourth semiconductor region 23 is also chosen such that the vertically integrated doping concentration is lower than about $5*10^{12}$ $cm^{-2}$.

Figure 76:
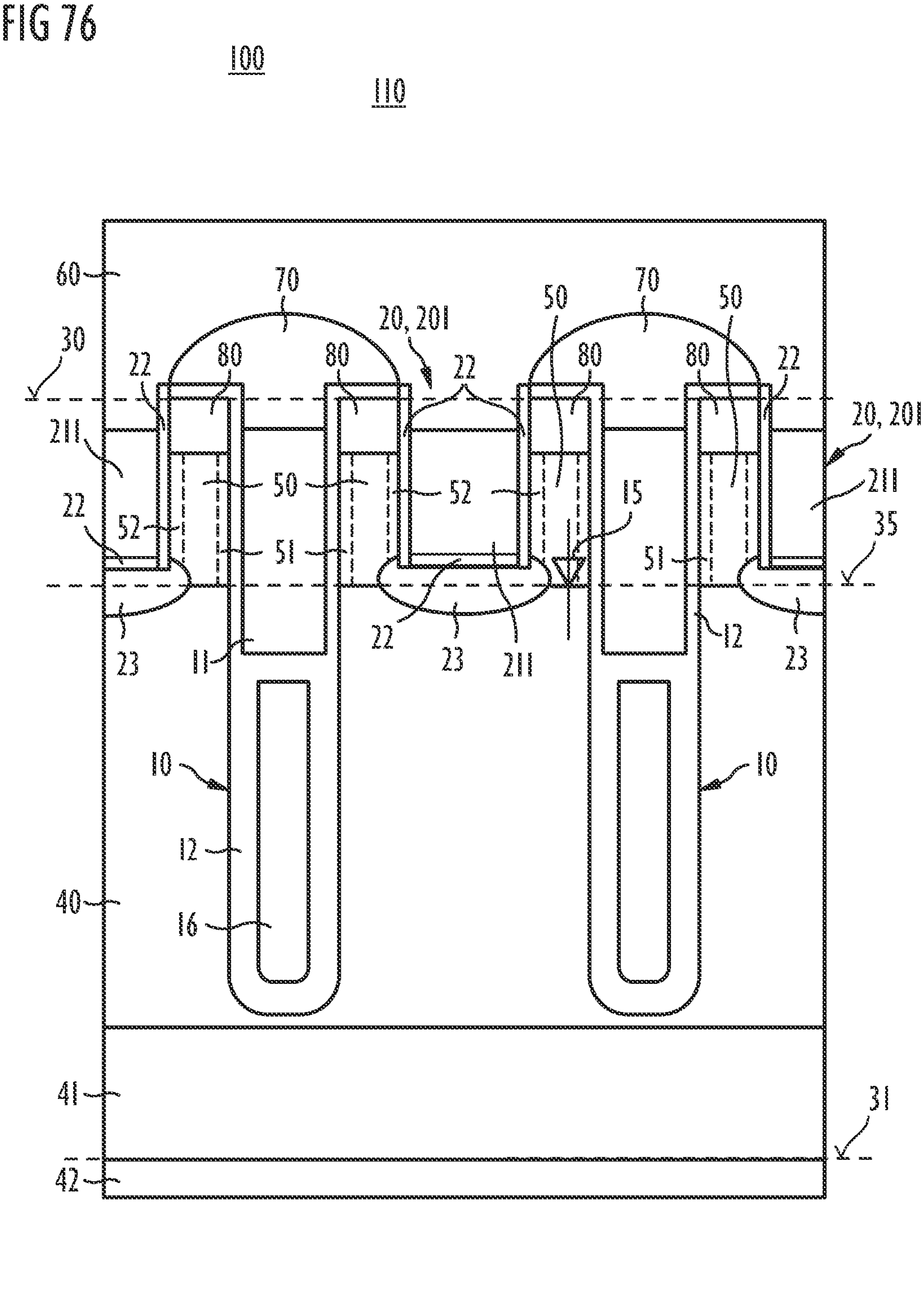
FIG. 76 illustrates a vertical cross-section of a semiconductor device according to an embodiment.

Referring now to FIG. 76 further embodiments are explained. FIG. 76 represents an enlarged view of the vertical cross-section through the MGD region 110 of the semiconductor device 100 shown in FIG. 75. In the embodiment of FIGS. 76 and 75, the bottom of the first trench portions 211 is arranged above the plane of pn-junction 35 of the body diode 15. Accordingly, the fourth semiconductor regions 23 also extend through the plane of pn-junction 35. Typically, inversion channels 51 and 52, respectively, can be formed along the first and second insulating region 12 and 22 in the body region 50 as indicated by the dashed lines. Due to the higher capacitances per unit area between the body region 50 and the gate electrodes 211 of the MGD structure compared to the capacitances per unit area between the body region 50 and the gate electrodes 11 of the MOSFET-structure, the voltage differences between the body region 50 and the gate electrodes 211 required to form the inversion channel 52 of the MGD-structure, is typically lower than the voltage differences between the body region 50 and the gate electrodes 11, which is required to form the inversion channel 51 of the MOSFET-structure. This ensures a low resistivity of the semiconductor device 100 when the MGDs operate as freewheeling diodes during reverse mode.

According to an embodiment, the body region 50 includes a first body sub-region including the channel region 51 which adjoins the first insulating region or layer 12 and a second body sub-region including the channel region 51 which adjoins the second insulating region of layer 22 and which has a lower doping concentration than the first body sub-region. In doing do, the threshold voltage of the MGD can further be reduced.

The threshold voltages of the MGD and the MOSFET may also be tailored using different electrode materials. In some embodiments, the work functions of the first and second gate electrode 11 and 211 are different. Typically, the work function of the second gate electrode 211 is smaller than the work function of the first gate electrode 11. For example, the first gate electrode 11 is made of highly doped poly-Si, and the second gate electrode 211 is made of or includes Ti, TiN, TaN, W, Al, Co or CoN. Further, the electron affinity of the body region 50 is typically also smaller than the work function of the first gate electrode 11. For example, the first gate electrode 11 and the body region 50 are made of highly doped poly-Si and of Si, respectively.

According to an embodiment, the semiconductor device 100 includes a source metallization 60, a field-effect structure having a source region 80 of a first conductivity type connected to the source metallization 60, a body region 50 of a second conductivity type adjacent to the source region 50, a drift region 40 of the first conductivity type adjacent to the body region 50 and a first trench 10 having a gate electrode 11 which is insulated from the body region 50 by a first insulating region 12. The semiconductor device 100 further includes a second trench 20 having a second gate electrode 211 connected to the source metallization 60 and an insulating layer 22 which insulates the second gate electrode 211 from the body region 50. The second trench 20 has a vertical extension which is smaller the vertical extension of the first trench 10.

In other words, the semiconductor device 100 includes a source metallization 60, a first field-effect structure including a source region 80 of a first conductivity type connected to the source metallization 60, a body region 50 of a second conductivity type adjacent to the source region 50, a first gate electrode 11 and a first insulating region 12 which is arranged at least between the first gate electrode 11 and the body region 50. The first gate electrode 11 and the first insulating region 12 are formed in a first trench 10. The semiconductor device 100 further includes a second field-effect structure including a source region 80 of the first conductivity type, a body region 50 of the second conductivity type adjacent to the source region 80, an electrode structure 211 and a second insulating region 22 which is arranged at least between the electrode structure 211 and the body region 50. The source region 50 and the electrode structure 211 are electrically connected to the source metallization 60. The electrode structure 211 and the second insulating region 22 are formed in a second trench 20 having a vertical extension which is smaller the vertical extension of the first trench 10. Typically, the first trench 10 further includes a field plate 16 which is arranged below the first gate electrode 11. Further, the semiconductor device is typically a power semiconductor device 100.

Figure 77:
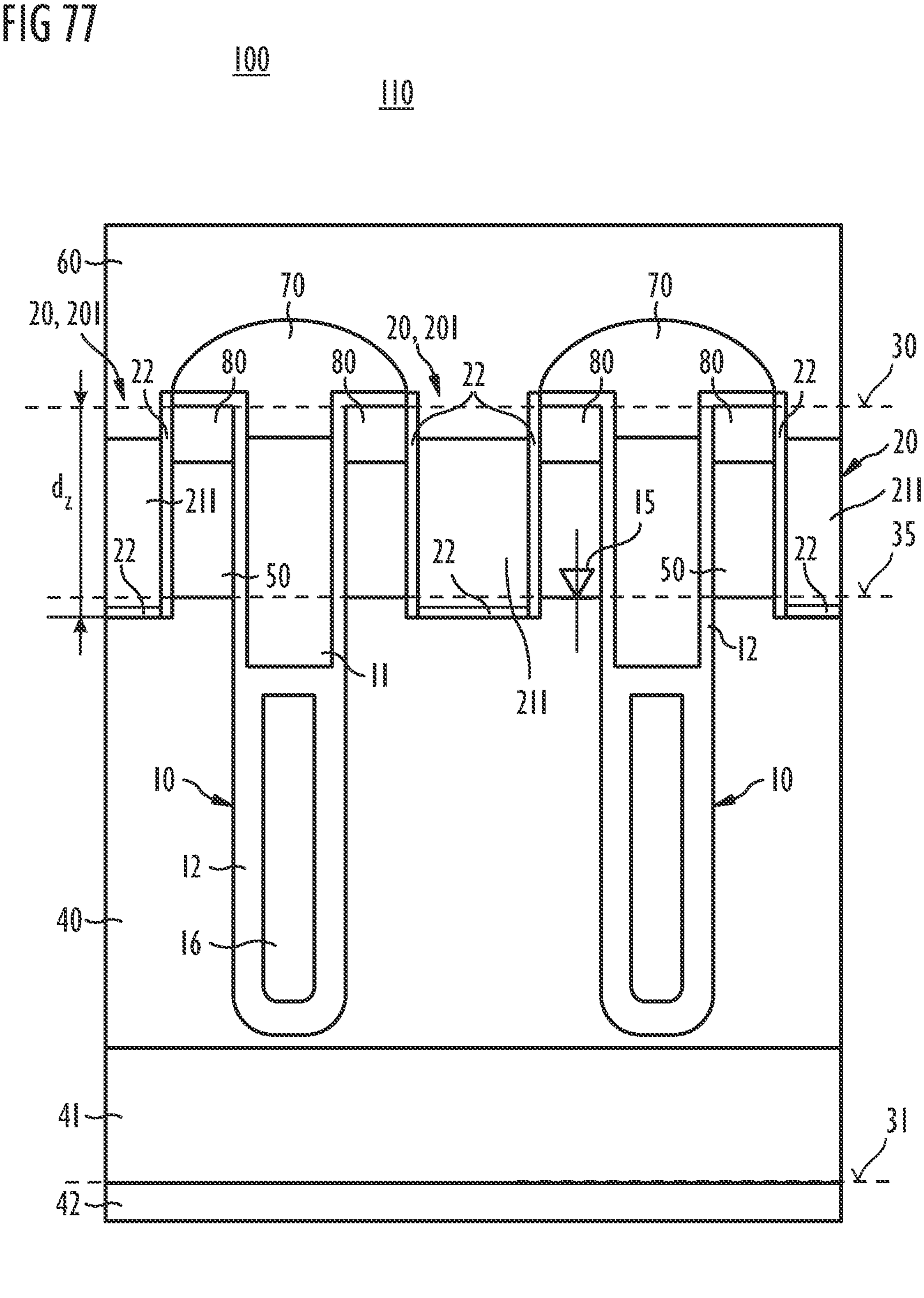
FIG. 77 illustrates a vertical cross-section of a semiconductor device according to an embodiment.

FIG. 77 also illustrates, in a vertical cross-section, the MGD region 110 of a semiconductor device 100. The MGD region 110 of FIG. 77 is similar to the MGD region 110 shown in FIG. 76. However, the first trench portions 201 extend from the first surface 30 through the source region 80, the body region 50 and partially into the drift region 40, i.e. across the plane of pn-junction 15. The depth into which the first trench portions 201 extend vertically from the first surface 30 into the semiconductor substrate is, in the following, also referred to as $d_Z$. As the first trench portions 201 adjoin the drift region 40, fourth semiconductor region are not required for forming a unipolar current path during reverse bias of the body diode 50 in the embodiment of FIG. 77. Accordingly, the punch-through stability is further improved. The semiconductor device 100 of FIG. 77 may also be operated as a MOSFET and typically includes a contact region 120 as shown in FIG. 75 having second trench portions 202 which typically do not extend across the plane of pn-junction 15. In other words, the first trench portions 201 may extend deeper into the semiconductor substrate than the second trench portions 202. The MGD region 110 of FIG. 77 may also be arranged in a semiconductor device 100 having a contact region 120 as illustrated in FIG. 78.

Figure 78:
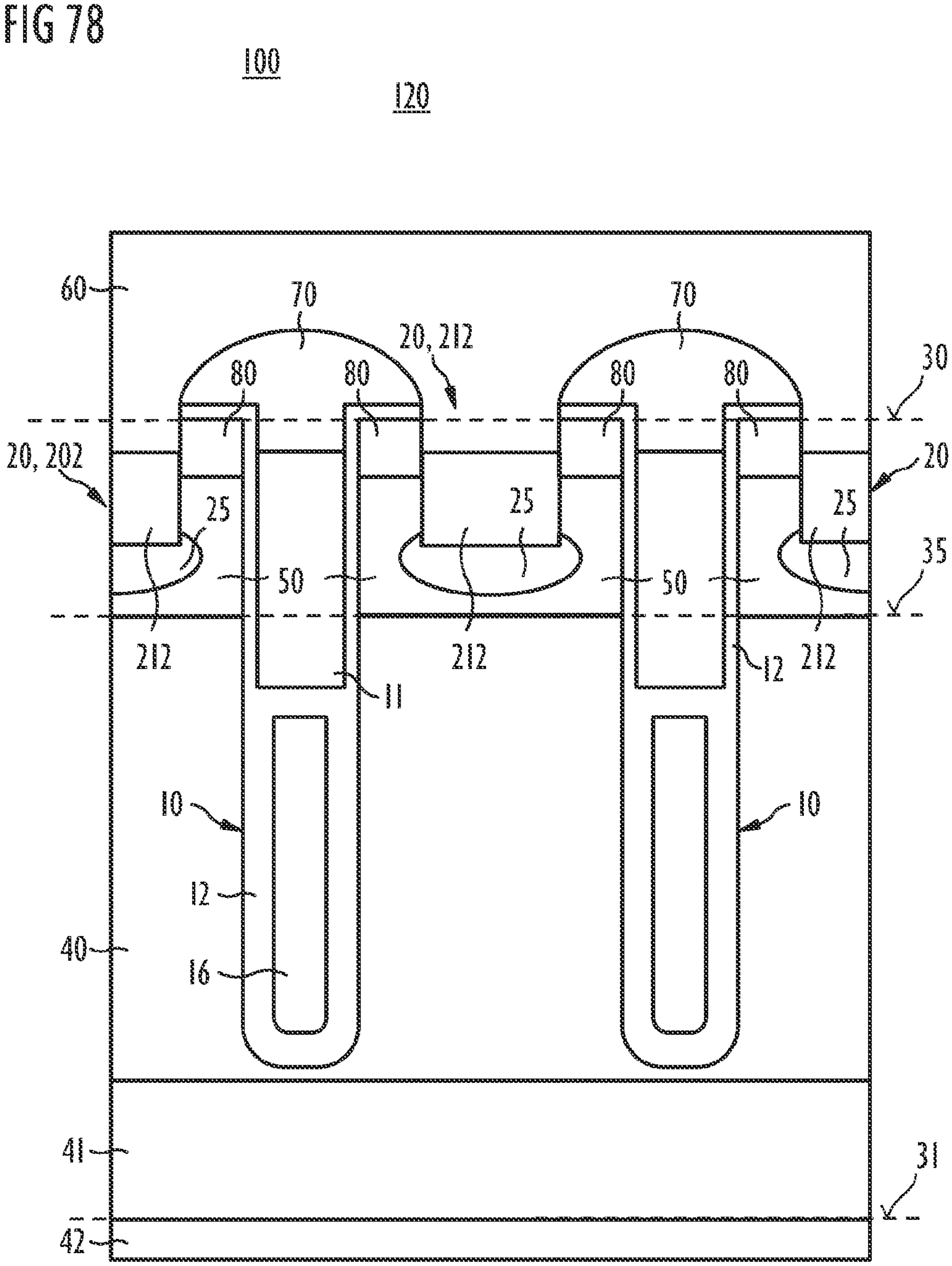
FIG. 78 illustrates a vertical cross-section of a semiconductor device according to an embodiment.

FIG. 78 illustrates, in a vertical cross-section, a contact region 120 of a semiconductor device 100. According to an embodiment, the second trench portions 202 extend through the source region 80 and partially into the body region 50. Further, the contact regions 25 are, unlike contact regions 25 in FIG. 75, completely embedded within the body region 50, i.e. the contact regions 25 are spaced apart from the drift region 40 by respective portions of the body region 50 in FIG. 78.

Figure 79A:
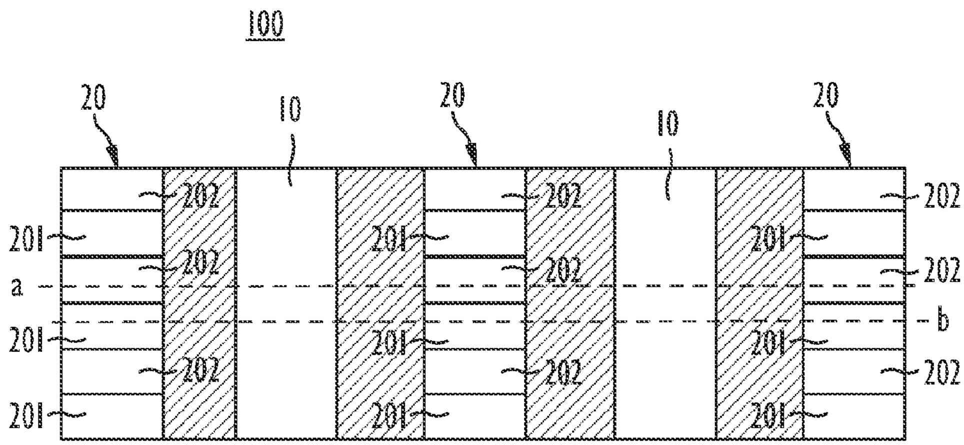
FIGS. 79A and 79B illustrate plan views of the semiconductor device illustrated in FIG. 75 according to certain embodiments.
Figure 79B:
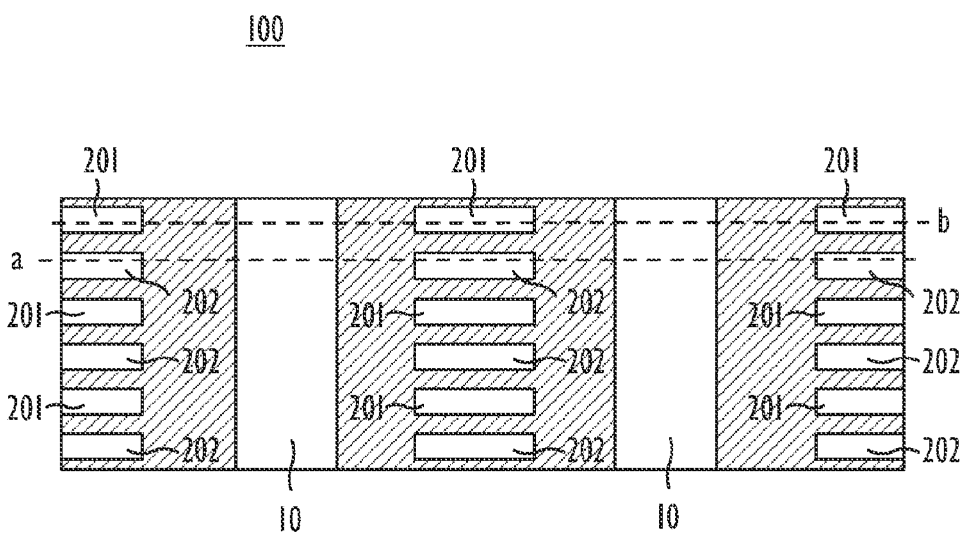

Referring now to FIG. 79 further embodiments are explained. FIGS. 79A and 79B illustrate, in plan views, typical arrangements of first and second trench portions 201 and 202 in the semiconductor substrate of the semiconductor device 100 as illustrated with reference to FIGS. 75-78. The plane views of FIGS. 79A and 79B correspond to typical horizontal cross-sections through the semiconductor body or plane views on the first horizontal surface of the semiconductor body onto which a common source metallization is arranged. The semiconductor body includes a first semiconductor region of a first conductivity type (e.g. n-type) and a second semiconductor region of the opposite conductivity type. The first semiconductor region and the second semiconductor region form a pn-junction which is typically parallel to the first surface. Further, the first semiconductor region typically extends to the first surface. The shown cross-sections may correspond to horizontal cross-sections between the plane of the pn-junction and the first surface and/or to horizontal cross-sections below the plane of the pn-junction.

According to an embodiment, second trenches 20 or trenches 20 extend vertically from the first surface into the semiconductor body and include a first trench portion 201 and second trench portion 202. Typically, each second trench 20 includes a pattern or an arrangement of first trench portions 201 and second trench portions 202. The second trenches 20 may e.g. be shaped as a bar which extends in a horizontal direction and include, in the horizontal direction, a simply connected alternating arrangement of first and second trench portions 201 and 202 as shown in FIG. 79A. The first trench portions 201 include a respective gate electrode which is connected to the source metallization and a respective insulating layer which insulates the respective gate electrode from the second semiconductor region. The second trench portions 202 include a respective conductive plug which is connected to the source metallization and to the second semiconductor region. In certain embodiments, the conductive plugs and/or the gate electrodes are formed by a simply connected electrode structure. The hatched regions in FIGS. 79A and 79B correspond to the first or second semiconductor region which is typically bar-shaped. The regions 10 may e.g. correspond to cross-sections through insulated gate electrodes of further field effect structures such as vertical MOSFETs, i.e. to further trenches 10.

Typically, the second semiconductor region forms a body region and the first semiconductor region forms a source region which is connected to the source metallization and extends to the first surface. Further, the semiconductor body typically includes a drift region of the first conductivity type (n-type) which is adjacent to the body region, and the first trench portions 201 and the second trench portions 202 extend through the source region and at least partially into the body region. In this case, vertical cross-sections through the semiconductor device of FIGS. 79A and 79B along the dashed line a and b correspond to vertical cross-section through MGD regions 110 and contact regions 120, respectively, as shown in the FIGS. 75-78. In FIG. 79A the shown trenches 20 are simply connected and formed by an alternating arrangement of first trench portions 201 and second trench portions 202. Different thereto, the first trench portions 201 and the second trench portions 202 are, at least in the shown plan view of FIG. 79B, isolated from each other but typically also from a regular pattern to ensure a uniform arrangement of MGD regions 110 and contact regions 120. The horizontal arrangement of first and second trench portions 201 and 202, i.e. of MGD regions 110 and contact regions 120, may also be chequered. Such an arrangement typically corresponds to a plan view as shown in FIG. 79B but with interchanged first trench portions 201 and the second trench portions 202 in the portion of the plane view between the two first trenches 10.

Figure 80A:
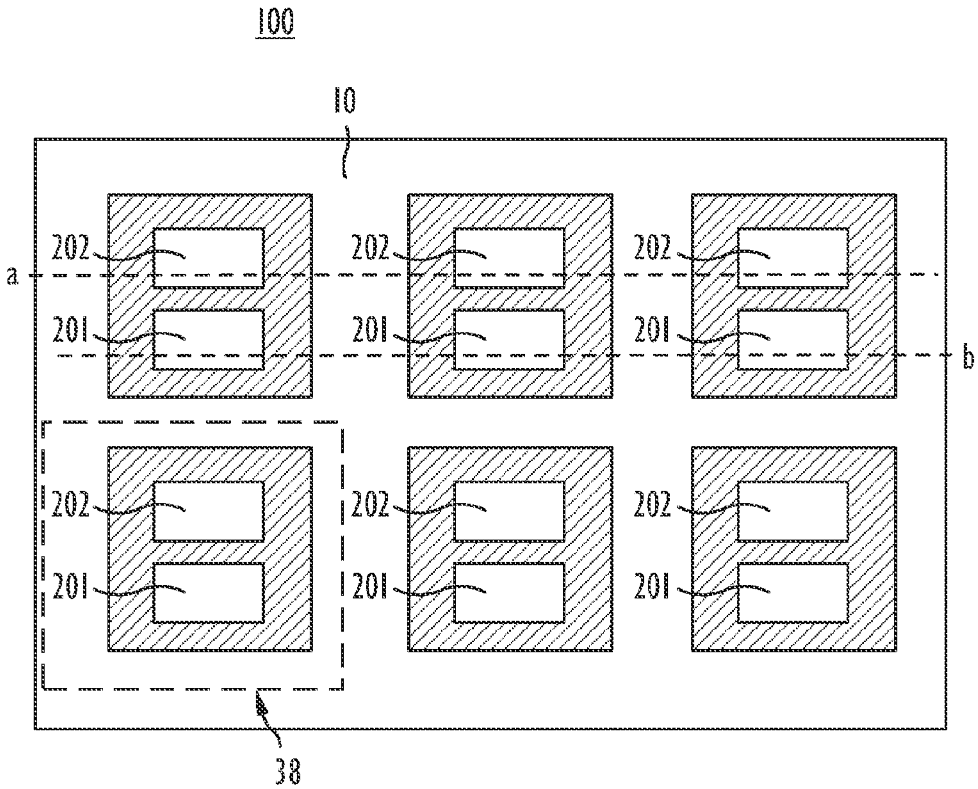
FIGS. 80A and 80B illustrate plan views of the semiconductor device illustrated in FIG. 75 according to certain embodiments.
Figure 80B:
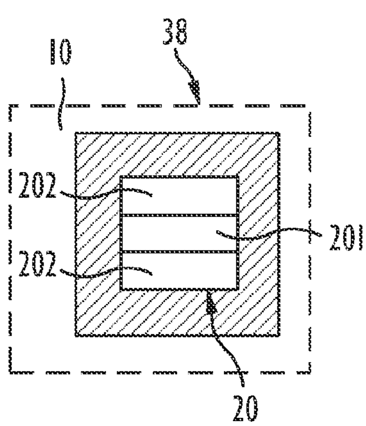
Figure 8I:
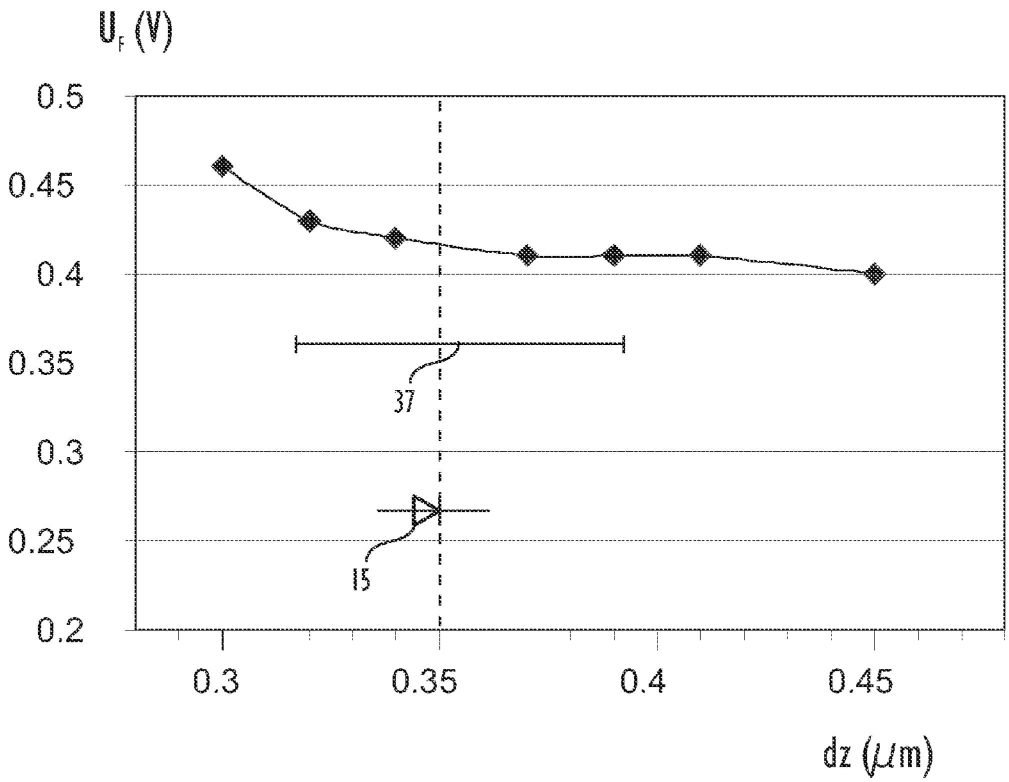

In FIGS. 80A and 80B further horizontal arrangements of first and second trench portions 201 and 202 in the semiconductor substrate of semiconductor devices 100 as shown in FIGS. 75-78 are illustrated. According to certain embodiments, the body regions and source regions, represented by hatched areas, are arranged on a regular two-dimensional lattice e.g. formed by a lattice of the first trenches 10. Typically, the regular lattice is at least formed in an active area of the semiconductor device 100 for carrying the load current.

The semiconductor device 100 may further include different structures such as junction termination structures in a peripheral area.

The body regions and source regions or unit cells 38 may be shaped as squares or rectangles and arranged on a square or rectangular lattice or grid as shown in FIG. 80A or as circles. The body regions and source regions or unit cells 38 may also be shaped as triangles arranged on a triangular lattice or as hexagons arranged on a hex lattice. According to an embodiment, each unit cells includes at least one first trench portions 201 and one second trench portions 202. The first and second trench portions 201 and 202 of a unit cell 38 may, in the shown cross-section, be separated from each other as shown in FIG. 80A or simply connected as show in FIG. 80B and may include an alternating arrangement of first and second trench portions 201 and 202.

In other words, the first and second trench portions 201 and 202 typically form a regular pattern in a horizontal direction. Typically, the regular pattern is a two dimensional pattern. The two-dimensional pattern may be formed by a one dimensional arrangement of simply connected second trenches 20 having a one dimensional arrangement of first and second trench portions 201 and 202 as shown in FIG. 79A, or by a two-dimensional pattern of simply connected second trenches 20 having at least a first trench portion 201 and at least a second trench portion 202 as shown in FIG. 80B. The two-dimensional pattern may, however, also be formed by a regular pattern of separated first and second trench portions 201 and 202 as shown in FIGS. 79B and 80A.

FIG. 81 illustrates results of numerical simulations of semiconductor devices 100 as shown in FIGS. 75, 77 and 78 but with varying vertical depth $d_Z$ of the first trench portion 201. As shown in FIG. 81, the first trench portion 201 can also be comparatively shallow as the forward voltage drop $U_F$ of the MGD only slightly increases with decreasing depth $d_Z$ when $d_Z$ is close to the depth of the plane 35 of the load pn-junction. With a comparatively shallow first trench portion 201 the breakdown voltage of the semiconductor device is typically not or almost not reduced. Further, the forward voltage drop of MGD's produced in different batches differs only slightly, when the depth $d_Z$ of the second trenches is set to about and/or slightly below the depth of the load pn-junction 15 as indicated by the bar 37 which refers to typical processing variations of the trench depth $d_Z$.

In FIGS. 75 to 78 semiconductor devices 100 which have vertically orientated MOSFET structures, e.g. gate electrodes arranged in first trenches 10, as first field effect structures have been illustrated. However, the concept of a trench 20 as described herein which extends from a first surface 30 through a first semiconductor region and at least partially into a second semiconductor region, and which includes, in a horizontal plane which is essentially parallel to the first surface, a first trench portion 201 having an insulated gate electrode 211 connected to a source metallization 60 and a second trench portion 202 having a conductive plug 211 which is connected to the source metallization 60 and to the second semiconductor region, is also applicable to semiconductor devices having lateral MOSFET structures as first field effect structures.

Figure 82:
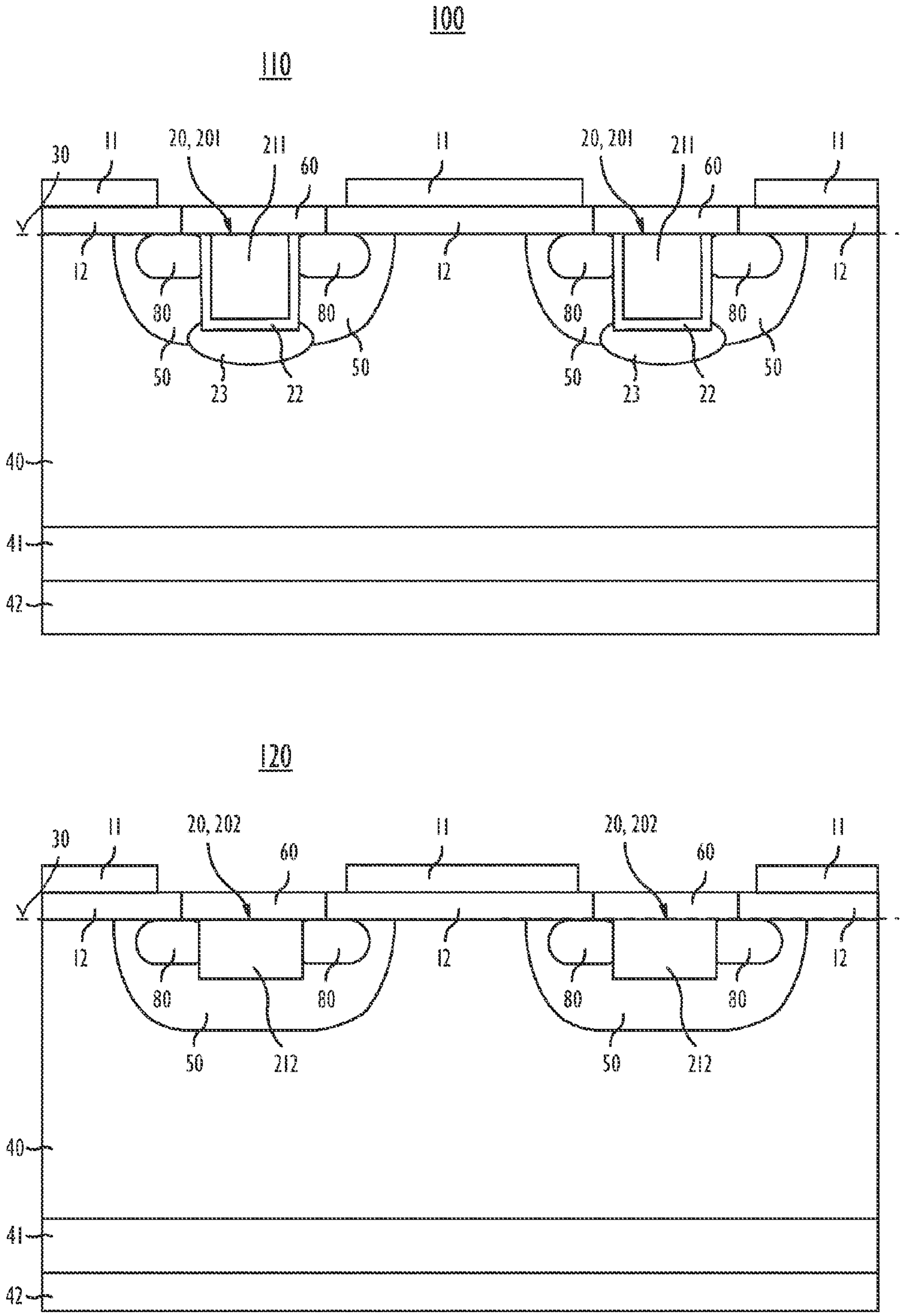
FIG. 82 illustrates two vertical cross-sections of a semiconductor device according to certain embodiments.

FIG. 82 illustrates a semiconductor device 100 with lateral DMOS structures and with integrated MGD's according to certain embodiments. The semiconductor device 100 includes p-type body regions 50 which are embedded within an n-type common drift region 40. The common drift region 40 is typically in Ohmic contact with a common drain metallization 42 arranged on a surface which is opposite of the first surface 30 via a highly n-doped common drain region 41. Within each body region 50 at least one n-type source region 80 connected to the source metallization 60 is embedded. The body regions 50 and the source regions 80 typically extend to the first surface 30 such that a horizontally orientated inversion channel may be formed in the body regions 50 and next to the first surface 30. In the cross-sectional views of FIG. 82 the source regions 80 are separated into separated portions by respective trenches 20 which extend from the first surface 30, through the respective source region 80 and partially into the respective body region or regions 50. Besides the source metallization 60, a gate electrode 11 of e.g. $n^+$-poly-Si is arranged on the first surface 30. The gate electrode 11 is separated from the semiconductor body by a first insulating region or first insulating layer 12 and forms gate electrodes 11 of DMOS-structures. In a first vertical cross-section 110, i.e. in a MGD portion 110, a gate electrode or electrode structure 211 electrically connected to the source metallization 60 and a second insulating region 22 are formed in first trench portions 201 of the trenches 20. The second insulating regions 22 are arranged at least between the respective gate electrode structure 211 and the respective body region 50 or body regions 50. Further, fourth n-type conductive regions 23 may be formed below and adjoining the first trench portions 201. Each conductive region 23 further adjoins the common drift region 40 and the body region 50 or body regions 50. In doing so MGD field effect structures are formed which typically have a higher gate capacitance per unit area than the capacitance formed between the first gate electrode 11 and the body region or regions 50. In a second vertical cross-section 120, i.e. in a contact portion 120, a conductive plug 212 is arranged in a second trench portion 202 of each trench 20 and electrically connects to the source metallization 60 with at least the body region or regions 50. It goes again without saying that the semiconductor devices of FIG. 82 can also be formed with opposite doping relations of the semiconductor regions.

The semiconductor device 100 of FIG. 82 is typically a power semiconductor device and may be operated as a DMOS. Doping concentrations, arrangement and geometry of first and second trench portions 201 and 202 as well as thickness and/or permittivity relations of the gate oxides may be chosen as described herein with respect to semiconductor devices 100 having vertically orientated MOSFET structures as first field effect structures. For example, each second trench 20 of the semiconductor device 100 shown in FIG. 82 is typically simply connected and includes a pattern of first trench portions 201 and the second trench portions 202 too. Also, each second trench 20 may e.g. be shaped as a bar which extends in a horizontal direction along the first surface 30, i.e. is perpendicularly orientated to the shown cross-sections 110 and 120, and may be formed by an alternating arrangement of first and second trench portions 201 and 202 in this direction. The first and second trench portions 201 and 202 may, however, also be arranged in horizontal two-dimensional pattern or lattice. It goes without saying that, in case of semiconductor devices 100 having horizontally orientated MOSFET structures as first field effect structures, the vertical thickness of the first insulating region 12 or first gate oxide layer 12 is typically higher than the horizontal thickness of the second insulating region 22 or second gate oxide layer 22.

According to one embodiment, the semiconductor device 100 of FIG. 82 further includes an optional third conductive region or body contact region of the second conductivity type (p-type in FIG. 82) which adjoins the body region 50 and the conductive plug 212 in a lower part of the second trench portion 120.

Figure 83:
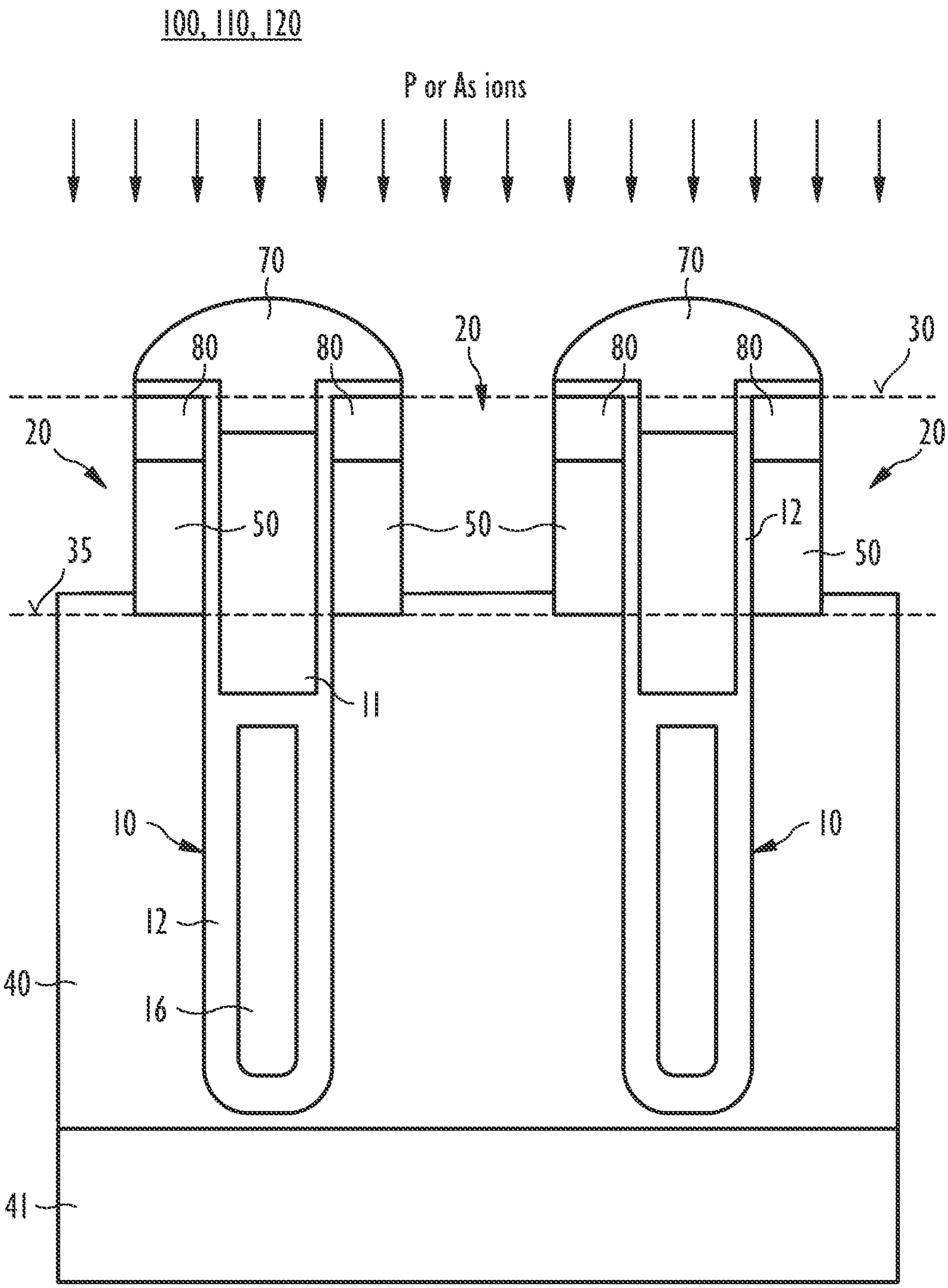
FIGS. 83-87 illustrate a further manufacturing method for forming a semiconductor device according to certain embodiments.

With respect to the FIGS. 83-87 certain embodiments of a further method for manufacturing a MOSFET with integrated MGDs 100 which has a MGD region 110 and a contact region 120 is explained. FIG. 83 illustrates a vertical cross-section of a semiconductor device 100 after providing a semiconductor substrate which includes an n-type common drain region 41 and an n-type common drift region 40 and after further processes including forming first and second trenches 10 and 20, forming p-type body regions 50 and n-type source regions 80 and forming dielectric portions 70. Typically, the first trenches 10 and second trenches 20 were formed in a regular pattern, at least in an active area for carrying the load current. Further, the second trenches 20 were etched through the source region 80 and partially into the body region 40. In other words, the second trenches 20 extend from the first surface 30 into the semiconductor substrate but do not reach the plane 35 of the pn-junction, i.e. the second trenches 20 do not adjoin the common drift region 40 in the embodiment of FIG. 83. All these processes were performed using standard processes for forming vertical trench MOSFETS as for example described above.

Figure 84:
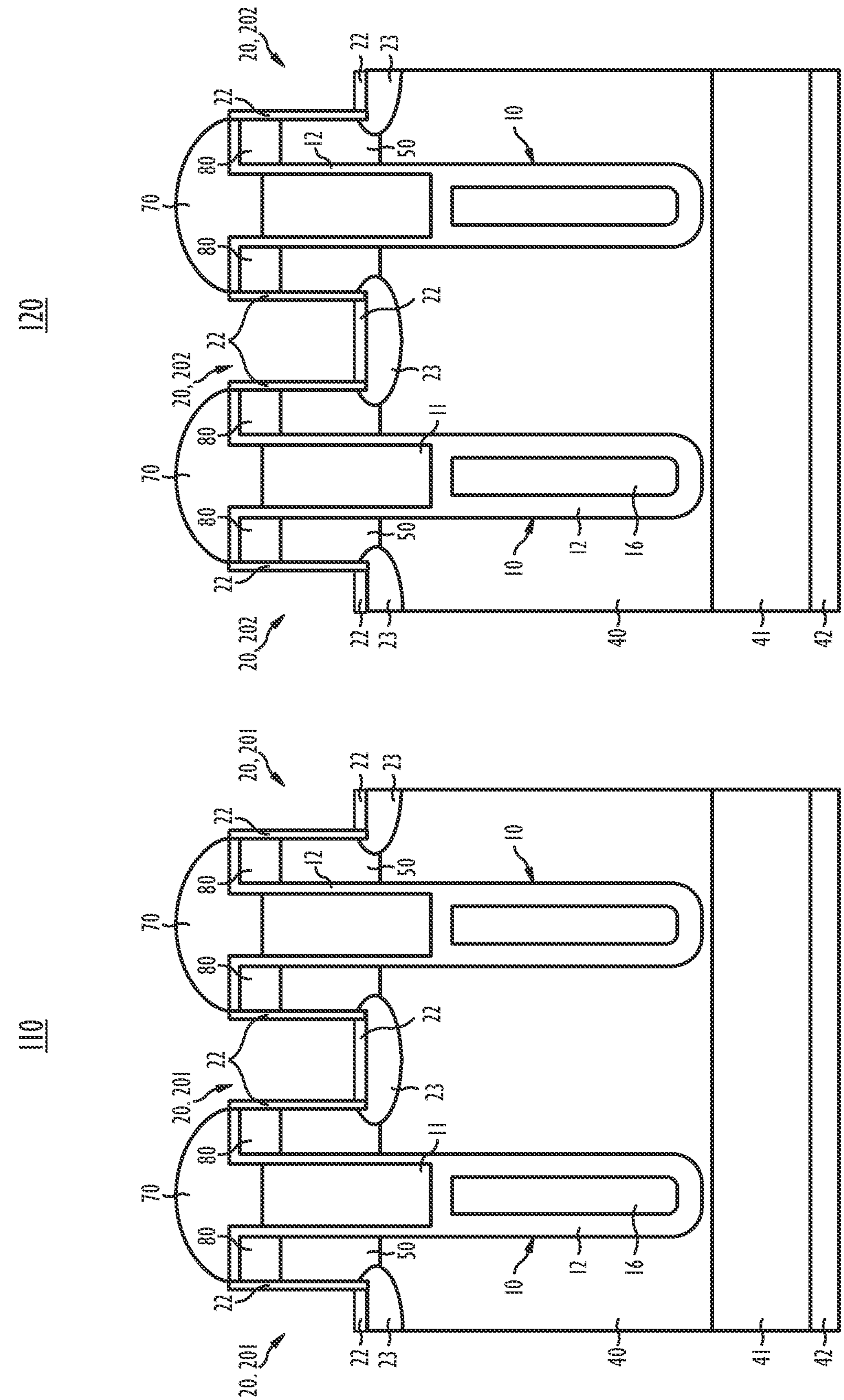

Thereafter, as shown in FIG. 84 fourth n-type conductive regions 23 are formed below and adjoining the second trenches 20 by appropriate ion implantation and subsequent drive-in. Typically, an arsenic ion implantation using the dielectric portions 70 as a mask is used for forming the fourth n-type semiconductor regions 23. The ion doses are typically chosen such that the doping concentration of the fourth semiconductor regions 23 exceeds the doping concentration of the common drift region 40.

FIG. 84 illustrates the semiconductor device 100 after subsequent arranging of an insulating layer 22 on the side walls and the bottom walls of the second trenches 20. This can be done by a thermal oxidation of the semiconductor substrate and/or by deposition of an insulating material. In some embodiments, the thickness of the insulating layer 22 between the mesa and the recess of the second trenches 20 is smaller than the thickness of the first insulating region 12 between the body regions 50 and the first gate electrode 11. In certain embodiments the permittivity of the insulating layer 22 is higher than the permittivity of the first insulating region 12. The lateral thickness of the insulating layer 22 on the side of the second trenches 20 is typically lower than about 10 nm, more typically lower than about 6 nm.

According to an embodiment, the second trenches 20, i.e. the first and second trench portions 201 and 202, extend essentially equally deep into the semiconductor substrate in the MGD region 110 and the contact region 120, respectively, as illustrated in FIG. 84. In doing so, the first and second trench portions 201 and 202 of the second trenches 20 can be formed in parallel and the MGD region 110 and the contact region 120 are, in the shown vertical cross-section essentially identical or similar up to this process step. Note, that the fourth n-type conductive regions 23 are formed only intermediately in the contact region 120. Forming of intermediate n-type conductive regions 23 in the contact region 120 may be avoided by an additional mask.

According to another embodiment, the second trenches 20 extend deeper into the semiconductor substrate in the MGD region 110 compared to the contact region 120. In the MGD region 110, the first trench portions 201 of the second trenches 20 may e.g. extend through the body region 50 partially into the common drift region 40. In other words, the manufacturing method may also start with providing a semiconductor substrate having an MGD region 110 as shown in FIG. 9 and a contact region 120 as shown in FIG. 83. In this event, the step of forming fourth n-type conductive region 23 is only optional. Different depth of first and second trench portions 201 and 202 may also be achieved by using separated etching steps for forming respective trench portions 201 and 201, e.g. for an lateral arrangement of first and second trench portions 201 and 202 as shown in FIG. 79B. In this case, forming the contact regions 120 and MGD regions 110, respectively, can be completely decoupled.

Figure 85:
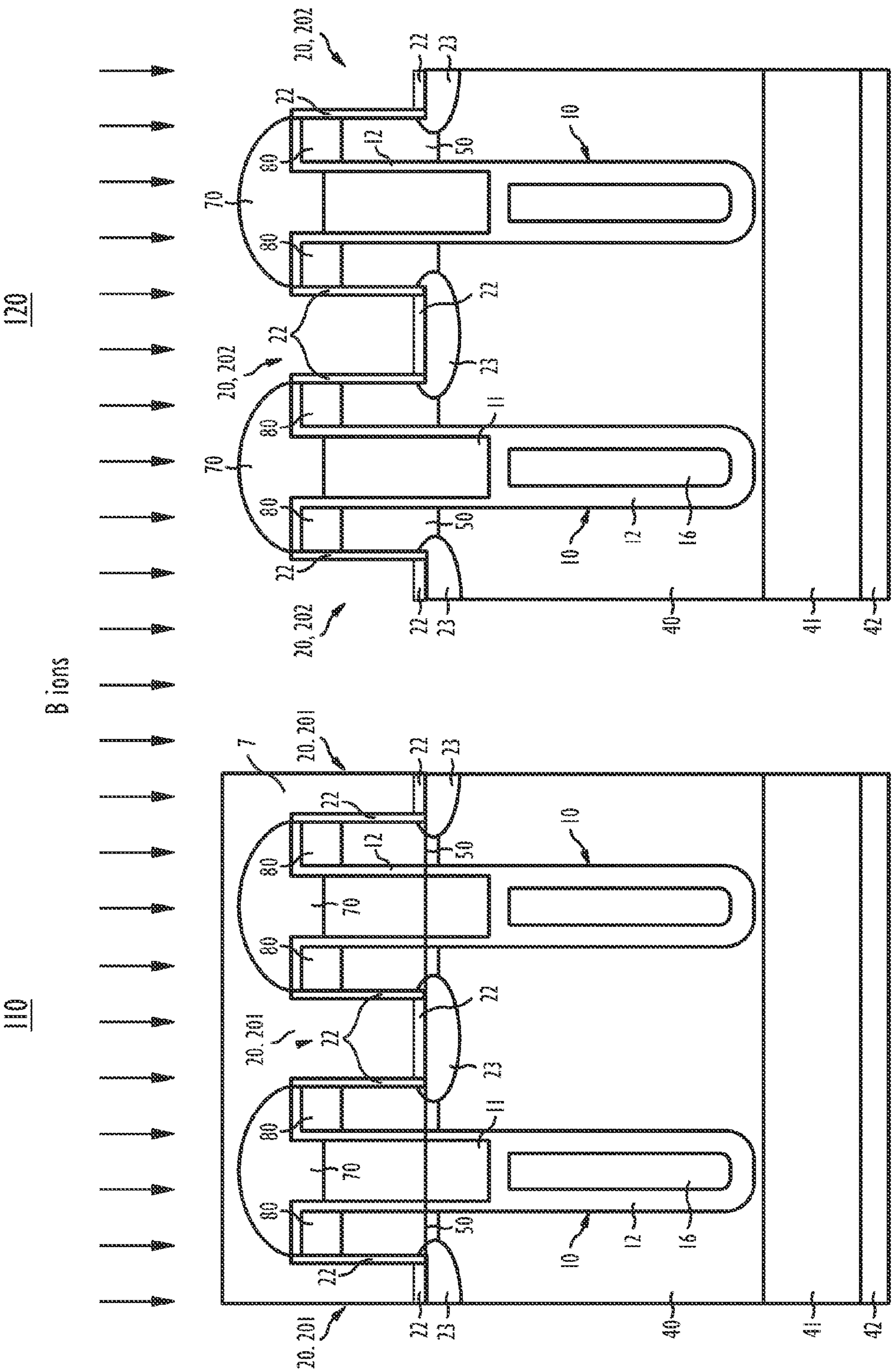

FIG. 85 illustrates the semiconductor device 100 after forming a structured mask 7 in the MGD region 110. The mask 7 forms together with the dielectric portions 70 a mask for a subsequent step of forming p-type third conductive regions 25 or contact regions 25 by appropriate ion implantation, e.g. implantation of boron ions, and subsequent drive-in. The ion doses are typically chosen such that the doping concentration of the contact regions 25 exceeds the doping concentration of the body regions 50 and of the fourth conductive region 23 to compensate the n-doping.

Figure 86:
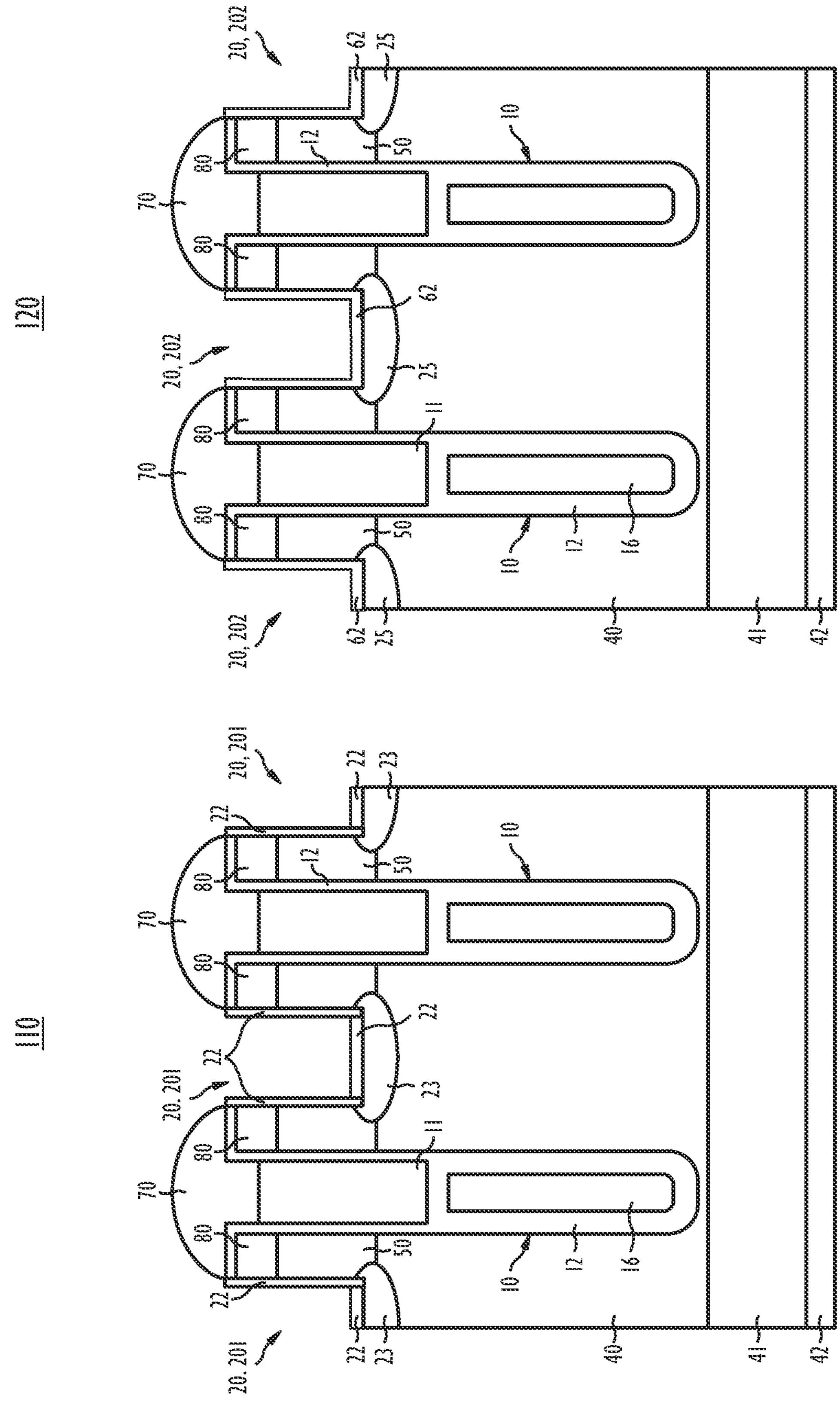

Thereafter, an isotropic etching process is carried out to remove the insulating layer 22 on the bottom and side walls of the second trench portions 202 in the contact region 120. Subsequently, an optional contact layer 62, e.g. a silicide layer 62 or a Ti/TiN layer 62 is deposited on the surface as illustrated in FIG. 86. For example, a self-aligned silicide layer may be formed by depositing of titanium which is followed by a tempering step to form the silicide, and a step etching the remaining titanium.

In another embodiment, the second trench portions 202 are formed in the contact region 120 such that the underneath formed region 25 are embedded within the body region 50 and spaced apart from the drift region 40.

Figure 87:
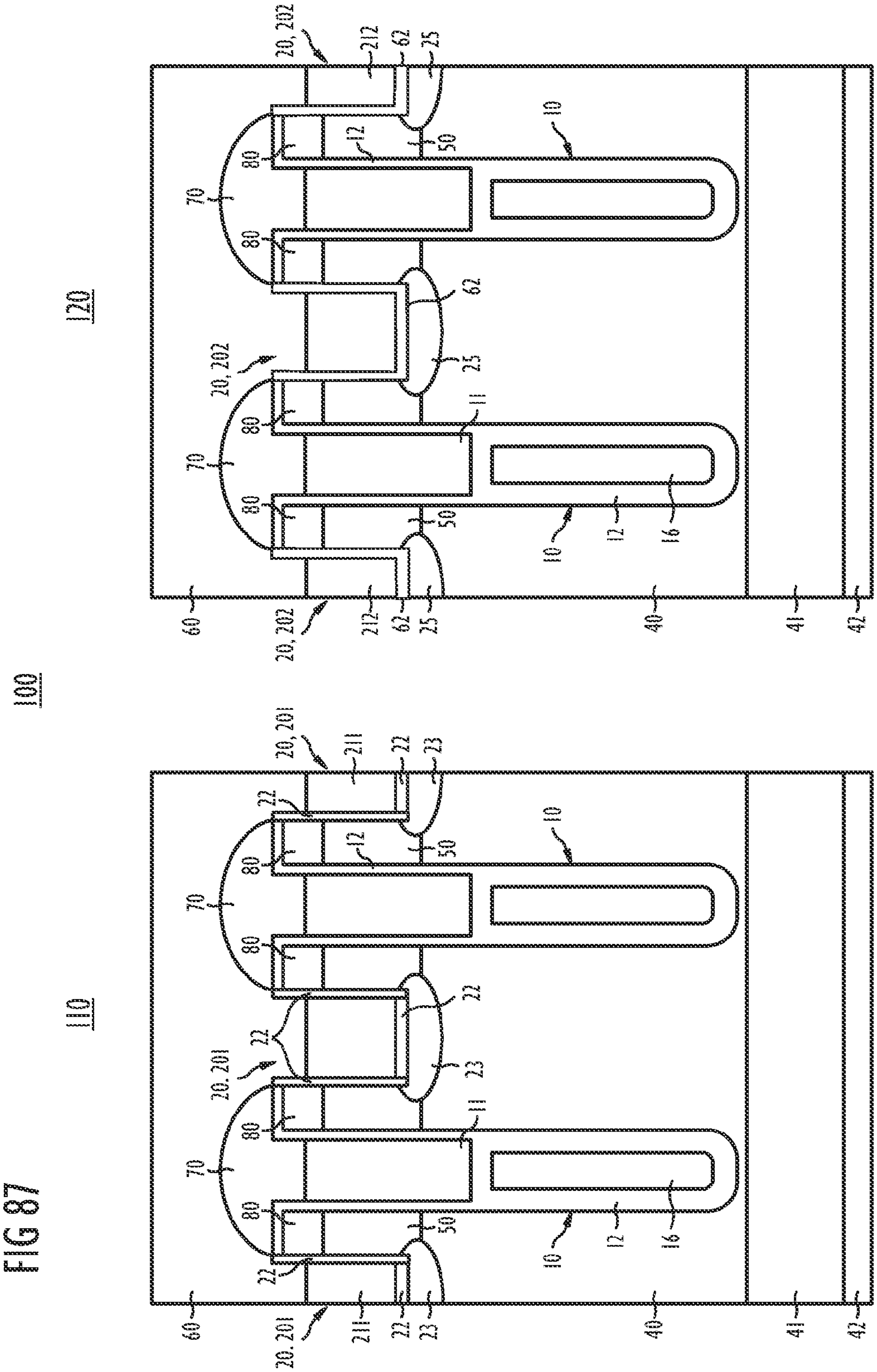

Thereafter, the gate electrodes 211 of the MGD, the conductive plugs 212, and a common source electrode 60 are formed e.g. by metal deposition or deposition of highly doped poly-Si on the top side. Further, a common drain metallization 42 is typically formed on opposite to the common source electrode 60. The resulting semiconductor device 100 is illustrated in FIG. 87.

Alternatively, the third conductive regions 25 may be formed after etching the insulating layer 22 on the bottom of the second trench portions 202 and filling the second trench 20 with poly-Si, e.g., by diffusion of boron out of the deposited poly-Si.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:

a source metallization;

a first field-effect structure including a source region of a first conductivity type, the source region being electrically connected to the source metallization; a body region of a second conductivity type adjacent to the source region; a first gate electrode and a first insulating region arranged at least between the first gate electrode and the body region, the first gate electrode, the first insulating region and the body region forming a first capacitance, the first capacitance having a first capacitance per unit area;

a second field-effect structure including a source region of the first conductivity type; a body region of the second conductivity type adjacent to the source region; an electrode structure and a second insulating region which is, in a first vertical cross-section, arranged at least between the electrode structure and the body region, the source region and the electrode structure being electrically connected to the source metallization; the electrode structure, the second insulating region and the body region forming a second capacitance, the second capacitance having a second capacitance per unit area;

the second capacitance per unit area being larger than the first capacitance per unit area; and a body contact region of the second conductivity type which adjoins, in a second vertical cross-section, the electrode structure and the body region of at least one of the first field-effect structure and the second field-effect structure; wherein the body region to which the body contact region adjoins has a first doping concentration; and wherein the body contact region has a second doping concentration which is higher than the first doping concentration.

2. The semiconductor device of claim 1, further comprising a common drift region of the first conductivity type; the common drift region forming a pn-junction with the body regions of the first field-effect structure and the second field-effect structure; wherein the body region of the first field effect structure and the common drift region form a body diode; wherein the second field effect structure forms a MOS-gated diode (MGD) connected in parallel to at least one of the body diode and the first field-effect structure; wherein the total current through the semiconductor device in forward biasing of the body diode is dominated by an unipolar current above an average current flow density in the drift region; and wherein the average current flow density is about 1 mA/mm$^2$.

3. The semiconductor device of claim 1, comprising a plurality of first field-effect structures and second field-effect structures, wherein at least a part of the plurality of first field-effect structures and second field-effect structures are arranged in a regular pattern.

4. The semiconductor device of claim 1, wherein the body region of the first field-effect structure includes a first body sub-region adjoining the first insulating region; wherein the body region of the second field-effect structure includes a second body sub-region adjoining the second insulating region; and wherein the doping concentration of the second body sub-region is lower than the doping concentration of the first body sub-region.

5. The semiconductor device of claim 1, wherein at least one of the first field-effect structures further includes at least one field plate electrically connected to the source metallization.

6. The semiconductor device of claim 1, wherein the first gate electrode includes a material having a first work function, and wherein the second gate electrode includes a material having a second work function which is smaller than the first work function.

7. A semiconductor device comprising:

a source metallization;

a first field-effect structure including a source region of a first conductivity type, the source region being electrically connected to the source metallization; a body region of a second conductivity type adjacent to the source region; a first gate electrode and a first insulating region arranged at least between the first gate electrode and the body region, the first gate electrode, the first insulating region and the body region forming a first capacitance, the first capacitance having a first capacitance per unit area;

a second field-effect structure including a source region of the first conductivity type; a body region of the second conductivity type adjacent to the source region; an electrode structure and a second insulating region which is, in a first vertical cross-section, arranged at least between the electrode structure and the body region, the source region and the electrode structure being electrically connected to the source metallization; the electrode structure, the second insulating region and the body region forming a second capacitance, the second capacitance having a second capacitance per unit area;

the second capacitance per unit area being larger than the first capacitance per unit area; and a common drift region of the first conductivity type; the common drift region forming a pn-junction with the body regions of the first field-effect structure and the second field-effect structure; wherein the body region of the first field effect structure and the common drift region form a body diode; wherein the second field effect structure forms a MOS-gated diode (MGD) connected in parallel to at least one of the body diode and the first field-effect structure; wherein the total current through the semiconductor device in forward biasing of the body diode is dominated by an unipolar current above an average current flow density in the drift region; and wherein the average current flow density is about 1 mA/mm$^2$.

8. The semiconductor device of claim 7, further comprising a body contact region of the second conductivity type which adjoins, in a second vertical cross-section, the electrode structure and the body region of at least one of the first field-effect structure and the second field-effect structure; wherein the body region to which the body contact region adjoins has a first doping concentration; and wherein the body contact region has a second doping concentration which is higher than the first doping concentration.

9. A semiconductor device comprising:

a source metallization;

a first field-effect structure including a source region of a first conductivity type, the source region being electrically connected to the source metallization; a body region of a second conductivity type adjacent to the source region; a first gate electrode and a first insulating region arranged at least between the first gate electrode and the body region, the first gate electrode, the first insulating region and the body region forming a first capacitance, the first capacitance having a first capacitance per unit area;

a second field-effect structure including a source region of the first conductivity type; a body region of the second conductivity type adjacent to the source region; an electrode structure and a second insulating region which is, in a first vertical cross-section, arranged at least between the electrode structure and the body region, the source region and the electrode structure being electrically connected to the source metallization; the electrode structure, the second insulating region and the body region forming a second capacitance, the second capacitance having a second capacitance per unit area;

the second capacitance per unit area being larger than the first capacitance per unit area; and wherein the body region of the first field-effect structure includes a first body sub-region adjoining the first insulating region; wherein the body region of the second field-effect structure includes a second body sub-region adjoining the second insulating region; and wherein the doping concentration of the second body sub-region is lower than the doping concentration of the first body sub-region.

10. A semiconductor device comprising:

a source metallization;

a first field-effect structure including a source region of a first conductivity type, the source region being electrically connected to the source metallization; a body region of a second conductivity type adjacent to the source region; a first gate electrode and a first insulating region arranged at least between the first gate electrode and the body region, the first gate electrode, the first insulating region and the body region forming a first capacitance, the first capacitance having a first capacitance per unit area;

a second field-effect structure including a source region of the first conductivity type; a body region of the second conductivity type adjacent to the source region; an electrode structure and a second insulating region which is, in a first vertical cross-section, arranged at least between the electrode structure and the body region, the source region and the electrode structure being electrically connected to the source metallization; the electrode structure, the second insulating region and the body region forming a second capacitance, the second capacitance having a second capacitance per unit area;

the second capacitance per unit area being larger than the first capacitance per unit area; and wherein at least one of the first field-effect structures further includes at least one field plate electrically connected to the source metallization.

11. A semiconductor device comprising:

a source metallization;

a first field-effect structure including a source region of a first conductivity type, the source region being electrically connected to the source metallization; a body region of a second conductivity type adjacent to the source region; a first gate electrode and a first insulating region arranged at least between the first gate electrode and the body region, the first gate electrode, the first insulating region and the body region forming a first capacitance, the first capacitance having a first capacitance per unit area;

a second field-effect structure including a source region of the first conductivity type; a body region of the second conductivity type adjacent to the source region; an electrode structure and a second insulating region which is, in a first vertical cross-section, arranged at least between the electrode structure and the body region, the source region and the electrode structure being electrically connected to the source metallization; the electrode structure, the second insulating region and the body region forming a second capacitance, the second capacitance having a second capacitance per unit area;

the second capacitance per unit area being larger than the first capacitance per unit area; and wherein the first gate electrode includes a material having a first work function, and wherein the second gate electrode includes a material having a second work function which is smaller than the first work function.

* * * * *